US011486033B2

(12) United States Patent
Neuman et al.

(10) Patent No.: US 11,486,033 B2
(45) Date of Patent: Nov. 1, 2022

(54) DRIVE CIRCUIT FOR CONTROLLING ELECTRO-OPTIC MIRROR

(71) Applicant: Gentex Corporation, Zeeland, MI (US)

(72) Inventors: George A. Neuman, Holland, MI (US); Henry A. Luten, Holland, MI (US); G. Bruce Poe, Hamilton, MI (US); John S. Anderson, Holland, MI (US)

(73) Assignee: GENTEX CORPORATION, Zeeland, MI (US)

( * ) Notice: Subject to any disclaimer, the term of this patent is extended or adjusted under 35 U.S.C. 154(b) by 1274 days.

(21) Appl. No.: 15/915,258

(22) Filed: Mar. 8, 2018

(65) Prior Publication Data

US 2018/0216222 A1   Aug. 2, 2018

Related U.S. Application Data

(63) Continuation of application No. 12/138,206, filed on Jun. 12, 2008, now Pat. No. 10,017,847, which is a continuation-in-part of application No. 11/833,701, filed on Aug. 3, 2007, now Pat. No. 7,746,534, which is a continuation-in-part of application No. 11/713,849, filed on Mar. 5, 2007, now Pat. No. 7,688,495.

(60) Provisional application No. 60/943,385, filed on Jun. 12, 2007.

(51) Int. Cl.
| C23C 14/08 | (2006.01) |
| C23C 14/18 | (2006.01) |
| C23C 14/58 | (2006.01) |
| G02F 1/163 | (2006.01) |

(52) U.S. Cl.
CPC .......... *C23C 14/086* (2013.01); *C23C 14/185* (2013.01); *C23C 14/5833* (2013.01); *C23C 14/5873* (2013.01); *G02F 1/163* (2013.01)

(58) Field of Classification Search
CPC . C23C 14/086; C23C 14/185; C23C 14/5833; C23C 14/5873; G02F 1/163
See application file for complete search history.

(56) References Cited

U.S. PATENT DOCUMENTS

| 1,096,452 A | 5/1914 | Perrin |
| 1,563,258 A | 11/1925 | Cunningham |
| 2,457,348 A | 12/1948 | Chambers |
| 2,561,582 A | 7/1951 | Marbel |
| 3,280,701 A | 10/1966 | Donnelly et al. |
| 3,712,710 A | 1/1973 | Castellion et al. |
| 3,837,129 A | 9/1974 | Losell |

(Continued)

FOREIGN PATENT DOCUMENTS

| CA | 2028461 | 10/1990 |
| CN | 101395521 A | 3/2009 |

(Continued)

OTHER PUBLICATIONS

Roberts, John, "Dichoric Mirrors With Semi-active Covert Displays," International Body Engineering Conference, Ltd., Sep. 21-23, 1993.

*Primary Examiner* — Nathanael R Briggs
(74) *Attorney, Agent, or Firm* — Price Heneveld LLP; Brian James Brewer

(57) ABSTRACT

The present invention relates to methods and apparatus for ion milling, and more particularly relates to methods and apparatus for smoothing a surface using ion milling.

4 Claims, 99 Drawing Sheets

(56) References Cited

U.S. PATENT DOCUMENTS

| | | |
|---|---|---|
| 4,274,078 A | 6/1981 | Isobe et al. |
| 4,733,335 A | 3/1988 | Serizawa et al. |
| 4,803,599 A | 2/1989 | Trine et al. |
| 4,827,086 A | 5/1989 | Rockwell |
| 4,855,550 A | 8/1989 | Schultz, Jr. |
| 4,859,813 A | 8/1989 | Rockwell |
| 4,902,108 A | 2/1990 | Byker |
| 5,014,167 A | 5/1991 | Roberts |
| 5,016,996 A | 5/1991 | Ueno |
| 5,017,903 A | 5/1991 | Krippelz, Sr. |
| 5,027,492 A | 7/1991 | Chansavoir et al. |
| 5,052,163 A | 10/1991 | Czekala |
| 5,059,015 A | 10/1991 | Tran |
| 5,066,112 A | 11/1991 | Lynam et al. |
| 5,069,535 A | 12/1991 | Baucke et al. |
| 5,073,012 A | 12/1991 | Lynam |
| 5,076,673 A | 12/1991 | Lynam et al. |
| 5,115,346 A | 5/1992 | Lynam |
| 5,151,824 A | 9/1992 | O'Farrell |
| 5,158,638 A | 10/1992 | Osanami et al. |
| 5,177,031 A | 1/1993 | Buchmann et al. |
| 5,239,406 A | 8/1993 | Lynam |
| 5,253,109 A | 10/1993 | O'Farrell et al. |
| 5,313,335 A | 5/1994 | Gray et al. |
| 5,355,284 A | 10/1994 | Roberts |
| 5,361,190 A | 11/1994 | Roberts et al. |
| 5,371,659 A | 12/1994 | Pastrick et al. |
| 5,379,146 A | 1/1995 | Defendini |
| 5,402,103 A | 3/1995 | Tashiro |
| 5,408,353 A | 4/1995 | Nichols et al. |
| 5,436,741 A | 7/1995 | Crandall |
| D363,920 S | 11/1995 | Roberts et al. |
| 5,481,409 A | 1/1996 | Roberts |
| 5,497,305 A | 3/1996 | Pastrick et al. |
| 5,497,306 A | 3/1996 | Pastrick |
| 5,523,877 A | 6/1996 | Lynam |
| 5,528,422 A | 6/1996 | Roberts |
| 5,587,699 A | 12/1996 | Faloon et al. |
| 5,610,380 A | 3/1997 | Nicolaisen |
| 5,619,374 A | 4/1997 | Roberts |
| 5,619,375 A | 4/1997 | Roberts |
| 5,632,551 A | 5/1997 | Roney et al. |
| 5,649,756 A | 7/1997 | Adams et al. |
| 5,668,663 A | 9/1997 | Varaprasad et al. |
| 5,669,699 A | 9/1997 | Pastrick et al. |
| 5,669,704 A | 9/1997 | Pastrick |
| 5,669,705 A | 9/1997 | Pastrick et al. |
| 5,724,187 A | 3/1998 | Varaprasad et al. |
| 5,748,172 A | 5/1998 | Song et al. |
| D394,833 S | 6/1998 | Muth |
| 5,788,357 A | 8/1998 | Muth et al. |
| 5,790,298 A | 8/1998 | Tonar |
| 5,796,176 A | 8/1998 | Kramer et al. |
| 5,798,575 A | 8/1998 | O'Farrell et al. |
| 5,818,625 A | 10/1998 | Forgette et al. |
| 5,823,654 A | 10/1998 | Pastrick et al. |
| 5,825,527 A | 10/1998 | Forgette et al. |
| 5,863,116 A | 1/1999 | Pastrick et al. |
| 5,864,419 A | 1/1999 | Lynam |
| 5,879,074 A | 3/1999 | Pastrick |
| D409,540 S | 5/1999 | Muth |
| 5,923,457 A | 7/1999 | Byker et al. |
| 5,938,320 A | 8/1999 | Crandall |
| 5,959,367 A | 9/1999 | O'Farrell et al. |
| 6,005,724 A | 12/1999 | Todd |
| 6,007,222 A | 12/1999 | Thau |
| 6,045,243 A | 4/2000 | Muth et al. |
| D425,466 S | 5/2000 | Todd et al. |
| 6,062,920 A | 5/2000 | Jordan et al. |
| 6,064,508 A | 5/2000 | Forgette et al. |
| 6,068,380 A | 5/2000 | Lynn et al. |
| D426,506 S | 6/2000 | Todd et al. |
| D426,507 S | 6/2000 | Todd et al. |
| D427,128 S | 6/2000 | Mathieu |
| 6,074,077 A | 6/2000 | Pastrick et al. |
| 6,076,948 A | 6/2000 | Bukosky et al. |
| D428,372 S | 7/2000 | Todd et al. |
| D428,373 S | 7/2000 | Todd et al. |
| 6,084,700 A | 7/2000 | Knapp et al. |
| 6,086,229 A | 7/2000 | Pastrick |
| 6,093,976 A | 7/2000 | Kramer et al. |
| 6,094,012 A | 7/2000 | Leung et al. |
| D428,842 S | 8/2000 | Todd et al. |
| D429,202 S | 8/2000 | Todd et al. |
| D430,088 S | 8/2000 | Todd et al. |
| 6,099,155 A | 8/2000 | Pastrick et al. |
| 6,102,546 A | 8/2000 | Carter |
| 6,111,683 A | 8/2000 | Cammenga et al. |
| 6,111,684 A | 8/2000 | Forgette et al. |
| 6,111,685 A | 8/2000 | Tench et al. |
| 6,124,886 A | 9/2000 | DeLine et al. |
| 6,142,656 A | 11/2000 | Kurth |
| 6,146,003 A | 11/2000 | Thau |
| 6,149,287 A | 11/2000 | Pastrick et al. |
| 6,152,590 A | 11/2000 | Furst et al. |
| 6,163,083 A | 12/2000 | Kramer et al. |
| 6,166,848 A | 12/2000 | Cammenga et al. |
| 6,170,956 B1 | 1/2001 | Rumsey et al. |
| 6,175,164 B1 | 1/2001 | O'Farrell et al. |
| 6,176,602 B1 | 1/2001 | Pastrick et al. |
| 6,195,194 B1 | 2/2001 | Roberts et al. |
| 6,206,553 B1 | 3/2001 | Boddy et al. |
| 6,222,177 B1 | 4/2001 | Bechtel et al. |
| 6,227,689 B1 | 5/2001 | Miller |
| 6,239,899 B1 | 5/2001 | DeVries et al. |
| 6,244,716 B1 | 6/2001 | Steenwyk et al. |
| 6,249,369 B1 | 6/2001 | Theiste et al. |
| 6,257,746 B1 | 7/2001 | Todd et al. |
| 6,259,102 B1 | 7/2001 | Shun'ko |
| 6,264,353 B1 | 7/2001 | Caraher |
| 6,276,821 B1 | 8/2001 | Pastrick et al. |
| 6,280,069 B1 | 8/2001 | Pastrick et al. |
| 6,296,379 B1 | 10/2001 | Pastrick |
| 6,299,333 B1 | 10/2001 | Pastrick et al. |
| 6,301,039 B1 | 10/2001 | Tench |
| 6,317,248 B1 | 11/2001 | Agrawal et al. |
| 6,336,737 B1 | 1/2002 | Thau |
| 6,340,849 B1 | 1/2002 | Kramer et al. |
| 6,340,850 B2 | 1/2002 | O'Farrell et al. |
| 6,347,880 B1 | 2/2002 | Furst et al. |
| 6,356,376 B1 | 3/2002 | Tonar et al. |
| 6,375,814 B1 | 4/2002 | De Bosscher et al. |
| 6,379,013 B1 | 4/2002 | Bechtel et al. |
| 6,407,468 B1 | 6/2002 | LeVesque et al. |
| 6,407,847 B1 | 6/2002 | Poll et al. |
| 6,420,800 B1 | 7/2002 | LeVesque et al. |
| 6,426,568 B2 | 7/2002 | Turnbull et al. |
| 6,441,943 B1 | 8/2002 | Roberts et al. |
| 6,441,963 B2 | 8/2002 | Murakami et al. |
| 6,471,362 B1 | 10/2002 | Carter et al. |
| 6,512,203 B2 | 1/2003 | Jones et al. |
| 6,606,183 B2 | 8/2003 | Ikai et al. |
| 6,614,579 B2 | 9/2003 | Roberts et al. |
| 6,621,616 B1 | 9/2003 | Bauer et al. |
| 6,639,360 B2 | 10/2003 | Roberts et al. |
| 6,650,457 B2 | 11/2003 | Busscher et al. |
| 6,679,608 B2 | 1/2004 | Bechtel et al. |
| 6,700,692 B2 | 3/2004 | Tonar et al. |
| 6,737,629 B2 | 5/2004 | Nixon et al. |
| 6,749,308 B1 | 6/2004 | Niendorf et al. |
| 6,755,542 B2 | 6/2004 | Bechtel et al. |
| 6,777,030 B2 | 8/2004 | Veerasamy et al. |
| 6,805,474 B2 | 10/2004 | Walser et al. |
| 6,831,268 B2 | 12/2004 | Bechtel et al. |
| 6,849,165 B2 | 2/2005 | Kloppel |
| 6,870,656 B2 | 3/2005 | Tonar et al. |
| 6,919,672 B2 | 7/2005 | Madocks |
| 6,928,366 B2 | 8/2005 | Ockerse et al. |
| 7,014,741 B2 | 3/2006 | Rietzel et al. |
| 7,154,657 B2 | 12/2006 | Poll et al. |
| 7,255,451 B2 | 8/2007 | McCabe et al. |
| 7,274,501 B2 | 9/2007 | McCabe et al. |
| 7,287,868 B2 | 10/2007 | Carter et al. |
| 7,488,951 B2 | 2/2009 | Murphy et al. |

(56) References Cited

U.S. PATENT DOCUMENTS

| | | |
|---|---|---|
| 7,706,046 B2 | 4/2010 | Bauer et al. |
| 7,830,583 B2 | 11/2010 | Neuman et al. |
| 7,864,398 B2 | 1/2011 | Dozeman et al. |
| 8,725,283 B2 | 5/2014 | Gray et al. |
| 2002/0126497 A1 | 9/2002 | Pastrick |
| 2002/0153103 A1 | 10/2002 | Madocks |
| 2002/0154379 A1 | 10/2002 | Tonar et al. |
| 2002/0171906 A1 | 11/2002 | Busscher et al. |
| 2003/0228416 A1 | 12/2003 | Iwamaru |
| 2004/0028955 A1 | 2/2004 | Hoffman |
| 2004/0061920 A1 | 4/2004 | Tonar et al. |
| 2004/0095632 A1 | 5/2004 | Busscher et al. |
| 2005/0099693 A1 | 5/2005 | Schofield et al. |
| 2005/0195488 A1 | 9/2005 | McCabe et al. |
| 2005/0247885 A1 | 11/2005 | Madocks |
| 2005/0264891 A1 | 12/2005 | Uken et al. |
| 2005/0270621 A1* | 12/2005 | Bauer .................. H05K 3/321 |
| | | 359/265 |
| 2008/0073557 A1 | 3/2008 | German et al. |
| 2008/0302657 A1 | 12/2008 | Luten et al. |
| 2009/0032393 A1 | 2/2009 | Madocks |

FOREIGN PATENT DOCUMENTS

| | | |
|---|---|---|
| EP | 0240226 A2 | 3/1987 |
| EP | 0450162 A1 | 12/1990 |
| EP | 0531143 A2 | 9/1992 |
| GB | 2161440 A | 1/1986 |
| MX | 2008011134 A | 9/2008 |
| WO | 89/02135 | 3/1989 |
| WO | 95/30495 | 11/1995 |
| WO | 99/40039 | 8/1999 |
| WO | 00/30893 | 6/2000 |
| WO | 03/103338 | 12/2003 |
| WO | 2007/103342 A3 | 9/2007 |

* cited by examiner

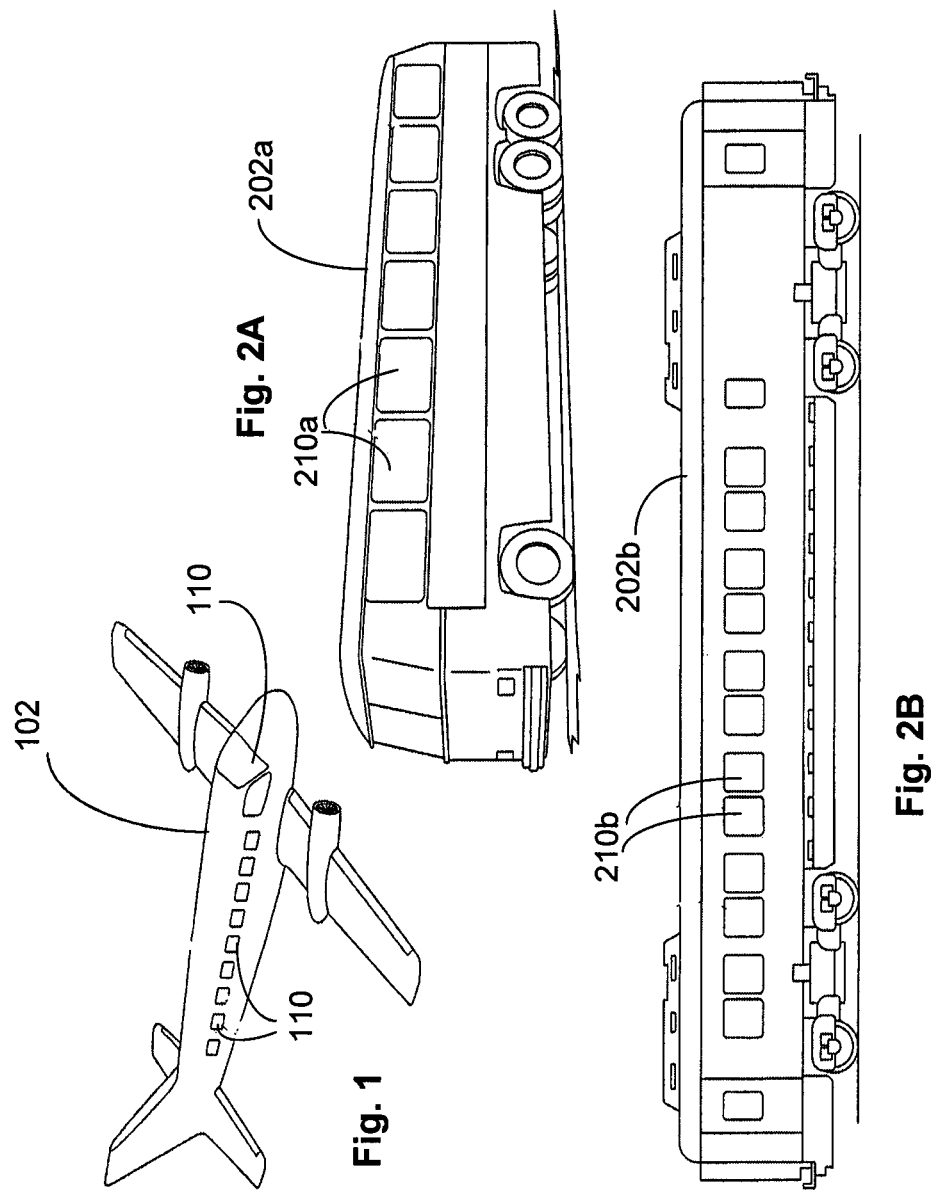

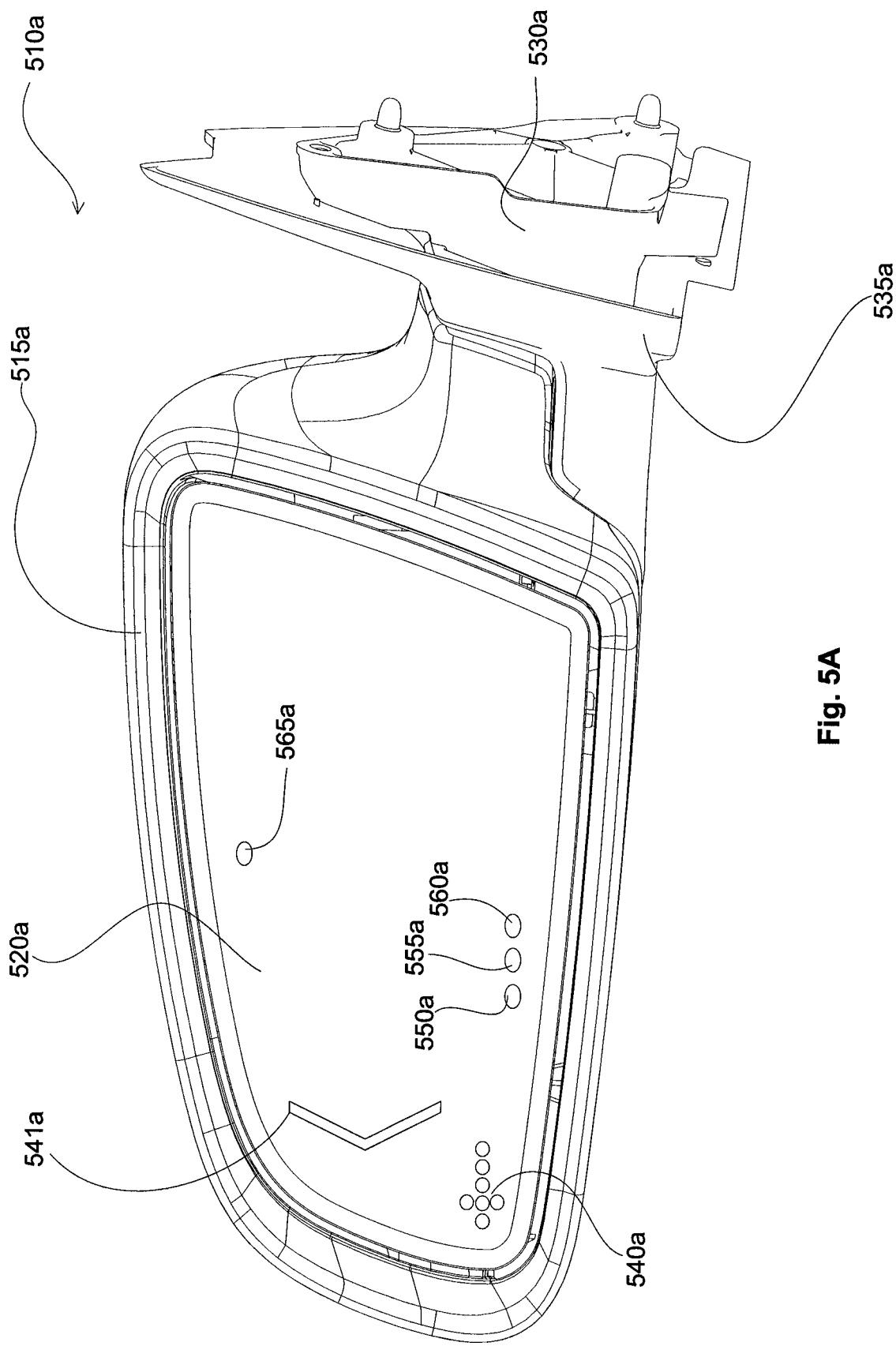

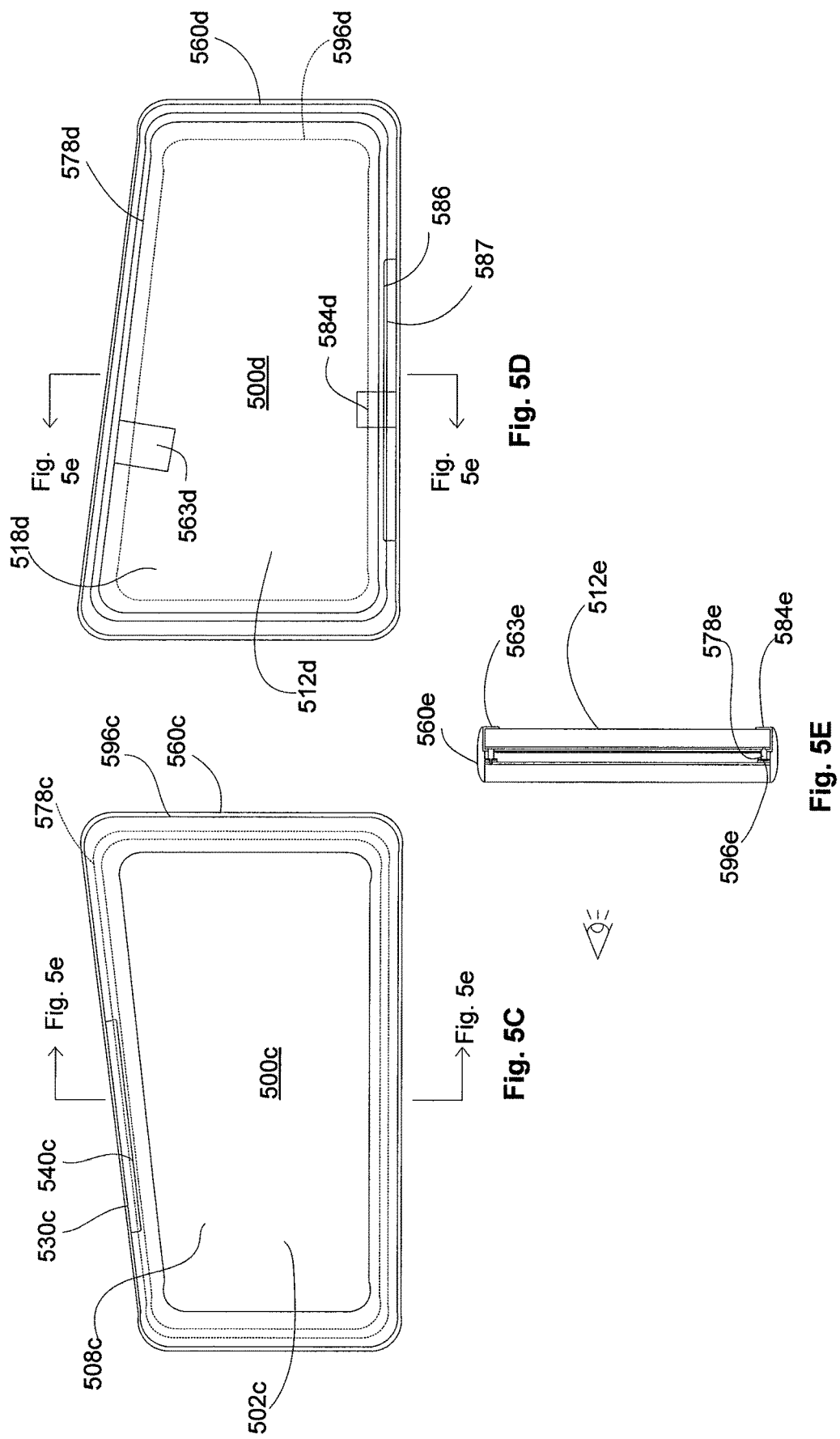

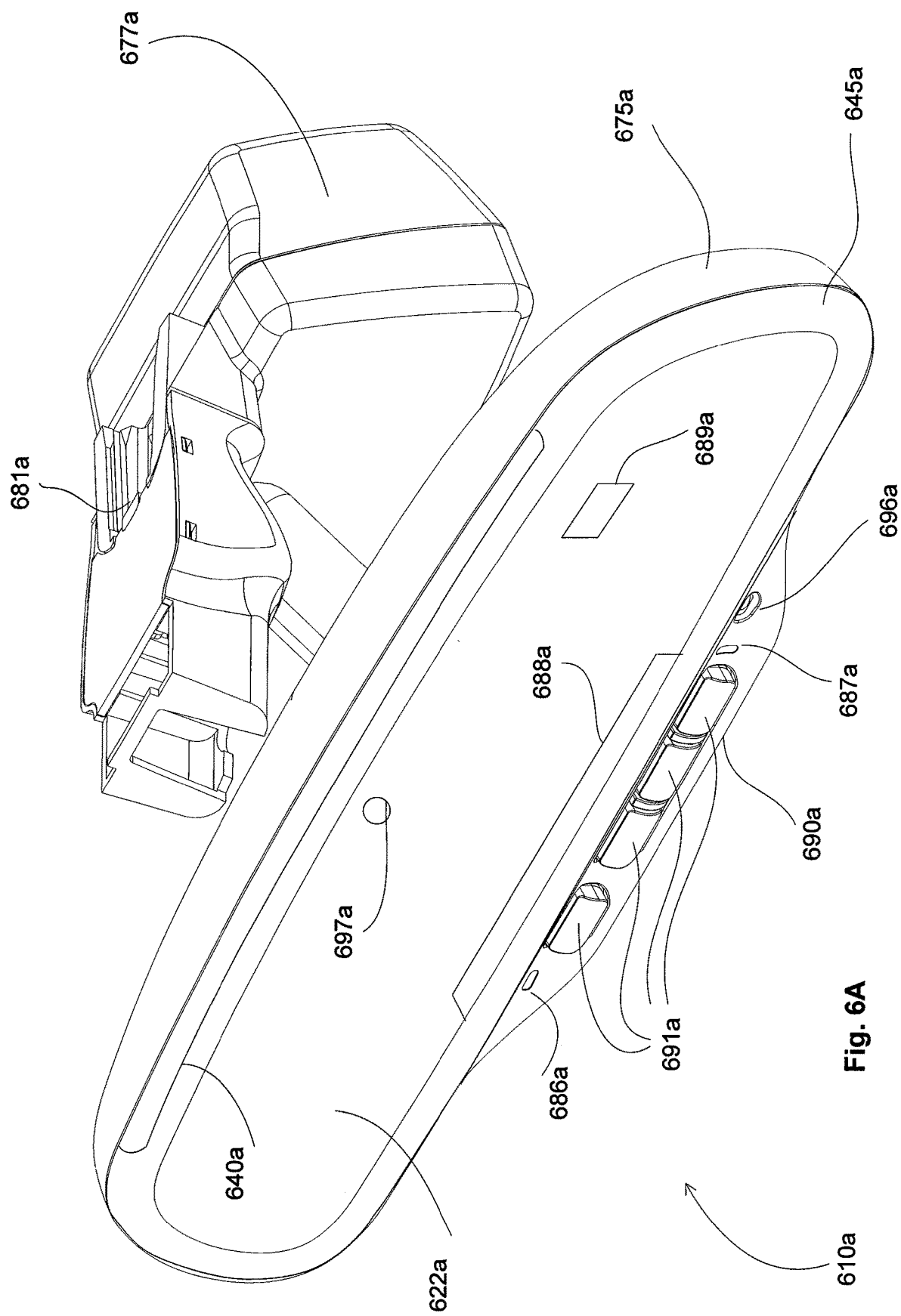

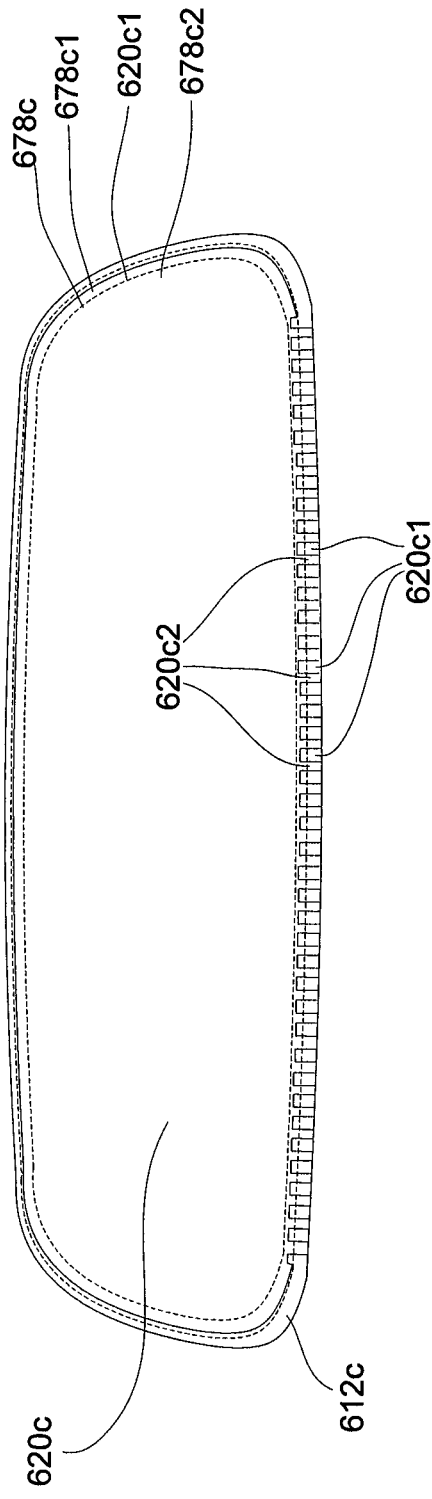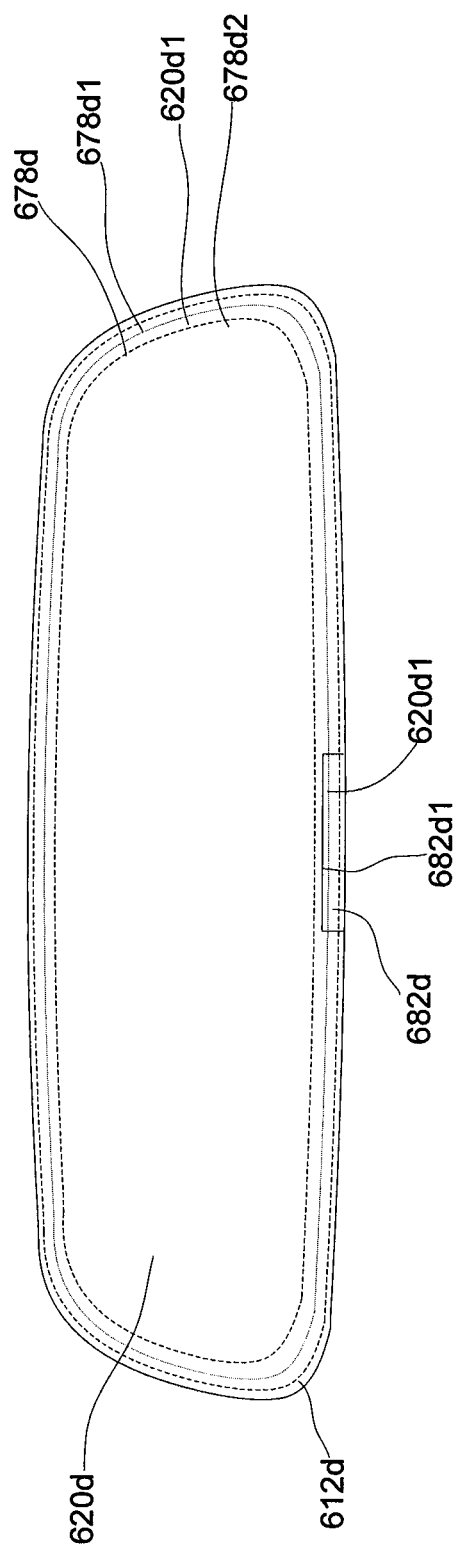

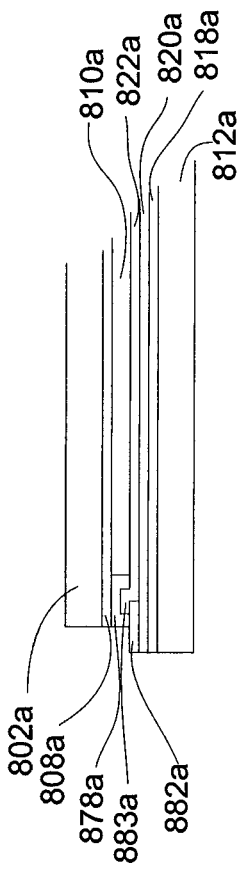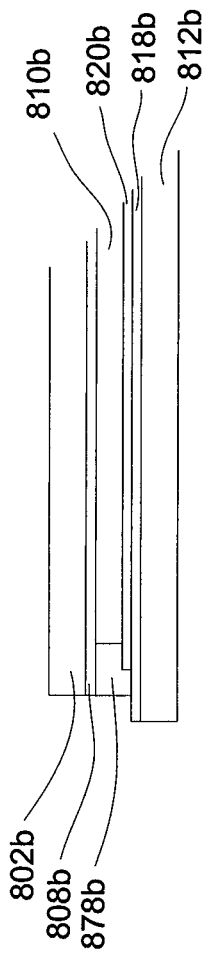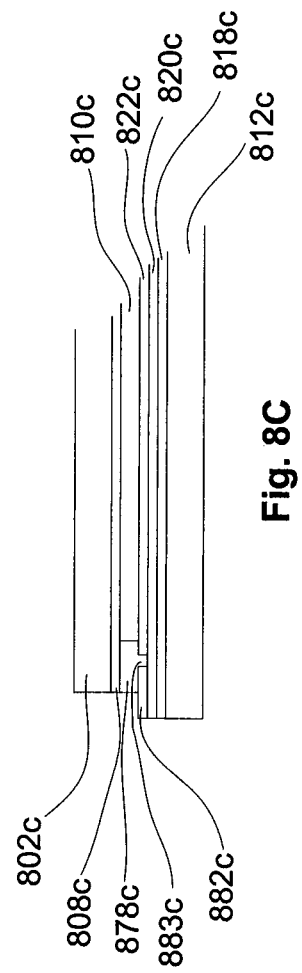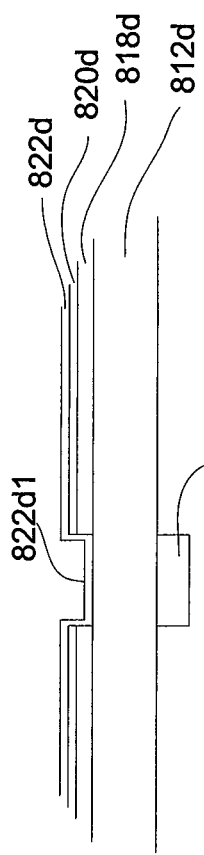
Fig. 8A
Fig. 8B
Fig. 8C
Fig. 8D

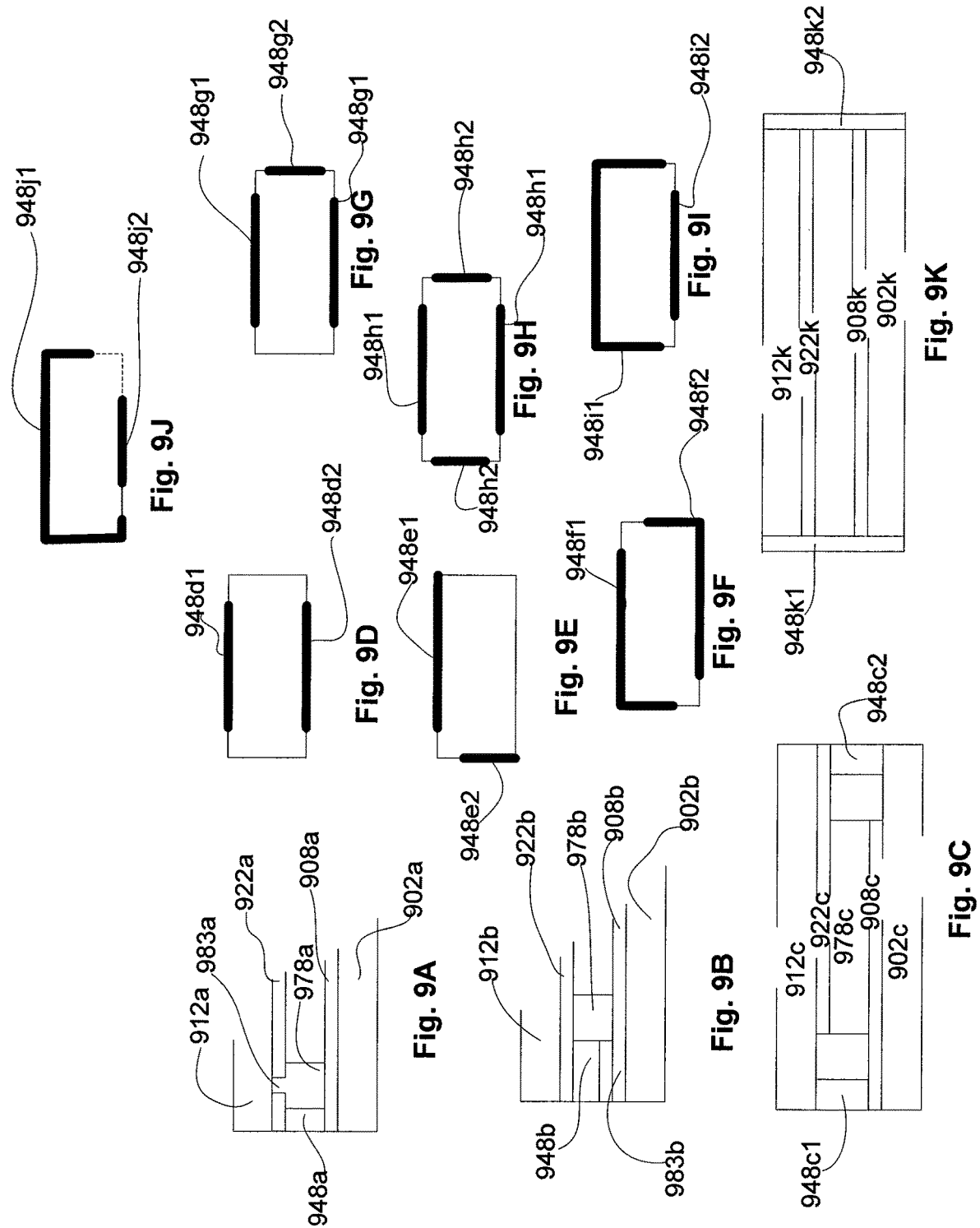

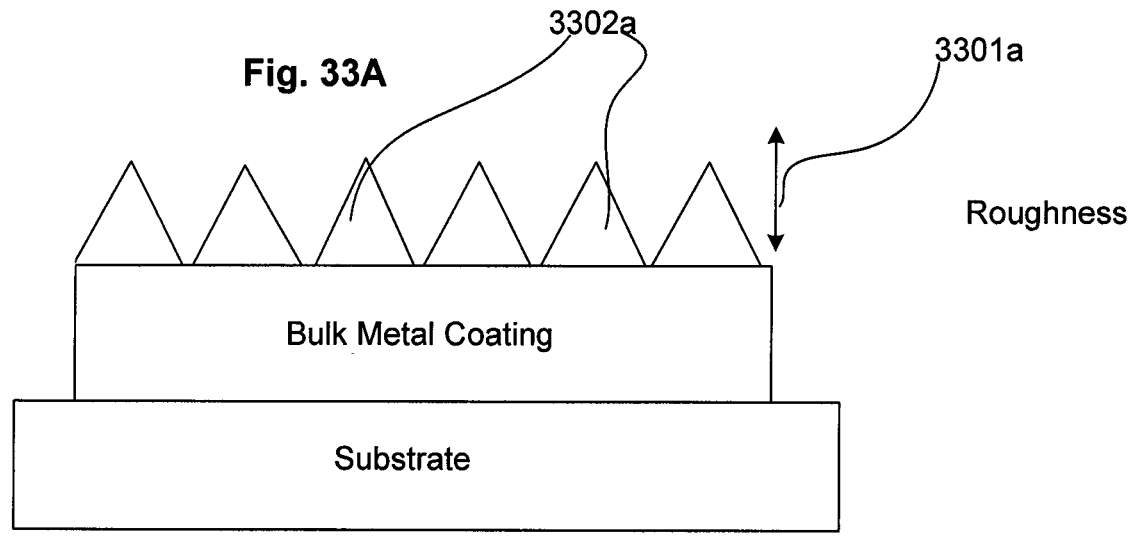
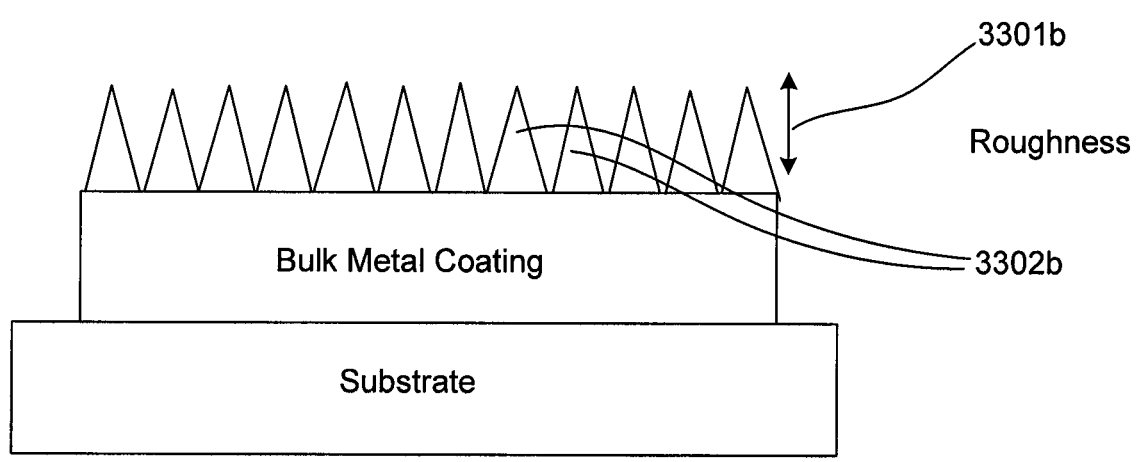
Fig. 33B

Figure 5.5: Variation of sputtering yield with ion energy at normal angle of incidence. Data from R.V. Stuart and G.K. Wehner, *J. Appl. Phys.* 33, 2351 (1962); D. Rosenberg and G.K. Wehner, *J. Appl. Phys.* 33, 1842 (1962); R. Behrisch, *Ergeb. Exakt. Naturw.* 35, 295 (1964).

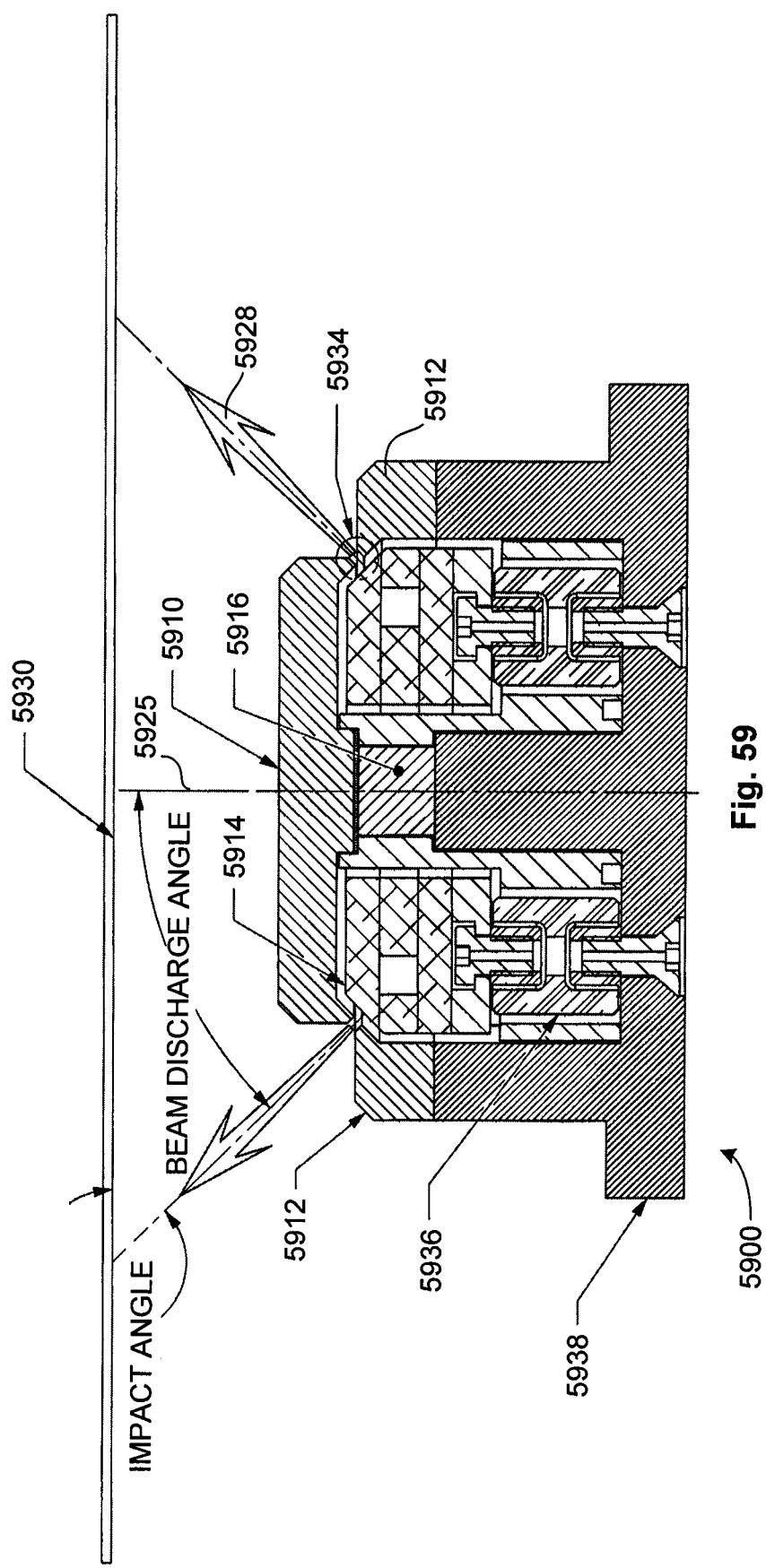

DRIVE CIRCUIT FOR CONTROLLING ELECTRO-OPTIC MIRROR

CROSS-REFERENCE TO RELATED APPLICATIONS

This application is a continuation of U.S. patent application Ser. No. 12/138,206, filed on Jun. 12, 2008, which is a continuation-in-part of U.S. patent application Ser. No. 11/833,701, filed on Aug. 3, 2007, now U.S. Pat. No. 7,746,534, which is a continuation-in-part of U.S. patent application Ser. No. 11/713,849, filed Mar. 5, 2007, now U.S. Pat. No. 7,688,495, the entire disclosures of which are incorporated herein by reference. U.S. patent application Ser. No. 12/138,206 also claims priority under 35 U.S.C. § 119(e) on U.S. Provisional Patent Application No. 60/943,385, filed on Jun. 12, 2007, the entire disclosure of which is incorporated herein by reference.

BACKGROUND OF THE INVENTION

The present invention relates to methods and apparatus for ion milling, and more particularly relates to methods and apparatus for smoothing a surface using ion milling.

This application is related to U.S. Provisional Patent Application No. 60/873,474 filed Dec. 7, 2006 and Application No. 60/888,686 filed Feb. 7, 2007; and U.S. patent application Ser. No. 11/682,098 filed Mar. 5, 2007 which claims the benefit of U.S. Provisional Application No. 60/779,369, filed Mar. 3, 2006, and U.S. Provisional Application No. 60/810,921, filed Jun. 5, 2006, and which is a continuation-in-part of U.S. patent application Ser. No. 10/863,638, filed Jun. 8, 2004; and U.S. patent application Ser. No. 11/682,121, filed Mar. 5, 2007 which claims the benefit of U.S. Provisional Application No. 60/779,369, filed Mar. 3, 2006, and U.S. Provisional Application No. 60/810,921, filed Jun. 5, 2006; the disclosures of which are incorporated herein in their entireties by reference.

BRIEF DESCRIPTION OF THE DRAWINGS

In the drawings:

FIG. 1 depicts an airplane having variable transmittance windows;

FIGS. 2A and 2B depict a bus and a train car, respectively, having variable transmittance windows;

FIGS. 5A-5F depict various views of exterior rearview mirror assemblies and related variable reflectance elements;

FIGS. 6A-6D depict various views of interior rearview mirror assemblies and related variable reflectance elements;

FIGS. 8A-8D depict profile views of cross sections of various elements;

FIGS. 9A-9K depict various electrical contacts for various elements;

FIGS. 33A and 33B depict thin film peak-to-peak surface roughness;

FIG. 59 is a cross sectional view of an ion source featuring a beam discharge which is not parallel to the axis of the source;

DETAILED DESCRIPTION OF THE EMBODIMENTS

Figure 3:
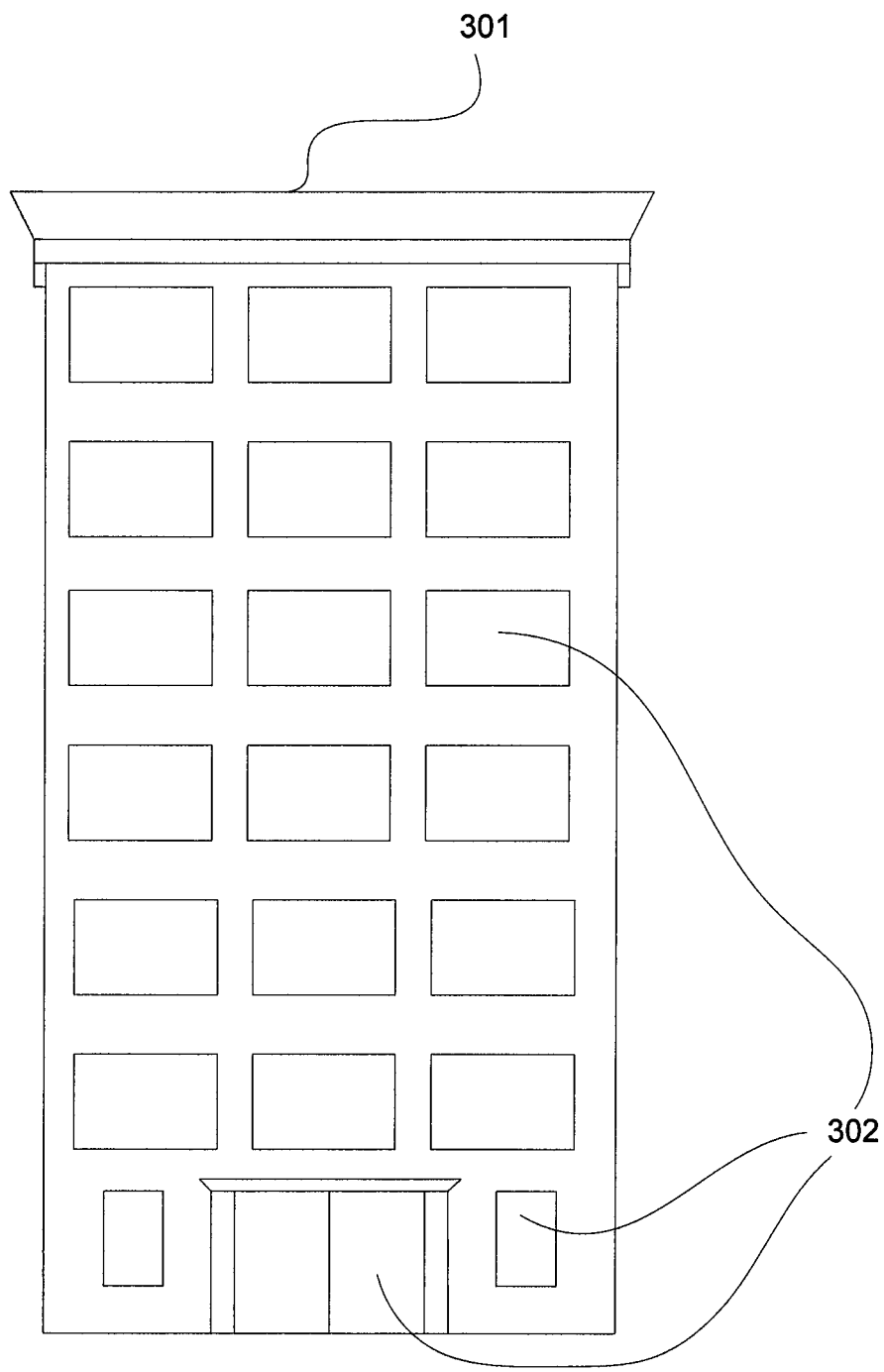
FIG. 3 depicts a building having variable transmittance and or variable reflectivity windows.

FIGS. 1, 2A and 2B depict multi-passenger vehicles 102, 202a, 202b employing variable transmittance windows 110, 210a, 210b. Multi-passenger vehicles employing variable transmittance windows 110, 210a, 210b include, for example, aircraft 102, buses 202a, and trains 202b. It should be appreciated that other multi-passenger vehicles, some of which are described in more detail elsewhere herein, may employ variable transmittance windows 110, 210a, 210b. The multi-passenger vehicles generally illustrated in FIGS. 1, 2A and 2B also include window control systems (not shown in FIGS. 1-2B, however, shown and described with reference to FIG. 10) for controlling the variable transmittance windows. Commonly assigned U.S. Pat. No. 6,567, 708 and U.S. Provisional Application No. 60/804,378, entitled Variable Transmission Window Systems, filed Jun. 9, 2006 describe various details related to variable transmittance windows, the disclosures of which are incorporated herein in their entireties by reference.

Another application of variable transmittance windows is depicted in FIG. 3. Architectural windows 302 of buildings 301 may advantageously incorporate variable transmission functionality. It should be understood that these variable transmission architectural windows may be included in residential, commercial and industrial facilities.

Figure 4:
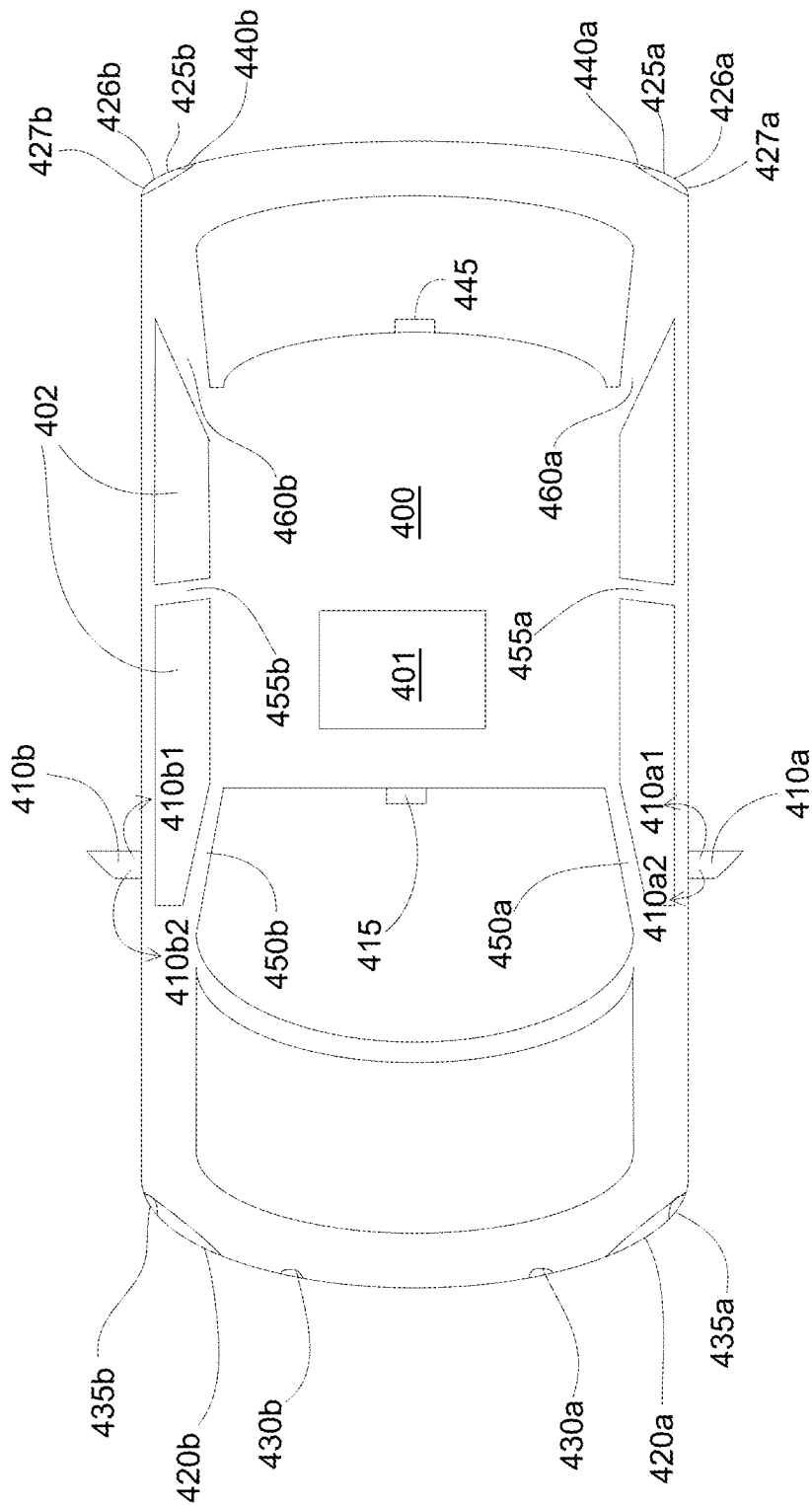
FIG. 4 depicts a vehicle having variable transmittance windows and variable reflectance rearview mirrors.

FIG. 4 depicts a controlled vehicle 400 comprising various variable transmittance and variable reflectance elements. As one example, an interior rearview mirror assembly 415 is depicted, in at least one embodiment, the assembly 415 comprises a variable reflectance mirror element and an automatic vehicle exterior light control system. Detailed descriptions of such automatic vehicle exterior light control systems are contained in commonly assigned U.S. Pat. Nos. 5,837,994, 5,990,469, 6,008,486, 6,130,448, 6,130,421, 6,049,171, 6,465,963, 6,403,942, 6,587,573, 6,611,610, 6,621,616, 6,631,316, 6,861,809, 6,895,684, 6,774,988, and U.S. Provisional Application Nos. 60/404,879 and 60/394, 583; and U.S. Patent Application Publication No. US 2004-0201483 A1 the disclosures of which are incorporated herein in their entireties by reference. The controlled vehicle is also depicted to include a driver's side outside rearview mirror assembly 410a, a passenger's side outside rearview mirror assembly 410b, a center high mounted stop light (CHMSL) 445, A-pillars 450a, 450b, B-pillars 455a, 455b and C-pillars 460a, 460b; it should be understood that any of these locations may provide alternate locations for an image sensor, image sensors or related processing and, or, control components. It should be understood that any, or all, of the rearview mirrors may be automatic dimming electro-optic mirrors (i.e. variable reflectance mirror elements). In at least one embodiment, a controlled vehicle may comprise variable transmittance windows 401, 402. The controlled vehicle is depicted to include a host of exterior lights including headlights 420a, 420b, foil weather lights 430a, 430b, front turn indicator/hazard lights 435a, 435b, tail lights 425a, 425b, rear turn indicator lights 426a, 426b, rear hazard lights 427a, 427b and backup lights 440a, 440b. It should be understood that additional exterior lights may be provided, such as, separate low beam and high beam headlights, integrated lights that comprise multipurpose lighting, etc. It should also be understood that any of the exterior lights may be provided with positioners (not shown) to adjust the associated primary optical axis of the given exterior light. In at least one embodiment, at least one exterior mirror assembly is provided with pivoting mechanisms to allow pivoting in directions 410a1, 410a2, 410b1, 410b2. It should be understood that the controlled vehicle of FIG. 4 is generally for illustrative purposes and that suitable automatic dimming rearview mirrors, such as those disclosed in the patents and patent applications incorporated herein by reference, may be employed along with other features described herein and within disclosures incorporated herein by reference.

Preferably, the controlled vehicle comprises an inside rearview mirror of unit magnification. Unit magnification mirror, as used herein, means a plane or flat mirror with a reflective surface through which the angular height and width of an image of an object is equal to the angular height and width of the object when viewed directly at the same distance with the exception for flaws that do not exceed normal manufacturing tolerances. A prismatic day-night adjustment rearview mirror wherein at least one associated position provides unit magnification is considered herein to be a unit magnification mirror. Preferably, the mirror provides a field of view with an included horizontal angle measured from the projected eye point of at least 20 degrees and a sufficient vertical angle to provide a view of a level road surface extending to the horizon beginning at a point not greater than 61 m to the rear of the controlled vehicle when the controlled vehicle is occupied by a driver and four passengers or the designated occupant capacity, if less, based on an average occupant weight of 68 kg. It should be understood that the line of sight may be partially obscured by seated occupants or by head restraints. The location of the driver's eye reference points are preferably in accordance with regulation or a nominal location appropriate for any 95th percentile male driver. In at least one embodiment the controlled vehicle comprises at least one outside mirror of unit magnification. Preferably, the outside mirror provides a driver of a controlled vehicle a view of a level road surface extending to the horizon from a line, perpendicular to a longitudinal plane tangent to the driver's side of the controlled vehicle at the widest point, extending 2.4 m out from the tangent plane 10.7 m behind the driver's eyes, with the seat in the rearmost position. It should be understood that the line of sight may be partially obscured by rear body or fender contours of the controlled vehicle. Preferably, the locations of the driver's eye reference points are in accordance with regulation or a nominal location appropriate for any 95th percentile male driver. Preferably, the passenger's side mirror is not obscured by an unwiped portion of a corresponding windshield and is preferably adjustable by tilting in both horizontal and vertical directions from the driver's seated position. In at least one embodiment, the controlled vehicle comprises a convex mirror installed on the passenger's side. Preferably, the mirror is configured for adjustment by tilting in both horizontal and vertical directions. Preferable, each outside mirror comprises not less than 126 cm of reflective surface and is located so as to provide the driver a view to the rear along an associated side of the controlled vehicle. Preferably, the average reflectance of any mirror, as determined in accordance with SAE Recommended Practice J964, OCT84, is at least 35 percent (40% for many European Countries). In embodiments where the mirror element is capable of multiple reflectance levels, such as with electro-optic mirror elements in accordance with the present invention, the minimum reflectance level in the day mode shall be at least 35 (40 when for European use) percent and the minimum reflectance level in the night mode shall be at least 4 percent. It should be understood that various embodiments of the present invention are equally applicable for motorcycle windscreens and rearview mirrors.

Figure 5B:
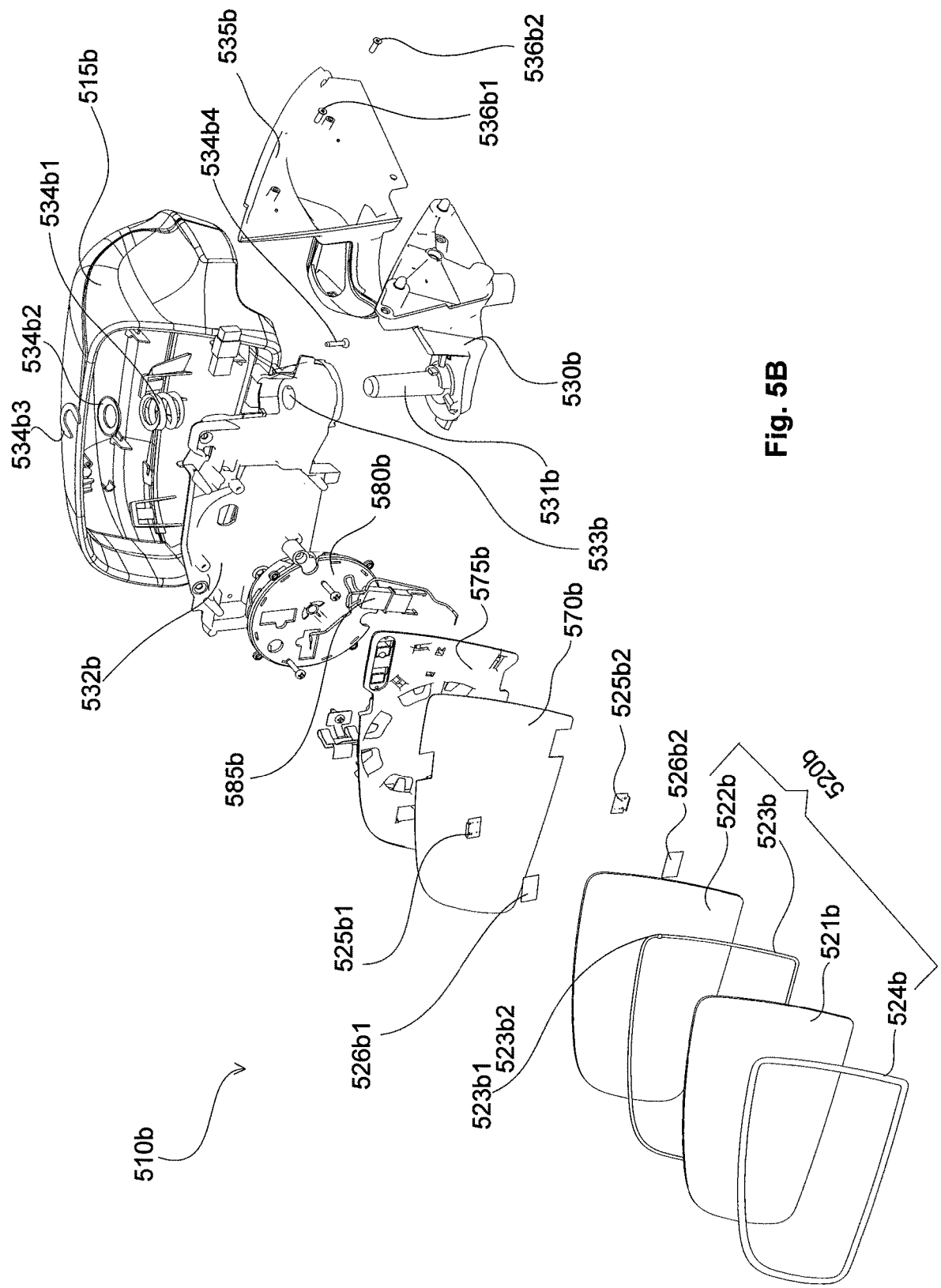

Turning now to FIGS. 5A and 5B, various components of an outside rearview mirror assembly 510a, 510b are depicted. As described in detail herein, an electro-optic mirror element may comprise a first substrate 521b secured in a spaced apart relationship with a second substrate 522b via a primary seal 523b to form a chamber there between. In at least one embodiment, at least a portion of the primary seal is left void to form at least one chamber fill port 523b1. An electro-optic medium is enclosed in the chamber and the fill port(s) are sealingly closed via a plug material 523b2. Preferably, the plug material is a UV curable epoxy or acrylic material. In at least one embodiment a spectral filter material 545a, 545b is located proximate a second surface of a first substrate, near the periphery of the mirror element. Electrical connectors 525b1, 525b2 are preferably secured to the element, respectively, via first adhesive material 526b1, 526b2. The mirror element is secured to a carrier plate 575b via second adhesive material 570b. Electrical connections from the outside rearview mirror to other components of the controlled vehicle are preferably made via a connecter 585b. The carrier is attached to an associated housing mount 585b via a positioner 580b. Preferably, the housing mount is engaged with a housing 515a, 515b and secured via at least one fastener 534b4. Preferably the housing mount comprises a swivel portion configured to engage a swivel mount 533b. The swivel mount is preferably configured to engage a vehicle mount 530b via at least one fastener 531b. Additional details of these components, additional components, their interconnections and operation is provided herein.

With further reference to FIGS. 5A and 5B, an outside rearview mirror assembly 510a is oriented such that a view of the first substrate 521b is shown with a spectral filter material 524b positioned between the viewer and the primary seal material 523b. A blind spot indicator 550a, a keyhole illuminator 555a, a puddle light 560a, a supplemental turn signal 540a, or 541a, a photo sensor 565a, anyone thereof, a subcombination thereof or a combination thereof may be incorporated within the rearview mirror assembly such that they are positioned behind the element with respect to the viewer. Preferably, the devices 550a, 555a, 560a, 540a, or 541a, 565a are configured in combination with the mirror element to be at least partially covert as discussed in detail herein and within various references incorporated by reference herein. Additional details of these components, additional components, their interconnections and operation are provided herein.

Turning now to FIGS. 5C-5E, a discussion of additional features in accordance with the present invention is provided. FIG. 5C depicts a rearview mirror element 500c viewed from the first substrate 502c with a spectral filter material 596c positioned between the viewer and a primary seal material 578c. A first separation area 540c is provided to substantially electrically insulate a first conductive portion 508c from a second conductive portion 530c. A perimeter material 560c is applied to the edge of the element. FIG. 5D depicts a rearview mirror element 500d viewed from the second substrate 512d with a primary seal material 578d positioned between the viewer and a spectral filter material 596d. A second separation area 586d is provided to substantially electrically insulate a third conductive portion 518d from a fourth conductive portion 587d. A perimeter material 560d is applied to the edge of the element. FIG. 5E depicts a rearview mirror element 500e viewed from a section line FIG. 5e-FIG. 5e of either the element of FIG. 5C or 5D. A first substrate 502e is shown to be secured in a spaced apart relation via a primary seal material 578e with a second substrate 512e. A spectral filter material (in at least one embodiment referred to herein as "chrome ring") 596e is positioned between a viewer and the primary seal material 578e. First and second electrical clips 563e, 584e, respectively, are provided to facilitate electrical connection to the element. A perimeter material 560e is applied to the edge of the element. It should be understood that the primary seal material may be applied by means commonly used in the LCD industry such as by silk-screening or dispensing. U.S. Pat. No. 4,094,058, to Yasutake et al., the disclosure of which is incorporated in its entirety herein by reference, describes applicable methods. Using these techniques the primary seal material can be applied to an individually cut to shape substrate or it can be applied as multiple primary seal shapes on a large substrate. The large substrate with multiple primary seals applied may then be laminated to another large substrate and the individual mirror shapes may be cut out of the laminate after at least partially curing the primary seal material. This multiple processing technique is a commonly used method for manufacturing LCD's and is sometimes referred to as an array process. Electro-optic devices in accordance with the present invention may be made using a similar process. All coatings such as the transparent conductors, reflectors, spectral filters and in the case of solid state electro-optic devices the electro-optic layer or layers may be applied to a large substrate and patterned if necessary. The coatings may be patterned using a number of techniques such as by applying the coatings through a mask, by selectively applying a patterned soluble layer under the coating and removing it and the coating on top of it after coating application, laser ablation or etching. These patterns may contain registration marks or targets used to accurately align or position the substrates throughout the manufacturing process. This is usually done optically for instance with a vision system using pattern recognition technology. The registration marks or targets may also be applied to the glass directly such as by sand blasting, laser or diamond scribing if desired. Spacing media for controlling the spacing between the laminated substrates may be placed into the primary seal material or applied to a substrate prior to lamination. The spacing media or means may be applied to areas of the laminate that will be cut away from the finished singulated mirror assemblies. The laminated arrays can be cut to shape before or after filling with electro-optic material and plugging the fill port if the devices are solution phase electro-optic mirror elements.

Figure 6B:
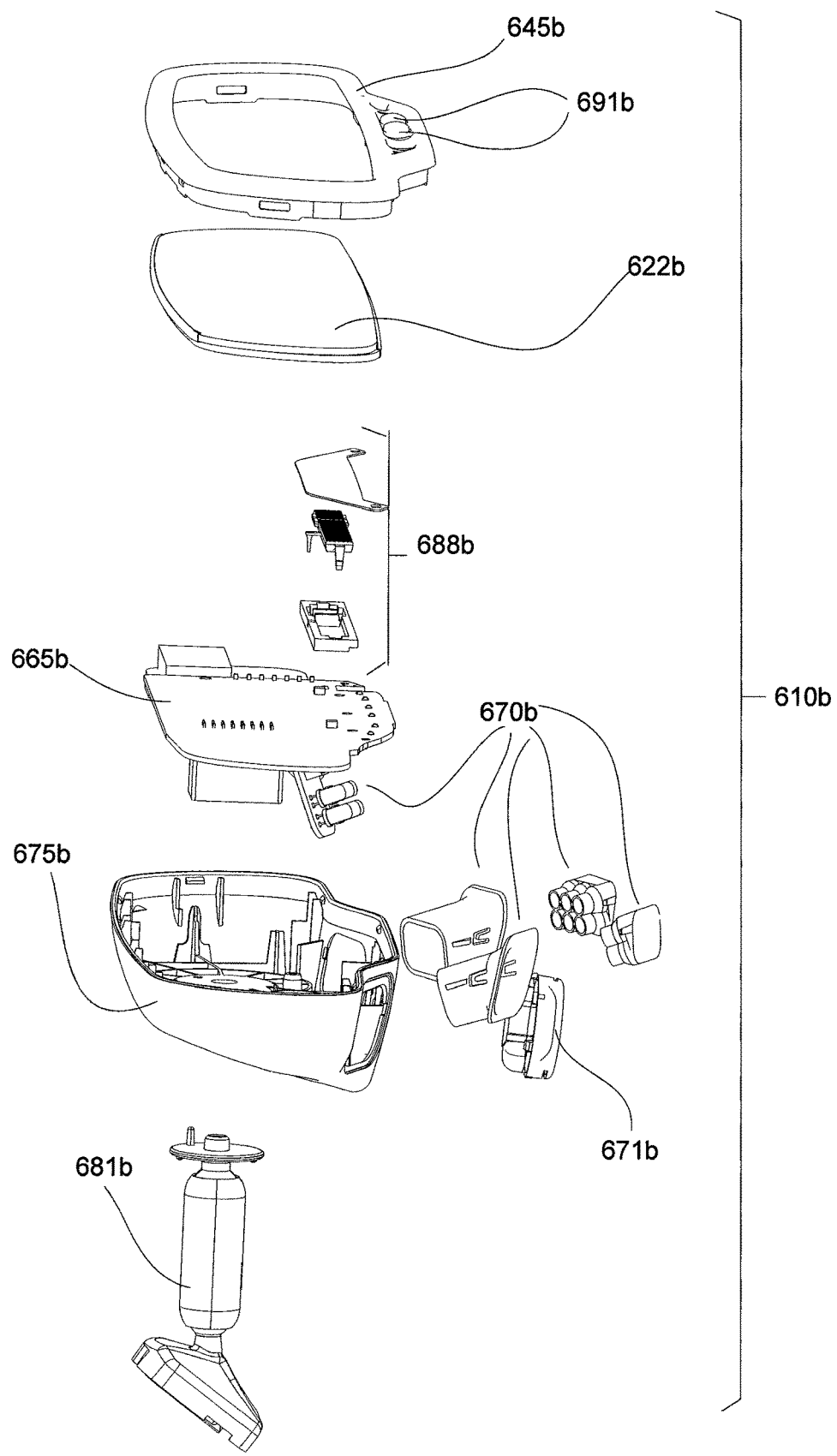

Turning now to FIGS. 6A and 6B, there is shown an inside rearview mirror assembly 610a, 610b as viewed looking at the first substrate 622a, 622b with a spectral filter material 645a or a bezel 645b positioned between a viewer and a primary seal material (not shown). The mirror element is shown to be positioned within a movable housing 675a, 675b and optionally combined with a stationary housing 677a on a mounting structure 681a (w/stationary housing) or 681b (w/o stationary housing). A first indicator 686a, a second indicator 687a, operator interfaces 691a, 691b and a first photo sensor 696a are positioned in a chin portion of the movable housing. A first information display 688a, 688b, a second information display 689a and a second photo sensor 697a are incorporated within the assembly such that they are behind the element with respect to the viewer. As described with regard to the outside rearview mirror assembly, it is preferable to have devices 688a, 688b, 689a, 697a at least partially covert as described in detail herein. In at least one embodiment an interior rearview mirror assembly may comprise at least one or more illumination assemblies 670b at printed circuit board 665b, at least one microphone, a sub-combination thereof, a combination thereof, or other combinations along with aforementioned devices. It should be understood that aspects of the present invention may be individually or collectively incorporated in electro-optic windows or mirrors in a multitude of combinations.

FIG. 6C depicts a plan view of a second substrate 612c comprising a stack of materials on a third, fourth or both third and fourth surfaces. In at least one embodiment, at least a portion 620c1 of a stack of materials, or at least the substantially opaque layers of a stack of materials, are removed, or masked, beneath the primary seal material. At least a portion 620c2 of at least a layer of the stack of materials extends substantially to the outer edge of the substrate or extends to an area to facilitate electrical contact between the third surface stack and an element drive circuit (not shown in FIG. 6C). Related embodiments provide for inspection of the seal and or plug viewing and or plug curing from the rear of the mirror or window element subsequent to element assembly. In at least one embodiment, at least a portion of an outer edge 620c1 of a stack of materials 620c is located between an outer edge 678c1 and an inner edge 678c2 of a primary seal material 678c. In at least one embodiment, the portion 620c1 of a stack of materials, or at least the substantially opaque layers of a stack of materials, are removed, or masked, beneath the primary seal material between approximately 2 mm and approximately 8 mm wide, preferably approximately 5 mm wide. At least a portion 620c2 of at least a layer of the stack of materials extends substantially to the outer edge of the substrate or extends to an area to facilitate electrical contact between the third surface stack and an element drive circuit (not shown) between approximately 0.5 mm and approximately 5 mm wide, preferably approximately 1 mm. It should be understood that any of the first, second, third and fourth surface layers or stacks of materials may be as disclosed herein or within the references incorporated elsewhere herein by reference.

FIG. 6D depicts a plan view of a second substrate 612d comprising a third surface stack of materials. In at least one embodiment, at least a portion of an outer edge 620d1 of a third surface stack of materials 620d is located between an outer edge 678d1 and an inner edge 678d2 of a primary seal material 678d. In at least one related embodiment, a conductive tab portion 682d extends from an edge of the second substrate inboard of an outer edge 678d1 of a primary seal material 678d. In at least one related embodiment, a conductive tab portion 682d1 overlaps with at least a portion of a third surface stack of materials beneath a primary seal material 678d. In at least one embodiment, a substantially transparent conductive layer (not shown individually), such as a conductive metal oxide, of a third surface stack of materials extends beyond an outer edge 620d1 of a remainder of the third surface stack as depicted in FIG. 8B to provide external electrical connection to the third surface. It should be understood that a conductive tab may be deposited along any of the substrate peripheral areas as shown in FIGS. 9C-9I. In at least one embodiment, a conductive tab portion comprises chrome. It should be understood that the conductive tab portion improves conductivity over the conductive electrode; as long as a conductive electrode layer is provided with sufficient conductivity, the conductive tab portion is optional. In at least one embodiment, the conductive electrode layer imparts the desired color specific characteristics of the corresponding reflected light rays in addition to providing the desired conductivity. Therefore, when the conductive electrode is omitted, color characteristics are controlled via the underlayer material specifications. It should be understood that any of the first, second, third and fourth surface layers or stacks of materials may be as disclosed herein or within the references incorporated elsewhere herein by reference.

Figure 7:
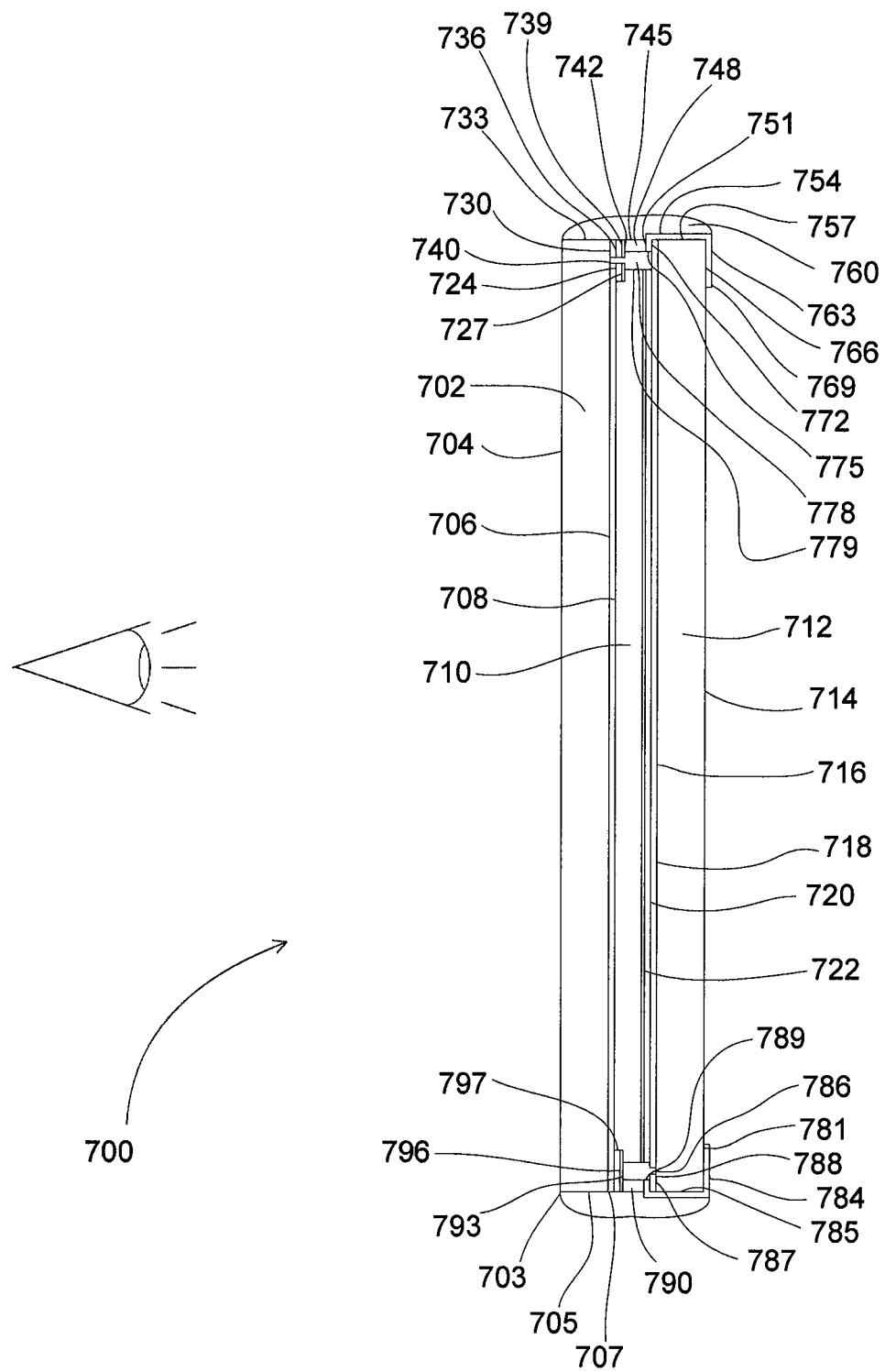
FIG. 7 depicts a profile view of a cross section of a variable reflectance element.

FIG. 7 depicts rearview mirror element 700 which is an enlarged view of the element depicted in FIG. 5E to provide greater detail. Element 700 comprises a first substrate 702 having a first surface 704 and a second surface 706. A first conductive electrode portion 708 and a second conductive electrode portion 730 applied to the second surface 706 are substantially electrically insulated from one another via a first separation area 740. As can be seen, in at least one embodiment the separation area is located such that the spectral filter material 796 and a corresponding adhesion promotion material 793 are also substantially electrically insulated to define first and second spectral filter material portions 724, 736, respectively, and first and second adhesion promotion material portions 727, 739, respectively. A portion of the first separation area 740, 540c, 540d, 540e is shown to be extending parallel within a portion of the primary seal material 778 located near the center thereof. It should be understood that this portion of the separation area 740 may lie such that a viewer would not readily perceive a line within the spectral filter material; for example, a portion of the separation area may be substantially aligned with an inboard edge 797 of spectral filter material 596. It should be understood that when any portion of the separation area 740 is located inboard of the primary seal material, as is described in more detail elsewhere herein, a discontinuity in the electro-optic material coloring and, or, clearing may be observed. This operational characteristic may be manipulated to derive a subjectively visually appealing element.

With further reference to FIG. 7, the element 700 is depicted to comprise a second substrate 712 having a third surface 715 and a fourth surface 714. It should be noted that the first substrate may be larger than the second substrate to create an offset along at least a portion of the perimeter of the mirror. Third and fourth conductive electrode portions 718, 787, respectively, are shown proximate the third surface 715 substantially electrically insulated via second separation area 786. A portion of the second separation area 786, 586c, 586d, 586e is shown to be extending parallel within a portion of the primary seal material 778 located near the center thereof. It should be understood that this portion of the separation area 786 may lie such that a viewer would not readily perceive a line within the spectral filter material; for example, a portion of the separation area may be substantially aligned with an inboard edge 797 of spectral filter material 796. As further shown in FIG. 7, a reflective material 720 may be applied between an optional overcoat material 722 and the third conductive electrode portion 718. It should be understood that any of the materials as disclosed in commonly assigned U.S. Pat. Nos. 6,111,684, 6,166,848, 6,356,376, 6,441,943, 5,825,527, 6,111,683, 6,193,378, 6,700,692, 6,816,297, 7,064,882, and 7,324,261, and U.S. Provisional Application No. 60/873,474, the disclosures of which are incorporated herein by reference, may be employed to define a unitary surface coating, such as a hydrophilic coating on a first surface, or a composite stack of coatings, such as conductive electrode material, spectral filter material, adhesion promotion material, reflective material, overcoat material applied to the first, second, third and fourth surfaces. It should be additionally understood that a hydrophobic coating, such as, a fluorinated alkyl saline or polymer, a silicone containing coating or a specially textured surface may be applied to the first surface. Either a hydrophilic or hydrophobic coating will alter the contact angle of moisture impinging upon the first surface relative to glass with no such coating and will enhance rear vision when moisture is present. It should be understood that both third surface and fourth surface reflector embodiments are within the scope of the present invention. In at least one embodiment, the materials applied to the third surface and, or, fourth surface are configured to provide a partially reflective/partially transmissive characteristic for at least a portion of the corresponding surface stack. In at least one embodiment, the materials applied to the third surface are integrated to provide a combination reflector/conductive electrode. It should be understood that additional "third surface" materials may extend outboard of the primary seal, in which case, it should be understood that the corresponding separation area extend through the additional materials. Having at least a portion of the primary seal visible from the fourth surface, as depicted in FIG. 6C for example, facilitates inspection and UV curing of plug material. In at least one embodiment, at least a portion of a stack of materials 620c, or at least the substantially opaque layers of a stack of materials, are removed, or masked, beneath the primary seal material to provide for inspection of at least 25% of the primary seal width around at least a portion of the perimeter. It is more preferred to provide for inspection of 50% of the primary seal width around at least a portion of the perimeter. It is most preferred to provide for inspection of at least 75% of the primary seal width around at least a portion of the perimeter. Various embodiments of the present invention will incorporate portions of a particular surface having a coating or stack of coatings different from other portions; for example, a "window" in front of a light source, information display, a photo sensor, or a combination thereof may be formed to selectively transmit a particular band of light ray wavelengths or bands of light ray wavelengths as described in many of the references incorporated herein.

With further reference to FIGS. 6A-6B and 7, the first separation area 740 cooperates with a portion of the primary seal material 775 to define the second conductive electrode portion 730, the second spectral filter material portion 736 and the second adhesion promotion material portion 739 substantially electrically insulated from the first conductive electrode portion 708, the first spectral filter material portion 724 and first adhesion promotion material portion 727. This configuration allows for placement of an electrically conductive material 748 such that the first electrical clip 763 is in electrical communication with the third conductive electrode portion 718, the reflective material 720, the optional overcoat 722 and the electro-optic medium 710. It should be apparent, particularly in embodiments wherein the electrically conductive material 748 is applied to the element prior to placement of the first electrical clip 769, that electrically conductive material may at least partially separate the interfaces 757, 766, 772, 775. Preferably, the material, or composition of materials, forming the third conductive electrode portion 718, the first electrical clip 763 and the electrically conductive material 748 are chosen to promote durable electrical communication between the clip and the materials leading to the electro-optic medium. The second separation area 786 cooperates with a portion of the primary seal material 775 to define the fourth conductive electrode portion 787 substantially electrically insulated from the third conductive electrode portion 718, the reflective layer 720, the optional overcoat material 722 and the electro-optic medium 710. This configuration allows for placement of an electrically conductive material 790 such that the second electrical clip 784 is in electrical communication with the first adhesion promotion material portion 727, the first spectral filter material portion 724, the first conductive electrode portion 708 and the electro-optic medium 710. It should be apparent, particularly in embodiments wherein the electrically conductive material 790 is applied to the element prior to placement of the first electrical clip 784, that electrically conductive material may at least partially separate the interfaces 785, 788, 789. Preferably, the material, or composition of materials, forming the first conductive electrode portion 708, the first electrical clip 784, the adhesion promotion material 793, the spectral filter material 796 and the electrically conductive material 790 are chosen to promote durable electrical communication between the clip and the materials leading to the electro-optic medium.

It is sometimes desirable to provide one or more optional flash over-coat layers 722 over reflective layer 720, such that it (and not the reflective layer 720) contacts the electrochromic medium. This flash over-coat layer 722 must have stable behavior as an electrode, it must have good shelf life, it must bond well to the reflective layer 720, and maintain this bond when the seal member 778 is bonded thereto. If optical properties from the underlayer(s) are to be visible the cover layer it must be sufficiently thin, such that it does not completely block the reflectivity of layer(s) beneath 720. In accordance with another embodiment of the present invention, when a very thin flash over-coat 722 is placed over the highly reflecting layer, then the reflective layer 720 may be silver metal or a silver alloy because the flash layer protects the reflective layer while still allowing the highly reflecting layer 720 to contribute to the reflectivity of the mirror. In such cases, a thin (e.g., less than about 300 .ANG., and more preferably less than about 100 .ANG.) layer of rhodium, ruthenium, palladium, platinum, nickel, tungsten, molybdenum or their alloys, is deposited over the reflective layer 720. The thickness of the flash layer is dependent on the material selected. For example, elements constructed with a third surface coating of chrome under ruthenium under rhodium under silver coated with a flash layer of as little as 10 .ANG. of ruthenium showed improved resistance compared to elements without the flash layer both to the formation of spot defects during processing and haze in the viewing area of the element when subjected to high temperature testing. The initial reflectivity of the elements with the ruthenium flash layer was 70-72%. When reflective layer 720 is silver, flash layer 722 may also be a silver alloy or an aluminum-doped zinc oxide. The flash layer or a thicker cover layer may also be a transparent conductor such as a transparent metal oxide. Cover layer(s) may be chosen specifically to compliment the other layers for such factors as barrier properties, advantageous interferential optics, balancing of compressive or tensile stresses and the like. It should be understood that the flash layer as described above may be used in other embodiments described elsewhere in this document.

Such cover layers when made from the aforementioned list of metals or other metals/alloys/semi-metals found to be compatible with the electrochromic system, when the metal or semi-metal layer(s) is thicker than 300 Angstroms tend to allow little optical effect from the layers beneath it. If it is considered more desirable that the appearance of the metallic cover layer it may be advantageous to use such a thicker cover layer. Some description of such stacks is provided in commonly assigned European Patent No. EP0728618A2 "Dimmable Rearview Mirror for Motor Vehicles" Bauer, et al., which is hereby incorporated by reference. When such thicker cover layer(s), which could be used in combination with glue layers and flash layers, and transparent conductive layers, such as indium doped tin oxide, aluminum doped zinc oxide, or indium zinc oxide are used, the conductivity benefits of having underlayers such as silver, silver alloys, copper, copper alloys, aluminum or aluminum alloys, would still be present. Layers typically thought of as insulators such as titanium dioxide, silicon dioxide, zinc sulfide or the like, may also be utilized in such a cover layer stack or interlayers and not negate the benefits of the more highly conductive layer(s) as long as their layer thicknesses were such that they still passed sufficient current from the more highly conductive layers.

It is known in the electrochromic art that a mirror or window may not darken uniformly when an electrical potential is applied to the element. The non-uniform darkening results from local differences in electrical potential across the solid state EC materials, fluid or gel in an EC element. The electrical potential across the element varies with the sheet resistance of the electrodes, the bus bar configuration, the conductivity of the EC medium, the concentration of the EC medium, the cell spacing or distance between the electrodes, and the distances from the bus bars. A commonly proposed solution to this problem is to make the coatings or layers composing the electrodes thicker thus reducing their sheet resistance and enabling a faster darkening element. As will be discussed below there are practical penalties that are imparted that restrict this simplistic approach to solving the problem. In many instances the penalties make an EC element unsuitable for a given application. In at least one embodiment of the present invention improved electrode materials, methods of manufacturing said electrodes and bus bar configurations are described that solve problems that arise with simply thickening the electrode layers and result in EC elements with faster, more uniform darkening characteristics.

In a typical inside mirror the bus bars run parallel to the long dimension. This is to minimize the potential drop across the part between the electrodes. The mirror also typically consists of a high sheet resistance transparent electrode and a lower sheet resistance reflector electrode. The mirror will darken most quickly near the bus bar for the higher sheet resistance electrode and slowest at some intermediate position between the two electrodes. Near the bus bar for the lower sheet resistance electrode will have a darkening rate between these two values. There is a variation in effective electrical potential as one moves between the two bus bars. In the case of two long parallel bus bars that have a relatively short distance between them (distance between the bus bars is less than half the length of the bus bars) the mirror will darken in a "window shade" fashion. This means that the mirror darkens faster near one bus and the darkening appears to move between the two bus bars in a gradual fashion. Typically, the darkening rate is measured at the middle of the part and in the case of a mirror with a width to height ratio greater than 2, any non-uniformities in darkening rate are relatively minor.

As the size of the mirrors increases, and along with it the distance between the bus bars, the relative difference in the darkening rate across the parts also increases. This can be exacerbated when the mirrors are designed for an outside application. The metals that can withstand the rigors of such an environment typically have lower conductivity than metals such as silver or silver alloys that are suitable and common for inside mirror applications. A metal electrode for an outside application may therefore have a sheet resistance up to 6 ohms/sq while an inside mirror may have a sheet resistance of <0.5 ohms/sq. In other outside mirror applications the transparent electrode may be limited in thickness for various optical requirements. The transparent electrode, such as ITO, is often limited to a ½ wave thickness in the most common usage. This limitation is due to properties of the ITO discussed herein but also due to the expense associated with making an ITO coating thicker. In other applications the coating is limited to 80% of the ½ wave thickness. Both of these thickness constraints limit the sheet resistance of the transparent electrode to greater than about 12 ohm/sq for a ½ wave and up to 17-18 ohms/sq for a coating that is 80% of a ½ wave coating. The higher sheet resistance of the metal and transparent electrodes results in a slower, less uniform darkening mirror.

The darkening rate may be estimated from an analysis of the EC element in terms of an electrical circuit. The discussion below pertains to coatings that have uniform sheet resistance across the element. The potential at any location between parallel electrodes is simply a function of the sheet resistance of each electrode and the resistance of the EC medium. In Table 1 below the average potential across the element between the electrodes is presented along with the difference between the maximum and minimum potential. This example is for an element with a 10 cm spacing between the parallel bus bars, a 180 micron cell spacing, a 1.2 volt driving voltage and 100,000 Ohm*cm fluid resistivity. Six combinations of top and bottom electrode sheet resistance are compared.

adjustments can have a negative impact on darkening speed, clearing speed or both darkening and clearing speed. For example, increasing cell spacing and decreasing fluid concentration will decrease the current draw and will thereby improve uniformity, but the clearing time will increase. Therefore, the sheet resistance of the layers must be appropriately set to attain both speed of darkening and uniformity of darkening. Preferably the sheet resistance of the transparent electrode should be less than 11.5 ohms/sq, preferably less than 10.5 ohms/sq and more preferably less than 9.5 ohms/sq and due to the optical requirements discussed below, in some embodiments, the thickness of the transparent electrode should be less than about a half wave optical thickness. The reflector electrode should be less than about 3 ohms/sq, preferably less than about 2 ohms/sq and most preferably less than 1 ohm/sq. A mirror or EC element so constructed will also have a relatively uniform darkening such that the difference in darkening time between the fastest and slowest darkening rate is less than a factor of 3, preferably less than a factor of 2 and most preferably less than a factor of 1.5. Novel, high-performance, low-cost materials are discussed below that enable these fast, uniform darkening elements.

In other applications it may be impractical to have two relatively parallel bus bars. This may be due to an uneven shape common with outside mirrors. In other circumstance it may be desirable to have a point contact to the low resistance electrode. The point contact may enable the

TABLE 1

|  | Ex: 1 | Ex: 2 | Ex: 3 | Ex: 4 | Ex: 5 | Ex: 6 |
| --- | --- | --- | --- | --- | --- | --- |
| Top Plate Sheet Resistance (ohm/sq) | 17 | 17 | 12 | 12 | 9 | 9 |
| Bottom Plate Sheet Resistance (ohm/sq) | 5 | 0.5 | 5 | 0.5 | 5 | 0.5 |
| Distance Between Electrodes (cm) | 10 | 10 | 10 | 10 | 10 | 10 |
| Cell Spacing (um) | 180 | 180 | 180 | 180 | 180 | 180 |
| Fluid Resistivity (Ohm*cm) | 100000 | 100000 | 100000 | 100000 | 100000 | 100000 |
| Driving Potential (V) | 1.2 | 1.2 | 1.2 | 1.2 | 1.2 | 1.2 |
| Finite Element Width (cm) | 1 | 1 | 1 | 1 | 1 | 1 |
| Potential at Anode (V) | 1.168 | 1.197 | 1.168 | 1.197 | 1.168 | 1.197 |
| Potential at Cathode (V) | 1.096 | 1.096 | 1.125 | 1.125 | 1.143 | 1.143 |
| Average Potential (V) | 1.131 | 1.145 | 1.146 | 1.160 | 1.155 | 1.169 |

The speed of darkening is fastest at the electrical contact to the highest sheet resistance electrode and is related to the effective potential at this position. The higher the effective potential adjacent to this electrical contact (or elsewhere) the faster the average darkening of the mirror will be. The fastest overall darkening time will occur when the potential is as high as possible across the part. This will drive the electrochemistry to darken at an accelerated rate. The sheet resistance of the coatings on both the top and bottom substrates plays a role in determining the effective potential between the electrodes, but as can be seen from the table the high sheet resistance electrode plays a more critical role. In past electrochromic art the improvements were driven almost exclusively by lowering the sheet resistance of the low resistance electrode. This was because the use of materials such as silver gave substantive benefits and was relatively easy to implement.

It is known in the art that the overall rate can be increased as the driving potential is increased but the trends will be constant independent of the driving voltage. It is also known that the current draw at a given voltage influences the darkening uniformity. Uniformity can be improved by adjustments to cell spacing, concentration, or choice of EC materials, but often improvements in uniformity using these minimization or elimination of the laser deletion line used in some applications. The use of a point contact simplifies or is preferential for some aspects of the mirror construction but it makes it difficult to achieve a relative uniform potential across the part. The elimination of the relatively long bus along the low resistance reflector electrode effectively increases the resistance of the electrode. Therefore, novel combinations of bus bars and coating sheet resistance values are needed to attain fast, uniform darkening.

As noted above one skilled in the art would have anticipated that it would require extremely low sheet resistance values on the metal reflector electrode to enable a point contact scheme. Unexpectedly it was discovered that it is necessary to have a lower sheet resistance for the transparent electrode to improve the uniformity. Table 2 shows the results of the uniformity experiments. In this test we made solution phase EC elements that were approximately 8 inches wide by 6 inches tall. The benefits of element designs discussed herein pertain predominantly to large elements. A large element is defined as one that has the minimum distance from the edge of any point on the edge of the viewing area to the geometric center is greater than approximately 5 cm. Lack of uniform darkening becomes even more problematic when the distance is greater than approximately 7.5 cm and even more problematic when the distance is greater than approximately 10 cm. The sheet resistance of the transparent electrode (ITO) and the metal reflector were varied as noted in Table 2. Contact was made to the metal electrode with a point contact. A clip contact such as the so called J-clip was used with an Ag paste line approximately 1" long to provide electrical contact to the metal reflector along one of the short length sides of the mirror. Electrical contact was made to the transparent electrode via an Ag paste along the one side opposite the point contact and continuing down one third of the distance along both long sides of the mirror. The darkening time (T5515) was measured at three locations on the mirror. Position 1 is near the point contact, position 2 is at the edge of the transparent electrode bus opposite the point contact and position 3 is at the center of the mirror. The T5515 time (in seconds) is the time it takes the mirror to go from 55% reflectance to 15% reflectance. The max reflectance is the maximum reflectance of the mirror. The delta T5515 is the time difference between either point 1 and point 2 or between point 2 and point 3. This is a measure of the difference in darkening rate between the fastest position and the other two locations on the mirror. As the darkening becomes more uniform these numbers become closer together. The timing factor is the darkening time at a given position divided by the time at the fastest position. This shows the relative scaling of time between the different locations independent of the absolute rate at any given location. As noted above, it is preferred to have a timing factor less than 3 and preferable less than 2 and most preferably less than 1.5. It can be seen from Table 2 that we do not attain a timing factor of 3 when the ITO sheet resistance is at 14 ohms/sq for this particular mirror configuration. All three examples with an ITO with 9 ohms per square have timing factors less than 3. The center of mirror reading is the location that deviates most from the fastest location. A statistical analysis was conducted on this data which revealed unexpectedly that the ITO sheet resistance was the sole factor that contributed to the timing factor. Using the statistical models an ITO sheet resistance of less than 11.5 ohms/sq is needed to have a timing factor of 3.0 or less for this embodiment. Using the same statistical models the ITO must have a sheet resistance of less than 7 ohms/sq for the timing factor to be less than 2.0 for this mirror configuration. Even though the timing factor is not affected by the sheet resistance of the third surface reflector the overall darkening rate is affected. When the sheet resistance of said reflector is less than or equal to 2 ohms/sq and the ITO is at approximately 9 ohms/sq the darkening rate for this mirror is less than 8 seconds in the center. This value corresponds approximately to a mirror of similar size with a conventional bus arrangement. Therefore, by lowering the sheet resistance of the ITO a point contact is enabled with a relatively high sheet resistance reflector.

TABLE 2

| Reflector ohms/sq | ITO ohm/sq | Measurement Position | Max Reflectance | T5515 | delta T5515 | timing factor |
|---|---|---|---|---|---|---|
| 0.5 | 9 | 1 | 55.3 | 3.7 | 1.3 | 1.6 |
| 0.5 | 9 | 2 | 55.5 | 2.3 | | |
| 0.5 | 9 | 3 | 55.3 | 6.0 | 3.7 | 2.6 |
| 1 | 9 | 1 | 56.0 | 5.4 | 2.3 | 1.7 |
| 1 | 9 | 2 | 56.0 | 3.1 | | |
| 1 | 9 | 3 | 56.0 | 7.2 | 4.1 | 2.3 |
| 2 | 9 | 1 | 55.8 | 5.0 | 1.9 | 1.6 |
| 2 | 9 | 2 | 55.9 | 3.1 | | |
| 2 | 9 | 3 | 55.9 | 7.8 | 4.6 | 2.5 |
| 0.5 | 14 | 1 | 56.5 | 5.6 | 2.8 | 2.0 |
| 0.5 | 14 | 2 | 56.6 | 2.9 | | |
| 0.5 | 14 | 3 | 56.5 | 10.2 | 7.3 | 3.6 |
| 1 | 14 | 1 | 57.6 | 6.8 | 3.4 | 2.0 |
| 1 | 14 | 2 | 57.6 | 3.4 | | |
| 1 | 14 | 3 | 57.5 | 12.2 | 8.8 | 3.6 |
| 2 | 14 | 1 | 57.3 | 8.4 | 4.4 | 2.1 |
| 2 | 14 | 2 | 57.5 | 4.0 | | |
| 2 | 14 | 3 | 57.4 | 14.0 | 9.9 | 3.5 |

The unexpected role of the sheet resistance of the ITO in the uniformity and speed of darkening was expanded on in another set of experiments. In these experiments the length of bus bar contact to the higher sheet resistance electrode, in this example ITO, was extended further down the sides of the mirror and even onto the bottom edge of the mirror in some cases. Table 3 demonstrates the effect on uniformity with changes in bus length. In these tests the element shape and configuration are the same as for Table 2 except where noted. The contact percentage is a percentage comparison of the bus bar length of the ITO contact compared to the total length of the perimeter. The bus bar ratio is the length of the ITO contact relative to the small reflector contact of approximately 2 cm or less.

The data from Table 3 depicts that increasing the bus length of the higher sheet resistance electrode significantly improves uniformity. For the 2 ohm/sq. reflector, increasing the length of the bus contact from 40% to 85% improves the timing factor from 2.4 to 1.7. For the 0.5 ohm/sq reflector, the same change in ITO bus length from 40 to 85% improves the timing factor from 3.2 to 1.2 and significantly improves the darkening rate. It is noted that the element with the lower sheet resistance reflector is generally faster to darken than the comparable 2 ohm/sq. case, but the uniformity of the 0.5 ohm case with a shorter ITO contact is actually worse as demonstrated by the timing factor. The increase bus length to the ITO is particularly helpful for the element with the 0.5 ohm/sq. reflector.

When the contact percentage is increased, the position of the fastest and slowest darkening can change as well. In this example higher contact percentage significantly improves the darkening times at both positions 1 and 3 and the corresponding timing factors.

TABLE 3

| Contact Percentage | Bus Bar Ratio | Reflector ohms/sq | ITO ohm/sq | Measurement Position | Max Reflectance | T5515 | delta T5515 | timing factor |
|---|---|---|---|---|---|---|---|---|
| 85 | 20 | 2 | 9 | 1 | 57.0 | 2.9 | | |
| 85 | 20 | 2 | 9 | 2 | 57.0 | 3.7 | 0.8 | 1.3 |
| 85 | 20 | 2 | 9 | 3 | 57.3 | 4.8 | 1.9 | 1.7 |
| 58 | 13 | 2 | 9 | 1 | 56.6 | 3.4 | | |
| 58 | 13 | 2 | 9 | 2 | 57.2 | 3.5 | 2.2 | 1.0 |
| 58 | 13 | 2 | 9 | 3 | 57.5 | 5.6 | 2.2 | 1.6 |
| 40 | 9 | 2 | 9 | 1 | 56.9 | 8 | 4.6 | 2.4 |
| 40 | 9 | 2 | 9 | 2 | 57.3 | 3.4 | | |
| 40 | 9 | 2 | 9 | 3 | 57.4 | 8.2 | 4.8 | 2.4 |
| 85 | 20 | 0.5 | 9 | 1 | 56.0 | 3 | | |
| 85 | 20 | 0.5 | 9 | 2 | 56.2 | 3 | | |
| 85 | 20 | 0.5 | 9 | 3 | 56.1 | 3.5 | 0.5 | 1.2 |
| 58 | 13 | 0.5 | 9 | 1 | 55.8 | 4 | 1.5 | 1.6 |
| 58 | 13 | 0.5 | 9 | 2 | 56.1 | 2.5 | | |
| 58 | 13 | 0.5 | 9 | 3 | 56.0 | 3.5 | 1 | 1.4 |
| 40 | 9 | 0.5 | 9 | 1 | 55.5 | 8.2 | 5.6 | 3.2 |
| 40 | 9 | 0.5 | 9 | 2 | 55.8 | 2.6 | | |
| 40 | 9 | 0.5 | 9 | 3 | 56.0 | 4.9 | 2.3 | 1.9 |

These experiments demonstrate that when using a short bus with the low sheet resistance electrode it is beneficial to increase the bus length to the opposite electrode to improve uniformity. Ideally, therefore for large mirrors we prefer the ratio of the lengths of the bus bars to be greater than 5:1, preferably greater than 9:1, even more preferably greater than 13:1 and most preferably greater than 20:1 to attain a timing factor below 3. We also find that independent of the length of the smaller bus that uniformity improves by increasing the length of the bus to the higher sheet resistance electrode to acquire a contact percentage preferably greater than approximately 58% and more preferably greater than approximately 85%. Typical large EC mirrors have a contact percentage less than 50%.

These findings are critical not only to mirrors with opaque reflectors but they are even more critical to mirrors employing transflective reflectors. In order to have a transflective coating the metals must be thinned to the point of transparency. The thinner metals therefore have higher sheet resistance values. In at least one embodiment of the present invention an electro-optic element comprises fast, uniform darkening with traditional bus bar arrangements with the optional point contact bus arrangements taught herein. Novel transflective coatings are described below that are particularly well suited to complement the bus arrangements described above.

One may also pattern the conductivity underneath an opaque cover layer or stack of layers that are opaque, in order to enable an electrochromic mirror to darken more uniformly over its entire area or to darken from its center first (where most headlight glare appears) outward toward the top and bottom of the viewing area. U.S. Patent Application Publication No. 2004/0032638 A1 "Electrochromic devices with thin bezel-covered edge" Tonar, et al. hereby incorporated by reference, mentions that "lower sheet resistance coating may be provided in an area proximate the associated electrical contact or around a perimeter area and allow the sheet resistance to increase as the distance from the electrical contact increases" and states that "this is particularly applicable when point contacts are utilized". One would typically want to provide contrast in ohms without any, or very minimal, visible contrast in the reflector when the electrochromic element has no voltage applied to it.

In order to obtain sufficient contrast between the more and less highly conductive areas of an electrochromic device to enable preferential darkening of certain areas, it may be necessary to include in the stack materials that are not metallic. This is because opaque layers or stacks of the more reflective metals and alloys tend to be conductive enough to provide acceptable darkening characteristics in an automotive electrochromic mirror without the supplement of more highly conductive patterns underneath them. One example of such a materials stack including semi-metals is one constructed similarly to those described in U.S. Pat. No. 5,535,056, "method for making elemental semiconductor mirror for vehicles" hereby incorporated by reference, where an opaque silicon layer would be covered by approximately one quarter wave optical thickness of Indium Tin Oxide covered by 20 to 25 nanometers of Silicon, covered by approximately 20 nm of Indium Tin Oxide. Such a coating stack, being opaque could have additional materials placed beneath it in patterns with minimal effect on its appearance from the front. This stack would also be sufficiently conductive throughout to not lose the advantages of that patterning. In addition, the ITO, if found to still be too conductive when deposited under conditions that usually yield approximately 12 ohms per square at about 1400 Angstroms thickness, can be made less conductive by adjusting process conditions or by changing the indium to tin ratio.

Figure 5F:
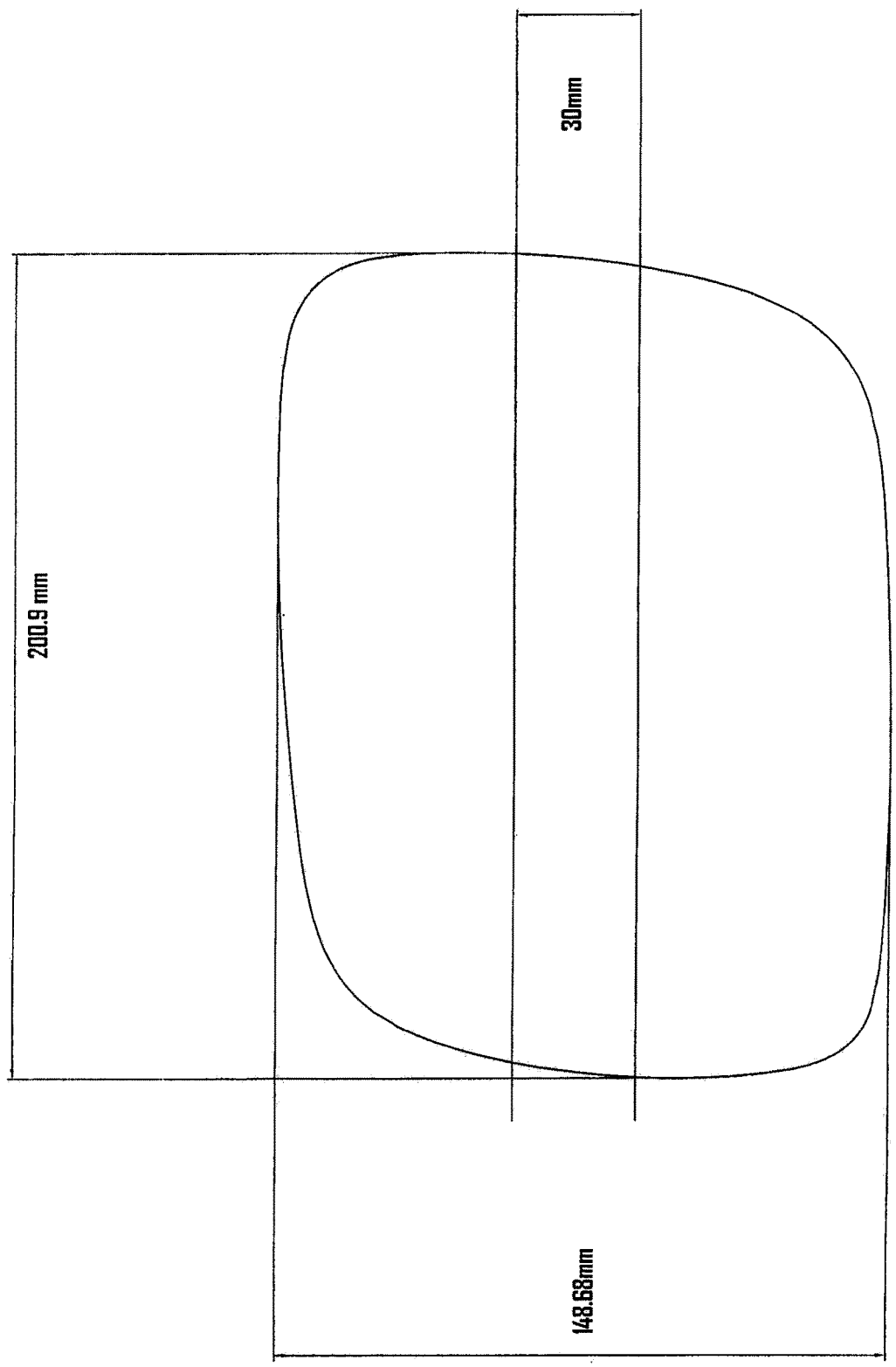

Elements constructed in accordance with the principles described in US2004/0032638A1 with the geometry of FIGS. 5F and 7, having conductive epoxy along top, lower and left edge, and point contact made at approximately the middle of the right edge were made with different third surface coating stacks and conductivity patterns. When mention of the entire third surface is made that will refer to the surface prior to any lasering to create the insulating areas necessary for the constructions in accordance with commonly assigned U.S. Patent Application Publication No. 2004/0022638A1.

Elements with ½ ohm per square third surface reflectors over the entirety of the viewing area were contrasted with those that had ½ ohm per square in a stripe of ½" or 1" or 2" across the center of the element covered by an opaque layer such that there was 4 Ohms per square conductivity in the remainder of the viewing area and yet fairly uniform appearance of the elements in the bright state. Upon darkening the elements there was a slight decrease in the tendency for the center of the element to lag in darkening when compared to the edges with the contrasting regions of conductivity.

In order to have a higher level of conductivity contrast, elements were made similar in construction to those in the preceding paragraph but on the third surface ITO of approximately 12 ohms and 40 ohms per square, respectively, had a conductive stripe of silver of 2" placed across the center of the single which (for processing durability) then was covered with a flash layer of transparent conductive oxide. After being made into full electrochromic devices, the elements were placed over a silvered piece of glass so that in evaluating the darkening characteristics there would be a reflector of similar strength to the silver stripe behind the regions with 12 ohm/sq. and 40 ohm/sq. ITO, which are relatively transparent. It was seen that the device with 40 Ohm/sq. to ½ ohm/sq. contrasting regions on the third surface had less of an iris effect when darkening than the element with 12 ohm/sq to ½ ohm/sq contrasting regions when viewed under these conditions.

Elements were made per the preceding paragraph except that additional coatings were used on the third surface. Those coatings consisted of: an additional flash layer of conductive oxide (put there for adhesion since the processing involved vacuum breaks in the coating process), approximately 300 nm Silicon, approximately 60 nm ITO, another 20 nm Silicon and then 10 nm ITO. The silicon layer may be prone to surface oxidation which may in certain EC elements may form a surface oxide that then interferes with the uniformity and consistency of darkening. The ITO or other TCO or another material described herein as a flash layer or overlayer may be used to inhibit the formation or negative effects of said oxide. Those elements which had started with the initial layer (per the preceding example) of 40 ohms per square had resulting third surface conductivities that were about 24 ohms/square in the top and bottom regions (per FIGS. 5F and 7), and <1 ohm/square in the center region as measured by four point probe. The elements which had started with an initial ITO layer of 12 Ohms/square had 10-12 ohms per square in the top and bottom regions. As per the previous example the elements with higher ohmic contrast had the least iris effect or the most tendency to center to edge darken. These elements also had the following optical characteristics in the unpowered state when using D65 2 degree observer,

|  | L* | a* | b* | Y |
|---|---|---|---|---|
| Higher ohmic contrast (50 ohm base layer) | 76 | −5 | 4 | 50 |
| Lower ohmic contrast (12 ohm base layer) | 75 | −3 | 5 | 51 |

Preferential darkening of certain areas of the electrochromic device may also be obtained by means of thin deletion lines in the second surface transparent conductor (stack) or third surface reflective (stack), as well as grading the thickness of the coatings as described elsewhere herein. Using laser deletion as an example, in general, as one decreases the operating wavelength of a laser it is capable of creating a thinner laser line. 15 micron width deletion lines, have been produced using UV laser of wavelength 355 nm. These lines are still discernable but much less so than those produced by using longer wavelength lasers. As shorter wavelength lasers continue to become more accessible one may fairly anticipate that deletion lines that are not cosmetically objectionable in the viewing area under normal conditions for an automotive mirror will be possible.

When at the lines or portions of the lines indicated across the center of FIGS. 5F and 7 there are deletions of the coating stack that will become the third surface of the element, and then elements are constructed in accordance with prior techniques so that there is a relatively small contact at one edge of the part and conductive epoxy used on the other three sides of the element the darkening characteristics are affected . . . .

Patterns of deletion, by laser, were made for both the lines shown interior to the element as described in FIGS. 5F and 7 on a ½ ohm per square reflector electrode as follows:

There was complete deletion of coating in a thin line extending form the edge of the glass to 15 cm from the edge of the glass.

There was complete deletion of coating in thin lines in a repeating pattern of 8 mm deletion and 2 mm unablated across the entire width of the part.

There was complete deletion of coating in a thin line extending from the edge of the glass to 14 cm from the edge and then deletion in a repeating pattern of 5 mm no oblation and 5 mm deletion across the remainder of the part.

There was complete deletion of coating in a thin line extending from the edge of the glass to 15 cm from the edge with the exception of 2 unablated segments of 0.4 mm at approximately 5 and 10 cm along the line.

When compared to similar parts without any deletion lines these elements exhibited some to substantially less "iris effect" when darkening. Pattern 4 being the best for overall cosmetics and even darkening among those with deletion patterns. Nonetheless all of these patterns would need adjustment for acceptable darkening cosmetics but movement towards a desired darkening characteristic has been shown.

With reference to FIG. 8A, a profile view of a portion of a rearview mirror element is depicted comprising a first substrate 802a having at least one layer 808a of a substantially transparent conductive material deposited on the second surface and a second substrate 812a having a stack of materials deposited on the third surface secured in a spaced apart relationship with respect to one another via a primary seal material 878a to define a chamber there between. In at least one embodiment, an electro-optic medium 810a is located within said chamber. In at least one embodiment, the third surface stack of materials comprises an underlayer 818a, a conductive electrode layer 820a, a metallic layer 822a and a conductive tab portion 882a having an overlap portion 883a underneath the metallic layer and primary seal material. It should be noted that the conductive tab portion 882a could alternatively be deposited over the metallic coating 822a to create the overlap portion. In at least one embodiment, the underlayer is titanium-dioxide. In at least one embodiment, the underlayer is not used. In at least one embodiment, the conductive electrode layer is indium-tin-oxide. In at least one embodiment, the conductive electrode layer is omitted. In at least one embodiment, the conductive electrode layer is omitted and the underlayer is either a thicker layer of titanium-dioxide or some other substantially transparent material having a relatively high index of refraction (i.e. higher index of refraction than ITO), such as, silicon carbide. In at least one embodiment, the conductive tab portion comprises chrome. It should be understood that the conductive tab portion may comprise any conductive material that adheres well to glass and/or other stack layers or the epoxy depending on the layers sequence and is resistant to corrosion under vehicular mirror testing conditions. As can be appreciated, when the third surface stack of materials, or at least those layers within the stack that are susceptible to corrosion, are kept within an area defined by an outer edge of the primary seal material, the element will be substantially immune to problems associated with third surface corrosion. It should be understood that the layer, or layers, susceptible to corrosion may extend beyond the primary seal material provided a protective overcoat or sealant is incorporated, such as, conductive epoxy or an overcoat layer. It should be understood that any of the first, second, third and fourth surface layers or stacks of materials may be as disclosed herein or within the references incorporated elsewhere herein by reference. It should be understood that the conductive tab portion improves conductivity over the conductive electrode; as long as a conductive electrode layer is provided with sufficient conductivity, the conductive tab portion is optional. In at least one embodiment, the conductive electrode layer imparts the desired color specific characteristics of the corresponding reflected light rays in addition to providing the desired conductivity. Therefore, when the conductive electrode is omitted color characteristics are controlled via the underlayer material specifications.

Turning to FIG. 8B, a profile view of a portion of a rearview mirror element is depicted comprising a first substrate 802b having at least one layer 808b of a substantially transparent conductive material deposited on the second surface and a second substrate 812b having a stack of materials deposited on the third surface secured in a spaced apart relationship with respect to one another via a primary seal material 878b to define a chamber there between. In at least one embodiment, an electro-optic medium 810b is located within said chamber. In at least one embodiment, the third surface stack of materials comprises an underlayer 818b, a conductive electrode layer 820b, a metallic layer 822b and a conductive tab portion underneath the primary seal material. In at least one embodiment, a void area 883c is defined between the metallic layer and the conductive tab portion, the conductive electrode provides electrical continuity there between. In at least one embodiment, the underlayer is titanium-dioxide. In at least one embodiment, the underlayer is not used. In at least one embodiment, the conductive electrode layer is indium-tin-oxide. In at least one embodiment, the conductive tab portion comprises chrome. It should be understood that the conductive tab portion may comprise any conductive material that adheres well to glass and/or other stack layers or the epoxy depending on the layers sequence and is resistant to corrosion under vehicular mirror testing conditions. As can be appreciated, when the third surface stack of materials, or at least those layers within the stack that are susceptible to corrosion, are kept within an area defined by an outer edge of the primary seal material, the element will be substantially immune to problems associated with third surface corrosion. It should be understood that any of the first, second, third and fourth surface layers or stacks of materials may be as disclosed herein or within the references incorporated elsewhere herein by reference.

With reference to FIG. 8C, a profile view of a portion of a rearview mirror element is depicted comprising a first substrate 802c having at least one layer 808c of a substantially transparent conductive material deposited on the second surface and a second substrate 812c having a stack of materials deposited on the third surface secured in a spaced apart relationship with respect to one another via a primary seal material 878c to define a chamber there between. In at least one embodiment, an electro-optic medium 810c is located within said chamber. In at least one embodiment, a first metallic layer 818c is deposited over substantially the entire third surface. In at least one embodiment, a second metallic layer 820c is deposited over the first metallic layer such that an outer edge of the second metallic layer is located within an area defined by an outer edge of a primary seal material 878c. In at least one embodiment, the first metallic layer comprises chrome. In at least one embodiment, the second metallic layer comprises silver or a silver alloy. It should be understood that any of the first, second, third and fourth surface layers or stacks of materials may be as disclosed herein or within the references incorporated elsewhere herein by reference.

Turning to FIG. 8D, a second substrate 812d is depicted comprising a stack of materials having an eyehole 822d1 substantially in front of a light sensor or information display. In at least one embodiment, a first metallic layer 818d is provided with a void area in the eyehole area. In at least one embodiment, a second metallic layer 820d is provided with a void area in the eyehole area. In at least one embodiment, a third metallic layer 822d is provided. In at least one embodiment, only the third metallic layer is deposited in the eyehole area. In at least one embodiment, the first metallic layer comprises chrome. In at least one embodiment, the second metallic layer comprises silver or silver alloy. In at least one embodiment, the third metallic layer comprises a thin silver, chrome or silver alloy. It should be understood that any of the first, second, third and fourth surface layers or stacks of materials may be as disclosed herein or within the references incorporated elsewhere herein by reference.

Turning to FIGS. 9A-K there are shown various options for selectively contacting a particular portion of the second and third surface conductive electrode portions 922, 908. As can be appreciated, the configuration of FIG. 7 results in the electrically conductive material contacting at least a portion of each the second and third surface conductive electrode portions. It should be understood that the contact configurations as shown may be rotated about the element in any fashion.

The element construction depicted in FIG. 9A comprises a first substrate 902a having a second surface stack of materials 908a and a second substrate 912a having a third surface stack of materials 922a. The third surface stack of materials is shown to have an isolation area 983a such that a portion of the third surface stack of materials that is in contact with a conductive epoxy 948a is isolated from the remainder of the third surface stack of materials. The first and second substrates are held in spaced apart relationship to one another via a primary seal material 978a. It should be understood that another side of the element may have a similar isolation area associated with the second surface stack of materials for providing contact to the third surface stack of materials within the viewing area. It should be understood that either the second or third surface stack of materials may be a single layer of materials as described elsewhere herein and within references incorporated herein by reference.

The element construction depicted in FIG. 9B comprises a first substrate 902b having a second surface stack of materials 908b and a second substrate 912b having a third surface stack of materials 922b. The first and second substrates are held in a spaced apart relationship with respect to one another via a primary seal material 978b. An electrically conductive epoxy 948b is in contact with the third surface stack of materials and electrically insulated from the second surface stack of materials via the insulating material 983b. It should be understood that another side of the element may have a similar isolation area associated with the second surface stack of materials for providing contact to the third surface stack of materials within the viewing area. It should be understood that either the second or third surface stack of materials may be a single layer of on materials as described elsewhere herein and within references incorporated herein by reference.

The element of FIG. 9C comprises a first substrate 902c having a second surface stack of materials 908c and a second substrate 912c having a third surface stack of materials 922c. The first and second substrates are held in spaced apart relationship with respect to one another via a primary seal material 978c. The second surface stack of materials extends toward the edge of the first substrate beyond the primary seal material such that it is in electrical contact with a first electrically conductive epoxy, or first solder, 948c1. The third surface stack of materials extends toward the edge of the second substrate beyond the primary seal material such that it is in electrical contact with a second electrically conductive epoxy, or second solder, 948c2. It should be understood that another side of the element may have a similar isolation area associated with the second surface stack of materials for providing contact to the third surface stack of materials within the viewing area. It should be understood that either the second or third surface stack of materials may be a single layer of on materials as described elsewhere herein and within references incorporated herein by reference.

FIG. 9D depicts the second surface electrical contact 948d1 being made on an opposite side of the element from a third surface electrical contact 948d2. FIG. 9E depicts the second surface electrical contact 948e1 being made on a side of the element and the third surface electrical contact being made on an end of the element. FIG. 9F depicts the second surface electrical contact 948f1 being made on one side and continuously with one end of the element and the third surface electrical contact 948f2 being made on an opposite side and continuously with an opposite end of the element. FIG. 9G depicts the second surface electrical contact 948g1 being made on opposite sides of the element and the third surface electrical contact 948g2 being made on an end of the element. FIG. 9H depicts the second surface electrical contact 948h1 being made on opposite sides of the element and the third surface electrical contact 948h2 being made on opposite ends of the element. FIG. 9I depicts the second surface electrical contact 948i1 being made continuously on opposite ends and one side of the element and the third surface electrical contact 948i2 being made on one side of the element. FIG. 9J depicts the second surface electrical contact 948j1 being made continuously on opposite ends, completely on one side and on at least one portion on the second side and the third surface electrical contact 948j2 being made on one side of the element. It should be understood that, in at least one embodiment, the longer electrical contact will correspond to the surface having the highest sheet resistance stack of materials. It should be understood that the electrical contact may be via electrical conductive epoxy, solder or an electrically conductive adhesive.

FIG. 9K depicts an element comprising a first substrate 902k having a second surface stack of materials 908k and a second substrate 912k having a third surface stack of materials 922k. The first and second substrates are held in spaced apart relationship with respect to one another via perimeter first and second primary seals 948k1, 948k2. The first primary seal functions to make electrical contact with the second surface stack of materials and the second primary seal functions to make electrical contact with the third surface stack of materials. The first and second primary seals hold the first and second substrates in a spaced apart relationship with respect to one another and preferably both primary seals are substantially outside the edge of each substrate.

Another approach for establishing an electrical connection to an electrode or contact clip, such as a J clip or L clip, of an electro-optic element is through a solid phase welding process. Wire bonding is a welding process that is used in the electronics industry to establish reliable interconnections between electronic components (usually IC chips and chip carriers). A wire bonding process is described in Chapter A by Zonghe Lai and Johan Liu in Nordic Electronics Packaging Guidelines. Electrical interconnections made by wire bonding employ a metal wire or ribbon and a combination of heat, pressure and/or ultrasonic energy to weld the wire or ribbon to an associated metal surface. Typically the wire or ribbon is welded using a special wedge or capillary bonding tool. Typical bonding processes use heat and or ultrasonic energy and generally fall into three major categories: thermocompression bonding, ultrasonic bonding and thermosonic bonding. A wire being bonded may be terminated at the bond or multiple bonds may be made with a continuous wire. Common forms of wire bonds include a ball bond, wedge bond and stitch bond. Wires and ribbons made of many different metals and alloys may be wire bonded including aluminum, gold, silver, copper and alloys thereof. These wires may be bonded to a number of metals or substrates coated with metal layers including but not limited to metal layers of gold, silver, nickel, aluminum and alloys made with these metals. In the case of bonding to electrodes of electro-optic elements the preferred substrate is glass and the preferred metal deposition process is by a physical vapor deposition process such as magnetron sputtering. A glue layer or layers such as of chrome, molybdenum, nichrome or nickel may be applied between the wire bonded metal layer and glass to obtain acceptable adhesion. The deposited metal layer thickness may be between 5 Angstroms to 1000 microns. More preferably the metal layer thickness is between 100 Angstroms and 1 micron and most preferably the metal layer thickness is between 200 and 1000 Angstroms. The wire diameter or ribbon thickness may be between 10 and 250 microns with diameters or thicknesses between 25 and 100 micron being preferred and diameters or thickness between 50 and 75 microns being most preferred. In at least one embodiment A continuous wire may be wedge or stitch bonded along a perimeter edge of a substrate such as to a chrome ring on a second surface of an electrochromic mirror. A wire or ribbon bus may be electrically connected to a clip such as a nickel J or L clip by welding the wire or ribbon to the clip and then looping the cup to the substrate and welding it to the associated electrode. The wire or ribbon may start at the metal clip and progress along the EC electrode or start along the EC electrode and loop to the clip and back to the electrode. In at least one embodiment, it is preferred to have redundant welded connections to the associated electrode and/or from the EC electrode to the associated electrical contact clip for reliability and uniform coloration of the device. Multiple welded connections to the substrate may be made at spacings from every 0.005 inches to 10 inches with spacings of 0.040 inches to 2 inches being preferred and with spacings between 0.100 and 0.50 inches being most preferred. A welded wire or ribbon bus may be protected from damage by encapsulating the wire and welds in a sealant. A preferred method is to protect the bus by encapsulating the wire/ribbon and welded bonds in the perimeter seal of the associated element. The metal wire/foil is chemically compatible with the EC media enclosing the bus in the device (inside the perimeter seal) is preferred. A wire bus may also be used to supplement the conductivity of the associated electrode inside the element. Wires with diameters of 75 microns or less are not readily apparent to the human eye. Welded wire bonding is attractive from a manufacturing perspective because it is a room temperature or low temperature process, there is no post cure or post processing operations required, the technology is well established with proven reliability and the bonds may be quickly (around 100 millisecond per bond) established.

Wire bonding may also be used to electrically connect electronic components to the substrate surfaces of an element. For example, many metals are electrochemically stable when used as a cathode but not as an anode in an element. It is desirable to provide protection such as by a diode to limit operation of the EC device when the polarity is reversed. (This is described in detail below with reference to FIG. 11A-C.) An electrical component such as a surface mount diode may be attached to the substrate or the bus clip and electrically connected to the substrate and/or the clip by wire bonding. In another embodiment, light emitting diodes (LED's) that are part of a signaling or warning system may be attached, for example in chip form, to an associated substrate and electrically connected to a circuit on the substrate formed by patterning metal coatings by etching, masking or laser ablation. These LED's or other electrical components may be mounted on or in the element on substrate surfaces one, two, three or four. Often it is desirable to increase the drive voltage applied to a solution phase electrochromic device as the temperature increases to compensate for the increased rates of diffusion of the electrochromic species and maintain good device darkening properties over a wide temperature range. A thermistor and electronic components required for a temperature modulated variable voltage drive circuit may be mounted to an associated substrate surface and electrically connected to metal coatings on the substrate by wire bonding. Example: Aluminum wires bonded to metal coatings on a glass substrate as follows:

Glass washed and vacuum sputter coated with approximately 400 Angstrom thick layers comprising a first layer of chrome and second layer of nickel (CN); a first layer of chrome and second layer of ruthenium (CR); a first layer of chrome, a second layer of ruthenium and third layer of nickel (CRN). A 0.00125" diameter aluminum alloy wire containing 1% silicon (1-4% elongation, 19 to 21 grams tensile strength) wire bonded to the metal coated glass substrates using a Westbond Model 454647E wirebonder with the following settings:

Settings First Bond Second Bond
"CN" Power 175 150
Time 30 millisecond 30 millisecond
Force 26 grams 26 grams
"CRN" Power 175 150
Time 30 milliseconds 30 milliseconds
Force 26 grams 26 grams
"CR" Power 150 125
Time 75 milliseconds 100 milliseconds
Force 26 grams 26 grams Bond strength of the wire was evaluated by pulling off the wire after bonding and after 1 hour exposure to 300 degrees centigrade and measuring the force.

Wire Bond Mean Pull Strength:
After Bonding After 300 C bake
"CN" 14.51 grams 9.02 grams
"CRN" 19.13 grams 8.2 grams
"CR" 12.42 grams 8.7 grams Predominate failure after bonding was wire break at the end of first welded bond. After bake the predominate failure was wire break at mid span for "CN" and "CRN" groups and wire break at the end of first bond for the "CR" group. This example demonstrates multiple reliable welded bonds may be made to typical sputtered metal layers on glass.

Figure 10:
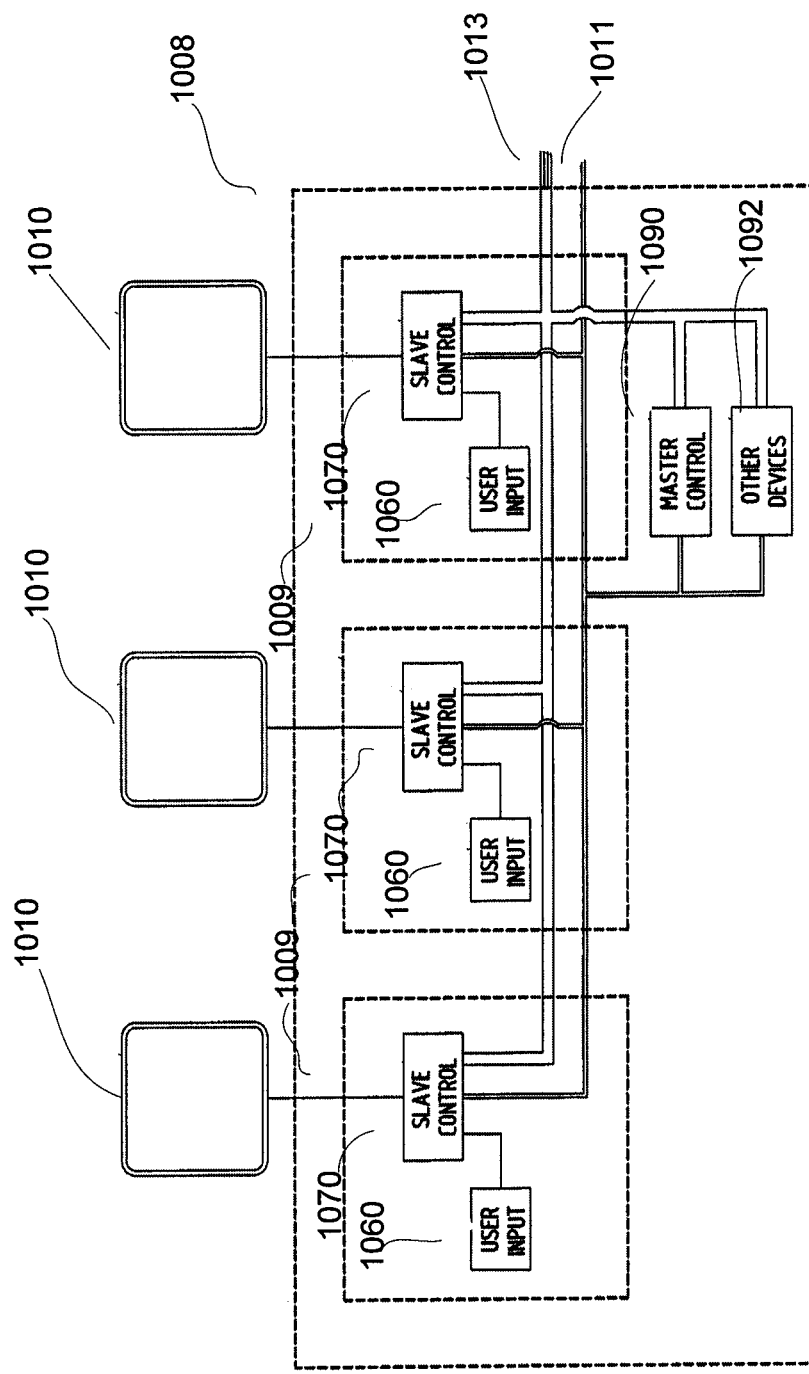
FIG. 10 depicts an electrical control schematic for multiple elements.

FIG. 10 generally illustrates variable transmittance windows 1010 that may be employed in multi-passenger vehicles, along with a window control system 1008 electrically coupled to the variable transmittance windows 1010 for controlling the transmittance state of the variable transmittance windows 1010. Window control system 1008 includes a window control unit 1009 coupled to each of the variable transmittance windows 1010 for controlling the transmittance of 7 each of the variable transmittance windows 1010. Each window control unit 1009 includes slave control circuitry 1070 for controlling the transmittance state of an associated variable transmittance window 1010. Each window control unit 1009 is also shown having user input mechanism 1060 coupled to slave control circuitry 1070 for providing a user input to slave control circuitry 1070 to change the transmittance state of the associated variable transmittance window 1010. Each window control unit 1009 is also shown coupled to power and ground lines 1011 for providing power to slave control circuitry 1070, user input mechanism 1060, and variable transmittance window 1010. As shown, power is provided to variable transmittance window 1010 via slave control circuitry 1070 from the power and ground lines 1011.

Each window control unit 1009 is also shown coupled to a window control system bus 1013. Other devices also coupled to the window control system bus 1013 include master control circuitry 1090 and other electronic devices 1092. Master control circuitry 1090 is configured to monitor signals provided on the window control system bus 1013 by each of window control units 1009 and to provide control signals on the bus to each of window control units 1009. Master control circuitry 1090 includes processing circuitry, including logic, memory, and bus interface circuitry, to permit master control circuitry 1090 to generate, send, receive, and decode signals on the window control system bus 1013. Slave control circuitry 1070, included in each of window control units 1009, is configured to receive a desired window transmittance state from user input mechanism 1060, and provide electrical signals to variable transmittance window 1010 to change the transmittance state of variable transmittance window 1010 to the state requested by the user via user input mechanism 1060. Slave control circuitry 1070 is also configured to monitor various characteristics of variable transmittance window 1010, including the power consumed by variable transmittance window 1010 and the transmittance state of variable transmittance window 1010. Slave control circuitry 1070 also includes circuitry for receiving signals from, and sending signals to, the window control system bus 1013.

Certain metal films can be less stable when configured as an anode when compared to transparent conductive oxides, such as, indium tin oxide films. This may be evidenced upon cycling in an electrochromic device by the metal deplating from the anode or by chemical changes in the metal surface such as oxidation, or by the surface becoming hazy from the mobile metal atoms rearranging into a rougher surface. Some metals and metal thin film stacks and thin film stacks containing metallic layers will be more resistant to these effects than others. Nonetheless it may be desirable to take steps to insure that the third surface reflector electrode is the cathode.

It is possible that in certain embodiments it might be preferable to incorporate materials into the second surface transparent electrode that are sensitive to use as an anode. In this case it may be preferable to drive the third surface electrode as the anode and the second surface electrode as the cathode in order to protect the second surface electrode.

For electrochromic mirrors on the exterior of a vehicle there may be a power source that is not directly tied to an associated drive circuit located in an associated interior mirror which may to some degree minimize the risk of the third surface reflector electrode being the anode on that mirror (i.e. the given exterior mirror may comprise an independent drive circuit). However, it is common for the power of an exterior mirror (or mirrors) to be supplied via the interior mirror. There are oftentimes several connections between an interior mirror and corresponding exterior mirror(s). The risk of the polarity of the power from the interior mirror to the exterior mirror being reversed, making the third surface reflector electrode of the device and anode, may be unacceptable when the associated reflector/electrode is not sufficiently durable to function as an anode.

Figure 11A:
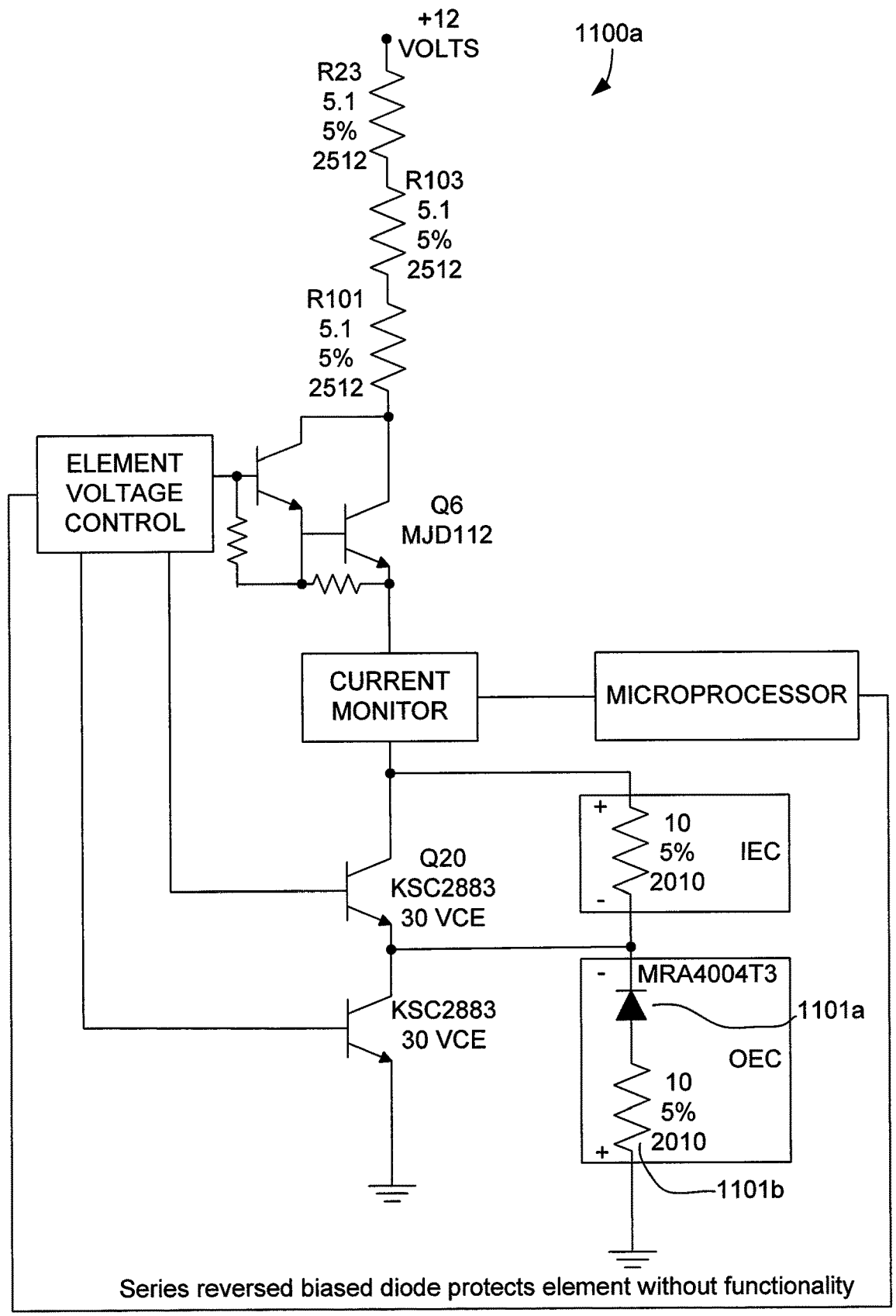
FIGS. 11A-11D depict various electrical control schematics.

With reference to FIG. 11A, a circuit 1101a having a diode in series with an exterior mirror element 1102a, prevents current flow with reversed polarity, as well as preventing electrochromic functionality. The device may have compromised performance when operated in the correct polarity in that the mirror will darken upon application of the usual voltage however upon shorting of the circuit at the inside mirror circuitry for clearing, the exterior mirror will not be able to discharge via that route. Therefore the exterior mirror element will mainly discharge as the positive and negatively charged species neutralize each other in solution, however not as they discharge to the conductive surfaces of the device. This may result in a substantially slowed clearing speed for the device.

Figure 11B:
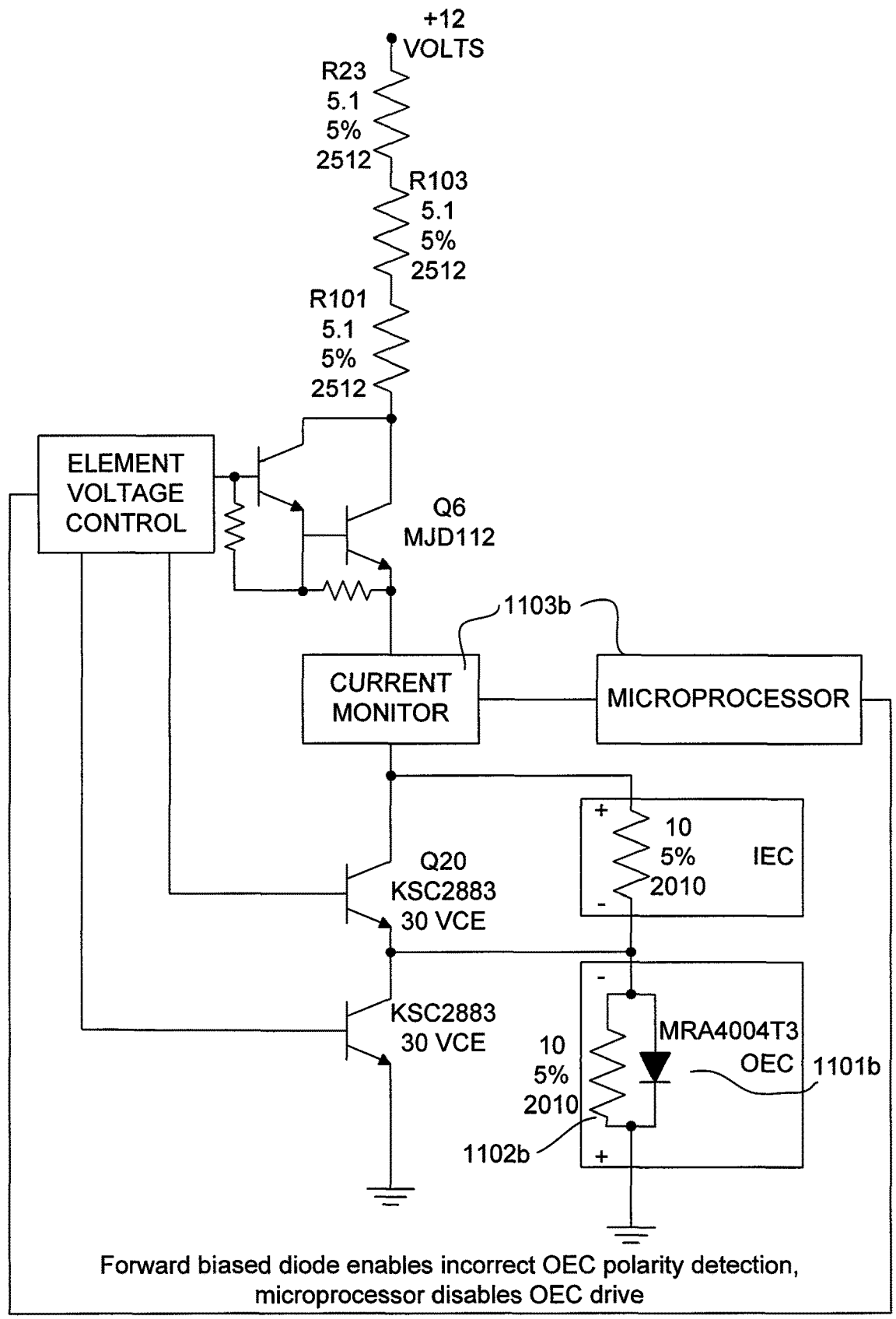
Figure 11C:
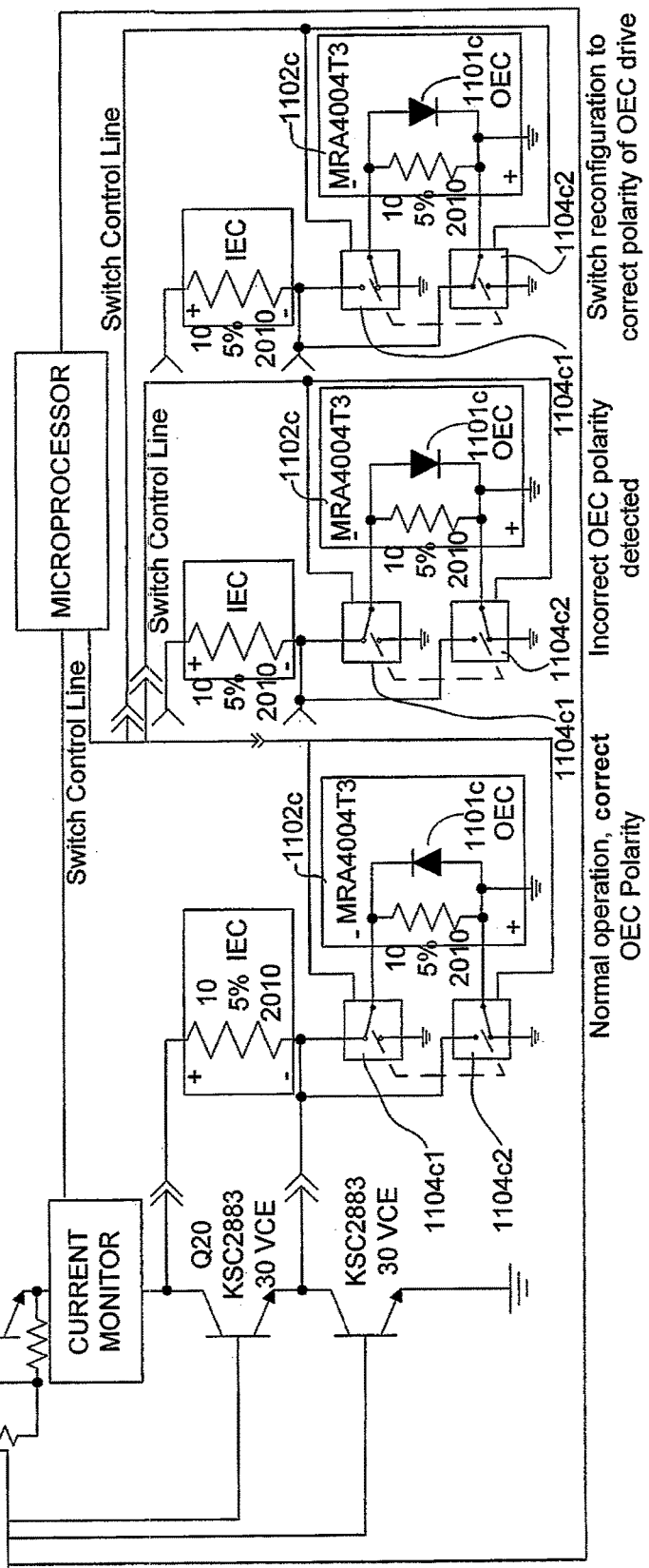

The circuit 1100b depicted in FIG. 11B comprises a diode 1101b in parallel across the leads near an exterior mirror element 1102b. A short circuit will be caused if the polarity of the current provided to that portion of circuit is reversed. Current will then flow through the diode and not the electrochromic element. The short is detected by the interior mirror circuitry 1103b and voltage is automatically disconnected. Therefore, even though allowing proper operation of the mirror when the polarity is correct, this circuit completely disables the electrochromic functionality of the mirror if the polarity is reversed.

However, when a diode 1101c is coupled with circuitry 1100c that does not initially cease to apply voltage when excessive current (shorting) however reverses voltage the mirror element 1102c remains operational and the proper polarity is delivered to the element such that the reflector electrode automatically is reconnected as the cathode. In this circuit 1100c when excessive current is detected two solid state switches 1104c1, 1104c2 are automatically reconfigured to redirect the current through the element 1102c in the opposite direction. Should excessive current be detected in this configuration, the solid state switches are reset and the drive to the element is discontinued since it is likely that some other fault is causing the excessive current draw.

Figure 11D:
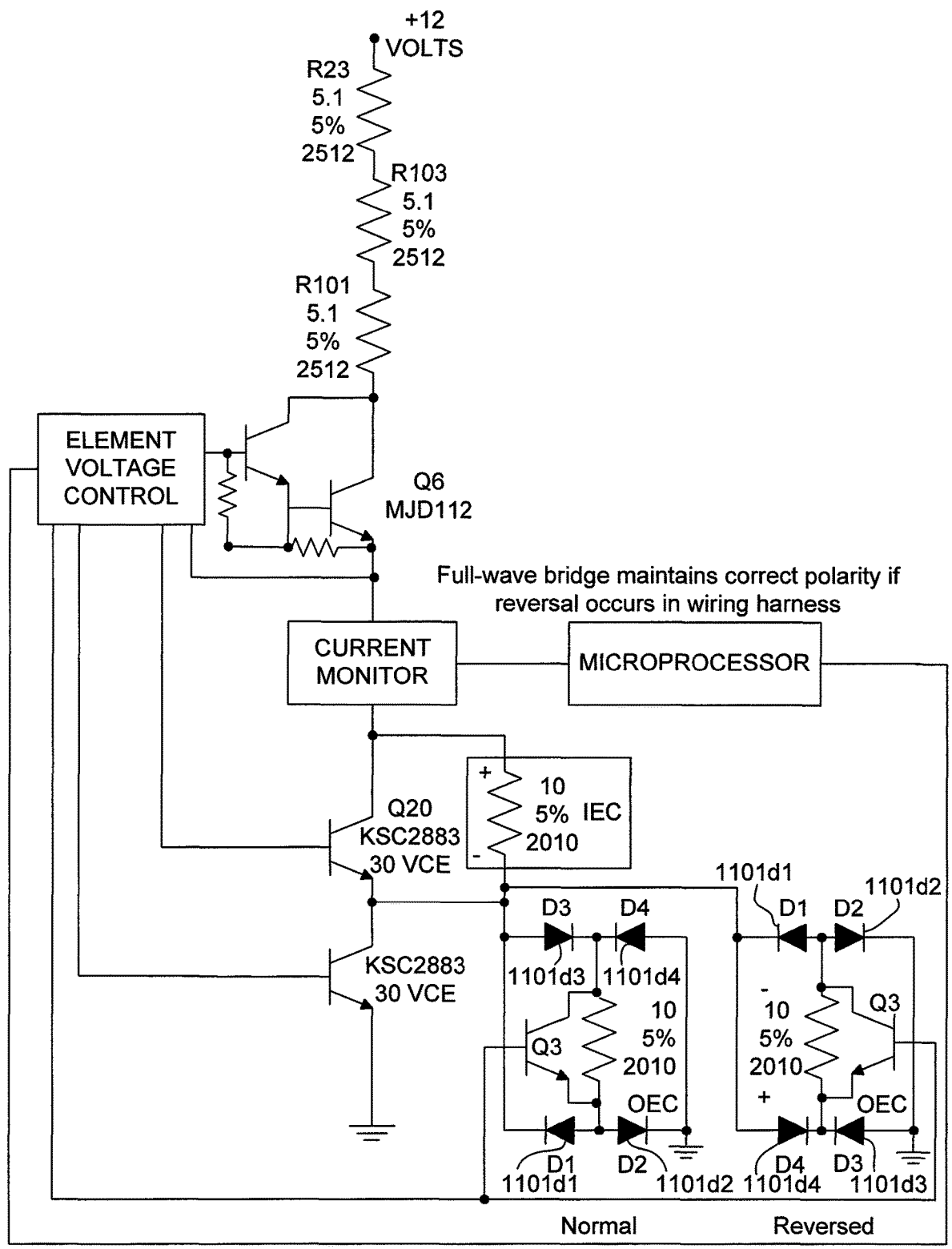

FIG. 11D depicts an alternate configuration for an electro-optic drive circuit that provides automatic compensation for reverse polarity. Diodes 1101d1, 1101d2, 1101d3, 1101d4 define a rectifier bridge which provides a dual current path. The actual path current flows will always have the desired orientation of anode and cathode of the electro-optic element 1102d.

The circuits 1100a, 1100b, 1100c, 1100d of FIGS. 11A-11D are depicted to a single outside mirror. Should it be desirable to protect more than a single exterior mirror the desired circuitry may be so adapted.

In electro-optic elements similar to that shown in FIG. 7, having a fourth surface reflector (not shown), when there is no electrical potential difference between transparent conductors 708 and 718, the electrochromic medium in chamber 710 is essentially colorless or nearly colorless, and incoming light ($I_0$) enters through the front element 702, passes through the transparent coating 708, the electrochromic medium in chamber 710, the transparent coating 718, the rear element 712, and reflects off the layer and travels back through the device and out the front element 702. It should be understood that aspects of the present invention directed toward variable transmittance windows as described above may not incorporate a reflective layer. In other embodiments a third surface reflector/electrode may be employed. Typically, the magnitude of the reflected image ($I_R$) with no electrical potential difference is about 45 percent to about 85 percent of the incident light intensity ($I_0$). The exact value depends on many variables outlined below, such as, for example, the residual reflection ($I'_R$) from the front face of the front element, as well as secondary reflections from the interfaces between the front element 702 and the front transparent electrode 708, the front transparent electrode 708 and the electrochromic medium, the electrochromic medium and the second transparent electrode 718, and the second transparent electrode 718 and the rear element 712. These reflections are well known in the art and are due to the difference in refractive indices between one material and another as the light crosses the interface between the two. When the front element and the back element are not parallel, the residual reflectance ($I'_R$) or other secondary reflections will not superimpose with the reflected image ($I_R$) from mirror surface, and a double image will appear (where an observer would see what appears to be double, or triple, the number of objects actually present in the reflected image).

There are minimum requirements for the magnitude of the intensity of the reflected light depending on whether the electrochromic mirrors are placed on the inside or the outside of the vehicle. For example, according to current requirements from most automobile manufacturers, inside mirrors preferably have a minimum high end reflectivity of at least 40 percent, and outside mirrors must have a minimum high end reflectivity of at least 35 percent.

The electrode layers 708 and 718 are connected to electronic circuitry, FIGS. 10-11D for example, which is effective to electrically energize the electrochromic medium, such that when a potential is applied across the conductors 708 and 718, the electrochromic medium in chamber 710 darkens, such that incident light ($I_0$) is attenuated as the light passes toward the reflector and as it passes back through after being reflected. By adjusting the potential difference between the transparent electrodes, a preferred device functions as a "gray-scale" device, with continuously variable transmittance over a wide range. For solution-phase electrochromic systems, when the potential between the electrodes is removed or returned to zero, the device spontaneously returns to the same, zero-potential, equilibrium color and transmittance as the device had before the potential was applied. Other materials are available for making electrochromic devices and it should be understood that aspects of the present invention are applicable irrespectively of which electro-optic technology is employed. For example, the electro-optic medium may include materials that are solid metal oxides, redox active polymers, and hybrid combinations of solution-phase and solid metal oxides or redox active polymers; however, the above-described solution-phase design is typical of most of the electrochromic devices presently in use.

Various attempts have been made to provide an electro-optic element with a second surface transparent conducting oxide with a relatively low sheet resistance while maintaining low absorption. In the electrochromic mirrors described above as well as in electrochromic windows or electro-optic devices in general, the transparent conductive layers 708, 718 are often made of indium tin oxide. Other attempts have focused on reducing the intrinsic stress of an ITO layer as applied to an associated glass substrate to minimize bending or warping of the substrate. Still other attempts have been made to optimize the optical properties such as the reflectance by adjusting the quarter and, or, half wave thickness of the ITO layer(s), or to minimize the weight of the overall associated assembly. However, there has been little success in efforts to simultaneously optimize all of the optical and physical properties noted above due to the previously perceived physical limitations.

One such previous approach to optimizing the optical properties of a given electrochromic assembly has been to manipulate the composition of the electrodes therein. Specifically, certain optical properties may be obtained by adjusting the reflectance of the reflective electrode of the assembly. More specifically, by manipulating the material composition of the stacked layers comprising the reflective electrode, the reflectivity thereof may be increased, thereby nullifying the relative absorption of the associated transparent electrode. However, increasing the reflectivity of the reflective electrode typically requires the use of additional amounts of the metals used to construct the same, such as rhodium, ruthenium, chrome, silver, and the like. As many of these metals are relatively expensive, adding additional amounts thereof to the electrochromic element unacceptably raises the cost thereof. Moreover, many lower cost metals, while providing good reflective properties, are incompatible with manufacturing processes and/or with the harsh environmental conditions to which the overall assembly will be subjected, such as, exterior mirror assemblies and exterior window assemblies.

Other approaches, which utilize ITO electrodes, required the balancing of several optical and physical parameters that are non-complimentary to one another. For example, increasing the thickness of a transparent ITO conductive layer to achieve a lower sheet resistance may adversely affect the absorption associated with that layer, the position of the quarter and, or, half wave points, and the bending of the substrate to which the ITO layer is applied, as is discussed in detail below.

As known in the art, reducing the sheet resistance of an ITO layer may be accomplished by increasing the thickness of that layer. However, the increased thickness of the ITO layer is accomplished with an undesirable increase in light absorption of that layer. Further, an increase in the thickness of the ITO layer has typically been restricted to quantums of half waves of a given wavelength range (typically centered at approximately 550 nm) so as to minimize the relative reflectance from the outer surface of the ITO layer. Moreover, increasing the thickness of the ITO layer may increase the bending of the substrate to which the ITO layer is applied. As is known, the ITO layer includes an internal stress that is exerted on the substrate, which when applied to some thin substrates, may result in bending of such substrate. In many applications, the substrate comprises relatively thin glass, so as to reduce absorption of the glass and the weight associated therewith, such that unacceptable bending occurs as the thickness of the ITO layer is increased. This is particularly prevalent in large applications, such as large windows such as those used within aircraft or in buildings. Bending of the associated substrate may affect the distance between the two electrodes within the overall assembly, thereby effecting clearing rates, color, relative uniformity darkness or brightness of the assembly at varying points across the surface thereof, and even causing optical distortions to the point of created multiple reflected images rather than a single image. Previous approaches at reducing the intrinsic stress of the ITO layer have focused on the methods utilized to produce the electrochromic elements. One method known in the art for applying the ITO layer to an associated substrate includes magnetic sputtering. Heretofore, these attempts have only been moderately successful due to several drawbacks, one of which is the physical limitations inherent in the approach, an example of which is the disruption of the laydown of the ITO layer at increased pressure, resulting in clustering of the ITO. Such clustered ITO layers exhibit an increase in sheet resistance, haze and absorption.

In at least one embodiment an electro-optic element is provided utilizing an ITO layer having reduced sheet resistance, reduced absorptivity, and low stress, while attaining a uniform darkness or brightness of the overall assembly, while reducing the weight of the overall assembly, any sub combination or combination thereof.

In at least one embodiment an electro-optic element is provided having a relatively reduced sheet resistance while simultaneously providing a relatively reduced absorptivity, a relatively decreased bending of an associated substrate to which the associate ITO layer is applied, and provides a relatively uniform darkness or brightness for the overall assembly while reducing the total weight thereof.

While mirror assemblies in general are utilized herein to describe many details of the present invention, it should be noted that embodiments of the present invention is equally applicable to the construction of electro-optic windows, as discussed elsewhere herein. The inside mirror assembly of FIGS. 6A-D and the outside rearview mirror assemblies of FIGS. 5A-5F may incorporate light-sensing electronic circuitry of the type illustrated and described in Canadian Patent No. 1,300,945, U.S. Pat. No. 5,204,778, or 5,451,822, and other circuits capable of sensing glare and ambient light and supplying a drive voltage to the electrochromic element; the disclosures of which are incorporated in their entireties herein by reference.

As noted above, high performance electro-optic elements (either mirrors or windows) require that the electrode and or reflector on the third surface and the transparent conductive electrode 708 provide moderate to high conductivity to provide even overall coloration, increased speeds of coloration and clearing, etc. While improvements in mirror elements have been accomplished by employing a third surface reflector/electrode, improvements with respect to the transparent electrode 708, 718 are desired. As also previously noted, simply increasing the overall thickness of an ITO transparent electrode 708, 718 while improving conductivity by decreasing the sheet resistance, has detrimental effects on other optical and physical properties of the electrochromic element. Table 4 depicts the drop in reflectance of an EC element with changing ITO thickness for three ITO coatings with different optical constants. The different ITO coatings in this example have different imaginary refractive indices. The example element construction consists of 1.7 mm glass, 50 nm Cr, 20 nm Ru, 140 microns of EC fluid, varying ITO and 1.7 mm of glass. The thickness of different ITO layers is shown in Table 4. In many side mirror applications the customer specifications require that the reflectance is greater than 55%. The thickness is limited depending on the properties of the ITO and therefore the viable sheet resistance is also limited. In a typical manufacturing process it is not always possible to operate a process at the lowest absorption levels. Therefore, the practical upper thickness and lower sheet resistance limits are constrained by the variation in the manufacturing process. Additionally, it is common that ITO with lower absorption undesirably corresponds to higher sheet resistance. Thicker, low absorption, ITO may also correspond to one with a higher sheet resistance thereby limiting the benefit of the thicker coating.

TABLE 4

| ITO Thickness (nm) | Reflectance (%) | | |
|---|---|---|---|
| | ITO RI = 1.893 k = 0.0057 | ITO RI = 1.868 K = 0.0079 | ITO RI = 1.865 K = 0.012 |
| 100 | 59.8 | 59.3 | 58.2 |
| 150 | 58.5 | 57.7 | 56.0 |
| 200 | 58.4 | 57.2 | 55.1 |
| 250 | 57.5 | 56.2 | 53.7 |
| 300 | 56.5 | 54.9 | 51.9 |
| 350 | 56.1 | 54.3 | 50.9 |
| 400 | 55.4 | 53.4 | 49.6 |
| 450 | 54.5 | 52.3 | 48.2 |
| 500 | 54.0 | 51.6 | 47.1 |

Another design attribute desirably for EC elements is to have a low reflectance in the dark state. This results in a high contrast ratio for the mirror elements. Table 5 depicts the dark state reflectance values for an EC mirror as a function of the ITO thickness. In this example the EC fluid is set to be substantially opaque. If the EC fluid is not completely opaque then the reflected light from the mirror coating will add to the reflectance in Table 5. As depicted, the dark state reflectance reaches a minimum at about 140 to 150 nm or a ½ wave coating with a design wavelength of 550 nm. As the thickness deviates from this half wave thickness, the dark state reflectance rises and the contrast ratio degrades. Therefore, ITO thickness cannot be set to an arbitrary thickness to attain a given sheet resistance value. The ITO thickness is constrained by both absorption of the coating and the dark state reflectance requirements.

TABLE 5

| ITO Thickness (nm) | Dark State Reflectance (%) |
|---|---|
| 70 | 9.4 |
| 80 | 9.2 |
| 90 | 8.6 |
| 100 | 7.7 |
| 110 | 6.7 |
| 120 | 5.8 |
| 130 | 5.1 |
| 140 | 4.9 |
| 150 | 5 |
| 160 | 5.5 |
| 170 | 6.2 |
| 180 | 7 |
| 190 | 7.7 |
| 200 | 8.2 |
| 210 | 8.5 |

In at least one embodiment, an electro-optic element includes at least one ITO transparent electrode 128 with reduced bulk resistance, thereby improving conductivity, without simultaneously sacrificing other related optical and physical properties. Specifically, an electro-optic element is constructed via a sputtering process at relatively high pressures and relatively high oxygen flow rates. Heretofore, traditional sputtering processes utilized for applying an ITO layer to a substrate have been limited to certain maximum pressures. Exceeding these pressures has previously resulted in a poor quality layer of ITO, or specifically a clustered, non-uniform deposition exhibiting poor electrical and optical properties.

In at least one embodiment, the ITO coatings were produced on a vertical, in-line sputtering coater. Cathodes were approximately 72" in length and either two or four cathodes were used to produce the coatings. The cathodes were outfitted with ceramic ITO tiles commonly used in the industry. The conveyor speed was adjusted as necessary to produce a targeted thickness of coating. The power applied to the cathodes was 5 kilowatts unless otherwise noted. Each process section has two pair of cathodes in an aligned facing configuration. Oxygen gas flows shown herein are for a process section consisting of four cathodes unless otherwise indicated. When two process sections are operated it is assumed that an equivalent amount of oxygen is fed into both chambers and the total amount of oxygen is double that used for four cathodes in one process chamber. Glass substrates were preheated to approximately 300 degrees Celsius. The sputtering gas was adjusted to attain a given pressure and oxygen was introduced at the prescribed flow rate or as a percentage of the total gas fed to the system. It should be understood, however, that the present invention is not limited by the exact flow rates and percentages described herein as one skilled in the art will know that different chambers have different pumping configurations, gas inlets and manifolds, cathodes and powers and measure their pressure at different points in the process. Rather, one skilled in the art will appreciate the novelty of the method used to produce the coatings and their resultant properties including bulk resistance, stress and morphology and will be able to readily scale or adapt the teachings herein to a different sputtering system without undo experimentation. Though the majority of the work described herein was conducted with a glass substrate temperature of 300 C the trends and findings will be adaptable to higher and lower temperatures and will yield improvements over the standard conditions even if the absolute values described herein are not attained at the different temperatures.

In at least one embodiment of the present invention, increase in process pressure is offset by an increase in oxygen flow. As described particular relation of pressure to oxygen flow rate depends on several factors, including the particular noble gas used during the sputtering process. Two noble gases, krypton, and argon, are discussed in detail herein, however, other gases may be utilized with the particulars for the other gases being extrapolated from the given data.

With respect to krypton, a pressure of greater than or equal to 1 millitorr (mT) with an oxygen percentage of 5%, is preferred, a pressure of greater than or equal to 2 mT with an oxygen percentage of 4% is more preferred a pressure of greater than or equal to 3 mT with an oxygen percentage of 3% is even more preferred, and a pressure of greater than or equal to 4.5 mT with an oxygen flow rate of 2% is most preferred.

With respect to argon, a pressure of greater than or equal to 2 mT with an oxygen percentage of 4% is preferred, a pressure of greater than or equal to 3 mT with an oxygen percentage of 3% is more preferred, a pressure of greater than or equal to 4.5 mT with an oxygen percentage of 2% is even more preferred and a pressure of greater than or equal to 6 mT with an oxygen percentage of 1% is most preferred.

As noted above, other gases may also be utilized. For example, Neon may be used with expected higher pressures, preferably greater than or equal to 3 mT and more preferably greater than or equal to 7 or 8 mT. Further, Xenon allows use of relatively low pressures as compared to krypton. One skilled in the art will also recognize that the preferred oxygen percentages may vary with the details of the sputtering apparatus. The percentages listed above are meant to be illustrative and non-limiting. The total flow of oxygen needed to obtain the optimal combination of material properties will generally increase with increased pressure. The needed amount of oxygen does not increase at the same rate as the sputtering gas, therefore, the percentage of oxygen decreases with increased pressure.

Typically, ITO is run at low pressures—at or below 2 mT. Low pressure, however tends to result in the ITO coating having compressive stress. Stress in the ITO can be high enough to bend glass especially as the thickness of the glass is reduced. As the thickness of the glass is reduced to make EC elements lighter, deflection of glass due to the ITO stress increases. When the mirror element or window size is large, deflection of the glass can be several millimeters. With traditional high volume production processing, as the thickness of the ITO is increased the deflection of the substrate typically increases.

Deflection of the glass can be expressed in various ways. One way is to consider the deflection of the glass is in terms of a lens. The magnification value then directly relates to the deflection of the glass and is independent of the dimensions of the glass. The magnification values relate to a radius of curvature using the following formula: radius of curvature= (3124 mm)/(1−1/magnification). A perfectly flat piece of glass will have a magnification value of 1.0. Coated glass, viewed from the coated side, when the coating is in compressive stress then the glass will become convex on the coated side. If the coating were in tensile stress the glass will be concave on the coated side. A compressive coating results in a warp or magnification value less than one and conversely if the coating is tensile, the magnification or warp values will be greater than 1. Warp values on the order of 0.85 are highly distorted from flat and glass. Warp values on this order will yield an EC mirror or window that may have double image since the reflectance from the first and third surfaces may not overlap. Additionally, it is difficult to produce a viable seal with glass having unacceptable warp. Glass with warp values as high as 0.97 can cause issues in manufacturing or with regard to double image.

Figure 12:
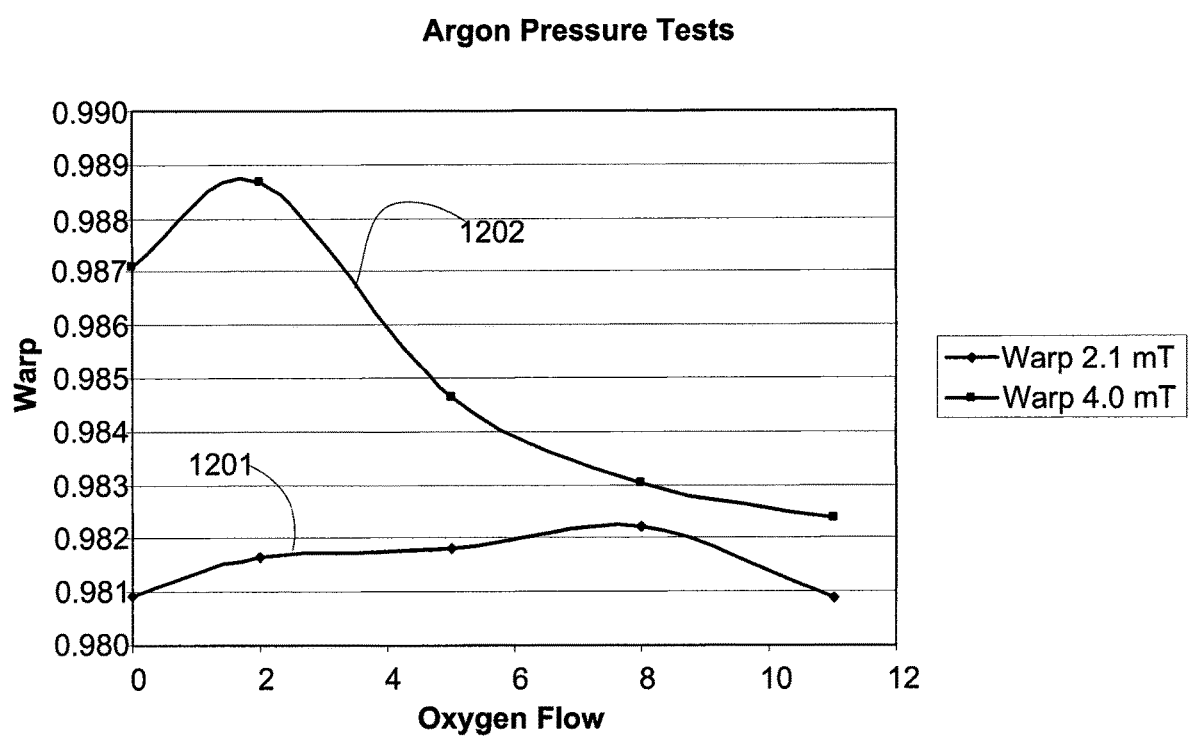
FIG. 12 depicts a graph of element wrap vs. oxygen flow for various argon process gas pressures utilized in an element manufacturing process.

With reference to FIG. 12, labeled "Argon Pressure Tests," the warp values were measured for ITO coatings on 1.6 mm glass. The glass thickness plays a significant role in deflection and warp when an ITO or other stressed coating is applied. The deflection amount generally varies inversely with the cube of the thickness of the glass (assuming that the intrinsic stress in the coating is constant with thickness of the coating). Therefore, thinner glass will warp in a non-linear fashion relative to thick glass. Thinner glass will generally warp with thinner ITO coatings when compared to thicker glass. The amount of warp scales linearly with the thickness of the coatings. In FIG. 12 the coatings were all approximately 50 nm in thickness. To calculate the warp at other thickness values the following formula may be used: New warp=[1−(1−warp value)*new thickness/old thickness]. Applying this formula to a value in FIG. 12 of 0.98, a warp value of 0.94 for an ITO coating 150 nm thick and a warp value of 0.74 for a coating 650 nm thick would be derived. If the glass were thinner these values would deviate from flat much more substantially.

FIG. 12 depicts several key findings. First, the warp values or stress (y-axis) in the ITO produced at 2.1 mT do not change substantially over the oxygen flow rate range (x-axis) in this experiment. Over this range the ITO passes through the minimum sheet resistance and bulk resistance values. It could be incorrectly concluded that it is not possible to simultaneously optimize both the electrical and stress properties, not to mention the other required optical properties. At very high oxygen flow rates, warp values start to deviate even more substantially from flat.

At the higher pressures (4.0 mT) a trend emerges. At low oxygen flow rates the stress in the ITO coating is reduced. But at higher pressures this translates into lower oxygen percentages in the overall sputtering environment. It is common in the sputtering art to keep the oxygen percentage constant while adjusting pressure. The trend and findings leading to one embodiment of the present invention is therefore undiscovered when traditional experimentation is employed. At the higher Argon pressure of 4 mT depicted with line 1202 a strong trend emerges whereby the stress in the ITO is minimized at low oxygen flows as compared to line 1201. The lower stress is due to a unique microstructure or morphology in the ITO coating that is described in detail below. At higher oxygen flow rates the warp values deviate from flatness, however at any particular oxygen flow rate the warp values remain higher than those obtained at the lower pressure. This trend continues for even higher pressures than those demonstrated in this FIG. 12. The benefits continue at pressures in excess of 7 mT. Further improvements may also be attained at even higher pressures, however, limitations in a particular sputtering chambers may restrict experimentation at pressures beyond this value.

Figure 13:
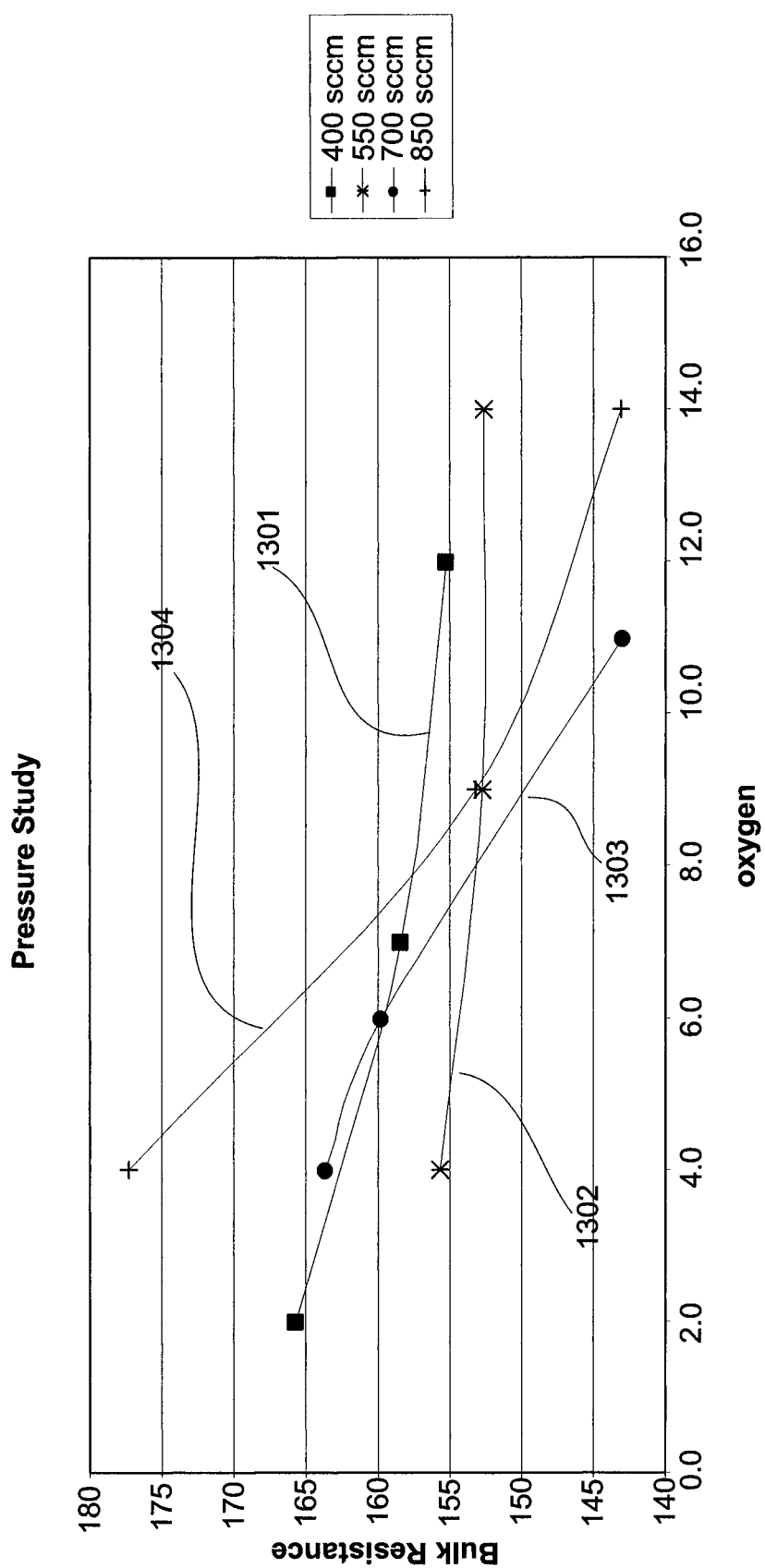
FIG. 13 depicts a graph of thin film bulk resistance vs. oxygen flow for various process gas pressures utilized in an element manufacturing process.

The graph of FIG. 13 illustrates the effects of a relative increase in Argon pressure and oxygen flow on bulk resistance. This particular test was conducted utilizing an argon as the sputtering gas. The 400 sccm argon case (line 1301) yields a pressure of 3.7 mT, 550 sccm (line 1302) yields 5 mT, 700 sccm (line 1303) yields 6.2 mT and 850 sccm (line 1304) yields 7.4 mT. The oxygen flow rate on the x-axis is in sccm. It is noted that significant improvements are obtained with respect to bulk resistivity as Argon pressure and oxygen flow increase. Additionally, the lower Argon pressure cases tend to have a minimum at higher bulk resistance values relative to the higher pressure cases. For reference, a comparable coating made at a pressure of 2 mT comprises a bulk resistance value between about 180 and 200 micro-ohm cm. In a recently published patent application, it was submitted by another manufacturer of electrochromic devices that the current state of the art for ITO coatings in EC applications corresponds to a bulk resistance of 200 micro-ohm cm. This indicates that the benefits and properties of ITO viable for EC applications does not anticipate the improved ITO coatings of the present invention. The higher pressure cases described herein do not attain their minimum value at the range of oxygen tested.

Figure 14:
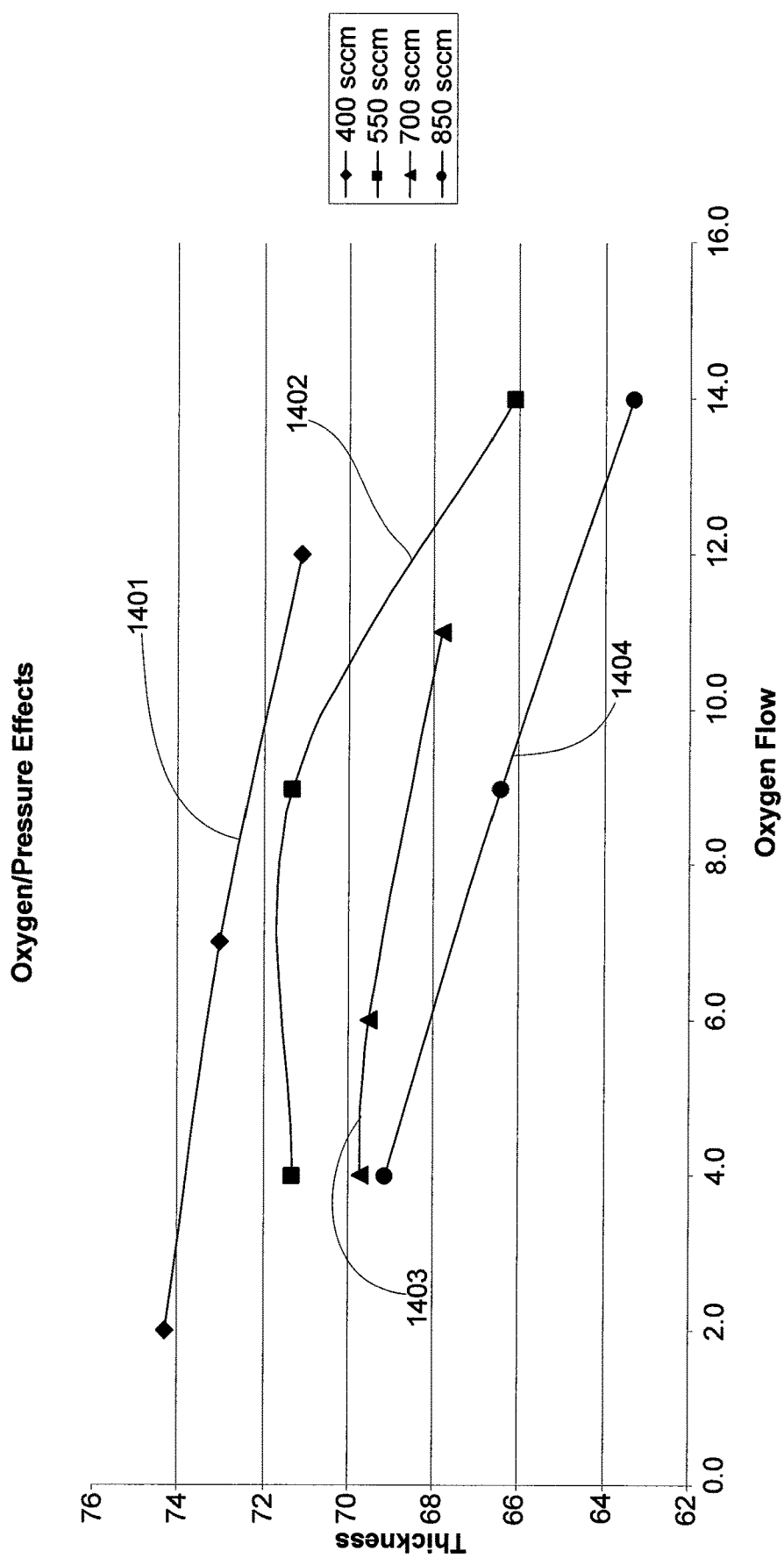
FIG. 14 depicts a graph of thin film thickness vs. oxygen flow for various process gas pressures utilized in an element manufacturing process.

The graph of FIG. 14 illustrates that higher pressures further result in a relatively thinner ITO coating on the substrate. This fact also contributes to why this embodiment of the present invention has not been previously attained. As depicted, when oxygen flow and Argon pressure are increased, the thickness of the ITO coating is decreased. The bulk resistance, an intrinsic measure of the quality of the ITO's electrical properties, is the multiplication of the sheet resistance and the thickness. It is common to only measure the sheet resistance, however, much information is lost when the coatings are not characterized in detail. Because the coatings are getting thinner with the changes to the process gasses the sheet resistance does not follow the same trends as the bulk resistance. The continued benefits to the bulk resistance obtained with the higher Argon pressures (line 1404 representing the highest relative to lines 1401, 1402 and 1403) and oxygen flows are shown in a comparable analysis of the sheet resistance. If only sheet resistance is examined then one may conclude that the 3.7 mT case is best and the preferred properties are attained at relatively low oxygen flow rates. Another benefit that comes with the lower bulk resistance is that the real part of the refractive index is reduced. A half wave coating with a lower refractive index is physically thicker than one with a higher refractive index resulting in even lower sheet resistance.

Figure 15:
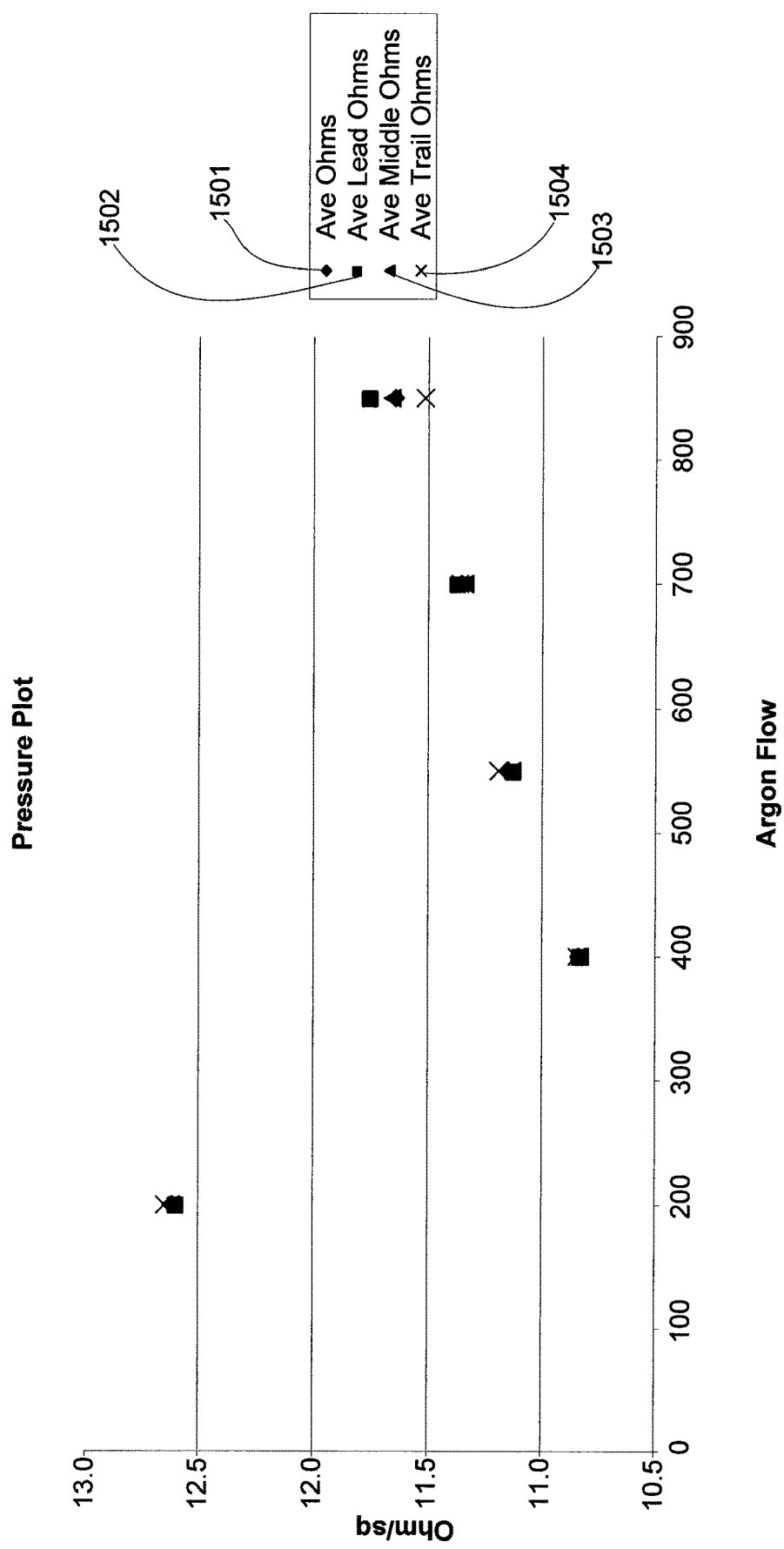
FIG. 15 depicts a graph of thin film sheet resistance vs. argon flow for various process gas pressures utilized in an element manufacturing process.
Figure 16:
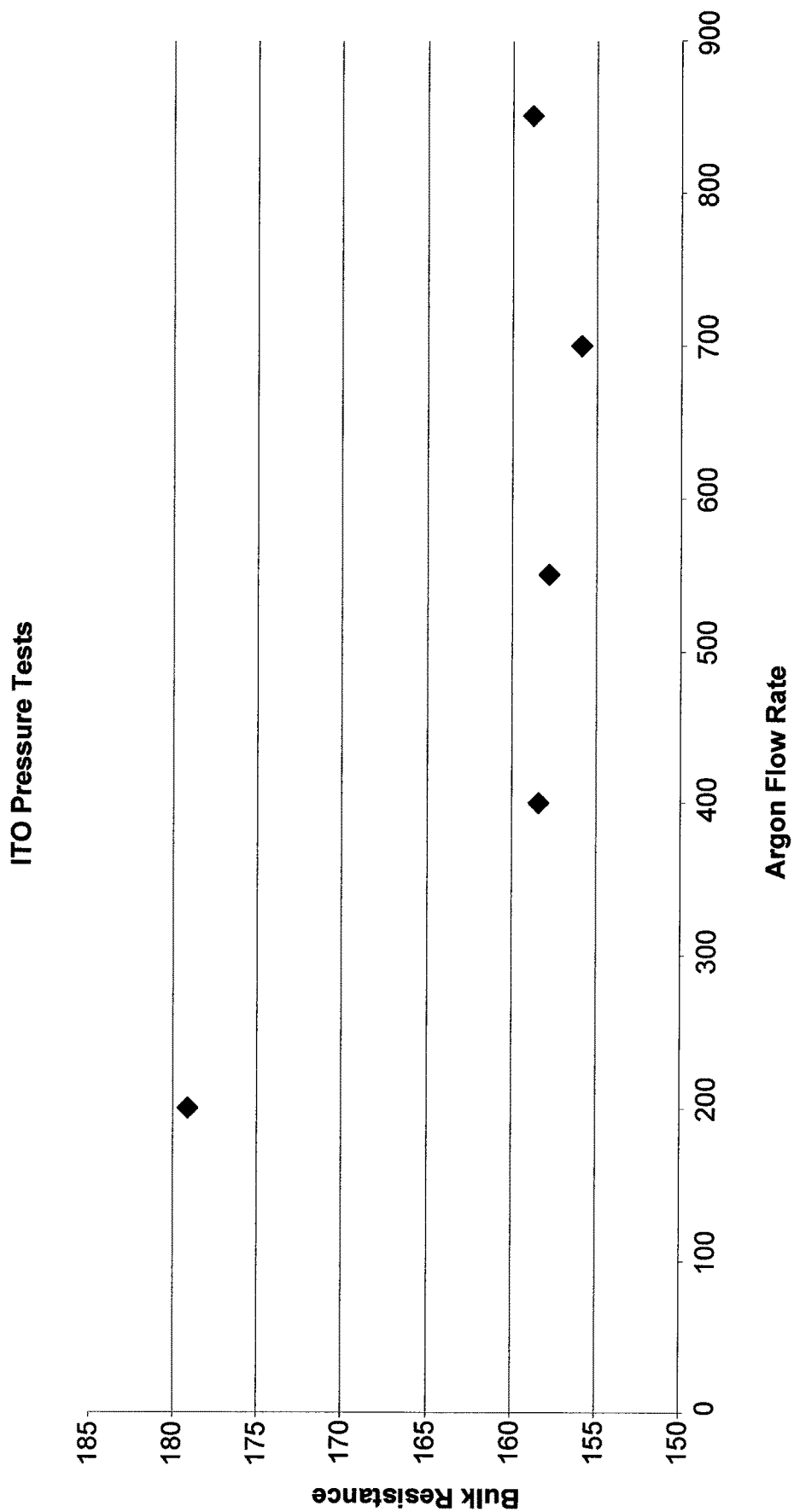
FIG. 16 depicts a graph of thin film bulk resistance vs. argon flow for various process gas pressures utilized in an element manufacturing process.

The graph of FIG. 15 illustrates the effect of utilizing an argon gas in conjunction with increased Argon pressure and increased oxygen flows, while the graph of FIG. 16 illustrates achieved ITO half wave bulk resistance. In order to attain ½ wave coating two process chambers were used. The 200 sccm case represents the standard in prior ITO coatings in the EC art. The half wave coating of the prior art had a sheet resistance of over 12.5 ohms/sq while higher pressure cases in accordance with at least one embodiment of the present invention attained values lower than 12 ohms/sq and some even below 11 ohms/sq. Substantial improvement in bulk resistance attained at higher pressures is exemplified in FIG. 16. In this case oxygen was not optimized at the higher pressures and the bulk resistance is seen to remain relatively constant with argon flows from 400-800 SCCM.

Bulk resistance of the ITO is important, however, as mentioned elsewhere herein sheet resistance is the primary factor that affects darkening speed in an EC element. A bulk resistance of 200 micro-ohm cm equates to a sheet resistance of 13.7 ohms/sq for a half wave coating, a bulk resistance of 180 equates to a sheet resistance of 12.4 ohms/sq and a bulk resistance of 140 equates to a sheet resistance of 9.6 ohms/sq. 9.6 ohms/square is a 30% reduction compared to the 13.7 ohms/sq case and results in substantial improvements in darkening times and will also enable novel bus configurations as described elsewhere herein which also improve element darkening uniformity.

Figure 17:
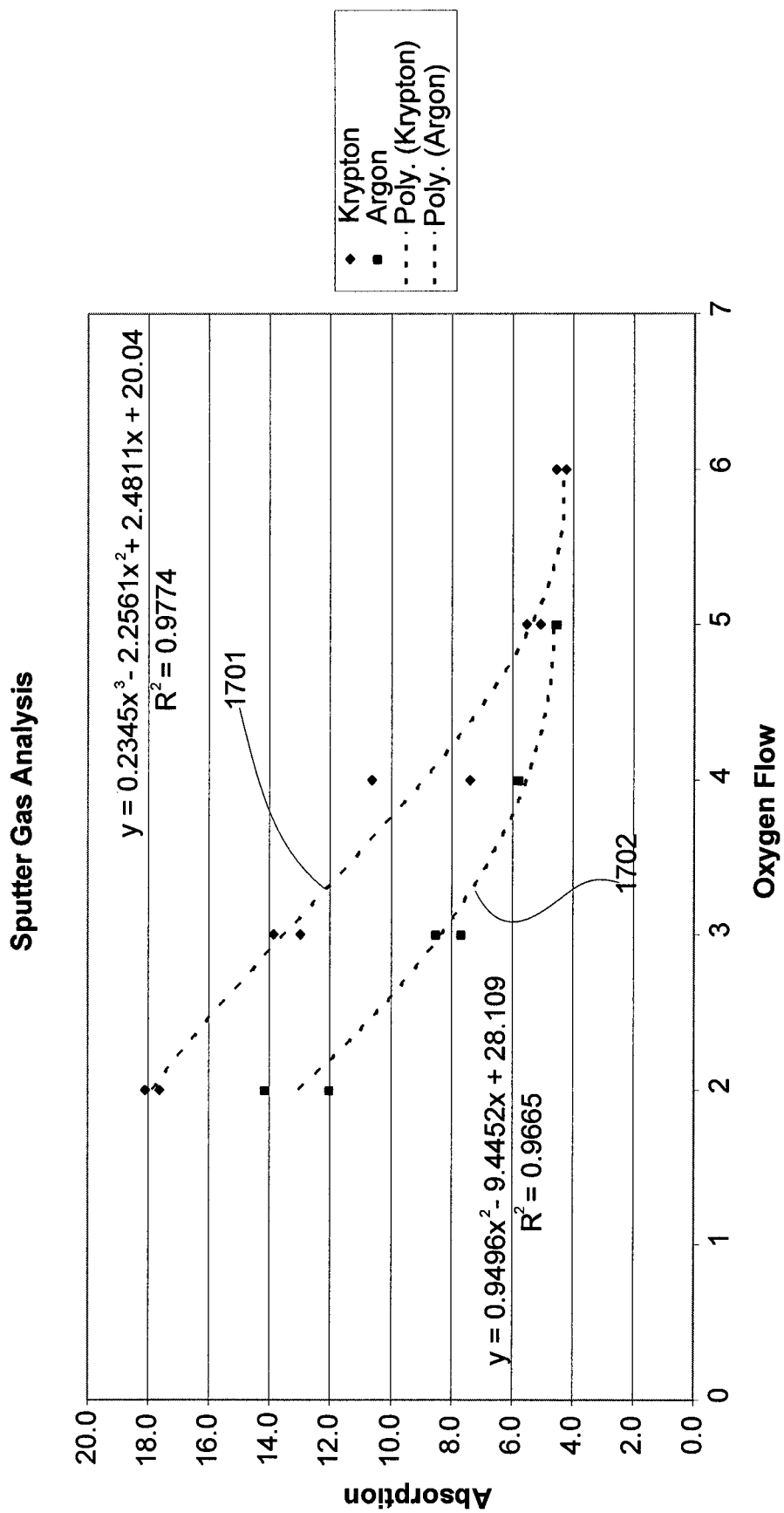
FIG. 17 depicts a graph of thin film absorption vs. oxygen flow for various process gas pressures utilized in an element manufacturing process.

In the next example, coatings were produce in a different coater. This coater has a cathode that is approximately 27 inches long. The experiments were conduced with both argon and krypton at a pressure of 2.73 millitorr. The coatings were made in two passes past the cathode. The oxygen was varied as depicted in the associated figures and tables. The resulting ITO coatings are approximately 600 nm in thickness. In FIG. 17 the absorption (y-axis) in the coatings is plotted as a function of the oxygen flow rate (x-axis). As can be seen the samples made with Krypton (line 1701) are higher in absorption at a given oxygen flow rate compared to the samples produced using argon (line 1702) as the sputtering gas.

Figure 18:
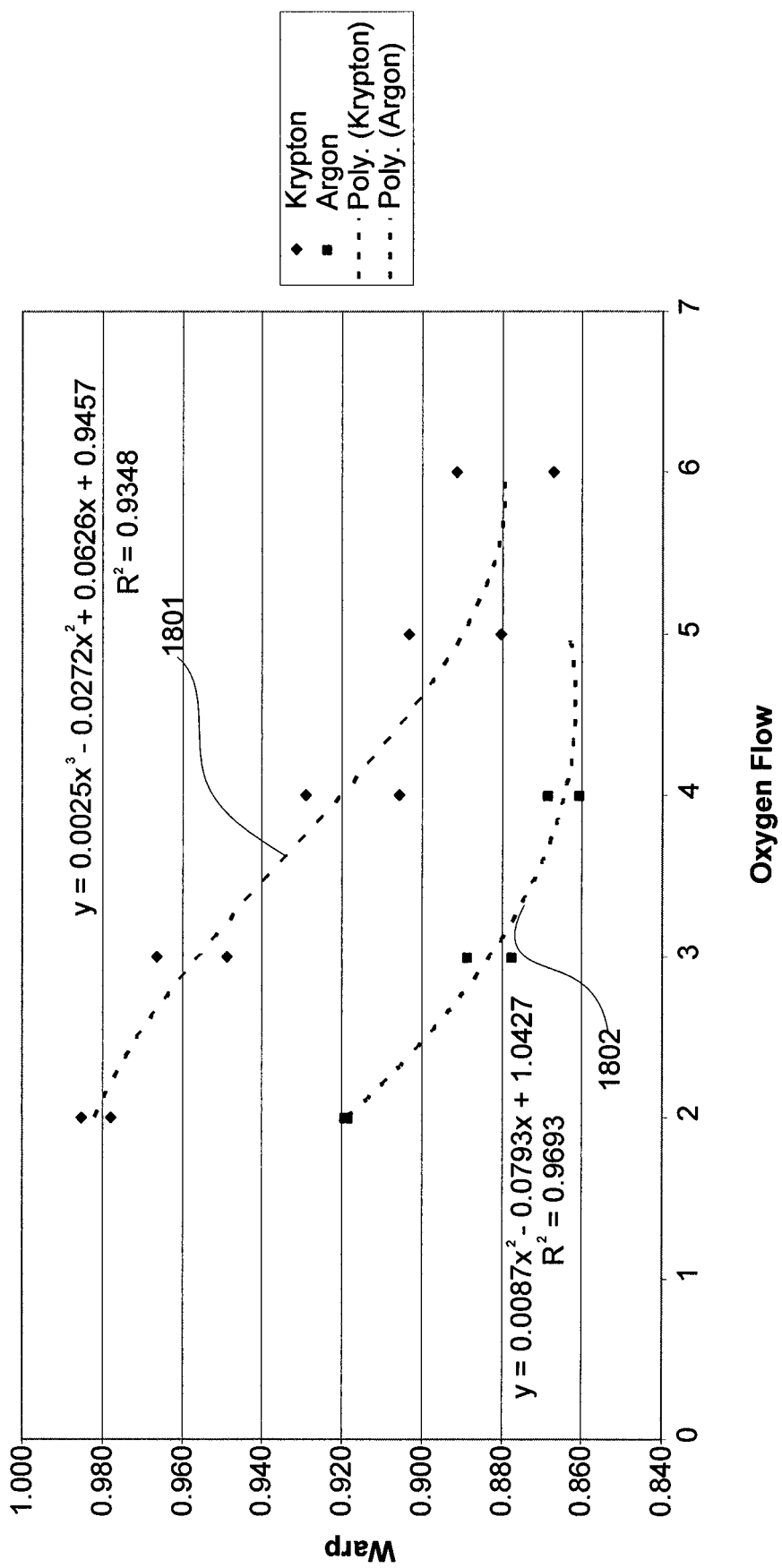
FIG. 18 depicts a graph of element wrap vs. oxygen flow for various process gas pressures utilized in an element manufacturing process.

In FIG. 18 warp in the glass (y-axis) is plotted as a function of oxygen flow rate (x-axis). It can be seen that the samples produced with Krypton (line 1801) have warp values closer to 1 which indicates that the krypton produced ITO coated glass is flatter than argon (line 1802) produced glass. FIG. 18 illustrates the data presented earlier where the warp was shown to increase with increasing oxygen flow rate.

Figure 19:
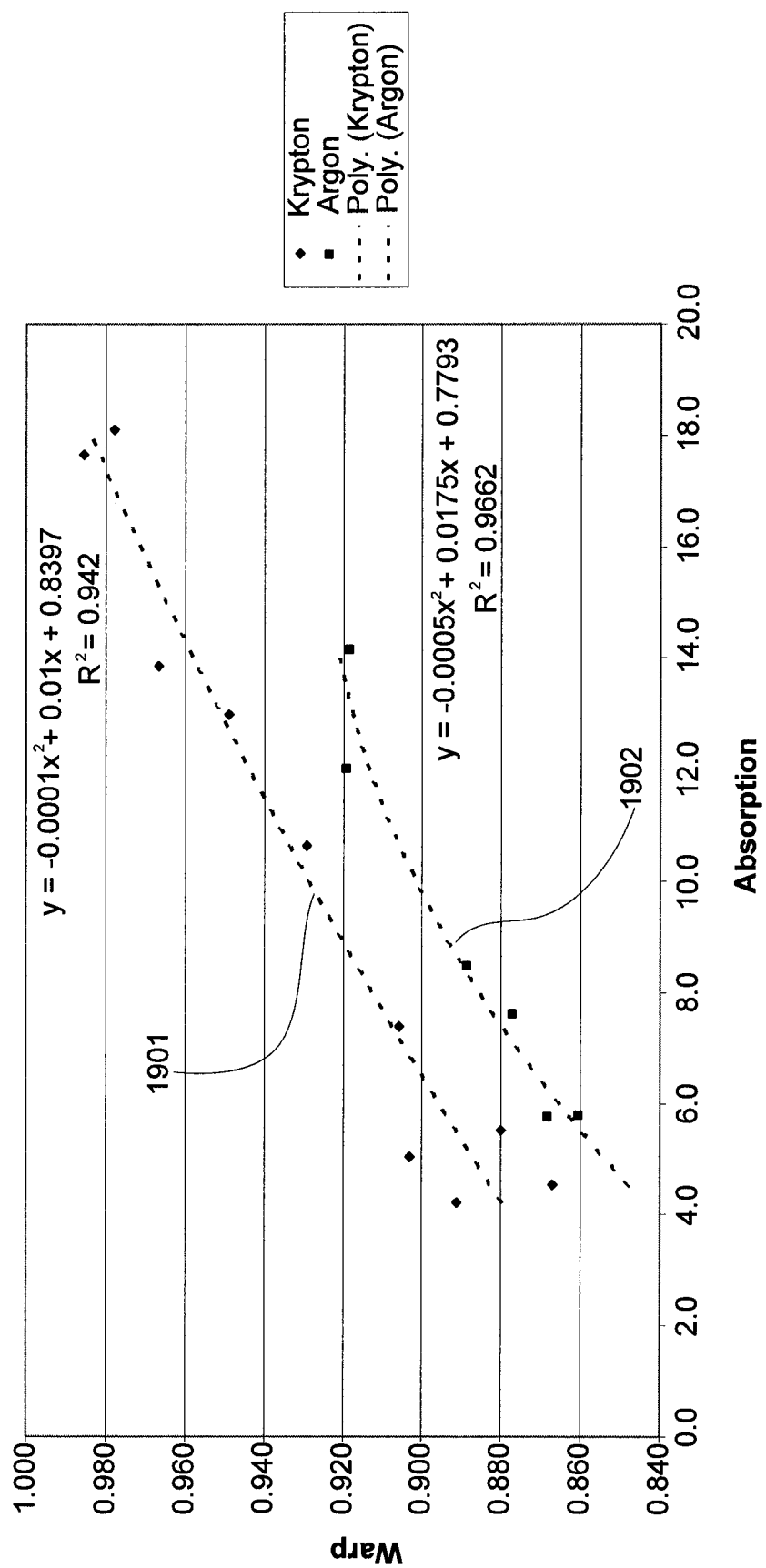
FIG. 19 depicts a graph of element wrap vs. thin film absorption for various process gas pressures utilized in an element manufacturing process.

In FIG. 19 warp of the glass (y-axis) is plotted versus the absorption (x-axis). The Krypton produced samples (line 1901) have more absorption when plotted against oxygen flow rate, however, when the warp is compared against absorption the Krypton produced samples are flatter than the argon produced samples (line 1902).

Figure 20:
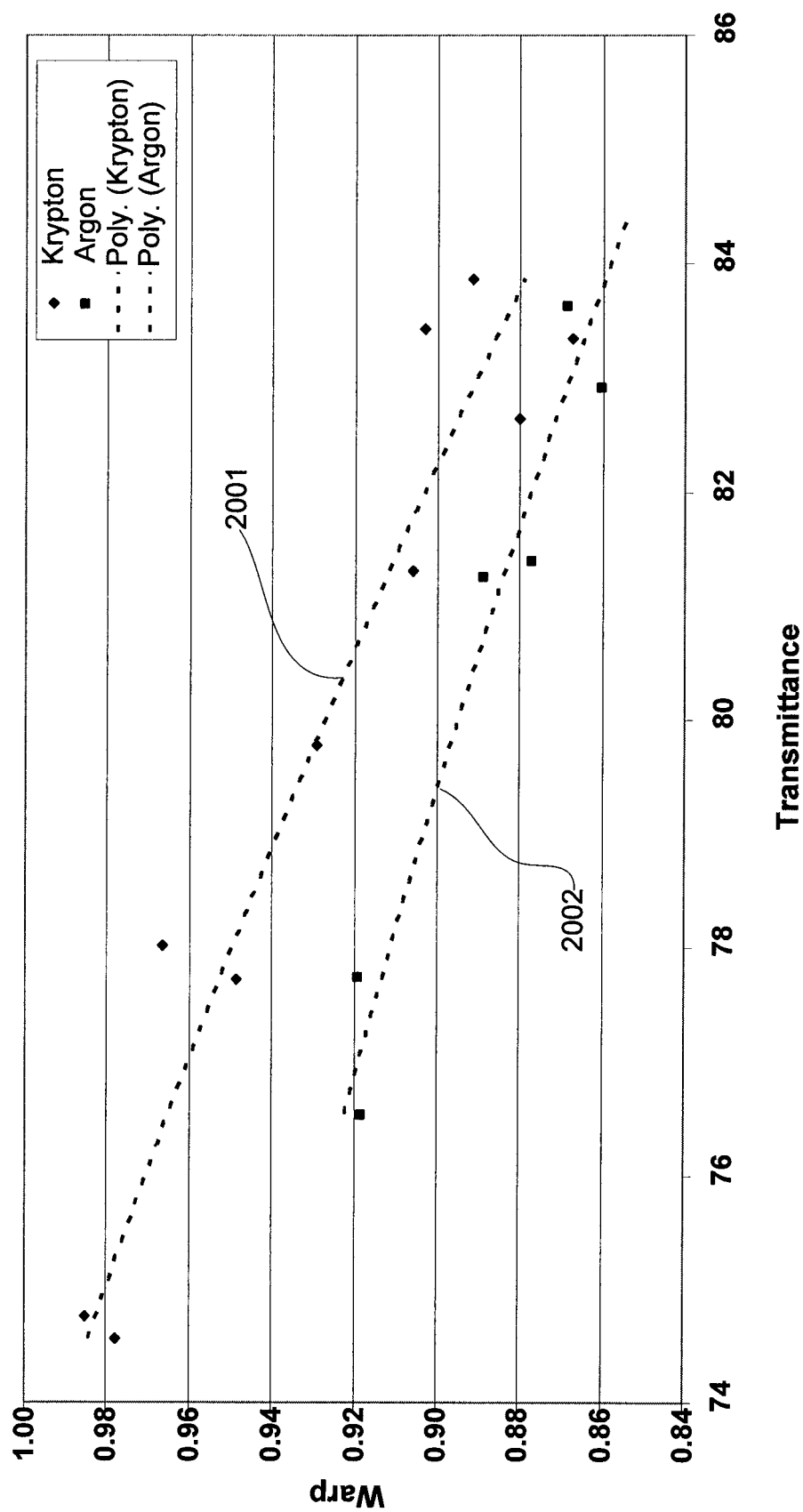
FIG. 20 depicts a graph of element wrap vs. thin film transmittance for various process gas pressures utilized in an element manufacturing process.

FIG. 20 depicts warp (y-axis) versus transmittance (x-axis) for Krypton (line 2001) and Argon (line 2002). Flatter glass is obtained for a given increased transmittance value. Additional improvements are possible using Krypton or Xenon, or even Argon, at higher pressures. Higher pressures enable the simultaneous achievement of lower stress, higher transparency and lower sheet resistance.

Figure 21:
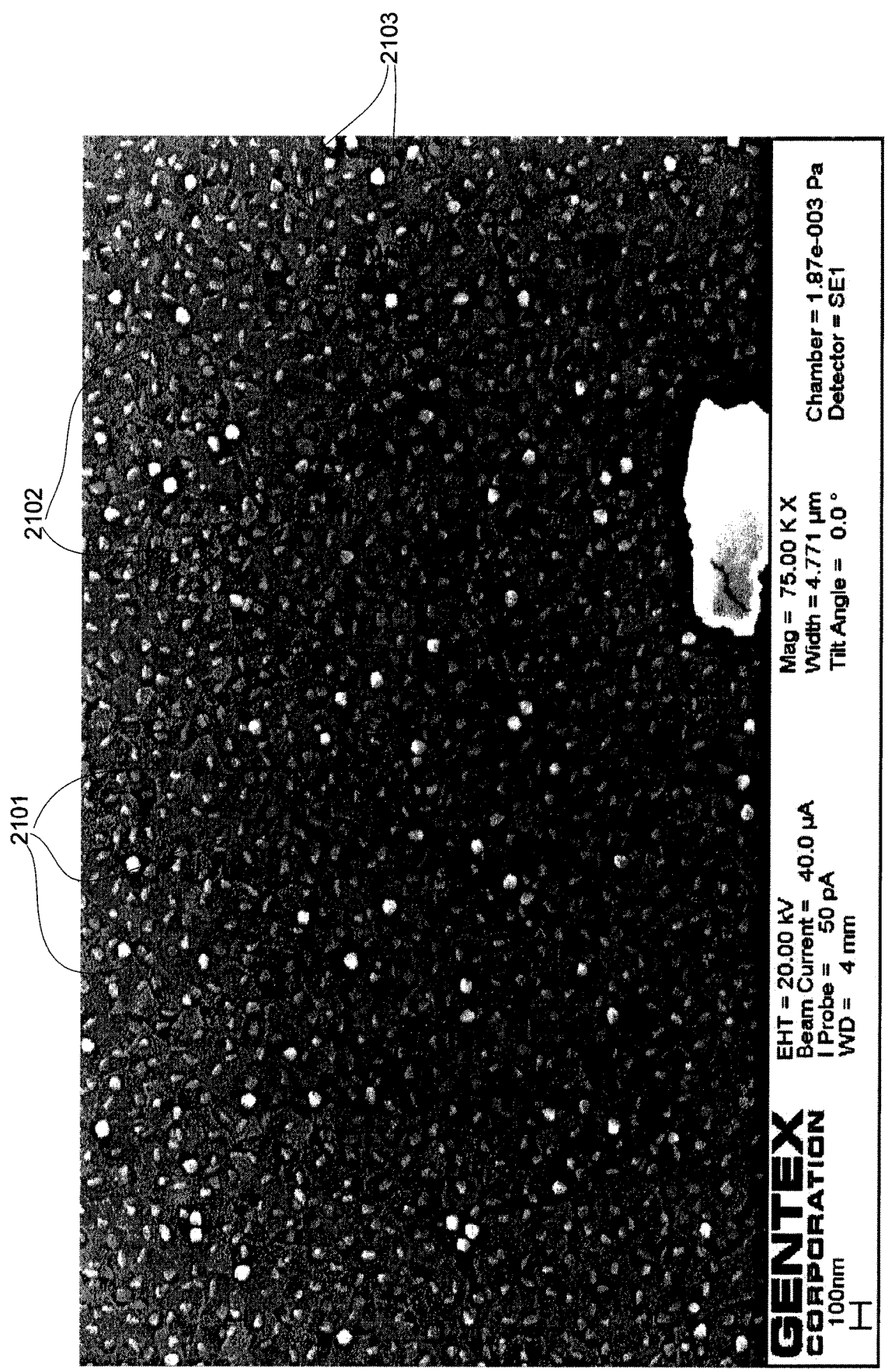
FIGS. 21-32 depict various thin film surface morphologies.

The morphology, or surface features, of the ITO coating also change with pressure and oxygen flow rate. There exists an interaction effect between these values where different morphologies are attained at different oxygen flow rates when the pressure is changed. ITO coating samples depicted in FIGS. 21-23 were produced in a coater with 72" cathodes. All samples were made at 2.1 mT, 5 kw per target, 1 process chamber (2 targets/side) and a line rate of 32 ipm. The oxygen flow rate was 2, 8 and 17 sccm for the samples in FIGS. 21, 22 and 23, respectively. Samples of FIG. 21 and FIG. 23 illustrate the extremes in the morphology. The sample of FIG. 21 has what we call a nodular 2101 morphology while the sample of FIG. 23 has a platelet 2302 morphology. Examining the sample of FIG. 21 reveals a background platelet 2102 structure. The sample of FIG. 21 is considered to have a somewhat mixed morphology. The sample of FIG. 22, at the intermediate oxygen flow has very few nodules 2201 and an overall dominant platelet 2202 morphology. The platelet morphology has been correlated with a higher stress in the coatings while the nodular morphology occurs in the coatings with less stress. Depending on the given process gas pressure, the transition between these two different morphologies is either abrupt or gradual. The low oxygen nodular morphology is characterized by a large peak-to-valley roughness (as described in detail with regard to FIGS. 33A and 33B). The nodules rise substantially above the surface of the coating thus creating large peak to valley roughness. As the nodules transition into the platelet microstructure the roughness of the surface decreases. The roughness is at a minimum when the nodules have just vanished from the surface. At this point we have a platelet microstructure with shallow "cliffs" 2103, 2203, 2303 or regions between the platelets. As the oxygen flow is further increased the height of the cliffs between the platelets increases, undesirably increasing the roughness of the surface.

Figure 22:
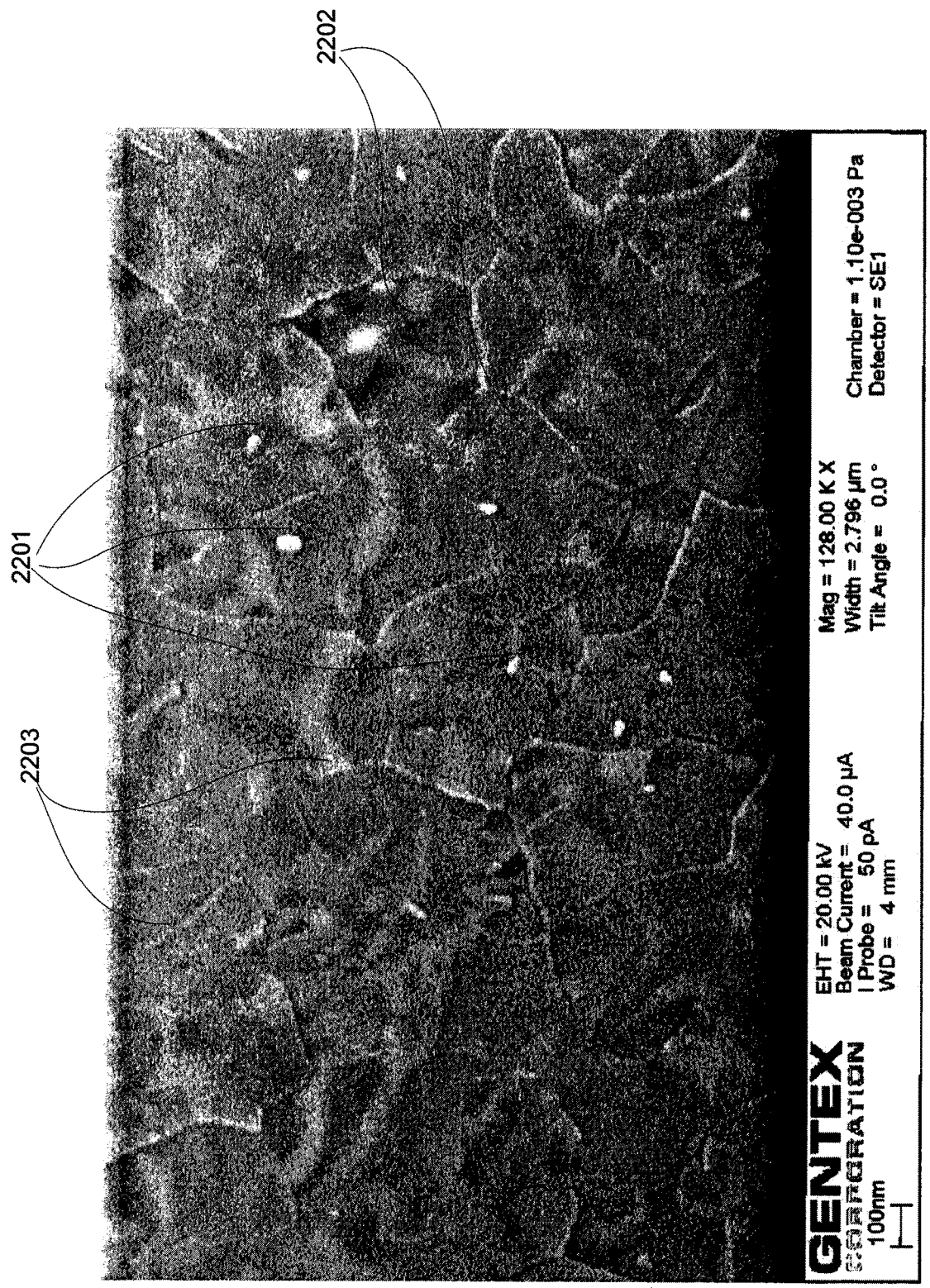
Figure 23:
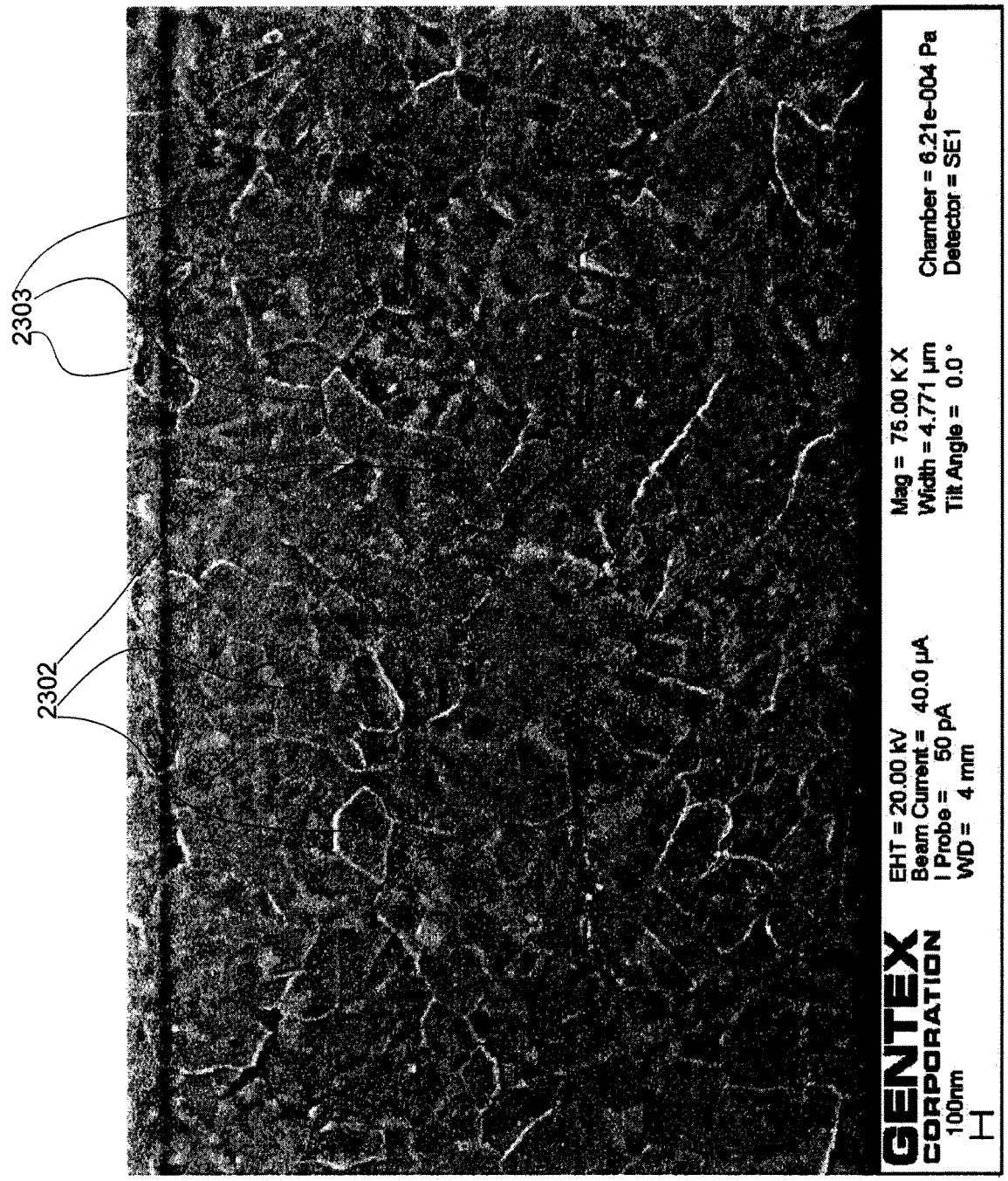
Figure 24:
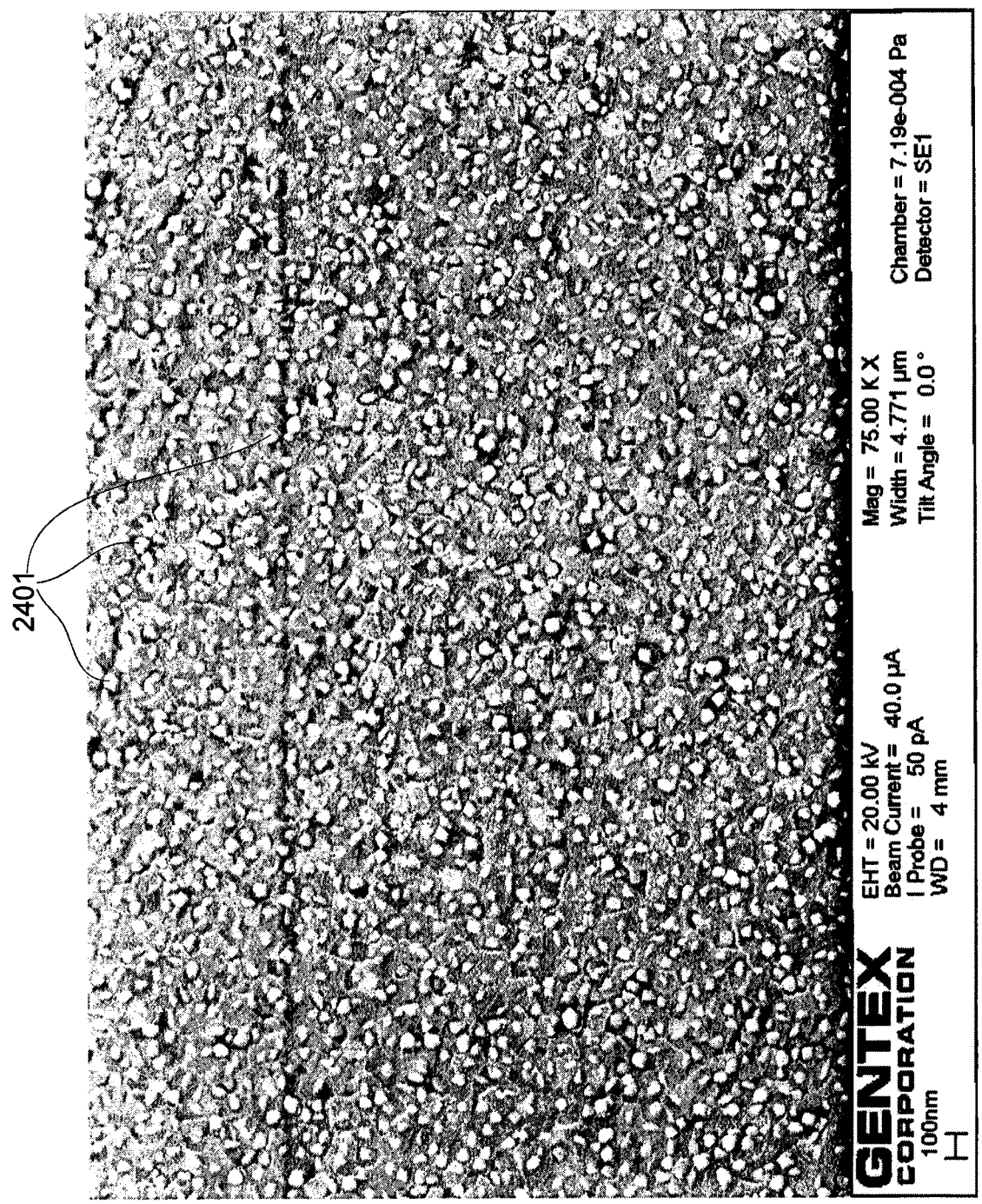
Figure 25:
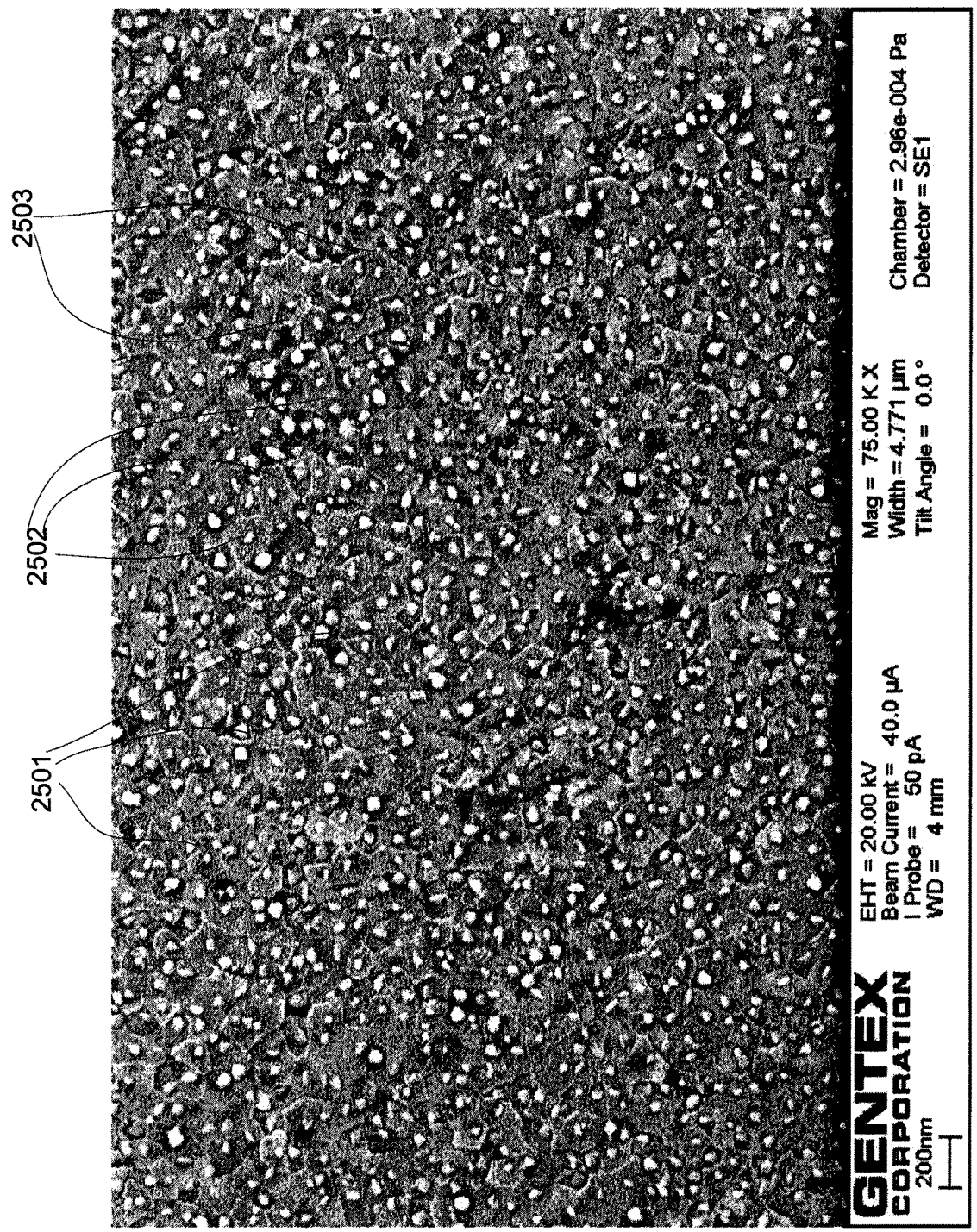
Figure 26:
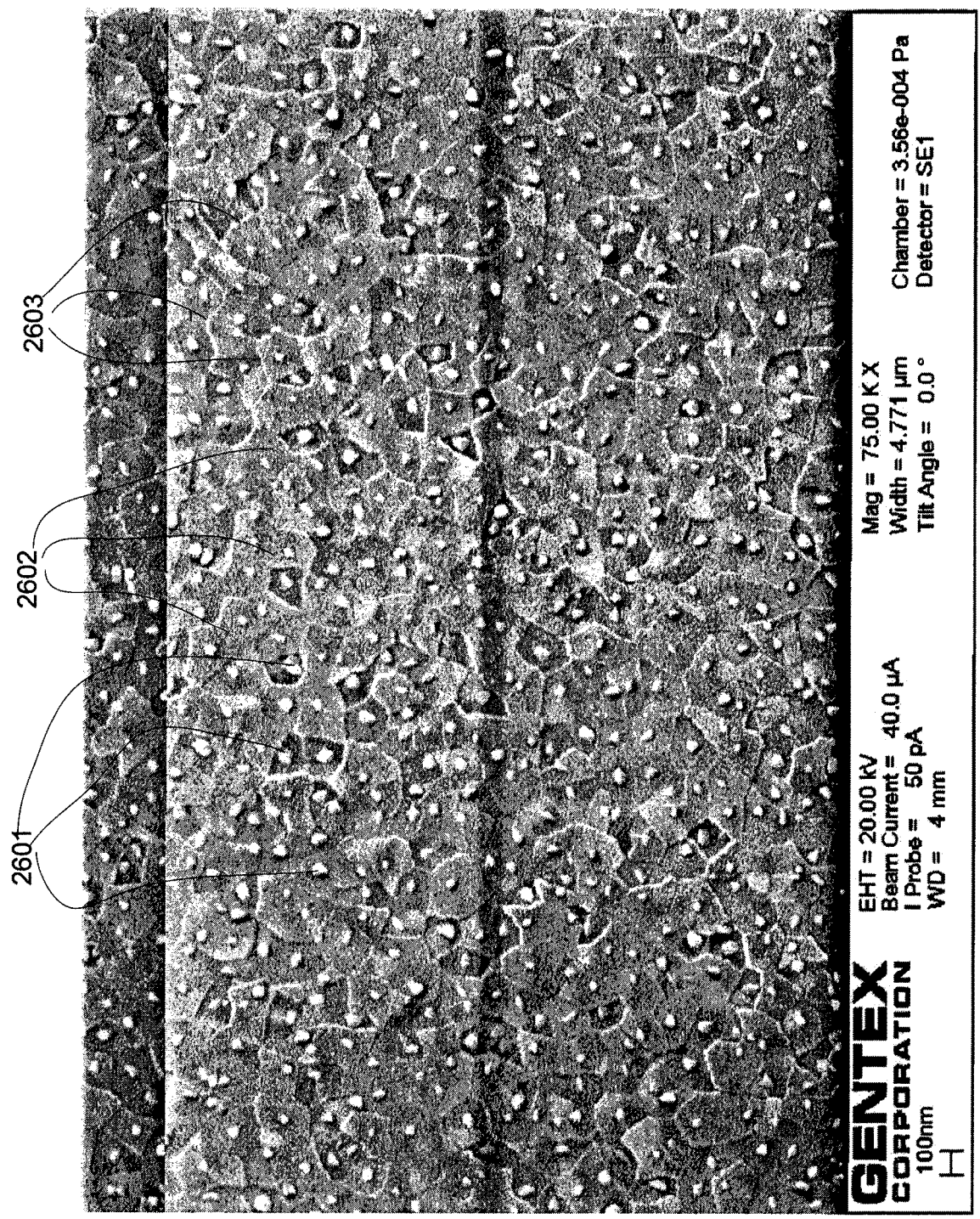

The samples of FIGS. 24-26 are made at comparable powers and line rates as with those of FIGS. 21-23 and all at 2 sccm oxygen. The process gas pressures were 3.7, 2.1 and 1.6 millitorr respectively. The morphology is increasingly dominated by the nodular morphology as the pressure is increased. The transition between the nodular 2401, 2501, 2601 and platelet morphologies is more gradual at the higher pressures, thus, allowing a finer adjustment between desirable optical and mechanical properties in the coating. The platelet 2402 morphology is still present in the background of the 3.7 millitorr sample, however, in a much less dominant amount. As the pressure is further decreased the nodule component is eventually eliminated leaving only the platelet morphology.

Figure 27:
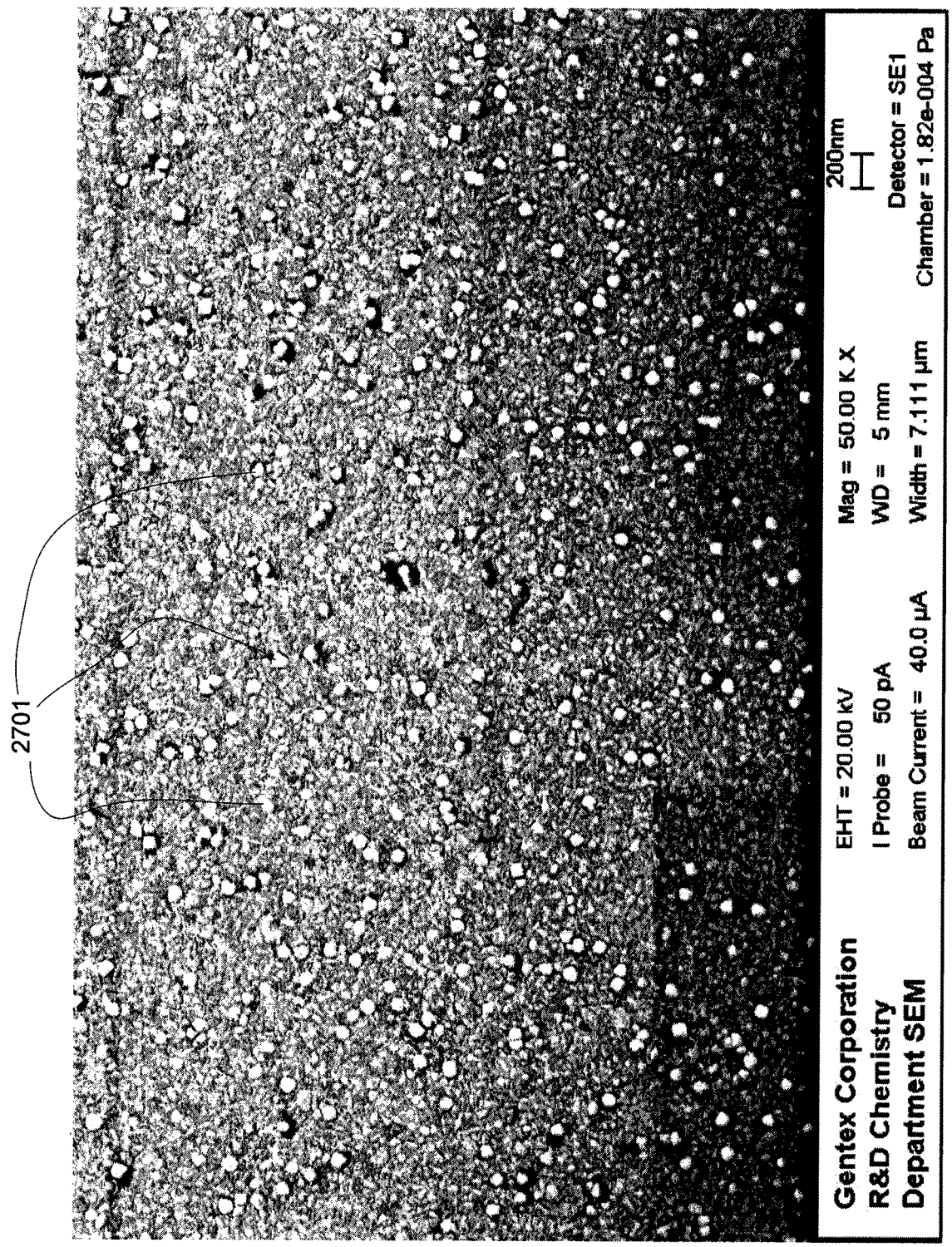
Figure 28:
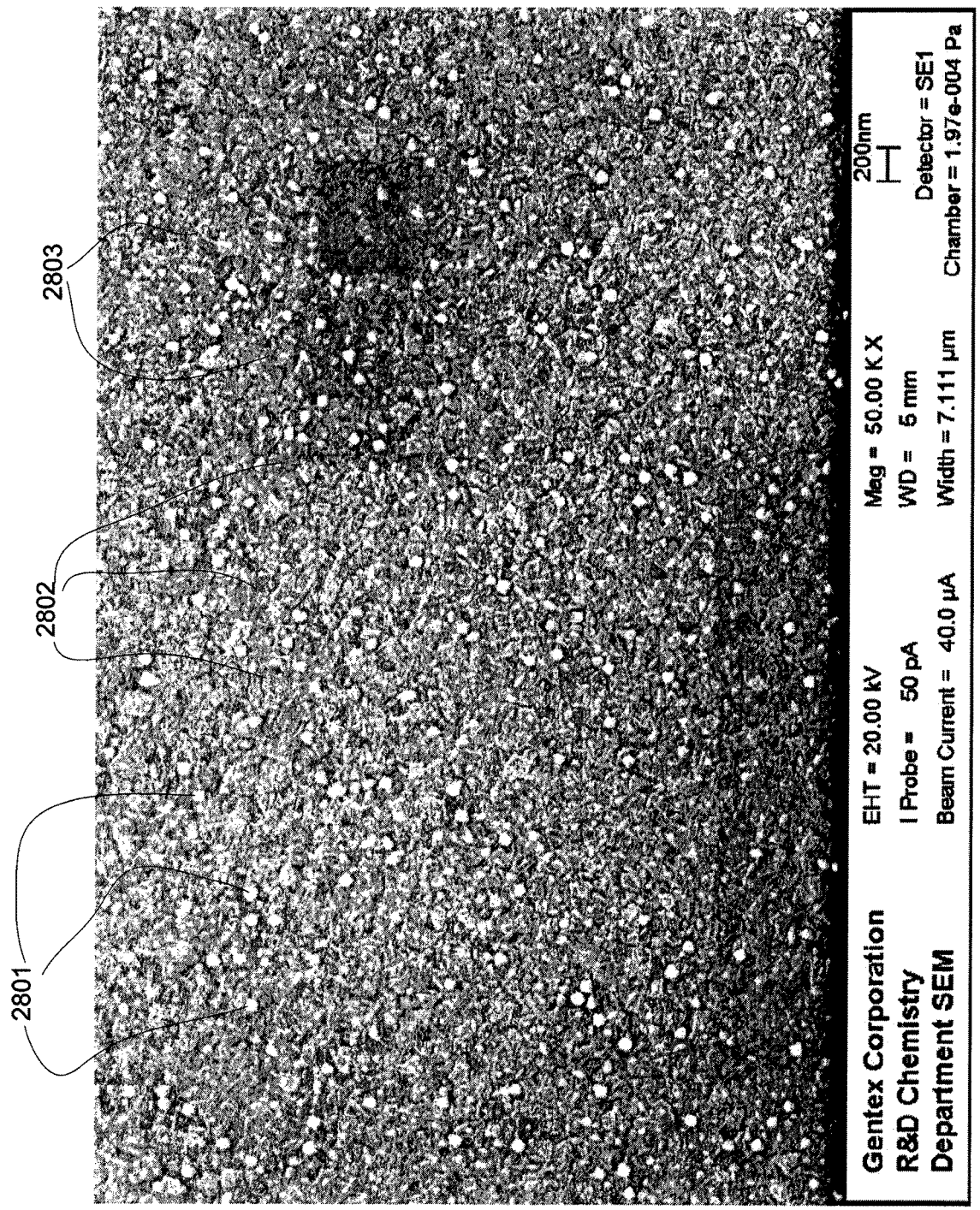
Figure 29:
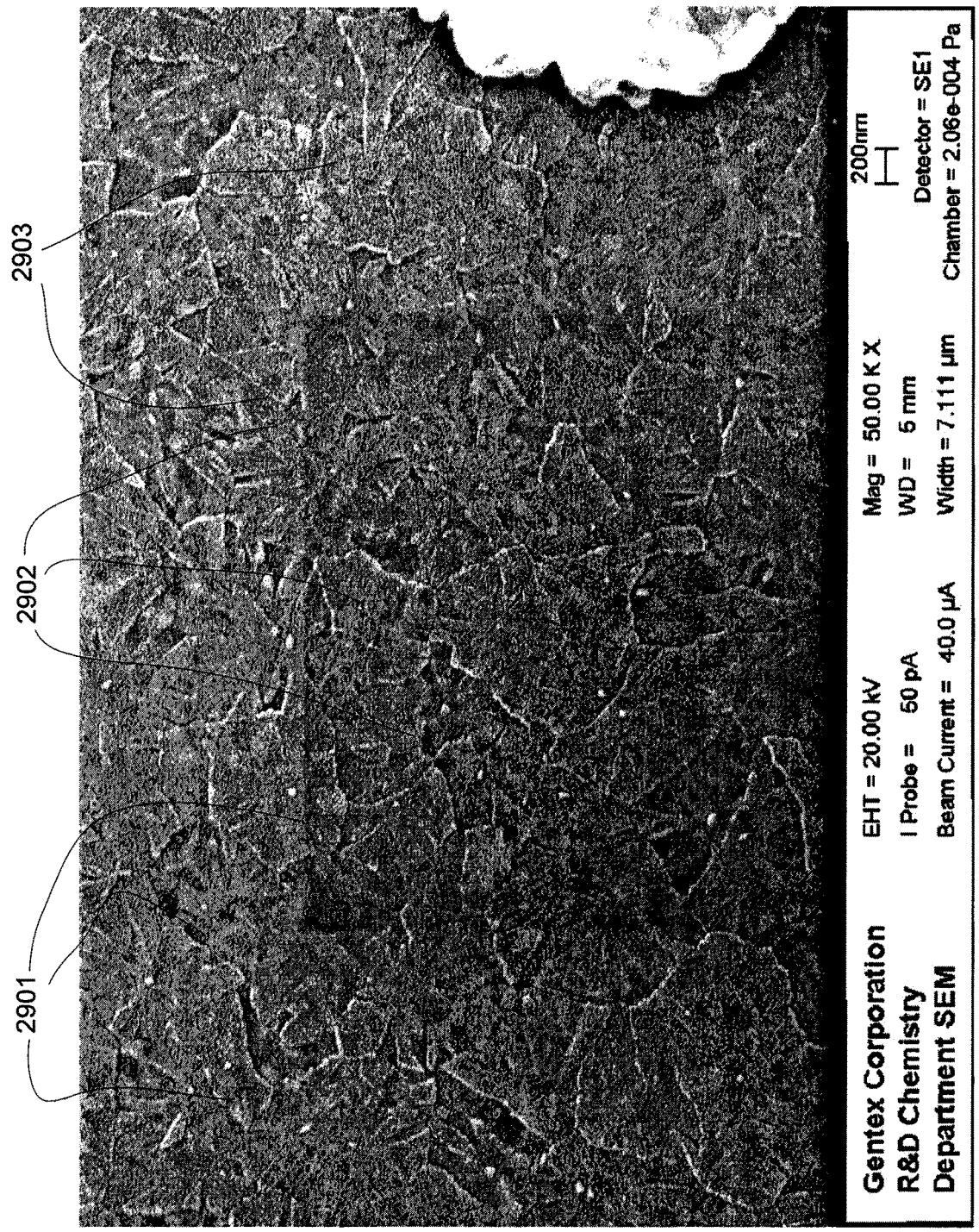

Use of Krypton or other heavier sputtering process gas is similar in some regards to running at a higher pressure. Three SEM images of ½ wave ITO samples are compared which were produced with Krypton as the process gas and with varying oxygen flow rates as depicted in FIGS. 27-29. These samples are described in more detail with reference to Table 6. These samples were made at 40 ipm line rate and 6.2 kw and using two process chambers (four cathodes/side). The glass thickness was 1.1 mm. Oxygen flow rates are 8, 12 and 16 sccm for samples in FIGS. 27, 28 and 29, respectively. The oxygen flow rates are per process chamber. The surface of the sample depicted in FIG. 27, produced at 8 sccm oxygen, has virtually no platelet component and is extremely stress free; the surface of this sample is predominantly nodules 2701. The sample depicted in FIG. 27, and the other ½ wave samples from Table 6, has warp values that are essentially unity. The surface structure of the sample depicted in FIG. 28 is generally comprised of nodules 2801 and has a very minor amount of platelet 2802 morphology with slight cliffs 2803. The sample of FIG. 29 is essentially all platelet 2902 surface structure with well defined cliffs 2903. The samples have very low bulk resistance values of approximately 150 micro-ohm cm. The absorption of these coatings is fairly low with the 12 sccm case having the best combination of flatness, resistivity and absorption. The low stress values for these coatings indicates that even some platelet morphology can be utilized with success when produced using higher pressures or with heavier sputtering gasses.

Figure 30:
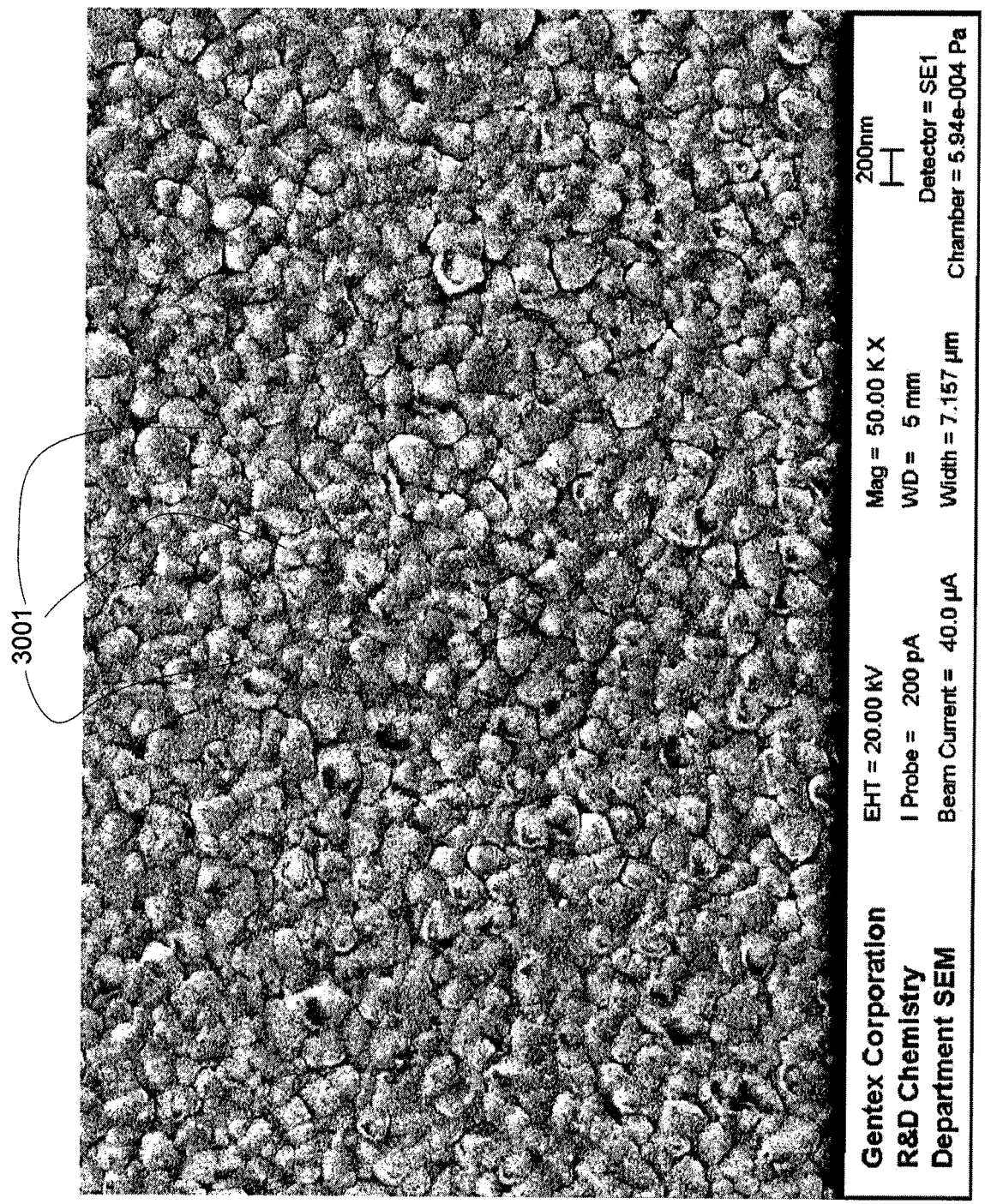
Figure 31:
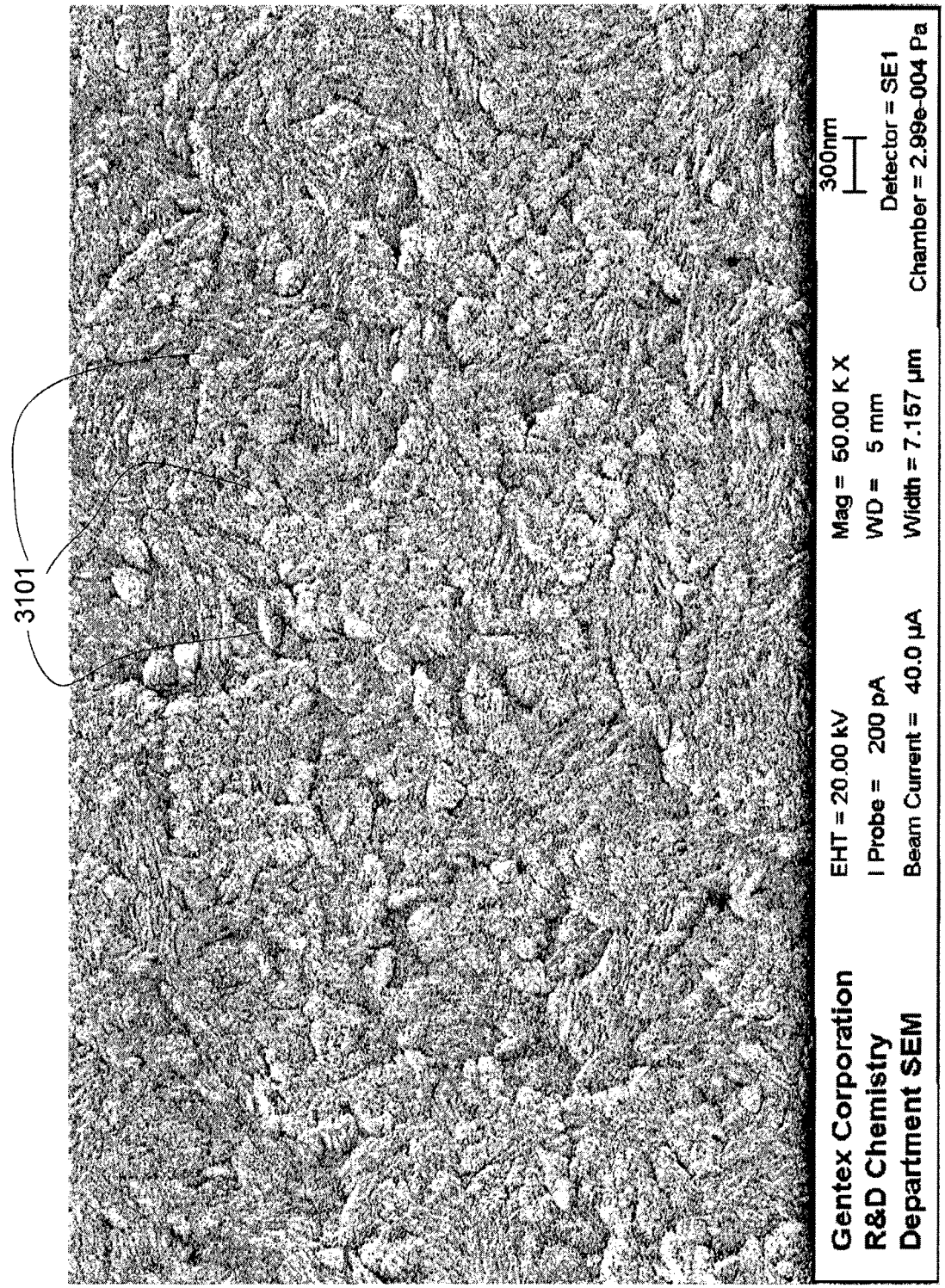
Figure 32:
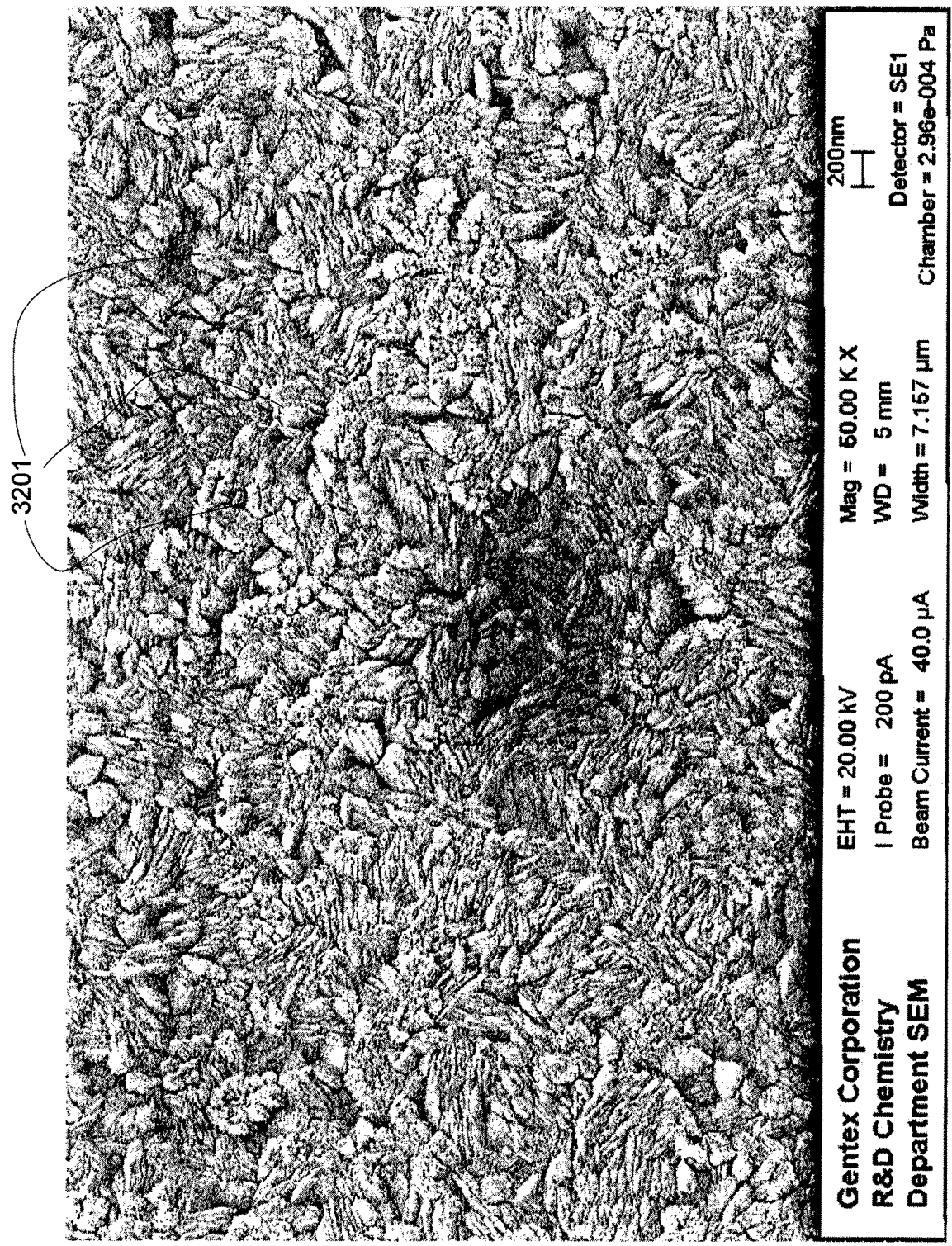

Samples D, E and F as depicted in FIGS. 30-32, respectively, are for the 2-wave ITO cases as tabulated in Table 7 and correspond to the 8, 12 and 16 sccm flow rates, respectively. The line rate was 7 ipm for these samples otherwise the process conditions were equivalent to those of Table 6. These coatings are approximately 5 times thicker than their half wave counterparts. The morphology of the coatings is somewhat different on these samples with the nodular 3001, 3101, 3201 morphology of the thinner samples giving rise to a more granular structure (sample D, FIG. 30). There are voids between the grains depicted in FIG. 30 which gives rise to undesirably high haze and a degraded conductivity; this is exemplified by the relatively high bulk resistance value of 200 micro-ohm-cm for this sample. Sample E, made with 12 sccm of oxygen has a very low bulk resistance (131 micro-ohm cm) and a fine grain microstructure. The 16 sccm case has a similar microstructure but in this case the platelet morphology is not present as it is in the thinner coatings. The stress levels of these Krypton-produced coatings are relatively low. The warp values range from essentially unity for the low oxygen case to 0.956 for the highest oxygen case. These samples were produced with 1.1 mm glass which is more susceptible to warp compared to the thicker 1.6 mm glass described previously. Still, the warp values are very close to unity. This is with coatings that are over 10 times thicker than the 50 nm coatings originally discussed on 1.6 mm glass. Not only do these coatings have extremely low stress but they also have better bulk resistance values and acceptable absorption values.

The peak-to-valley surface roughness (as defined in the discussion below with reference to FIGS. 33A and 33B) for these coatings is preferably less than or equal to 200 Å, more preferably less than 150 Å, more preferably less than or equal to about 100 Å, even more preferably less than or equal to about 50 Å, and most preferably less than or equal to about 25 Å.

To illustrate additional features and advantages of an electrochromic mirror, constructed in accordance with at least one embodiment of the present invention, summaries of experimental results are provided below in tables 3 and 4. In these summaries, references are made to the spectral properties of elements of electrochromic mirrors constructed in accordance with the parameters specified in each example. In discussing colors, it is useful to refer to the Commission Internationale de l'Eclairage's (CIE) 1976 CIELAB Chromaticity Diagram (commonly referred to the L*a*b* chart). The technology of color is relatively complex, but a fairly comprehensive discussion is given by F. W. Billmeyer and M. Saltzman in *Principles of Color Technology*, $2^{nd}$ Edition, J. Wiley and Sons Inc. (1981), and the present disclosure, as it relates to color technology and terminology, generally follows that discussion. On the L*a*b* chart, L* defines lightness, a* denotes the red/green value, and b* denotes the yellow/blue value. Each of the electrochromic media has an absorption spectra at each particular voltage that may be converted to a three number designation, their L*a*b* values. To calculate a set of color coordinates, such as L*a*b* values, from the spectral transmission or reflectance, two additional items are required. One is the spectral power distribution of the source or illuminant. The present disclosure uses CIE Standard Illuminant A to simulate light from automobile headlamps and uses CIE Standard Illuminant $D_{65}$ to simulate daylight. The second item needed is the spectral response of the observer. The present disclosure uses the 2 degree CIE standard observer. The illuminant/observer combination generally used for mirrors is then represented as A/2 degree and the combination generally used for windows is represented as $D_{65}/2$ degree. Many of the examples below refer to a value Y from the 1931 CIE Standard since it corresponds more closely to the spectral reflectance than L*. The value C*, which is also described below, is equal to the square root of $(a^*)^2+(b^*)^2$, and hence, provides a measure for quantifying color neutrality.

Tables 3 and 4 summarize experimental results for elements constructed in accordance with the present invention. Specifically, experiments were conducted within a range of between 8 sccm and 16 sccm oxygen flow for both half and two wave thicknesses with krypton as the sputtering gas and at a pressure of 3 mTorr. Table 6 summarizes the results for a slightly less than half wave ITO thickness, while Table 7 summarizes the results for a slightly more than two wave ITO thickness, the half wave thickness being applicable, for example, to mirror applications and the two wave thickness being applicable, for example, to window applications. Further, it is noted that these tables include results for both single layers and elements constructed of dual layers.

TABLE 6

| Experiment | | | | Transmittance | | | | | | Singles | | | | | Cell |
|---|---|---|---|---|---|---|---|---|---|---|---|---|---|---|---|
| Rack Average | | | | | | | | | | | | | | Ab- | Re- | Ab- |
| Oxygen | ohms | Oxygen | Trial | L* | a* | b* | Y | Haze | Singles | L* | a* | b* | Y | Haze | sorption | flection | sorption |
| 8 | 11.6 | 8 | 1/2 wv-8 sccm-1/3 | 93.1 | −2.8 | 4.7 | 83.3 | 0.06 | .5 W 8-1 | 94.9 | −2.1 | 3.8 | 87.3 | 0.01 | 4.1 | 8.5 | 8.7 |
| | | | | | | | | | .5 W 8-3 | 94.8 | −2.1 | 3.8 | 87.2 | 0.01 | 4.3 | 8.5 | |
| | | | 1/2 wv-8 sccm-2/4 | 92.9 | −2.6 | 5.7 | 82.8 | 0.01 | .5 W 8-2 | 94.7 | −1.9 | 4.9 | 86.9 | 0.02 | 4.5 | 8.6 | 9.1 |
| | | | | | | | | | .5 W 8-4 | 94.7 | −1.9 | 5.2 | 86.9 | 0.01 | 4.3 | 8.8 | |

TABLE 6-continued

| Oxygen | Trial | | | | | | Singles | | | | | | Bulk Thick | rough-ness | Total Thickness | Ohms/sq | Bulk Resistance |
|---|---|---|---|---|---|---|---|---|---|---|---|---|---|---|---|---|---|
| 10 | 10.9 | 10 | 1/2 wv-10 sccm-1/3 | 93.4 | −2.7 | 5.7 | 83.9 | 0.01 | .5 W 10-1 | 95.0 | −2.1 | 5.0 | 87.5 | 0.02 | 3.5 | 8.9 | 7.6 |
| | | | | | | | | | .5 W 10-3 | 94.8 | −1.8 | 5.6 | 87.2 | 0.01 | 3.7 | 9.1 | |
| | | | 1/2 wv-10 sccm-2/4 | 93.8 | −3.0 | 4.2 | 84.9 | 0.02 | .5 W 10-2 | 95.1 | −2.3 | 4.0 | 87.9 | 0.00 | 3.2 | 8.9 | 6.9 |
| | | | | | | | | | .5 W 10-4 | 95.1 | −2.3 | 2.9 | 88.0 | 0.01 | 3.2 | 8.8 | |
| 12 | 10.6 | 12 | 1/2 wv-12 sccm-1/2 | 94.1 | −3.1 | 4.2 | 85.5 | 0.05 | .5 W 12-1 | 95.2 | −2.4 | 3.9 | 88.2 | 0.01 | 2.9 | 8.9 | 6.3 |
| | | | | | | | | | .5 W 12-2 | 95.3 | −2.4 | 2.9 | 88.3 | 0.01 | 2.7 | 9.0 | |
| 14 | 11.1 | 14 | 1/2 wv-14 sccm-2/4 | 94.3 | −3.1 | 4.1 | 85.9 | 0.05 | .5 W 14-2 | 95.3 | −2.4 | 3.5 | 88.3 | 0.01 | 2.7 | 9.1 | 5.8 |
| | | | | | | | | | .5 W 14-4 | 95.3 | −2.5 | 3.1 | 88.4 | 0.02 | 2.4 | 9.1 | |
| 16 | 11.0 | 16 | 1/2 wv-16 sccm-1/2 | 94.3 | −3.1 | 4.8 | 85.9 | 0.15 | .5 W 16-1 | 95.3 | −2.5 | 4.1 | 88.4 | 0.01 | 2.5 | 9.1 | 5.6 |
| | | | | | | | | | .5 W 16-2 | 95.3 | −2.5 | 4.0 | 88.4 | 0.01 | 2.6 | 9.0 | |

| | | Reflectance | | | | | | | | | | | Bulk | rough- | Total | | Bulk |
|---|---|---|---|---|---|---|---|---|---|---|---|---|---|---|---|---|---|
| Oxygen | Trial | L* | a* | b* | Y | Haze | Singles | L* | a* | b* | Y | Haze | Thick | ness | Thickness | Ohms/sq | Resistance |
| 8 | 1/2 wv-8 sccm-1/3 | 33.9 | 6.1 | −12.4 | 7.9 | 0.06 | .5 W 8-1 | 35.0 | 8.5 | −13.3 | 8.5 | 0.01 | 131.9 | 5.4 | 137.3 | 11.6 | 159.3 |
| | | | | | | | .5 W 8-3 | 35.0 | 8.5 | −12.9 | 8.5 | 0.01 | | | | | |
| | 1/2 wv-8 sccm-2/4 | 34.4 | 5.1 | −16.1 | 8.2 | 0.01 | .5 W 8-2 | 35.1 | 7.8 | −16.8 | 8.6 | 0.02 | | | | | |
| | | | | | | | .5 W 8-4 | 35.6 | 7.5 | −17.4 | 8.8 | 0.01 | | | | | |
| 10 | 1/2 wv-10 sccm-1/3 | 34.9 | 5.2 | −17.0 | 8.4 | 0.01 | .5 W 10-1 | 35.9 | 7.8 | −17.6 | 8.9 | 0.02 | 132.7 | 5.0 | 137.7 | 11.1 | 152.8 |
| | | | | | | | .5 W 10-3 | 36.2 | 6.4 | −19.2 | 9.1 | 0.01 | | | | | |
| | 1/2 wv-10 sccm-2/4 | 34.3 | 6.6 | −12.4 | 8.2 | 0.02 | .5 W 10-2 | 35.8 | 8.8 | −14.2 | 8.9 | 0.00 | | | | | |
| | | | | | | | .5 W 10-4 | 35.7 | 8.6 | −10.2 | 8.8 | 0.01 | | | | | |
| 12 | 1/2 wv-12 sccm-1/2 | 34.5 | 6.9 | −12.4 | 8.2 | 0.05 | .5 W 12-1 | 35.8 | 9.0 | −14.1 | 8.9 | 0.01 | 130.2 | 4.4 | 134.6 | 11 | 148.1 |
| | | | | | | | .5 W 12-2 | 36.0 | 8.9 | −10.5 | 9.0 | 0.01 | | | | | |
| 14 | 1/2 wv-14 sccm-2/4 | 34.7 | 7.2 | −12.3 | 8.4 | 0.05 | .5 W 14-2 | 36.1 | 9.1 | −12.9 | 9.1 | 0.01 | 127.6 | 5.1 | 132.7 | 11.7 | 155.3 |
| | | | | | | | .5 W 14-4 | 36.2 | 9.2 | −11.1 | 9.1 | 0.02 | | | | | |
| 16 | 1/2 wv-16 sccm-1/2 | 34.9 | 7.2 | −14.9 | 8.5 | 0.15 | .5 W 16-1 | 36.1 | 9.3 | −15.0 | 9.1 | 0.01 | 126.7 | 3.6 | 130.3 | 11.45 | 149.2 |
| | | | | | | | .5 W 16-2 | 36.0 | 9.3 | −14.8 | 9.0 | 0.01 | | | | | |

TABLE 7

| | | Transmittance | | | | | | | | | | | Singles | | Cell |
|---|---|---|---|---|---|---|---|---|---|---|---|---|---|---|---|
| Oxygen | Trial | L* | a* | b* | Y | Haze | Singles | L* | a* | b* | Y | Haze | Absorption | Reflection | Absorption |
| 8 | 2 wv-8 sccm-1/3 | 84.0 | −2.9 | 4.2 | 64.0 | 2.0 | 2 W 8-1 | 89.0 | −0.9 | 3.8 | 74.2 | 1.48 | 17.5 | 8.3 | 27.0 |
| | | | | | | | 2 W 8-3 | 88.6 | −0.5 | 5.0 | 73.3 | 1.47 | 18.2 | 8.5 | |
| | 2 wv-8 sccm-2/4 | 84.2 | −2.8 | 4.4 | 64.4 | 1.9 | 2 W 8-2 | 88.9 | −0.9 | 4.1 | 74.0 | 2.20 | 16.5 | 9.5 | 25.4 |
| | | | | | | | 2 W 8-4 | 88.6 | −0.2 | 5.0 | 73.3 | 1.87 | 16.2 | 10.5 | |
| 10 | 2 wv-10 sccm-2/4 | 85.2 | −2.9 | 3.4 | 66.3 | 1.7 | 2 W 10-2 | 89.5 | −0.6 | 3.5 | 75.3 | 1.54 | 15.3 | 9.4 | 24.3 |
| | | | | | | | 2 W 10-4 | 89.4 | −1.0 | 3.7 | 75.0 | 1.51 | 15.9 | 9.1 | |
| | 2 wv-10 sccm-1/3 | 85.6 | −2.6 | 3.3 | 67.1 | 1.8 | 2 W10-1 | 89.8 | −0.5 | 3.6 | 75.9 | 1.41 | 15.0 | 9.1 | 23.4 |
| | | | | | | | 2 W 10-3 | 89.5 | −0.7 | 3.4 | 75.3 | 1.51 | 15.5 | 9.3 | |
| 12 | 2 wv-12 sccm-1/2 | 84.5 | −2.5 | 2.4 | 65.0 | 0.1 | 2 W 12-1 | 89.5 | −0.5 | 1.9 | 75.3 | 0.22 | 13.8 | 11.0 | 22.5 |
| | | | | | | | 2 W12-2 | 89.4 | −0.9 | 2.0 | 75.1 | 0.20 | 14.2 | 10.7 | |
| | 2 wv-12 sccm-3/4 | 78.8 | −2.8 | 2.9 | 54.5 | 0.3 | 2 W 12-3 | 89.6 | −1.1 | 2.3 | 75.4 | 0.23 | 12.6 | 12.0 | 35.5 |
| | | | | | | | 2 W12-4 | 83.4 | −1.0 | 2.1 | 62.9 | 0.25 | | 13.1 | |
| 14 | 2 wv-14 sccm-1/3 | 85.3 | −2.6 | 1.8 | 66.7 | 0.3 | 2 W 14-1 | 89.6 | −0.7 | 1.4 | 75.5 | 0.33 | 13.6 | 10.9 | 23.4 |
| | | | | | | | 2 W14-3 | 89.8 | −1.1 | 1.7 | 75.9 | 0.27 | 13.1 | 11.0 | |
| | 2 wv-14 sccm-2/4 | 84.4 | −2.6 | 1.5 | 64.9 | 0.3 | 2 W14-2 | 89.3 | −0.7 | 1.2 | 74.8 | 0.38 | 13.8 | 11.3 | 25.5 |
| | | | | | | | 2 W14-4 | 89.3 | −0.8 | 1.5 | 74.8 | 0.30 | 14.6 | 10.7 | |
| 16 | 2 wv-16 sccm-1/3 | 86.5 | −2.8 | 1.9 | 69.0 | 0.7 | 2 W 16-1 | 89.7 | −1.1 | 2.2 | 75.8 | 0.63 | 10.8 | 13.4 | 18.8 |
| | | | | | | | 2 W 16-3 | 90.3 | −1.3 | 1.0 | 77.0 | 0.63 | 11.0 | 12.0 | |
| | 2 wv-16 sccm-2/4 | 87.2 | −2.8 | 1.4 | 70.3 | 0.7 | 2 W 16-2 | 90.5 | −1.3 | 1.2 | 77.4 | 0.53 | 10.8 | 11.8 | 18.8 |
| | | | | | | | 2 W 16-4 | 90.5 | −1.2 | 1.0 | 77.4 | 0.58 | 10.7 | 11.9 | |

| | Reflectance | | | | | | | | | | | Bulk | rough- | Total | | Bulk | |
|---|---|---|---|---|---|---|---|---|---|---|---|---|---|---|---|---|---|
| Trial | L* | a* | b* | Y | Haze | Singles | L* | a* | b* | Y | Haze | Thick | ness | Thickness | Ohms | Resistance | Warp |
| 2 wv-8 sccm-1/3 | 35.9 | −2.4 | −3.1 | 9.0 | 2.0 | 2 W 8-1 | 34.6 | −1.9 | −3.2 | 8.3 | 1.48 | 758.5 | 21.4 | 779.9 | 2.6 | 202.8 | 0.996 |
| | | | | | | 2 W 8-3 | 35.1 | −2.0 | −3.8 | 8.5 | 1.47 | | | | | | |
| 2 wv-8 sccm-2/4 | 38.3 | −2.7 | −5.3 | 10.3 | 1.9 | 2 W 8-2 | 36.9 | −2.2 | −4.4 | 9.5 | 2.20 | | | | | | |
| | | | | | | 2 W 8-4 | 38.6 | −3.3 | −4.9 | 10.5 | 1.87 | | | | | | |
| 2 wv-10 sccm-2/4 | 36.7 | −2.3 | −3.5 | 9.4 | 1.7 | 2 W 10-2 | 36.8 | −3.1 | −2.1 | 9.4 | 1.54 | 740.9 | 16.1 | 757.0 | 1.95 | 147.6 | 0.984 |
| | | | | | | 2 W 10-4 | 36.2 | −2.2 | −1.9 | 9.1 | 1.51 | | | | | | |
| 2 wv-10 sccm-1/3 | 36.9 | −3.1 | −2.9 | 9.5 | 1.8 | 2 W10-1 | 36.3 | −2.3 | −2.0 | 9.1 | 1.41 | | | | | | |
| | | | | | | 2 W 10-3 | 36.5 | −1.7 | −2.5 | 9.3 | 1.51 | | | | | | |
| 2 wv-12 sccm-1/2 | 42.1 | −5.8 | −9.0 | 12.5 | 0.1 | 2 W 12-1 | 39.5 | −4.5 | −6.3 | 11.0 | 0.22 | 705.7 | 6.2 | 711.9 | 1.85 | 131.7 | 0.972 |
| | | | | | | 2 W12-2 | 39.1 | −2.8 | −6.4 | 10.7 | 0.20 | | | | | | |
| 2 wv-12 sccm-3/4 | 37.8 | −4.1 | −7.7 | 10.0 | 0.3 | 2 W 12-3 | 41.2 | −1.4 | −8.2 | 12.0 | 0.23 | | | | | | |
| | | | | | | 2 W12-4 | 42.9 | −5.4 | −7.2 | 13.1 | 0.25 | | | | | | |

TABLE 7-continued

| | | | | | | | | | | | | | | | | |
|---|---|---|---|---|---|---|---|---|---|---|---|---|---|---|---|---|
| 2 wv-14 sccm-1/3 | 37.6 | −2.9 | −6.4 | 9.9 | 0.3 | 2 W 14-1 | 39.4 | −2.9 | −4.9 | 10.9 | 0.33 | 712.7 | 7.2 | 719.9 | 1.95 | 140.4 | 0.961 |
| | | | | | | 2 W14-3 | 39.6 | −3.4 | −4.5 | 11.0 | 0.27 | | | | | | |
| 2 wv-14 sccm-2/4 | 37.1 | −3.6 | −6.1 | 9.6 | 0.3 | 2 W14-2 | 40.1 | −1.2 | −5.7 | 11.3 | 0.38 | | | | | | |
| | | | | | | 2 W14-4 | 39.1 | −3.1 | −5.3 | 10.7 | 0.30 | | | | | | |
| 2 wv-16 sccm-1/3 | 41.6 | −1.3 | −7.2 | 12.2 | 0.7 | 2 W 16-1 | 43.4 | −0.8 | −5.9 | 13.4 | 0.63 | 716.5 | 8.9 | 725.4 | 2 | 145.1 | 0.956 |
| | | | | | | 2 W 16-3 | 41.2 | −0.7 | −3.5 | 12.0 | 0.63 | | | | | | |
| 2 wv-16 sccm-2/4 | 39.3 | −1.3 | −5.0 | 10.9 | 0.7 | 2 W 16-2 | 40.9 | −0.6 | −3.7 | 11.8 | 0.53 | | | | | | |
| | | | | | | 2 W 16-4 | 41.0 | −0.7 | −3.3 | 11.9 | 0.58 | | | | | | |

Table 8 depicts the inter-dependence between bulk resistance, electron mobility and electron carrier concentration. It is noted that there is a continuum of carrier concentration and mobility combinations that will yield a given bulk resistance.

TABLE 8

| Bulk Resistance | cc | mu | RI n | RI k |
|---|---|---|---|---|
| 160 | 1.15E+21 | 34.0 | 1.776 | 0.0145 |
| 160 | 6.88E+20 | 56.7 | 1.8845 | 0.0054 |
| 160 | 4.91E+20 | 79.4 | 1.9295 | 0.0031 |
| 140 | 1.31E+21 | 34.0 | 1.7349 | 0.0168 |
| 140 | 7.86E+20 | 56.7 | 1.8616 | 0.0062 |
| 140 | 5.61E+20 | 79.4 | 1.9135 | 0.0034 |
| 120 | 1.53E+21 | 34.0 | 1.6791 | 0.0202 |
| 120 | 9.17E+20 | 56.7 | 1.8306 | 0.0072 |
| 120 | 6.55E+20 | 79.4 | 1.892 | 0.0039 |

The electron carrier concentration is preferably greater than or equal to 40 $e^{20}$ electrons/cc, while the mobility is preferably greater than or equal to 25 cm^2/V-s. The carrier concentration and electron mobility, thickness and surface roughness presented herein are derived from ellipsometric analysis of the coatings. The electron concentration and mobility may vary from those determined using a Hall characterization method and one skilled in the art will recognize that an offset may exist between the measurement methods. As noted above there are a continuum of carrier concentrations and mobility values that can attain a given bulk resistance. In an embodiment where a low refractive index is preferred then tuning of the deposition process to yield a higher carrier concentration will be preferred. In other embodiments where a low absorption is preferred then tuning of the deposition process to yield higher electron mobility will be preferred. In other embodiments one may desire an intermediate level of both carrier concentration and mobility.

In at least one embodiment, an electro-optic element includes an improved ITO layer that simultaneously exhibits a reduced bulk resistance, reduced absorption, decreasing bending or warping of the associated substrate to which the ITO is applied, and maintaining a uniform darkness and brightness of the overall assembly, and reduces the weight thereof.

Surface topology, morphology or roughness is typically not important in non-microscale electrical applications dealing with metal coatings. The surface topology is of particular interest when metals are used in an optical application. When the surface roughness becomes too large the coating will have appreciable non-specular reflectivity or haze. This degree of roughness, in most applications, is often the first to be addressed because it can have a negative impact on visual appearance but not necessarily on functionality. In the case of optical applications, such as many described herein, the presence of objectionable haze is considered a worst case scenario. The surface roughness may have other negative consequences at roughness levels much less than those that result in objectionable haze. Surface roughness levels define acceptable morphologies for metal films to allow them to function adequately in different optical applications. A penalty associated with not adequately controlling the surface morphology is often increased cost since larger quantities of higher priced metals with higher reflectivity are often needed overcome the problems associated with improper surface morphology. The effects of different levels of morphology or surface roughness using thin film modeling techniques have been analyzed. These techniques are accepted in the art of thin film technologies and have been proven to accurately describe real thin film or coating systems and can therefore be used to predict the impact of different changes to a coating. This is advantageous because it may be expensive or time consuming to manufacture or fabricate the large number of samples needed to show the effects. In this case a commercial thin film program called TFCalc supplied by Software Spectra, Inc. was used to perform the calculations.

The roughness, as used herein, is defined in terms of mean peak-to-valley distance. The FIGS. 33A and 33B depict two different roughness scenarios. In FIG. 33A large crystallites 3302a are represented. In FIG. 33B small crystallites 3302b are represented. In both of these cases the peak-to-valley distance 3301a, 3301b is depicted to be the same. Additionally, both examples have the same void to bulk ratios. It should be understood that the valleys and peaks may not be at the same height. The mean peak-to-valley measurement, therefore, provides a more representative quantifying value.

When the layer is thin it may be approximated by a single homogeneous layer with a uniform refractive index. There are several ways to approximate the refractive index of a mixed layer. These are called effective medium approximations (EMA). Each different EMA has its strengths and weaknesses. In these examples a Bruggeman EMA methodology was employed. When the thickness of the layer becomes large the roughness is not approximated well if a single fixed refractive index is used. In these cases the roughness may be approximated as several slices of different ratios of void and bulk material to form a graded index approximation.

Several metals are modeled herein to provide representative examples of the optical effect of surface roughness on reflectance. Tables 6, 7 and 8 show the effect of roughness thickness on the reflectivity of the surface for Ag, Cr and Rh, respectively. The thickness of the layers is in nanometers and the Cap Y value represents the reflectance from the coated surface. The reflectivity drops off as the thickness of the roughness increases for each of these metals. Depending on the application, the amount of acceptable roughness will vary. The roughness should be less than 20 nm mean peak-to-valley, preferably less than 15 nm, even more preferably less than 10 nm and even more preferably less than 5 nm and most preferably less than 2.5 nm. These preferred ranges, as noted above, depend on the application. For instance, in one embodiment, the thickness of a flash layer, cover layer, barrier layer or adhesion layer (i.e., functional layer) may need to scale with the degree of roughness of the underlying surface. The thickness of the functional layer necessitated by the roughness of the underlying surface may result in undesirable effects such as changes in optical properties of the resultant stack, higher costs or other negative effects. Means to smooth the surfaces prior to deposition of the functional layers are described below. It should be noted that there may be some embodiments where increased surface roughness may be advantageous such as creating an effectively larger surface area for better adhesion to a seal material.

The tables 6, 7 and 8 also include a value labeled as "% of Theoretical Maximum". This metric defines how close the reflectance of a coating with a rough surface matches the reflectance of the ideal, perfectly smooth surface. A coating with a % of Theoretical Maximum value of 100% would have the maximum reflectance theoretically attainable for that material. If the % of Theoretical Maximum value was 85% then the reflectance attained would be only 85% of the value of the ideal smooth coating or reflectance of coating with zero roughness times 0.85.

The reflectance of a metal or alloy coating is dependent on many attributes of the coating even one that is relatively smooth. The density of the coating, presence or absence of internal voids, stress levels, etc all play a role in how the reflectance approaches some ideal maximum value. The theoretical maximum reflectance defined herein pertains not to this ideal reflectance of an ideal coating but rather to the reflectance value of a smooth real world coating. In practice the Theoretical Maximum value is obtained through a combination of optical analysis and thin film modeling. By analyzing a real world coating that has surface roughness using an optical technique such a Variable Angle Spectroscopic Ellipsometry the refractive index versus wavelength and surface roughness can be obtained. The refractive index versus wavelength can then be inputted into a thin film modeling program such as TFCalc or Essential Macleod and the reflectance can be calculated. This calculated reflectance using measured refractive index data is then the Theoretical Maximum reflectance value from that particular film or coating.

Preferably the reflectance of a coating is greater than 85% of the Theoretical Maximum, more preferably 90% of the Theoretical Maximum and most preferably greater than 95% of the Theoretical Maximum.

TABLE 9

Effect of roughness thickness on reflectivity of Ag coatings
Silver

| Bulk | Roughness | Cap Y | % of Theoretical Maximum |
|---|---|---|---|
| 350 | 0 | 98.5 | |
| 350 | 5 | 95.2 | 97% |
| 350 | 10 | 91.3 | 93% |
| 350 | 15 | 87.1 | 88% |
| 350 | 20 | 82.7 | 84% |
| 350 | 25 | 78.4 | 80% |
| 350 | 30 | 74.2 | 75% |
| 350 | 35 | 70.4 | 71% |
| 350 | 40 | 66.8 | 68% |
| 350 | 45 | 63.6 | 65% |

TABLE 9-continued

Effect of roughness thickness on reflectivity of Ag coatings
Silver

| Bulk | Roughness | Cap Y | % of Theoretical Maximum |
|---|---|---|---|
| 350 | 50 | 60.8 | 62% |
| 350 | 55 | 58.3 | 59% |
| 350 | 60 | 56.2 | 57% |

TABLE 10

Effect of roughness thickness on reflectivity of chrome coatings
Chrome

| Bulk | Roughness | Cap Y | % of Theoretical Maximum |
|---|---|---|---|
| 40 | 0 | 65.9 | |
| 40 | 5 | 64.6 | 98% |
| 40 | 10 | 62.2 | 94% |
| 40 | 15 | 59.0 | 89% |
| 40 | 20 | 55.2 | 84% |
| 40 | 25 | 51.3 | 78% |
| 40 | 30 | 47.7 | 72% |
| 40 | 35 | 44.5 | 68% |
| 40 | 40 | 41.9 | 64% |
| 40 | 45 | 39.8 | 60% |
| 40 | 50 | 38.3 | 58% |
| 40 | 55 | 37.2 | 56% |
| 40 | 60 | 36.5 | 55% |

TABLE 11

Effect of roughness thickness on reflectivity of rhodium coatings
Rhodium

| Bulk | Roughness | Cap Y | % of Theoretical Maximum |
|---|---|---|---|
| 40 | 0 | 76.9 | |
| 40 | 5 | 74.8 | 97% |
| 40 | 10 | 71.6 | 93% |
| 40 | 15 | 67.2 | 87% |
| 40 | 20 | 62.1 | 81% |
| 40 | 25 | 56.4 | 73% |
| 40 | 30 | 50.7 | 66% |
| 40 | 35 | 45.2 | 59% |
| 40 | 40 | 40.3 | 52% |
| 40 | 45 | 36.0 | 47% |
| 40 | 50 | 32.4 | 42% |
| 40 | 55 | 29.6 | 38% |
| 40 | 60 | 27.4 | 36% |

In some applications it is desirable to have high second surface reflectance where the reflectance is off of the metal layer when viewed through the glass. In this case buried void is of concern in addition to surface roughness. The amount of void (% relative to bulk) may vary and the thickness of the void layer may vary also. The general rules described above for surface roughness apply here as well.

Often times when metallic layers comprise low sheet resistance surface roughness is of particular concern. A metal or other electrically conductive material has an intrinsic property known as the bulk resistivity. The sheet resistance of the coating is determined by dividing the bulk resistance number by the thickness of the coating. In principle, any sheet resistance value can be obtained from any conductive material as long as the coating is thick enough.

The challenge or limitation in achieving low sheet resistance comes in when other attributes are required in addition to the sheet resistance or conductivity.

As the thickness of coatings is increased the surface roughness typically also increases which leads to a reduction in the specular reflectivity as described previously. Coatings which are very thick often have reflectivity levels significantly below those of a perfectly smooth surface. The amount of roughness a coating will develop is a function of a number of factors. The properties of the material itself are the major driving force but within boundaries the deposition process parameters (along with which deposition process is employed) can modify the surface properties of the coating.

Due to other considerations, the material with the best surface roughness cannot always be selected for a given application. Other factors also play a role. Adhesion and cost, for instance, are critical issues which influence the selection of materials which go into a coating stack. Often it is impossible to select a single material to meet all of the requirements; therefore, multilayer coatings are employed. Certain platinum group metals have high reflectivity such as Rhodium, Ruthenium, Iridium, etc but are very expensive. Therefore, an entire coating with a low sheet resistance produced with these materials would be cost prohibitive. When extreme adhesion to glass or other materials may be needed then these materials may also be found to have weaker bond strengths than other materials. Silver based coatings may have insufficient stability as an anode and depending on the coating stack may also be problematic from an adhesion standpoint. A metal such as chrome is relatively low in cost compared to some other metals and is known to have very good adhesion. Chrome may, therefore, function as an adhesion layer and may be built up to sufficient thickness to get the desired electrical properties.

Unfortunately, chrome is very reactive and this leads to an intrinsic predisposition to relatively large surface roughness values. The high reactivity is important in that as the coating is deposited, using Magnetron Sputter Vacuum Deposition (MSVD) for example, the chrome atoms will tend to stick where they first land. The rate of bond formation is very fast and this restricts the atom's ability to diffuse along the surface and find a low energy location. Typically, a low energy stable location on the coating is one that lends itself to less surface roughness. This tendency to not go to a low energy state also contributes to a degradation of the coating's bulk resistance. Therefore, a thicker layer is needed to attain the target sheet resistance and the surface roughness tends to further degrade. It is difficult to simultaneously attain the goal of low sheet resistance and high reflectivity because of these competing effects.

It is known that the reflectivity of a low reflectance metal may be increased by putting a thin layer of a higher reflectance metal above it. For instance, the previously mentioned metals such as Rhodium or Ruthenium may be used. The necessary thickness of these metals to attain a given reflectivity level will be a direct result of the surface roughness of the underlying chrome layer. Other metals that could be used as the conductive layer include, but are not limited to, aluminum, cadmium, chromium, cobalt, copper, gold, iridium, iron, magnesium, molybdenum, nickel, osmium, palladium, platinum, rhodium, ruthenium, silver, tin tungsten and zinc. Alloys of these metals with each other or with another metal or metals may be possible. The suitability of these materials in a given application will depend on the full list of requirements. For instance, Ruthenium may be an expensive metal in one application but in another application it may be low cost relative to another metal such as Rhodium and may therefore fall within the spirit of this invention. In other non-limiting embodiments a given metal or alloy may not be compatible with all of the other components in an application. In this case, the sensitive metal may be buried or otherwise isolated from components where there are interaction limitations. The layers deposited on top of the chrome usually will pattern the roughness of the underlying layer. Therefore, a thin layer of a higher reflectance metal will also not have its ideal reflectivity because of the layer or layers underneath it. In most instances the preferred embodiment is one that has the higher reflectance metal oriented toward the observer. Many of the high conductivity metals listed above also have high reflectivity. These metals may need to be alloyed with other metals to have adequate chemical, environmental or physical properties. The metals or alloys may then have an unacceptable color or hue. The overall reflectance intensity may be adequate for the desired application but if the reflected color does not meet requirements then the metal or alloy is unsuitable. In this case, similar to the description above, the metal or alloy may be buried beneath a layer with lower intrinsic reflectivity but one that has a more preferable reflected color.

Reference samples were prepared to allow evaluation of the trade-off between reflectance and sheet resistance for a chrome-ruthenium bi-layer coating stacks. In these samples chrome was applied to get a target sheet resistance value. The samples were then overcoated with Ruthenium of different thicknesses. The following process conditions were employed:

All of the coating were processed a 3.0 mTorr

Cr @ 4.0 Kw @ (130)=approx 1000 angstroms

Cr @ 4.0 Kw @ (130)×9=0.7 ohms squ.

Cr @ 4.0 Kw @ (130)×3=1.5 ohms.squ.

Cr @ 4.0 Kw @ (87)×1=3 ohms squ.

Cr @ 4.0 Kw @ (170)×1=6 ohms squ.

Ru @ 1.7 Kw @ (130)=400 angstroms

Ru @ 0.85 Kw @ (130)=200 angstroms

Ru @ 0.43 Kw @ (130)=100 angstroms

Ru @ 0.43 Kw @ (260)=50 angstroms

Ru @ 0.43 Kw @ (520)=25 angstroms

The chrome samples were all deposited at 4 kw. The line speed (in parenthesis—arbitrary units) and number of passes (e.g. ×9) were varied to adjust the thickness of the coating to hit sheet resistance targets. The ruthenium layers were produced with varying line speed and power to attain the target thickness levels. The results of the matrix are tabulated in Table 12. The reflectivity generally drops with increasing thickness and decreasing sheet resistance. Several samples prepared which target 3 ohm/sq do not fit the trends. This is because they were made a different line speed than the other chrome coatings. When the line speed is reduced the substrate moves at a slower speed. In a linear process this means that the initial nucleation layers are formed predominantly with sputtered high angle deposition materials. As noted in the description below, the high angle deposition results in inferior material properties. Shielding is often used to eliminate this high angle deposition. The 3 ohm/sq chrome case in this study is an excellent example of how the high angle can degrade the optical properties of the coating.

TABLE 12

Chrome Ruthenium bi-layer results

| Trial | | Ruthenium | Ohms | Y | a* | b* | Haze (Specular Excluded) |
|---|---|---|---|---|---|---|---|
| #1 | .7 | 0 | 0 | 0.6 | 50.0 | −0.9 | 0.0 | 0.13 |
| #2 | 1.5 | 0 | 0 | 1.5 | 55.3 | −0.7 | −0.2 | 0.04 |
| #3 | 3 | 0 | 0 | 2.9 | 54.4 | −0.5 | 0.5 | 0.02 |
| #6 | 6 | 0 | 0 | 5.1 | 60.9 | −0.9 | −0.2 | 0.02 |
| #1 | .7 | 25 | 25 | 0.6 | 50.7 | −0.9 | 1.0 | 0.11 |
| #2 | 1.5 | 25 | 25 | 1.6 | 54.2 | −0.6 | 0.8 | 0.03 |
| #3 | 3 | 25 | 25 | 3 | 53.0 | −0.5 | 1.1 | 0.02 |
| #4 | 6 | 25 | 25 | 5.9 | 58.8 | −0.7 | 1.0 | 0.02 |
| #1 | .7 | 50 | 50 | 0.6 | 51.0 | −0.9 | 1.6 | 0.12 |
| #2 | 1.5 | 50 | 50 | 1.5 | 55.0 | −0.6 | 1.2 | 0.03 |
| #3 | 3 | 50 | 50 | 2.9 | 54.1 | −0.5 | 1.2 | 0.03 |
| #6 | 6 | 50 | 50 | 5.6 | 59.6 | −0.6 | 1.2 | 0.02 |
| #1 | .7 | 100 | 100 | 0.6 | 52.7 | −0.7 | 2.4 | 0.13 |
| #2 | 1.5 | 100 | 100 | 1.5 | 56.6 | −0.5 | 1.6 | 0.04 |
| #3 | 3 | 100 | 100 | 2.8 | 56.7 | −0.4 | 1.3 | 0.03 |
| #6 | 6 | 100 | 100 | 5 | 62.5 | −0.4 | 1.2 | 0.02 |
| #1 | .7 | 200 | 200 | 0.5 | 54.7 | −0.2 | 2.7 | 0.14 |
| #2 | 1.5 | 200 | 200 | 1.4 | 60.1 | −0.1 | 1.6 | 0.04 |
| #3 | 3 | 200 | 200 | 2.5 | 63.1 | 0.0 | 1.3 | 0.03 |
| #6 | 6 | 200 | 200 | 4.2 | 67.4 | −0.1 | 0.9 | 0.03 |
| #1 | .7 | 400 | 400 | 0.6 | 56.5 | 0.2 | 2.6 | 0.15 |
| #2 | 1.5 | 400 | 400 | 1.3 | 64.1 | 0.1 | 1.4 | 0.05 |
| #3 | 3 | 400 | 400 | 2 | 67.5 | 0.0 | 1.2 | 0.03 |
| #6 | 6 | 400 | 400 | 3 | 69.8 | −0.1 | 0.8 | 0.03 |

As can be seen from Table 12, the chrome coating alone has relatively low reflectance values even at the 6 ohm/sq case. The reflectance was only about 61% for this sample. Chrome produced by other means or process conditions should be able to attain values in excess of 65%. Therefore, even at this modest sheet resistance value the chrome reflectance has been compromised.

When a 3 ohm/sq coating is desired, 100 and 200 angstroms of ruthenium on top of the chrome is needed to attain even modest reflectance values. Ideally, a ruthenium coating should be able to attain a reflectance in excess of 72%. Even 400 angstroms on top of the 6 ohm/sq chrome fall short of the theoretical optimum by 2%. The lower ohm samples do not even come close to approaching the theoretically attainable reflectance values. Therefore, in cases where both low sheet resistance and high reflectance are needed a standard chrome-ruthenium bi-layer does not meet the requirements. Other means must be employed to solve this problem.

Deposition process parameters can be adjusted to minimize the surface roughness during the formation of the coating. In the case of metals, the surface roughness can be reduced and the reflectivity increased by running the process at low pressure and preferably using neon or an argon-neon mixture as the sputtering gas as described in detail below. These parameters contribute to proper momentum and energy transfer in the deposition process with the result in less rough surfaces and lower bulk resistivities.

Table 13 depicts how the surface roughness, reflectivity and electrical properties vary as the process parameters are adjusted. The 3 mT case is provided as a reference. The thickness of the coating is about 600 angstroms. This thickness is important because the coating is nearly opaque at this level and the sheet resistance is relatively low. As can be seen, lowering the pressure reduces the roughness by about 17% and almost a 2% increase in reflectance is achieved. Lowering the pressure and sputtering with a 50:50 mixture of argon and neon results in further improvements. The roughness is about 20% lower than the reference case and the reflectance is about 2.7% higher. The last case is with even higher amounts of neon—approximately 70% of the sputtering gas is neon. Reflectance is about 3.5% higher than in the reference case and the roughness is reduced by about 24%. Thickness and roughness values are determined by using variable angle spectroscopic ellipsometry.

TABLE 13

Chrome properties versus process settings
Chrome

| Process Conditions | Thickness Angstroms | Roughness Angstroms | Sheet Resistance Ohms/sq | Bulk Resistance Micro-ohm cm | Reflectance % |
|---|---|---|---|---|---|
| 3 mT Chrome 100% Ar | 484 | 101 | 13.5 | 79 | 59.6 |
| 2 mT Chrome 100% Ar | 494 | 84 | 12.6 | 72.8 | 61.7 |
| 2 mT Chrome 50:50 Ar:Ne | 507 | 81 | 11 | 64.7 | 62.3 |
| 2 mT Chrome 10:24 Ar:Ne | 506 | 77 | 11.3 | 65.9 | 63.1 |

Results can be further improved by lowering the pressure and by increasing the neon content in the sputtering gas. In addition, increasing the substrate temperature also contributes to smoother coatings. Higher substrate temperature results in more surface mobility of the deposited atoms leading to a smoother surface.

Table 13 also includes bulk resistance values for the chrome coatings. The theoretical minimum bulk resistance value for chrome is about 13 micro ohm cm. The reference case made at a typical pressure of 3 mT in argon has a bulk resistance value of more than 6 times the theoretical bulk resistance. By improving the deposition properties bulk resistance values of less than 5 times the theoretical minimum may be obtained. Preferably, the bulk resistance is less than 5 times the theoretical minimum, more preferably less than 4 times the theoretical minimum, more preferably less than 3 times the theoretical minimum and most preferably less than 2 times the theoretical minimum.

The presence of oxygen (or water) in the system can be particularly harmful from a surface roughness perspective. Chrome is very reactive with oxygen and tends to react immediately. This leads to additional roughness in the coating. Therefore, a coating with less oxygen is recommended. Table 14 depicts the effect of oxygen on roughness. The oxygen level in Table 14 refers to the percentage in the sputtering gas. The pressure is in mT and the thickness is in angstroms. The amount of acceptable oxygen in the coating is less than 5 atomic percent, preferable less than 2 atomic percent and ideally less than 1 atomic percent.

TABLE 14

The effect of oxygen percentage in the sputtering atmosphere on the roughness of chrome coatings

| Oxygen level | pressure | thickness | Roughness |
|---|---|---|---|
| 1 | 2.00 | 493 | 105 |
| 5 | 2.00 | 438 | 130 |
| 10 | 2.00 | 370 | 162 |

The amount of acceptable roughness is dependent on the application. When high reflectance values are desired less roughness is also desirable. Where reflectance requirements are not as stringent more roughness may be acceptable. Generally, roughness should be less than about 200 angstroms, preferable less than 100 angstroms, even more preferably less than 50 angstroms, even more preferably less than 25 angstroms and most preferably less than 15 angstroms. Roughness as the term is used herein refers to the average peak-to-valley distance as determined using ellipsometry or atomic force microscopy.

Other means may be used either alone or together with each other or the previously mentioned methods to minimize surface roughness. For example, the cathode may be shielded to minimize the grazing (high) angle deposition. Other methods to get smoother surfaces include the use of ion assisted sputtering or ion assisted deposition, plasma assisted sputtering and other means to increase surface mobility of atoms. The cathode type may be selected to facilitate smoother coatings, such as, use of "twin mags", unbalance magnetrons, RF superimposed DC power, microwave assisted sputtering, high power pulse deposition, AC sputtering or other such means.

Although chrome was used in the examples above as the conductive layer, other metals, alloys or multilayer coating materials as described herein and within the references incorporated herein may be used within the spirit of the invention. Other materials may need other process conditions to attain smooth surfaces. ITO for instance does not necessarily have smooth surfaces under conditions which are preferred for metals. In the case of ITO, the surface morphology is modified by a number of process variables. The case of controlling the surface properties of ITO are even more challenging than that of a metal. ITO is not always conductive like a metal and some process settings which may result in a smooth coating for a metal may not result in a highly conductive coating with ITO. Therefore, controlling the morphology in light of other properties of the material is quite challenging. In general, for high temperature coatings on glass or other vitreous substrates, relatively smooth coatings may be obtained at high pressures and relatively high oxygen settings as describe earlier in this document. Variation in process parameters to smooth a coating can be applied to other materials as well such as $TiO_2$ or multi-layers such as $TiO_2$ and ITO taught in transflective coating applications.

As noted above, the roughness generally increases with the thickness of the coatings. Often the process settings described above are insufficient to result in coatings with an acceptable roughness level. This is the case where extremely low sheet resistance values are needed. In this scenario alternate means are needed to attain coatings with relatively low surface roughness that simultaneously have low sheet resistance values.

Figure 37:
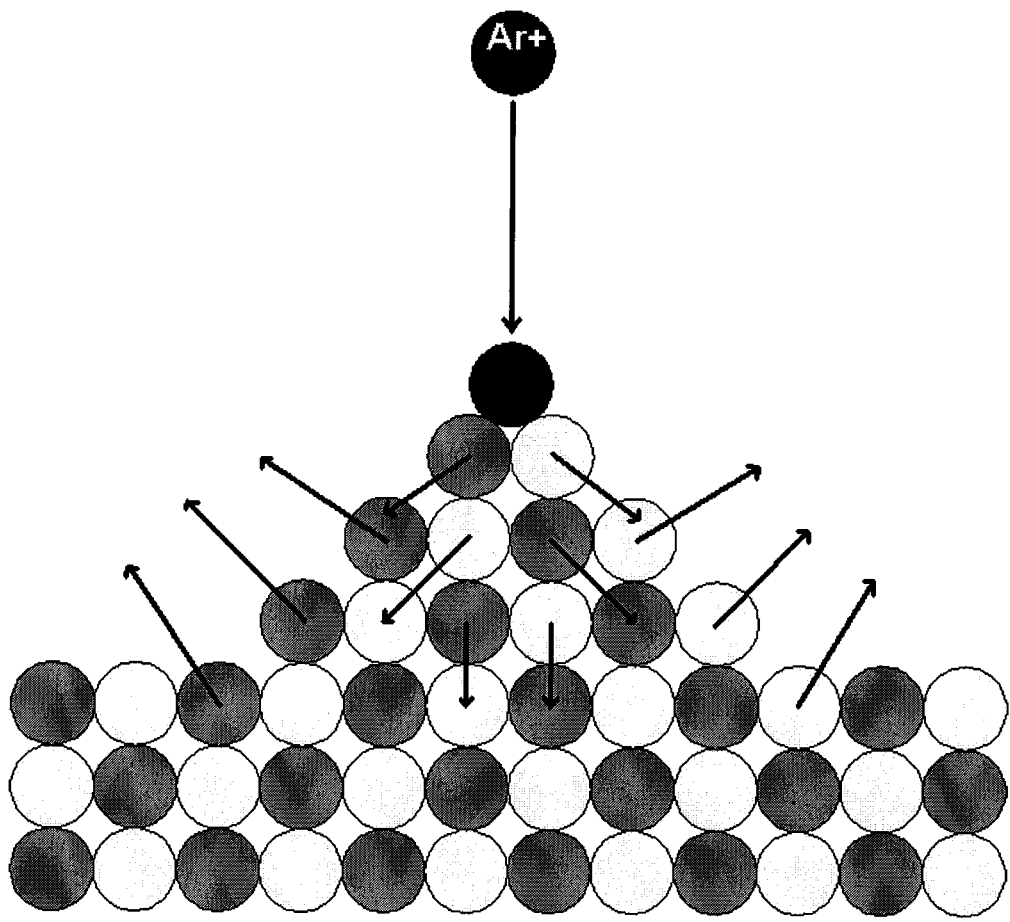

In commonly assigned U.S. Patent Application Publication No. 2006/0056003, the entire disclosure of which is incorporated herein by reference, an ion beam is introduced as a means to thin a coating in a local area on a coated substrate. As discussed at length herein, an ion beam may also be used to smooth (as depicted in FIGS. 33A and 33B) a rough coating (as depicted in FIG. 37). An ion beam may be used either alone or in conjunction with other methods taught herein to reduce the roughness of a coating and thus increase the reflectivity. Ion beam sources vary in design and function. For the purpose of this discussion, any design capable of delivering fluxes of ions at the energy ranges described herein are suitable.

An ion beam is a relatively collimated group of energetic positive or negative ions. The energy of the ions is a function of the operating potential of the ion beam. The current, or flux of ions, is a function of the operating potential and the amount of gas fed through the beam and the back ground pressure in the chamber. Sufficient energy for the ions is desirable to etch, mill away and/or smooth the coating material. An example of a related phenomenon is that of billiards. Consider the incoming ion as the cue ball and the coating as the rack of balls at the start of the game. If the cue ball is shot at the rack with very low energy then the rack does not break apart. Conversely, if the cue ball is shot with high energy then the rack can be broken apart quite violently.

Figure 34:
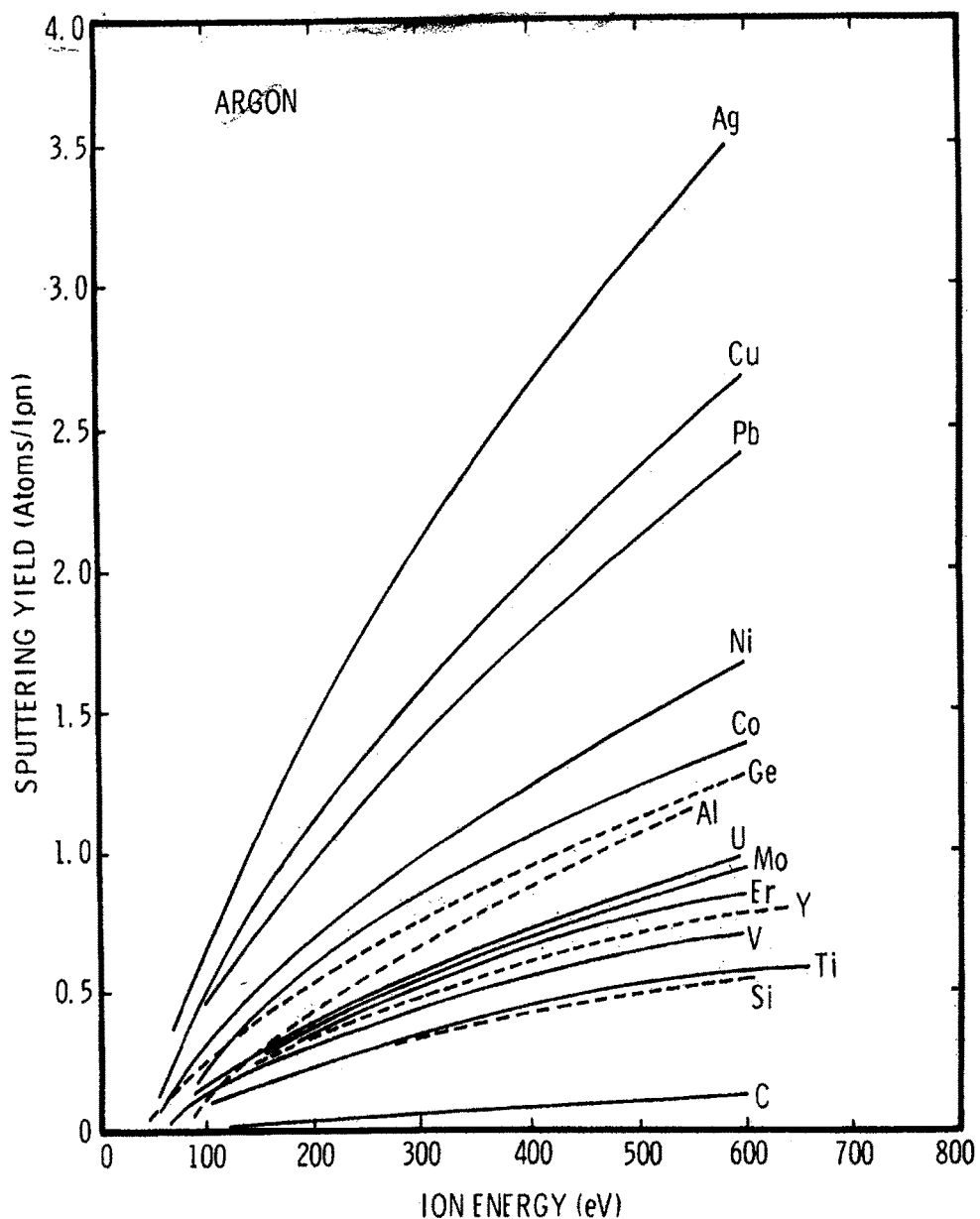
FIG. 34 depicts a graph of sputtering yield vs. ion energy for various thin film materials.
Figure 35:
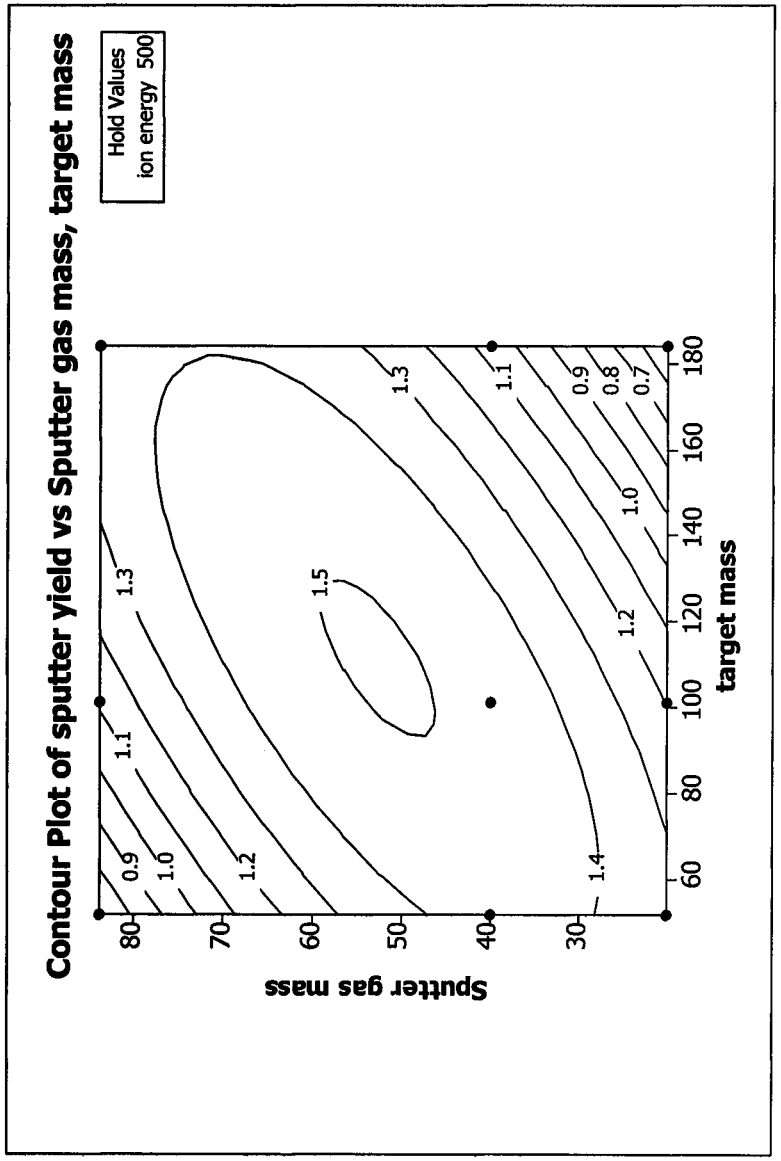
FIG. 35 depicts a graph of sputter yield vs. sputter gas mass/target mass.

FIG. 34 depicts sputtering yield as a function of argon ion energy for various materials. There is a threshold energy whereby no or minimal sputtering occurs. As the energy is increased the sputtering yield increases. The ionized atom may also affect the sputtering rate. The preferred mass of sputtering ion to have the maximum sputtering yield will vary with the energy of the sputtering ion and the mass of the atoms to be sputtered. FIG. 35 depicts sputtering yield as a function of sputtering ion and sputtered atom mass at 500 eV ion energy. The data depicted in FIG. 35 was generated using a computer simulation program called "Stopping and Range of Ions in Matter (SRIM)". As depicted there is a range of optimal sputter gas ion masses which will produce acceptable sputtering yields for a given target atomic mass. In general, as the beam energy is increased the optimal mass of ions increases to maximize the sputter yield. To some extent, the preferred ion will be dependent on the mass of the sputtering atom. For optimal energy and momentum, transfer of the atoms should be of relatively comparable mass. FIG. 34 depicts that the threshold energy is dependent on the sputtered material. Some materials take more energy to release than others. The graph of FIG. 34 also depicts that at relatively high energy of the ion the sputtering yields tend to plateau. At these relatively high energies, the process starts to move into the region of ion implantation rather than ion sputtering. For efficient sputtering or etching, the ion energy should be above 100 electron volts, preferably above 500 electron volts and most preferably above 1000 electron volts.

Figure 36:
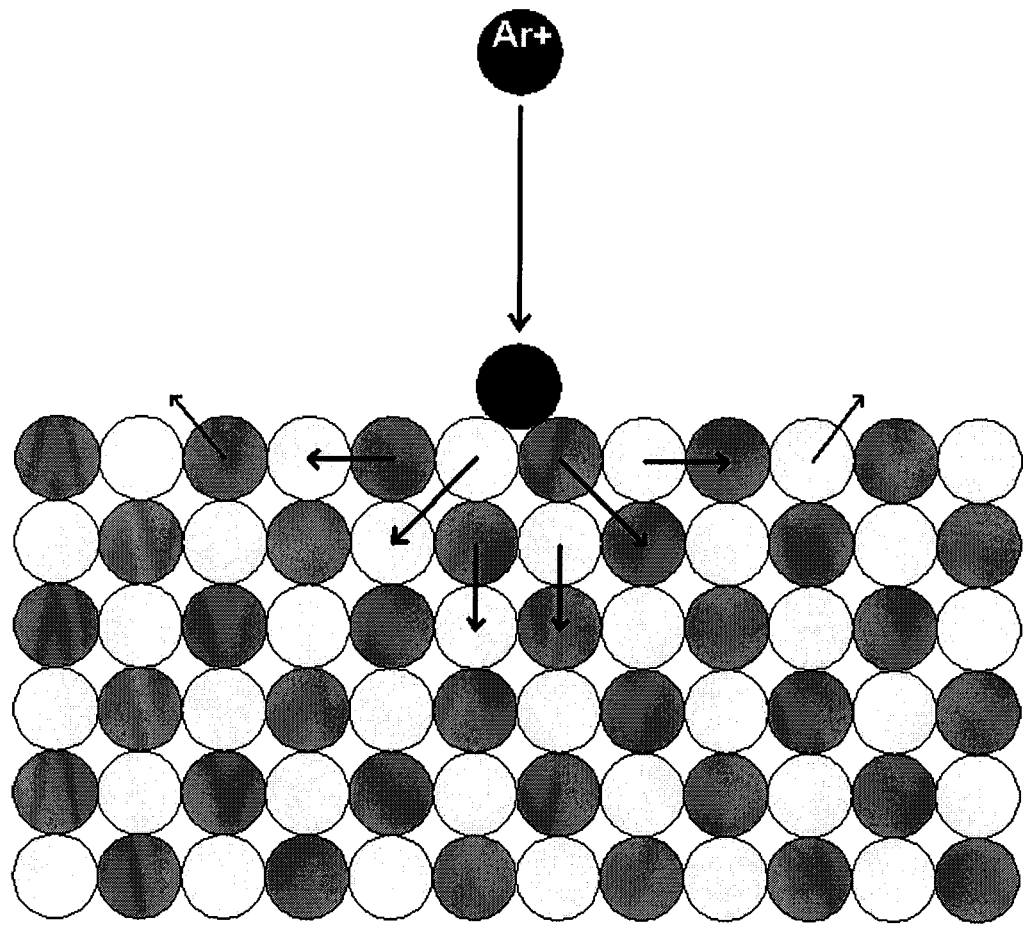
FIGS. 36 and 37 depict enlarged ion-milling results.

The smoothing effect is illustrated with reference to FIGS. 36 and 37. In FIG. 36 an ion is impinging on a smooth surface. When the ion hits the surface, energy is transferred both parallel and perpendicular to the surface. Some of the energy which is transferred parallel to the surface may result in a component perpendicular and away from the surface which results in an ejected atom. In FIG. 37 the same ion impinges on a rough surface. As can be appreciated, it is much more likely that an ion is ejected from the coating. The majority of the energy which is directed perpendicular to the surface may result in ejection of an atom; there is more surface area and are more directions which can release an atom. As the ion milling process continues, the coating becomes more and more smooth. In these and other examples the ion beam is consisting of a single atom. In practice clusters of ions/atoms may be employed in lieu of single ions. Known methods to produce clusters may be employed in this situation also.

In a similar fashion, an ion beam impinging on the surface at an angle may have a substantially higher sputtering efficiency and smoothing effect. In this case the angled ion beam would have a high probability of ejecting material laterally to the coating surface.

As noted below the reflectance, transmittance, absorption and sheet resistance properties of a particular transflective coating were limited by roughness in the layers. One relevant coating is Glass/ITO/Si/Ru herein referred to as "Option 4". The ITO is optimally a ¾ or ⅝ wave coating, 2100 or 3600 angstroms, respectively. The Si layer is about 220 angstroms and the Ruthenium layer is about 70 angstroms. Also as discussed below different variants of this stack are possible. The reflectance and transmittance of this stack is very dependent on the surface and interface roughness. When multi-layer stacks such as option 4 are considered that consist of dielectric, semiconducting layers, transparent conduction oxides and metals then the interface roughness must be considered as well as the roughness of the surface.

Table 15 depicts the effect of ion milling the surface of ITO—one of the lower layers used in Option 4 stacks. The data was determined by using ellipsometry to characterize the coatings. Table 15 also depicts the initial properties of the ITO coating. The initial roughness for the ¾ and ⅝ wave coatings are 7.4 and 11.5 nm, respectively. These values are relatively high. The samples were ion milled with a single beam (38 cm long beam) running at 270 mA current and 3000 volts with argon feed at 20 sccm and the operating pressure in the chamber was 2.5 mT. The ion beam is a closed drift Hall-effect anode layer type design. The line speed for the 2B (two beam equivalent at 30 ipm) case was 15 ipm and the line speed for the 4B (four beam equivalent at 30 ipm) was 7.5 ipm. The beam was oriented perpendicular to the surface of the coated glass. The ion beam removed about 17 nm/beam equivalent at 30 ipm for the ¾ wave ITO and about 11.1 nm/beam equivalent at 30 ipm. The surface roughness drops dramatically in both cases with the ¾ wave ITO getting nearly perfectly smooth. The ⅝ wave ITO did not get as smooth, however, because it started from a much more rough initial state it may require a slower line speed or additional beams to attain the minimal roughness values.

TABLE 15

Ion milled ITO properties
Ion Milling Data

| | Thickness (nm) | | | nm/Beam Removed | (Ohms/sq) Average Sheet Resistance | (Micro ohm cm) Bulk Resistance |
| --- | --- | --- | --- | --- | --- | --- |
| | Bulk | Roughness | Total | | | |
| 3/4 wave ITO | 233.0 | 7.4 | 240.4 | | 5.9 | 141.0 |
| 3/4 wave ITO 2 beam | 203.0 | 1.4 | 204.4 | 18.0 | 6.4 | 130.3 |
| 3/4 wave ITO 4 beam | 177.2 | 0.2 | 177.4 | 15.8 | 6.8 | 121.0 |
| 5/4 wave ITO | 369.0 | 11.5 | 380.5 | | 4.0 | 150.3 |
| 5/4 wave ITO 2 beam | 351.0 | 7.1 | 358.1 | 11.2 | 4.2 | 149.5 |
| 5/4 wave ITO 4 beam | 331.1 | 4.9 | 336.0 | 11.1 | 4.4 | 147.8 |

The key demonstration is the substantial increase in reflectance with the ion milling process. In Table 16a the ITO coatings described in Table 15 are overcoated with approximately 22 nm of Si and 7 nm of Ru. The transmittance generally decreases with ion milling due to the higher reflectance of these coatings. More importantly the absorption of the ion milled ITO samples is appreciably lower. This results in higher light output of associated light sources through the coating at the same reflectivity level. The differences are much more significant when all of these coatings are normalized to the same reflectance level. In order to attain the same reflectance levels for the non-ion milled parts the thickness of the Ruthenium layer is substantially increased. This, in turn, further reduces the transmittance and increases the absorption which is undesirable in some applications.

These coated lites, as tabulated in Table 16a, were incorporated into electro-optic mirror elements, as tabulated in Table 16b, to evaluate the optics in an actual EC element. A number of 2"×5" cells were made and the transmittance and reflectance (specular and non-specular) were measured. The increase in reflectance of the assembled elements correlates with the results observed in the singles data. The transmitted color is very amber biased even though the reflected color is quite neutral. This implies that this design, due to its unique materials of construction, transmits more red light than blue light. This can be of particular advantage when a red display, for example is positioned behind the mirror element.

Table 16b also depicts the specular excluded reflectance (Spec Ex) data for the sample elements. Ion milling smoothes the surface which substantially reduces the scattered light. The resultant image is much clearer and crisp due to the lower amount of scattered light.

Many automotive companies have specifications dictating that the reflectance must be above 55% for an outside mirror application. The non-ion milled samples did not meet this specification with the initial amount of roughness on the ITO. The ion milled samples, even the ⅝ wave ITO parts, meet the specification. The switching speed of a mirror element, particularly the darkening speed, is dependent on the sheet resistance of the coatings. By enabling the use of a ⅚ wave ITO or thicker, the ion beam milling allows for faster switching times while simultaneously meeting the reflectance requirements. Also, some of the ¾ wave elements have reflectance values that significantly exceed the minimum requirement. These coatings may be adjusted to have higher transmittance values by decreasing the thickness of the Ruthenium or other high reflectance metal used as the top layer when overall design requirements benefit from this change. Without the ion beam smoothing method the useful range of reflectance and transmittance options would be limited.

TABLE 16a

Option 4 - Single Lite of Glass Results

| Trial | Reflectance | | | Transmittance | | | Absorption |
|---|---|---|---|---|---|---|---|
| | Y | a* | b* | Y | a* | b* | Y |
| 3/4 wave ITO @ 3 mT Pressure | 66.3 | 0.6 | 0.8 | 9.9 | 2.3 | 19.6 | 23.9 |
| 3/4 wave ITO @ 3 mT Pressure and 2 beam equivalent | 69.3 | 1.0 | 1.1 | 8.4 | 1.4 | 19.2 | 22.3 |
| 3/4 wave ITO @ 3 mT Pressure and 4 beam equivalent | 70.8 | 0.7 | 2.2 | 8.1 | 1.0 | 17.1 | 21.2 |
| 3/4 wave ITO @ 1.7 mT Pressure | 67.7 | 0.6 | 1.2 | 8.7 | 2.8 | 20.1 | 23.7 |
| 3/4 wave ITO @ 1.7 mT Pressure and 2 beam equivalent | 70.0 | 1.1 | 1.4 | 7.7 | 1.9 | 19.6 | 22.3 |
| 3/4 wave ITO @ 1.7 mT Pressure and 4 beam equivalent | 71.1 | 0.9 | 2.3 | 7.5 | 1.4 | 17.3 | 21.3 |
| 5/4 wave ITO @ 3 mT Pressure | 62.9 | −1.3 | 2.0 | 10.5 | 4.9 | 16.0 | 26.6 |
| 5/4 wave ITO @ 3 mT Pressure and 2 beam equivalent | 65.7 | 1.0 | 1.5 | 8.9 | 1.5 | 17.9 | 25.4 |
| 5/4 wave ITO @ 3 mT Pressure and 4 beam equivalent | 68.4 | 0.8 | 1.5 | 8.1 | 0.5 | 17.9 | 23.4 |
| 5/4 wave ITO @ 1.7 mT Pressure | 64.2 | −1.2 | 2.4 | 9.4 | 5.2 | 16.6 | 26.5 |
| 5/4 wave ITO @ 1.7 mT Pressure and 2 beam equivalent | 66.4 | 1.0 | 1.9 | 8.2 | 1.9 | 18.3 | 25.5 |
| 5/4 wave ITO @ 1.7 mT Pressure and 4 beam equivalent | 69.2 | 1.1 | 1.8 | 7.2 | 1.0 | 18.4 | 23.5 |

TABLE 16b

Cell data comparing ion milled parts properties

| Sample ID | Reflectance | a* | b* | Transmittance | a* | b* | Spec Ex |
|---|---|---|---|---|---|---|---|
| 3/4 wave | 54.2 | −1.5 | 2.3 | 11.5 | 2.9 | 21.7 | 0.7 |
| 3/4 wave 2B | 57.6 | −0.2 | 3.1 | 10.4 | 0.9 | 21.6 | 0.2 |
| 3/4 wave 4B | 59.3 | −0.7 | 4.4 | 10.0 | 1.0 | 19.1 | 0.3 |
| 3/4 wave 4B | 58.5 | −0.4 | 3.6 | 10.3 | 0.7 | 20.5 | 0.3 |
| 5/4 wave | 50.1 | −2.0 | 4.0 | 10.8 | 3.9 | 18.2 | 1.1 |
| 5/4 wave 2B | 52.9 | −0.6 | 3.6 | 11.0 | 2.1 | 19.8 | 0.8 |
| 5/4 wave 2B | 52.1 | −0.6 | 3.6 | 11.5 | 2.0 | 19.7 | 0.8 |
| 5/4 wave 4B | 55.6 | −0.3 | 3.9 | 10.0 | 0.1 | 20.4 | 0.5 |
| 5/4 wave 4B | 55.3 | 0.0 | 3.2 | 10.2 | 0.6 | 20.8 | 0.6 |

Figure 38:
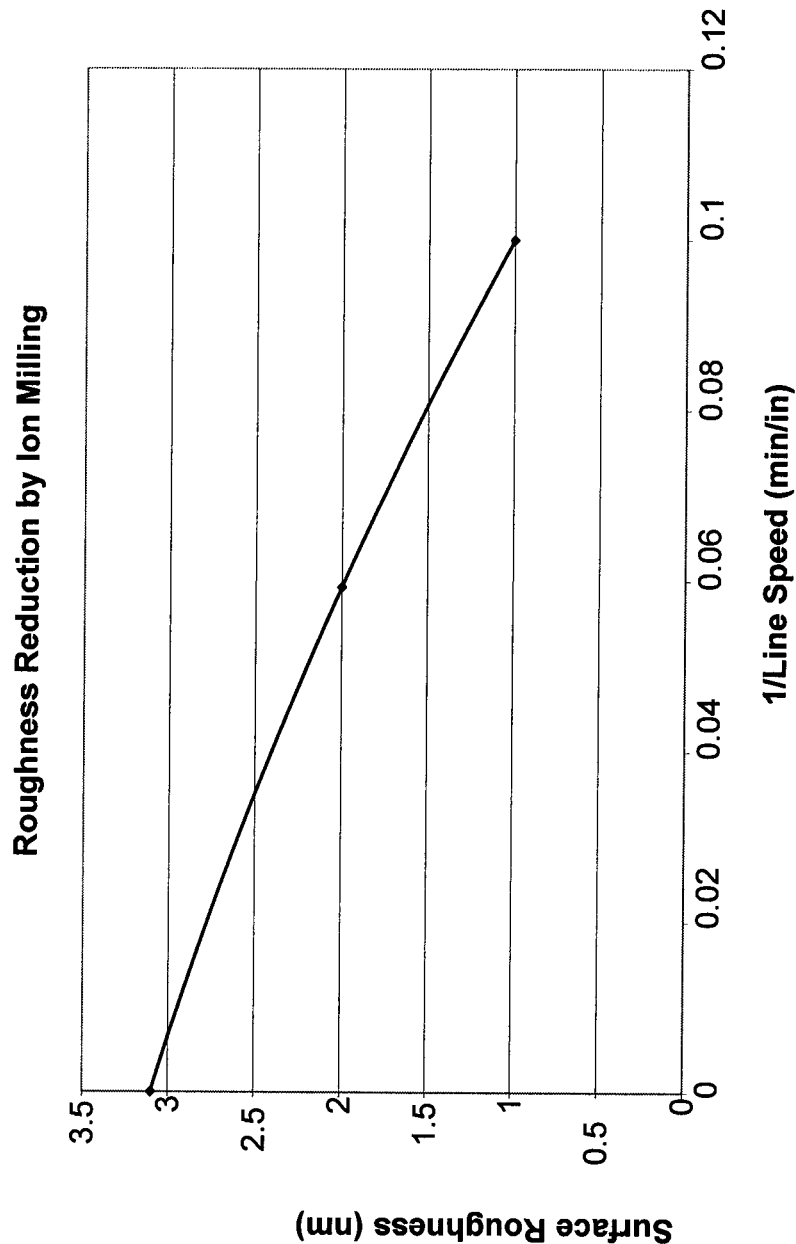
FIG. 38 depicts a graph of thin film surface roughness v. inverse of line speed.
Figure 39:
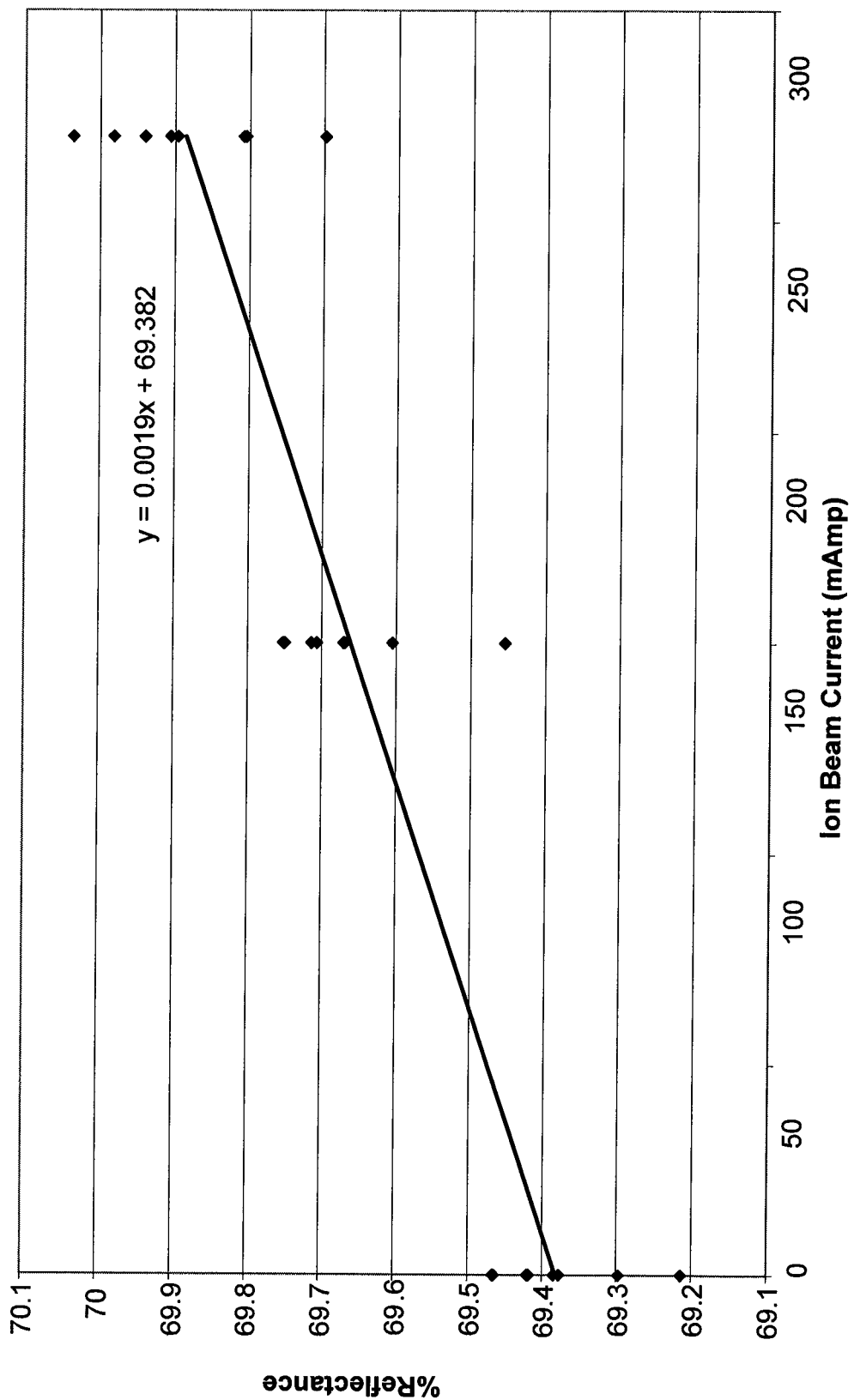
FIG. 39 depicts a graph of thin film reflectance vs. ion beam current.

In another application, use of ion milling to smooth an ITO for a non-transflective application was performed. In this case, the coating is Glass/ITO/Cr/Ru. The chrome and ruthenium are masked internal to the epoxy seal and the ITO is used to transfer electric current from the electrodes to the EC element interior. The ITO has some degree of roughness which is reduced by treatment with an ion beam. FIG. 38 shows decreased roughness with inverse line speed at fixed beam current. In another example the line speed for the glass through the coater was 30 inches per minute (ipm). A single ion beam was used and the current was adjusted to vary the ion milling rate. FIG. 39 depicts the increase in reflectance versus beam current. A reflectance increase of 0.5% is attained with even this modest ion milling condition. In these examples the ITO coating maintained its initial roughness to potentially facilitate increased adhesion of the ITO to the epoxy in the area of the seal while milling the ITO in the viewing area to attain improved optical properties.

Figure 40:
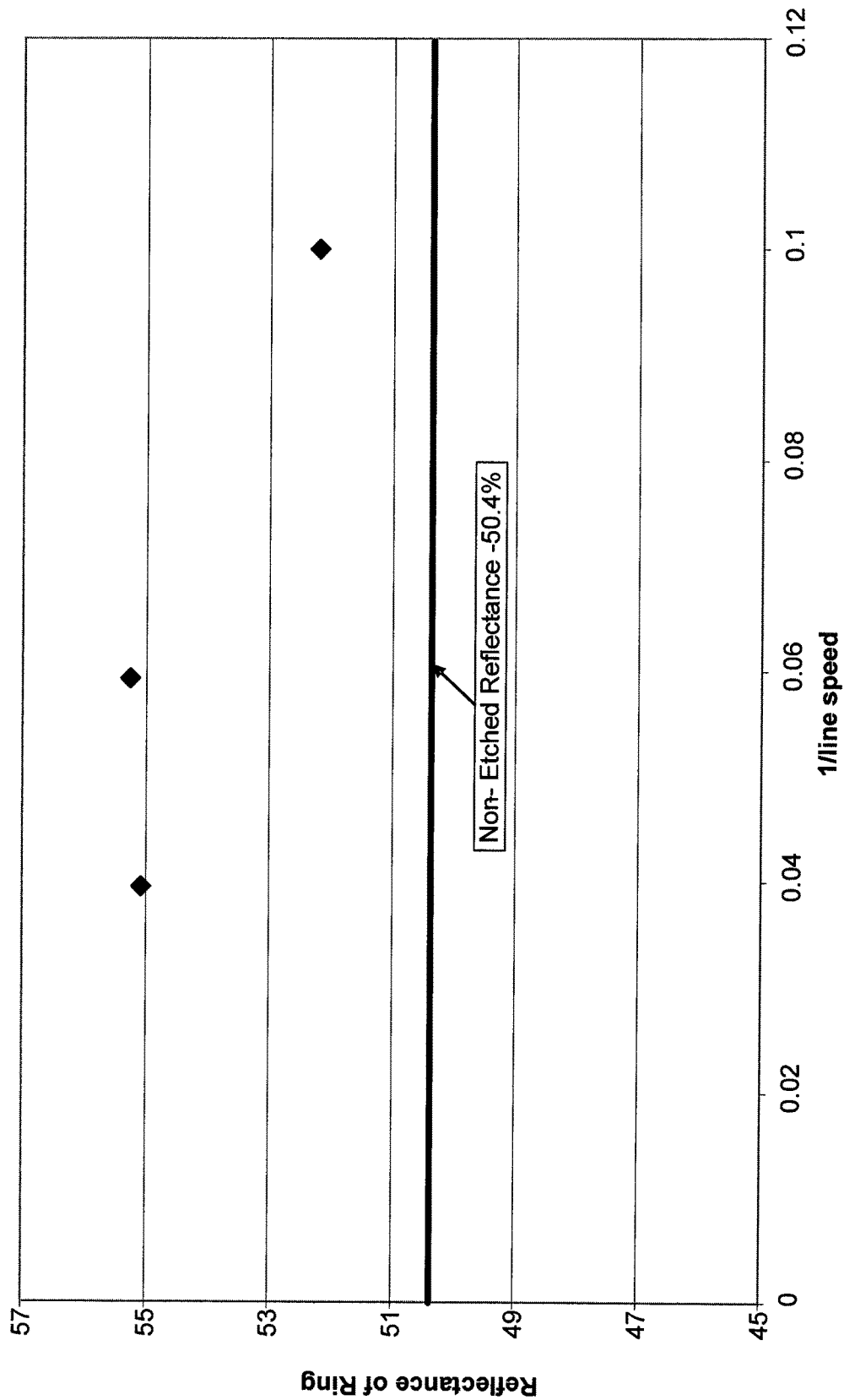
FIG. 40 depicts a graph of thin film reflectance vs. inverse of line speed.

In another application using the ion milling the color and reflectance of a so-called chrome ring type coating was investigated. In this application a multi-layer metal coating is applied on top of an ITO coating that is on glass. The ITO coated glass was ion etched in a ring around an element to thin the ITO coating in this location to improve the color and reflectance of the chrome ring stack while enabling lower sheet resistance of the thicker ITO in the center of the part. FIG. 40 depicts the reflectance of different conditions when viewed through the glass. The reflectance without ion milling is depicted as the bold line. The reflectance with several different line speeds are also depicted. As the speed is reduced, the residence time under the beam is increased and the roughness is reduced. This results in an increase in reflectance. The reflectance appears to plateau, however, there was some arcing of the beam during these tests which may have affected the results. The key result is that with ion milling, even in the presence of arcing, the reflectance is increased. FIG. 38 depicts the change in ITO roughness in these tests versus line speed under conditions without arcing.

Figure 41:
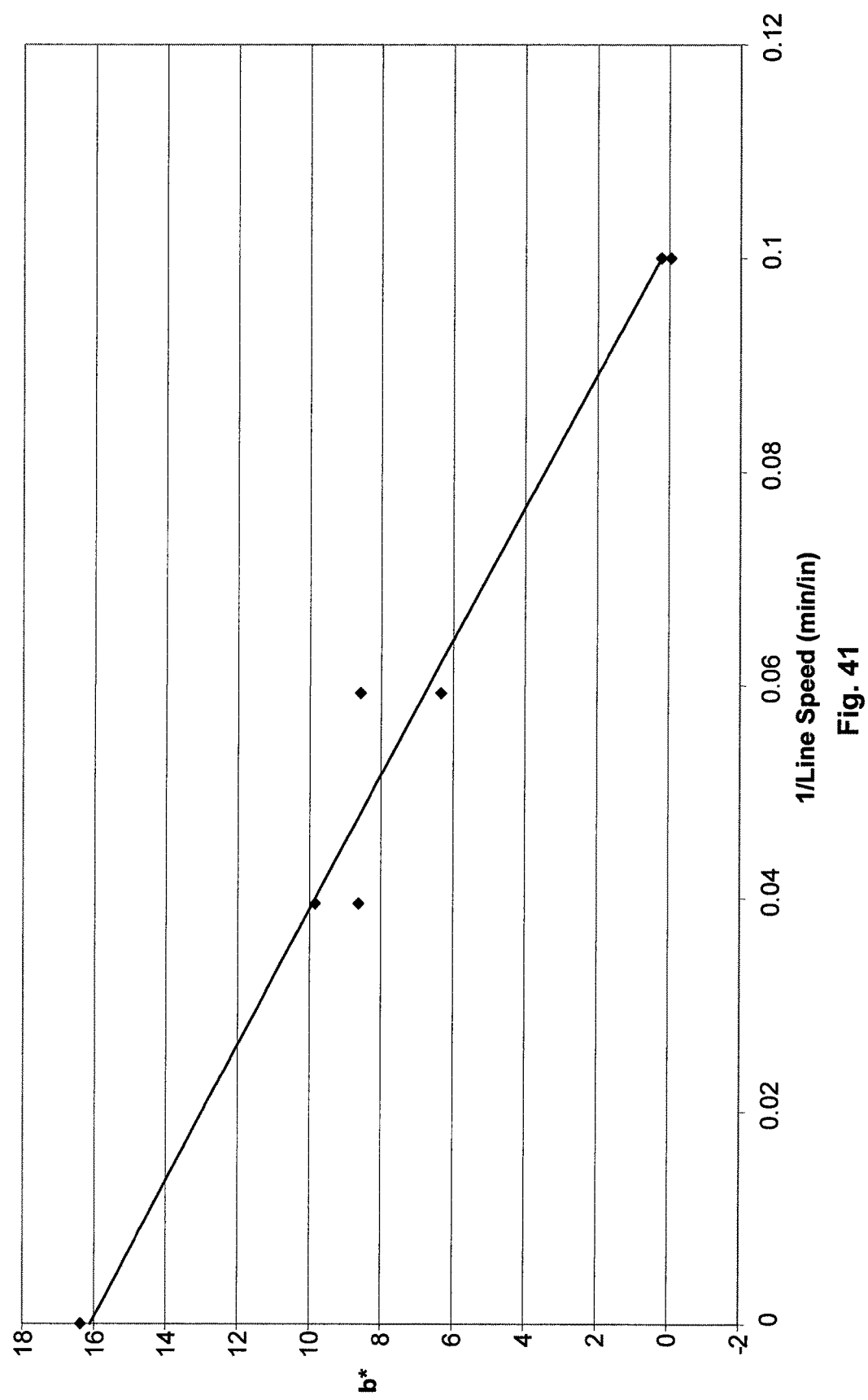
FIG. 41 depicts a graph of thin film b* vs. inverse of line speed.

Another set of tests in the same coater examined the color of the chrome ring with ion milling. The line speed was adjusted to alter the amount of ITO removed. The ITO started as a ½ wave and the goal was to reduce the thickness to approximately 80% of a ½ wave in other words from approximately 145 nm to approximately 115 nm. FIG. 41 depicts the reflected b* of the chrome ring with line speed adjustments. The reflected b* is directly correlated with the thickness of the ITO as described in the priority document incorporated herein by reference. The b* for a ½ wave ITO coating is about 16. As the line speed is lowered, the amount of etched material is reduced. In at least one embodiment an ideal match to the center viewing area a b* of about 2.5 is desired. Therefore, the line speed should be about 12.5 ipm. When faster line speeds are required then more ion beams may be employed.

In another example where reduced sheet resistance values are desired the effect of ion milling on reflectance and material usage was investigated. As noted above, the roughness of a coating increases with thickness and the reflectance decreases with roughness. In this example, a coating with 1.5 ohms/sq with a layer structure of Glass/Chrome/Ruthenium was desired. The chrome thickness was set to approximately 2500 angstroms to provide the majority of the contribution to the sheet resistance. The Ruthenium was initially set to 400 angstroms. In situations where the surfaces are perfectly smooth, the maximum reflectance will be attained with as little as 180 to 200 angstroms of Ruthenium. A level of 400 angstroms was used to ensure that the Ruthenium was thick enough to compensate somewhat for the rough surface of the chrome. The additional Ruthenium increases the reflectance but the cost also increases.

Figure 42:
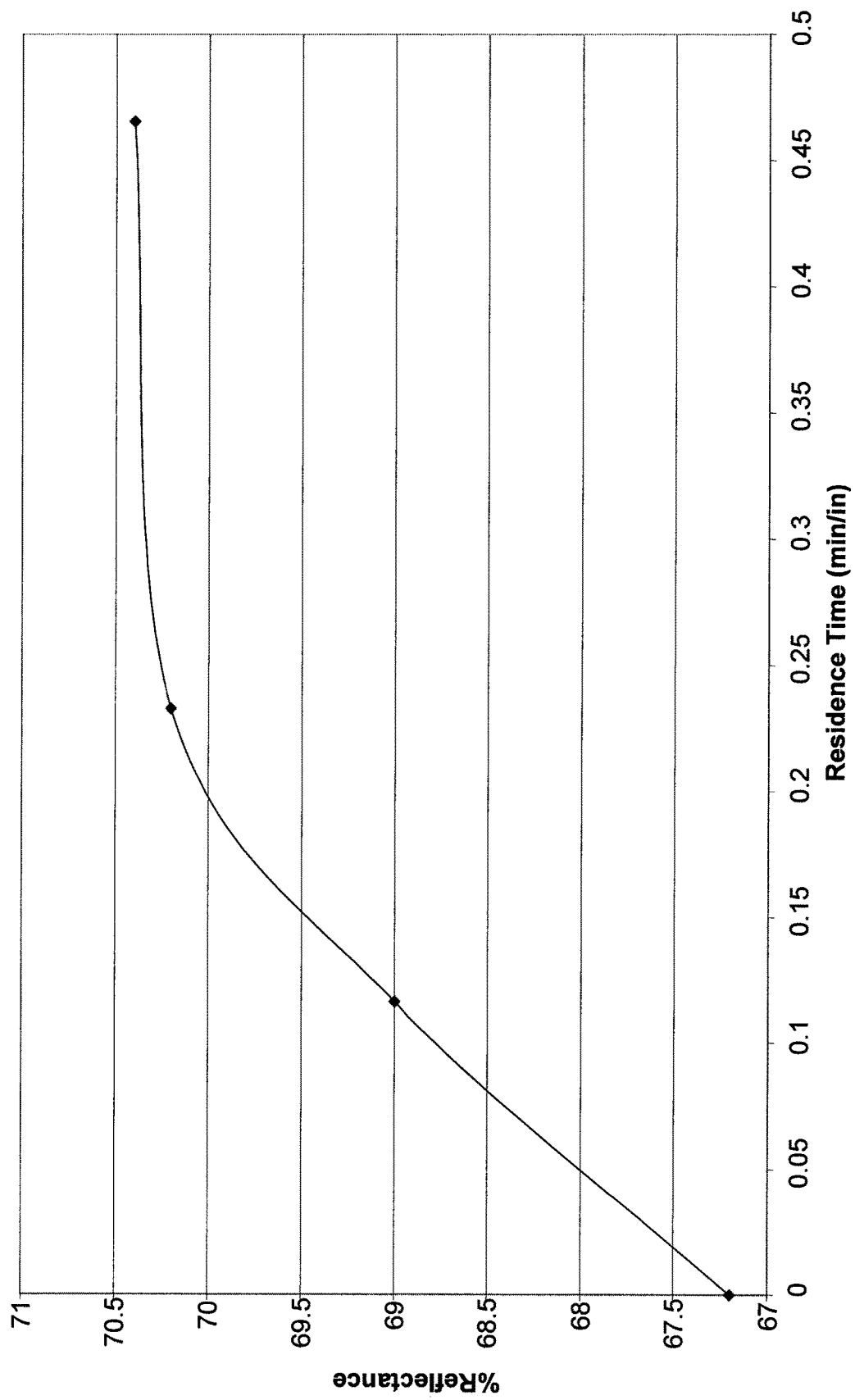
FIG. 42 depicts a graph of thin film reflectance vs. ion beam residence time.

FIG. 42 depicts the reflectance versus inverse line speed for an ion beam treatment of a chrome layer prior to the application of the Ruthenium layer. The beam current was set to about 250 mA. At a line speed of about 4"/minute the coating attains its maximum reflectance of almost 70.5%. Further reductions in the line speed did not result in additional increases in reflectance. If faster line speeds are desired then additional beams may be employed.

Figure 43:
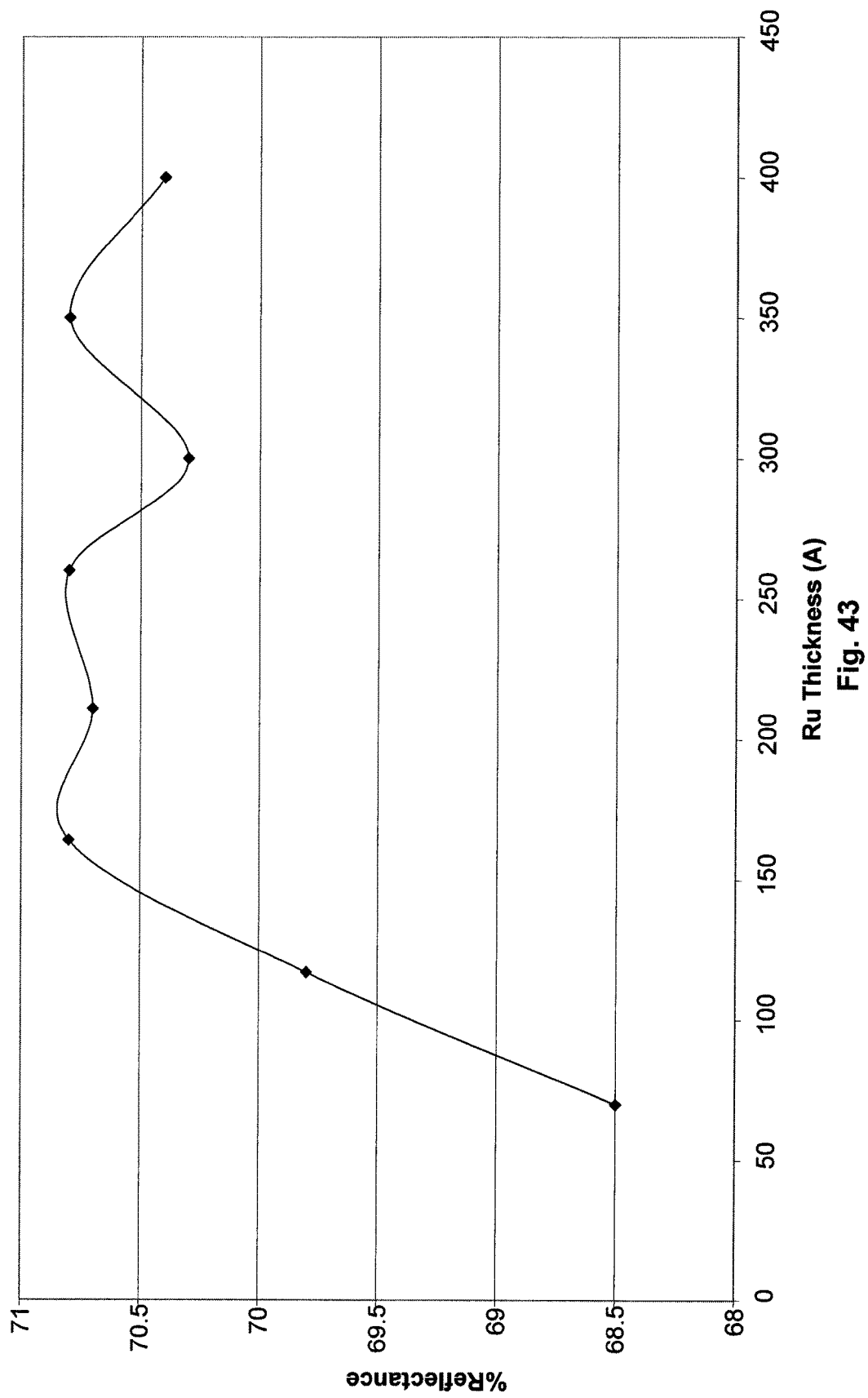
FIG. 43 depicts a graph of thin film reflectance vs. thickness.

FIG. 43 depicts how reducing the amount of Ruthenium may be used in the coating due to the smoothing effect of the ion beam. The line speed was at about 2.1 ipm and the beam current was comparable to the results in FIG. 42. As little as 160 angstroms of Ruthenium may be used to net the maximum reflectivity. This results in substantial cost savings relative to the baseline case where extra Ruthenium was used to compensate for the roughness of the initial layers. Additionally, a 1.5 ohm/sq coating of chrome and ruthenium with relatively high reflectance may not have even been practical without ion beam smoothing.

Typically roughness of a coating produced without any special efforts to make a smooth coating will vary between approximately 10 and 20% of the total thickness of the coating. Table 17 depicts the thickness of chrome/ruthenium stacks needed to attain various sheet resistance values. The bulk resistance of the chrome layer is varied to demonstrate how the thickness of the chrome layer will vary to attain different sheet resistance values as the bulk resistance changes. This may be used as an example of variations in chrome bulk resistance properties or one could consider this as a means to demonstrate what happens when materials with different or varying bulk resistance values are substituted for chrome.

The range of roughness is calculated in Table 17 as 10 and 20% of the bulk thickness. The ruthenium is set at 200 angstroms which is just slightly above the thickness necessary to attain maximum reflectance for that material in an ideal application. If the chrome layer is smooth or has been smoothed by an ion beam then this thickness demonstrates the optimal reflectance case. Table 17 depicts the results of calculations where the thickness of the ruthenium is compared to the total thickness. The contribution of the roughness is considered to be the average of the 10 and 20% cases. The percentage of the stack that is ruthenium varies with the target sheet resistance of the stack and with the bulk resistance of the chrome or base layer. It is desirable that the ruthenium or other high reflectance metal to be less than 50% of the total thickness if the sheet resistance is greater than or equal to 6 ohm/sq. If the sheet resistance of the stack is approximately 2 ohms/sq then the ruthenium thickness should be less than about 25% of the total thickness. The thickness percentage of the high reflectance layer will also vary with the bulk reflectance of this metal and the reflectance target. The appropriate high reflectance percentage of total thickness is a function of the desired reflectance of the stack, the desired sheet resistance of the stack and the bulk resistance of the different materials being used to construct the stack. The percentage of the high reflectance material should be less than 50% of the total thickness, preferable less than 25%, more preferably less than 15%, even more preferably less than 10% and most preferably less than 7.5% of the total thickness. In this example chrome and ruthenium are used to demonstrate the benefits of one embodiment of the present invention. Other metals can be substituted for the chrome layer as a means to provide the majority of the sheet resistance. The so-called high reflectance metal is defined as a metal that is of higher reflectance relative to the layer that is contributing to the majority of the sheet resistance. In this example we discuss the role of the top most layer as having a higher reflectance relative to the electrical conduction layer. In other embodiments the electrical conduction layer or layers may have an unacceptable color or hue. The reflectance intensity may be acceptable but the reflected color may be considered objectionable. In this embodiment the top most, high reflectance layer, may in fact function not to increase the reflectance but rather to provide an acceptable color. In one example the electrical conduction layer may be highly colored and a neutral reflected color is preferred. In this case the so called high reflectance layer would act to make the color more neutral.

In another embodiment, the electrical conduction layer may have a neutral reflected color and a highly colored reflectance is preferred. Here the top, high reflectance metal may be selected to provide a non-neutral appearance. In yet another embodiment, a multi-layer stack may be applied over the electrical conduction layer such that the stack attains low sheet resistance while having the flexibility to adjust color via adjustments to the multi-layer stack placed above the electrical conduction layer. In this example, the multi-layer stack could consist of metals, dielectric layers, and/or semi-conductor layers. The selection of the materials comprising the stack, their thicknesses, orientation relative to the electrical conduction layer and neighboring medium will be determined by the design criteria of a given application.

TABLE 17

Sheet Resistance Analysis

| Chrome Thickness | Minimum Chrome Roughness | Maximum Chrome Roughness | Bulk Resistance Chrome | Sheet Resistance Chrome | Ruthenium Thickness | Bulk Resistance Ruthenium | Sheet Resistance Ruthenium | Total Sheet Resistance | Ruthenium % |
|---|---|---|---|---|---|---|---|---|---|
| 496 | 50 | 99 | 57 | 10.00 | 200 | 30 | 15 | 6.00 | 26.0% |
| 909 | 91 | 182 | 57 | 5.45 | 200 | 30 | 15 | 4.00 | 16.1% |

TABLE 17-continued

Sheet Resistance Analysis

| Chrome Thickness | Minimum Chrome Roughness | Maximum Chrome Roughness | Bulk Resistance Chrome | Sheet Resistance Chrome | Ruthenium Thickness | Bulk Resistance Ruthenium | Sheet Resistance Ruthenium | Total Sheet Resistance | Ruthenium % |
|---|---|---|---|---|---|---|---|---|---|
| 2148 | 215 | 430 | 57 | 2.31 | 200 | 30 | 15 | 2.00 | 7.5% |
| 4622 | 462 | 924 | 57 | 1.07 | 200 | 30 | 15 | 1.00 | 3.6% |
| 9581 | 958 | 1916 | 57 | 0.52 | 200 | 30 | 15 | 0.50 | 1.8% |
| 261 | 26 | 52 | 30 | 10.00 | 200 | 30 | 15 | 6.00 | 40.0% |
| 478 | 48 | 96 | 30 | 5.46 | 200 | 30 | 15 | 4.00 | 26.7% |
| 1130 | 113 | 226 | 30 | 2.31 | 200 | 30 | 15 | 2.00 | 13.3% |
| 2433 | 243 | 487 | 30 | 1.07 | 200 | 30 | 15 | 1.00 | 6.7% |
| 5040 | 504 | 1008 | 30 | 0.52 | 200 | 30 | 15 | 0.50 | 3.3% |
| 130 | 13 | 26 | 15 | 10.00 | 200 | 30 | 15 | 6.00 | 57.1% |
| 239 | 24 | 48 | 15 | 5.45 | 200 | 30 | 15 | 4.00 | 42.1% |
| 565 | 57 | 113 | 15 | 2.31 | 200 | 30 | 15 | 2.00 | 23.5% |
| 1217 | 122 | 243 | 15 | 1.07 | 200 | 30 | 15 | 1.00 | 12.5% |
| 2522 | 252 | 504 | 15 | 0.52 | 200 | 30 | 15 | 0.50 | 6.5% |

As the sheet resistance is lowered for various applications the thickness must be increased and thus the surface roughness is increased and the reflectance is decreased. The reflectance of the coating then will drop to a low value relative to the Theoretical Maximum value. The lower the sheet resistance value that is targeted then the lower the percentage of the Theoretical Maximum reflectance value that is attained. For a coating with a sheet resistance of approximately 6 ohms per square or less the techniques described herein will allow one to attain a reflectance greater than 90% of the Theoretical Maximum and preferably greater than about 95% of the Theoretical Maximum. For a coating with a sheet resistance of approximately 3 ohms per square or less the techniques described herein will allow one to attain a reflectance greater than 80% of the Theoretical Maximum and preferably greater than about 85% of the Theoretical Maximum, more preferably greater than about 90% of the Theoretical Maximum, and most preferably greater than about 95% of the Theoretical Maximum. For a coating with a sheet resistance of approximately 1.5 ohms per square or less the techniques described herein will allow one to attain a reflectance greater than 75% of the Theoretical Maximum and preferably greater than about 85% of the Theoretical Maximum, more preferably greater than about 90% of the Theoretical Maximum, and most preferably greater than about 95% of the Theoretical Maximum. For a coating with a sheet resistance of approximately 0.5 ohms per square or less the techniques described herein will allow one to attain a reflectance greater than 70% of the Theoretical Maximum and preferably greater than about 80% of the Theoretical Maximum, more preferably greater than about 90% of the Theoretical Maximum, and most preferably greater than about 95% of the Theoretical Maximum.

In commonly assigned U.S. Patent Application Publication No. 2006/0056003, which is incorporated herein in its entirety by reference, various metal stacks are discussed for a "chrome ring" mirror element. A thin chrome adhesion layer is deposited onto ITO and a layer of a metal with a higher inherent reflectivity is deposited onto the chrome layer. Various higher reflectance metals were discussed. A second layer of chrome is described that does not contribute to the appearance when the coating is viewed from the glass side, however, is applied to minimize the transmittance of visible and UV light. The reduction of visible light is to hide the seal material while the UV light is reduced to protect the seal material during exposure to sunlight. Chrome was contemplated in this example as a low cost means to reduce the transmittance of the light, whether it be UV and/or visible. Other low cost metals may provide the same function provided they have good adhesion to the seal and to the higher reflectance metal.

The thickness of the high reflectance metal may also be simply increased to also reduce the light transmittance but the high reflectance metals are often relatively expensive and the sole use of these materials would result in a higher price of the coating.

The ITO layer may be any transparent conducting oxide or other transparent electrode. The transparent conducting oxide or transparent electrode may consist of a single layer or multilayer. The layers in a multilayer may be selected to modify the reflected color or appearance such that the "ring" has the appropriate optical properties. One such multilayer may include the use of color suppression layers placed between the glass substrate and the transparent conducting oxide. The use of this layer leads to more selections of color for the ring as the ITO layer thickness is adjusted.

Adhesion layer may be chrome, Ni, NiCr, of various compositions, Ti, Si, or silicon alloys, or other suitable adhesion enhancement layer. The "high reflectance metals" are selected from metals and alloys that have bulk reflectance values that are higher than chrome. Example metals include aluminum, ruthenium, rhodium, iridium, palladium, platinum, cadmium, copper, cobalt, silver, gold and alloys of these materials. In addition to alloys, mixtures of these metals with each other or with other metals may be employed. Multi-layers may also be used in place of the single layer shown in the schematic for the high reflectance metal. Similarly, the UV blocking layer may consist of a single material, alloy, multi-layer or other combination which results in the appropriate reduction of transmittance.

The adhesion of materials, layer or coatings may also be improved by use of the ion beam treatment described herein. For example, ion beam treatment of an ITO surface was performed using argon and then a mixture of argon and oxygen. These tests were compared to non-ion milled surfaces. The samples were attached to a test piece of glass by an epoxy material to form a sealed cavity. A hole was drilled in the top lite of glass and the cavity is pressurized to determine the pressure value necessary for the cavity to fail. Failure mode may include cohesive failure within the epoxy, adhesion of the epoxy to the coatings, fracture of the glass or the coating may de-adhere from the substrate or there may be intra-coating adhesion failures.

The ITO surface was either ion beam treated with argon, argon/oxygen mixture or had no treatment. The surface was then coated with a thin layer of chrome about 50 angstroms thick followed by a ruthenium layer approximately 500 angstroms thick (so called Beta Ring). The coated glass was bonded to another piece of glass with an epoxy typically used in EC elements and the epoxy was then cured. Table 18 depicts the pressure values at failure and the amount of metal lift from the ITO coating. The control parts have trace amounts of metal lift. The argon beamed parts had substantial lift of metals but the pressures at failure were essentially the same. The use of oxygen had again similar pressure values at failure but the lift of metals from the ITO was eliminated. The oxygen improves the adhesion of chrome to the ITO. The ion beam will preferentially sputter oxygen which is a component which helps the adhesion of chrome. The argon only case results in a minimization of critical oxygen and a weaker bond. Adding oxygen into the beam, it is believed, "heals" the ITO surface thus strengthening the bond and minimizing the metal lift. The pressure values at failure do not show a correlation because the glass is fracturing during the test. This fracturing determines the pressure value at failure and thus dominates the test. In this example, the oxygen is necessary but there may be situations where other gases may be preferable or argon alone may be the better choice.

In another example, where Ruthenium is deposited directly onto ITO a dramatic change in the pressure values at failure and a change in failure mode was observed. When the ion beam treatment is not used the pressure values at failure are quite low, approximately 6-7 psi, and the coating lift was the failure mode; the glass does not fracture. When the ITO surface is treated with an oxygen containing beam and ruthenium is then deposited on the surface the pressure values at failure increase by over a factor of 2 and the glass fracture is the dominant failure mode. The coating still lifts from the ITO but the adhesion strength is dramatically increased.

TABLE 18

Pressure values at failure and amount of metal lift from ITO coating.

| Blow Values (psi) | | | Lift % | | |
|---|---|---|---|---|---|
| A | B | C | A | B | C |
| 10.8 | 11.8 | 11.5 | trace | 45 | 0 |
| 10.4 | 12.2 | 9.9 | trace | 40 | 0 |
| 10.6 | 11.6 | 12.2 | 5 | trace | 0 |
| 12 | 9.4 | 9.9 | 5 | 30 | 0 |
| 9 | 9.7 | 10.2 | 5 | 20 | 0 |
| 12.4 | 11.4 | 9.3 | 0 | 40 | 0 |
| 11.2 | 9.4 | 9.7 | 0 | 40 | 0 |
| 10.4 | 11 | 9.5 | 0 | 60 | 0 |
| 9.7 | 11.6 | 11.1 | 5 | 20 | 0 |
| 11.8 | 8.9 | 11.5 | 0 | 40 | 0 |
| 9.7 | 10.4 | 9.5 | 5 | 20 | 0 |
| 11.5 | 9.4 | 11.8 | trace | 0 | 0 |
| | 10.3 | | | 30 | |
| | 9.1 | | | 30 | |
| | 10.7 | | | 30 | |
| | 11.1 | | | 35 | |

A—Beta Ring Controls
B— Beta Ring with Argon Ion Milling
C—Beta Ring with Argon/Oxygen Ion Milling A top layer, which may be used in some applications, may be an electrical conduction stabilizing material. Its role is to provide good electrical conduction between the ring metals and the bus bar or silver paste. The material may be selected from the platinum group metals such as iridium, osmium, palladium, platinum, rhodium and ruthenium. Mixtures or alloys of these metals with each other or with other suitable metals may be used.

The thickness and selection of the materials in the layers are preferably selected to provide the appropriate color and reflectance intensity as taught in the referenced patent application. The thickness of the layers should also be selected to attain the necessary transmittance properties. The visible transmittance should be set so that the epoxy seal is not visible when viewed. The visible transmittance should be less than 5%, preferably less than 2.5%, even more preferably less than 1% and most preferably less than about 0.5%. The UV transmittance may or may not correlate exactly with the visible transmittance. In the case of the UV transmittance the appearance of the ring is not the issue but rather the protection of the seal is the principle concern. This of course presumes that the selected seal is sensitive to UV light. The amount of allowable UV light is dependent on how susceptible the seal is to the UV light. Ideally, the coating should be designed such that the ring coating is opaque to UV light but unfortunately this level of UV transmittance may be cost prohibitive. Additionally, the adhesion of the layers may be compromised if the total thickness becomes too large. The stresses which may be present in the layers would result in a strain large enough to cause the layers to delaminate from the glass or other layers of the coating. For this reason one needs to contemplate a finite amount of UV transmittance. The UV transmittance should be less than about 1%, preferable less than 0.5%, more preferably less than 0.1% and most preferably less than 0.05%.

For the purpose of this document, "Ion Milling" is defined to be the application of ions having greater than the sputtering threshold energy to a surface. For the purposes of this document, "Ion Milling" is best differentiated from "Plasma Cleaning" by the relative energies involved. Plasma Cleaning, in most of its embodiments, refers to a reactive chemical process where very reactive chemical species are generated in plasma and then utilized to attack/remove materials on a substrate surface. The removal process is primarily chemical in nature and the energies of the particles involved are below or close to the sputtering threshold for the substrate surface (~16 eV for Cr). Ion Milling utilizes highly energetic species, well above the sputtering threshold, optimally above 20 eV, more optimally above 250 eV, most optimally above 1000 eV. Material removal is due primarily to physical ablation of atoms/clusters from the substrate surface.

Ion Milling has the property of preferentially reducing roughness while removing material from a surface. FIG. 36 illustrates the basics of the sputtering process. An incoming ion impacts the substrate surface and transfers momentum to the surface atoms. Those atoms receiving enough momentum along a vector out of the surface are ejected. On a rough surface, geometric factors increase the probability of atoms being ejected from the surface as is depicted in FIG. 37. This causes preferential removal of raised areas of the surface which results in smoothing of the surface as material is removed.

Figure 44:
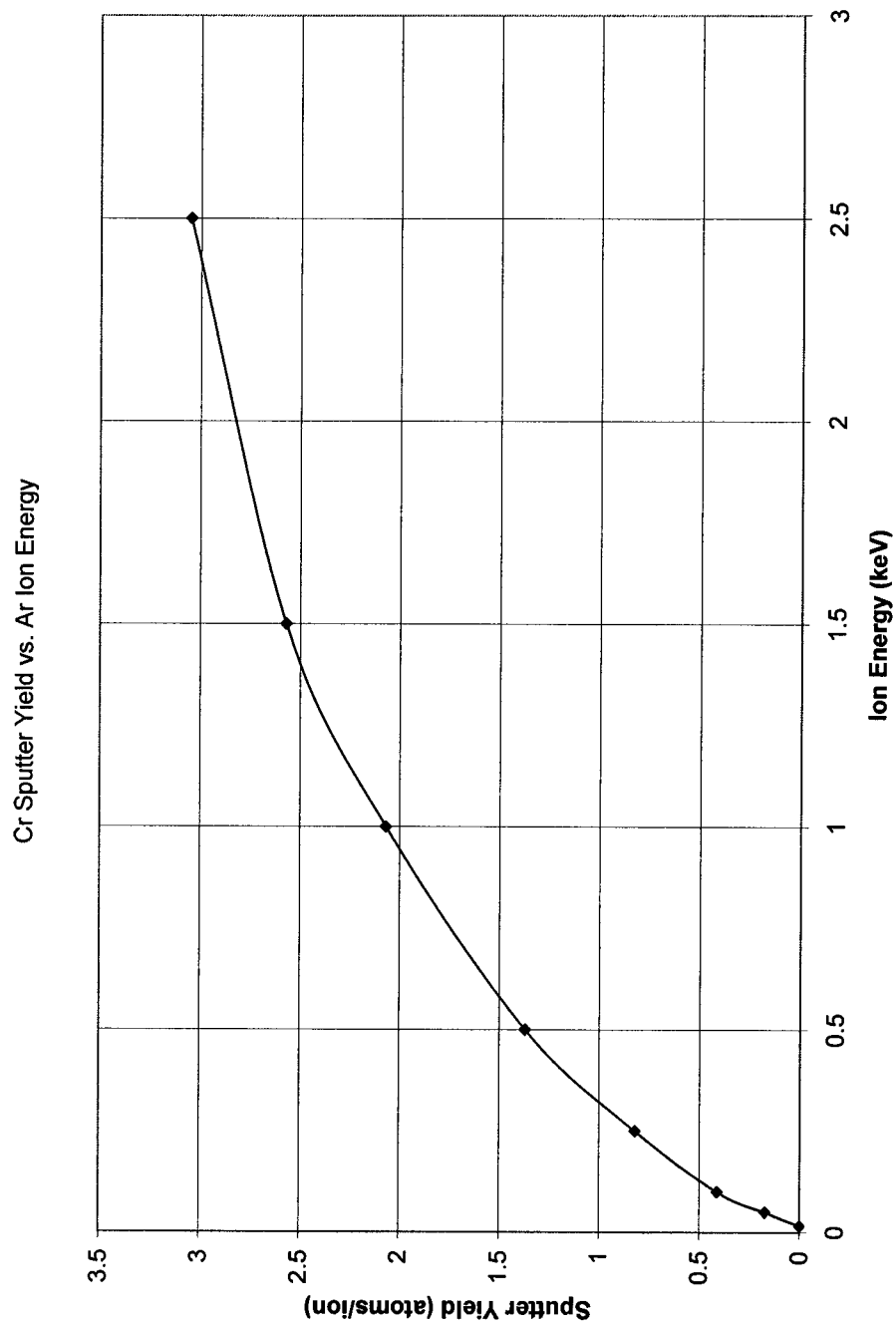
FIG. 44 is a plot of Cr sputter yield vs. Ar ion energy.
Figure 45:
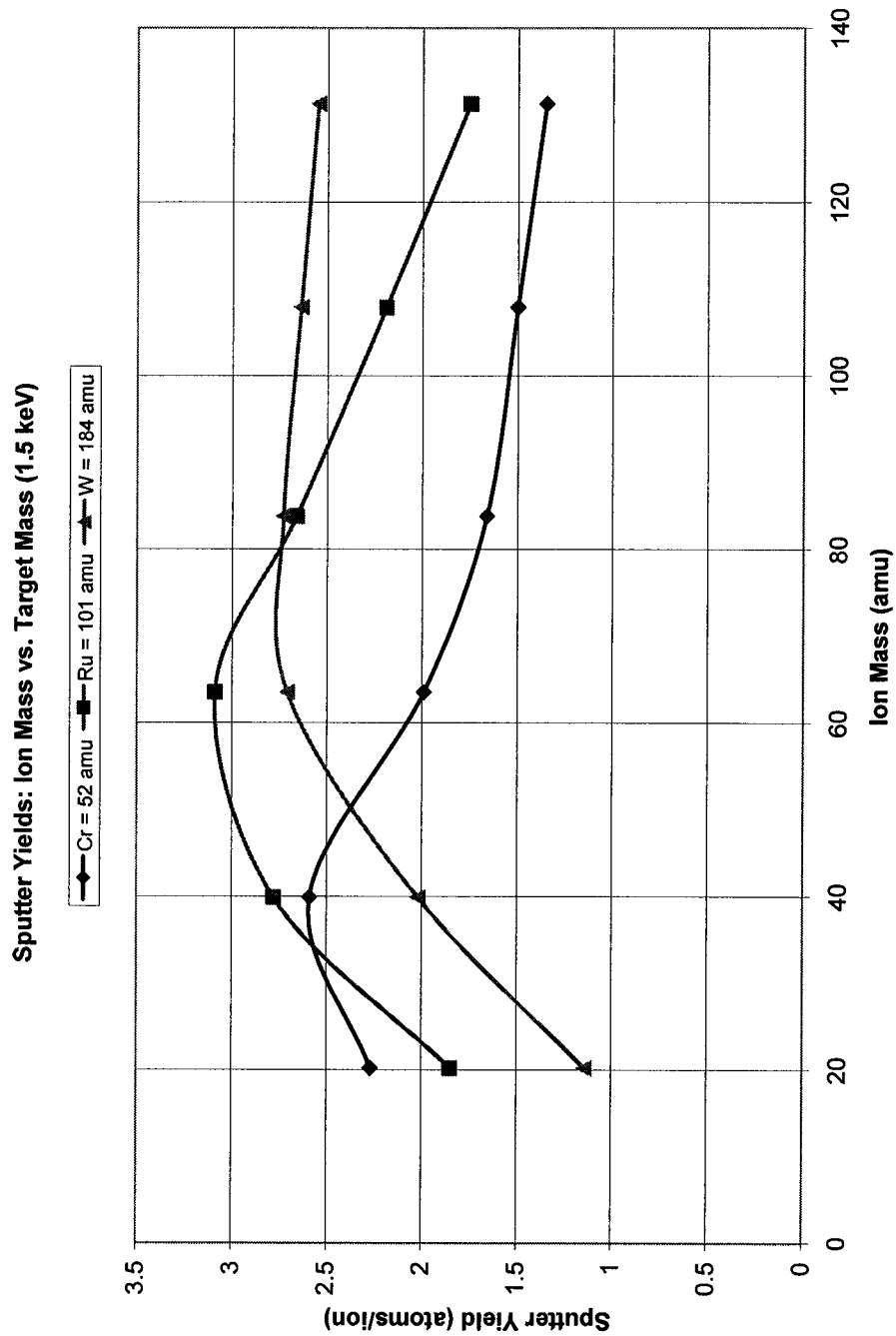
FIG. 45 is a plot of sputter yields for ion mass vs. target mass.

The efficiency of material ablation by energetic ions is a function of the energy of the incoming ions. This effect is demonstrated for Ar ions sputtering Cr in FIG. 44. The efficiency of the momentum transfer is related to the ratio of the ion mass to the target atomic mass. This relationship is demonstrated for 1.5 keV ions energy in FIG. 45. Argon is the most commonly utilized ion for sputtering; however other elements may be used to form ions for sputtering to improve the sputtering efficiency (atoms/ion) or modify the relative energetics of the sputtering process. For deposition processes the energy of the ejected atoms can affect the properties or quality of deposited films. Also, a certain fraction of the incoming ions are reflected either as ions or neutrals from the target surface and can impact the growing film. The relative fraction reflected and the energy of the reflected ions/neutrals is a function of the ion mass to the target atom mass.

Figure 46:
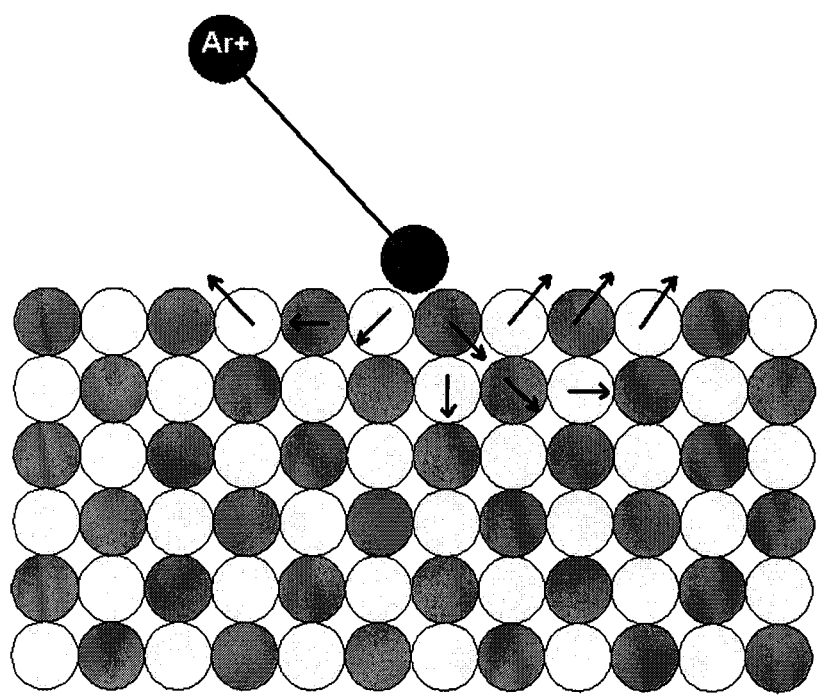
FIG. 46 depicts an enlarged ion milling result with the ion beam incident at an angle.

Angle has an interesting effect in the Ion Milling process. Sputtering yield increases with angle up to approximately 70 degrees. The actual maximum varies depending on choice of ion and target material. The geometric component of this effect is shown in FIG. 46. As an example, more quantitative data for the sputtering of Cr at angle with two energies of Ar ion and a single energy of Kr ion. As can be seen from the data, for this system the most efficient angle ranges from about 60 to about 70 degrees. The increase in sputtering yield shows synergy between the ion energy and the incident angle. The increase in incident angle shows higher benefit at higher ion energy. The sputtering yield shows further enhancement for heavier ions at angle. These enhancements have not been previously demonstrated in the art.

Figure 47:
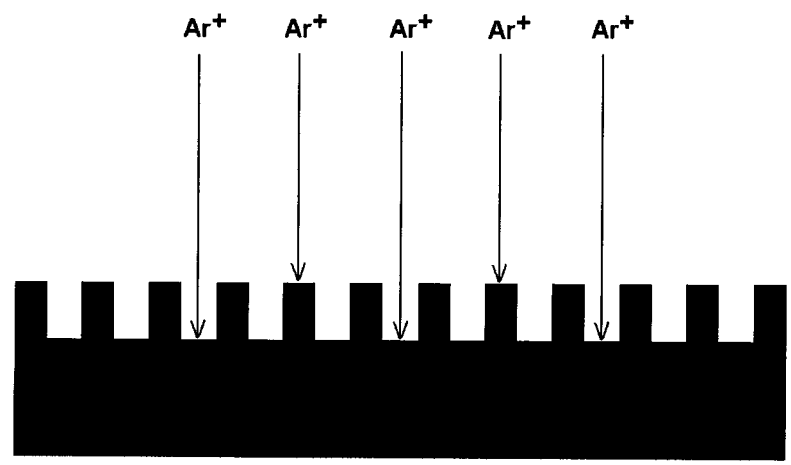
FIG. 47 depicts an enlarged ion milling of a rough surface with the ion beam incident perpendicular to the surface.
Figure 48:
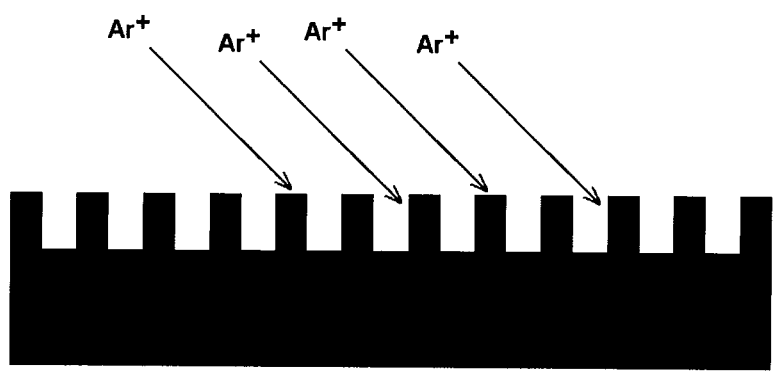
FIG. 48 depicts an enlarged ion milling of a rough surface with the ion beam incident at an angle to the surface.

Angle can also enhance the smoothing effect of Ion Milling. For a perfectly uniform, isotropic etch process, any texture on the surface would be maintained as material was removed. Smoothing bias here is defined as the ratio of anisotropic etching, resulting in smoothing, relative to isotropic etching, which results in material removal with no change in surface texture. The increased material removal rate due to angle described above will accelerate the smoothing process. Also, geometric factors come into play that can increase the bias of smoothing versus total material removal. FIG. 47 depicts normal incidence ions impacting a rough surface with reasonably high aspect ratio roughness. As was discussed above, the geometric factors present enhance the removal rate of the surface protrusions. At angle, shadowing comes into play further biasing the process to removal of protrusions. This is shown pictographically in FIG. 48. Higher aspect ratio roughness should show a higher bias to smoothing.

Figure 49:
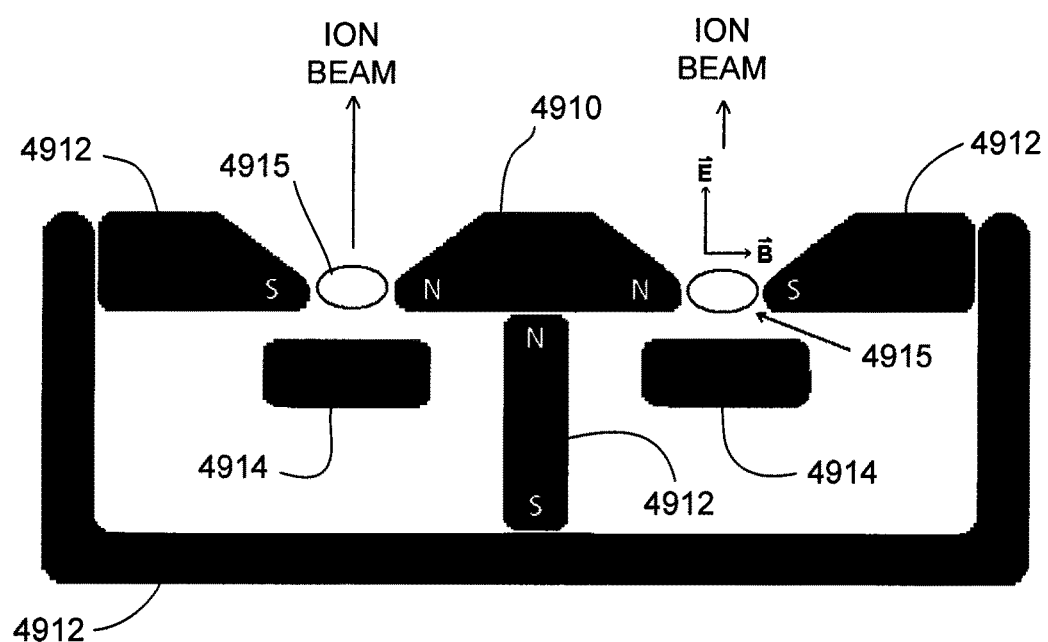
FIG. 49 is a cross sectional view of an ion source that emits an ion beam parallel to the source central axis.
Figure 50:
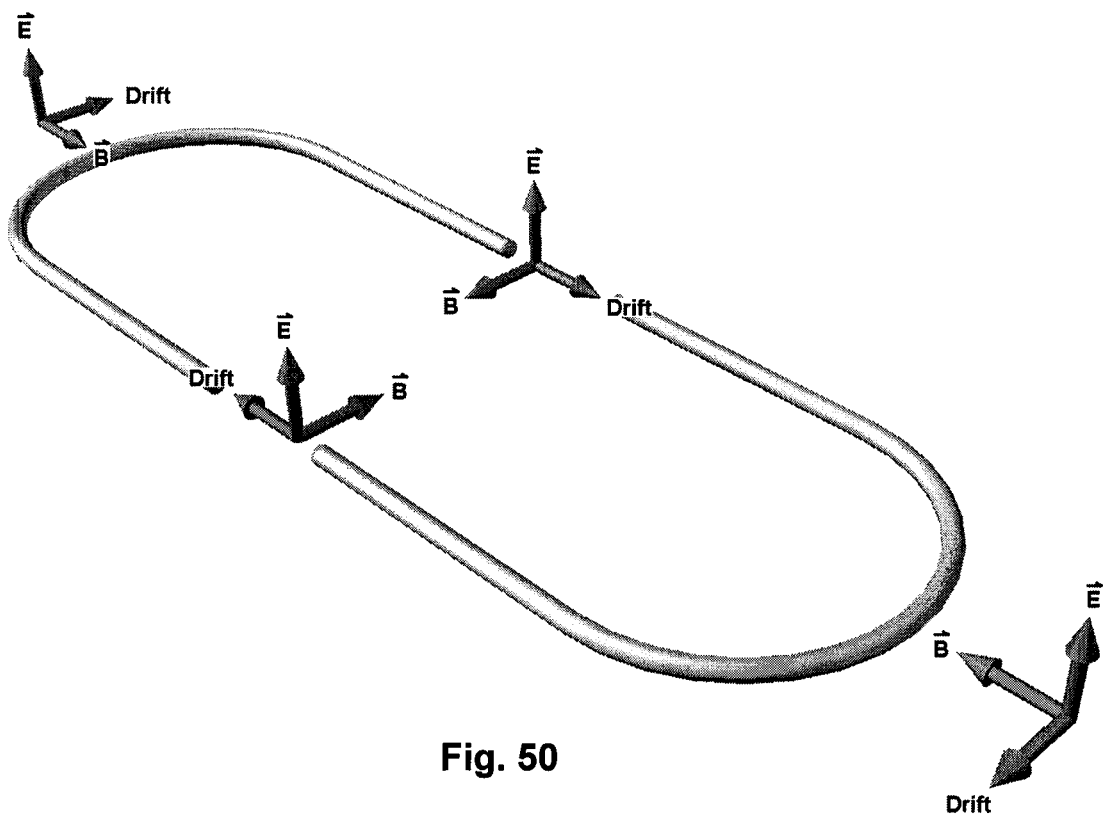
FIG. 50 is a three-dimensional view of an electron race track of an ion source that emits an ion beam parallel to the source central axis.

The class of linear ion source described here is of the closed-drift anode-layer Hall-effect type. These sources generate a race-track plasma 4915 similar to that of a magnetron style cathode for sputter deposition. The race-track is located in the cathode gap, the space between the inner cathode 4910 and outer cathode 4912. A simplified cross-section is shown in FIG. 49 detailing the main components. As shown, the ion source includes an inner cathode 4910, an outer cathode 4912, an anode 4914, a magnet 4916, and a base plate 4918, which may be made of a high magnetic permeability alloy. A 3D view of the plasma shape and related electric and magnetic fields is shown in FIG. 50. The electric field vector is designated by E and the magnetic field vector is designated by B. Drift refers to the direction of electron travel in the Hall current (flow of electrons around the race track). The sign of the magnetic field (N vs. S) is unimportant overall since it effects only the direction of the Hall current flow (clockwise vs. counter-clockwise), not the function of the ion source. The two significant forces acting on the electrons in the plasma are due to the electric and magnetic fields. The force generated by the electric field involves the charge on the electron (q) and is described by the equation:

$$\vec{F} = q\vec{E}.$$

In other words, the force applied to the electron by the electric field is in proportion to the electron's charge and the electric field strength and in the direction of the electric field (opposite direction here because the charge is negative). The force generated by the magnetic field involves the instantaneous velocity of the electron ($\vec{v}$) and is described by:

$$\vec{F} = q\vec{v} \times \vec{B}.$$

In other words, the force applied to the electron by the magnetic field is proportional to the charge on the electron, the magnetic field strength and the velocity of the electron. The force is applied in a direction at right angle to both the velocity vector and the magnetic field vector following the right hand rule (left hand rule since the charge is negative). These two equations combine in the following equation to give the instantaneous force on the electron:

$$\vec{F} = m\partial\vec{v}/\partial t = q\left[\vec{E} + (1/c)\left(\vec{v} \times \vec{B}\right)\right].$$

Figure 51:
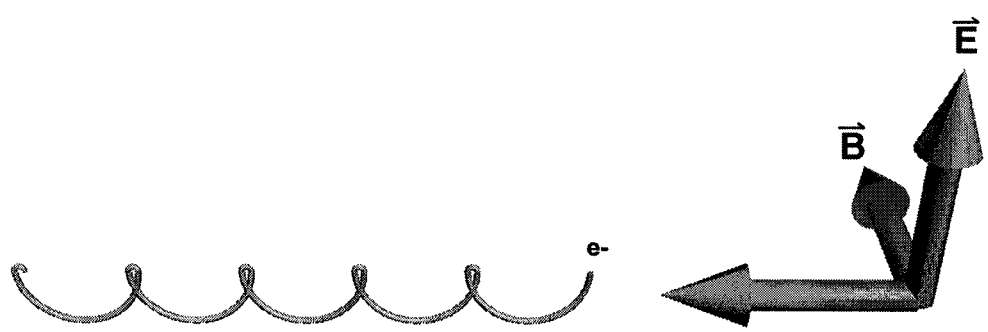
FIG. 51 depicts the travel of an electron as it propagates along the race track of an ion source.

This results in an odd hopping motion for the electrons as they circle the race track. This motion is illustrated in FIG. 51. The electron accelerates toward the positively charged anode due to the electric field. As the velocity increases, the force applied due to the motion of the electron in the magnetic field is increased causing the electron to turn. As the velocity vector of the electron is turned away from the anode, the electric field begins to slow the electron, reducing the turning force of the magnetic field. This continues until the electron essentially stops and then begins to accelerate towards the anode again.

Figure 52:
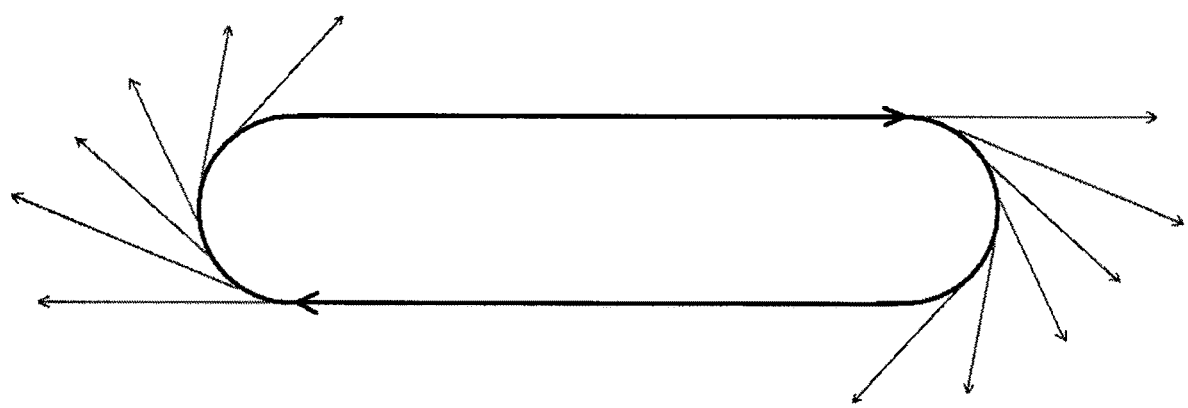
FIG. 52 depicts an electron race track of an ion source with electron loss at the turns.

A weakness of the standard design and its field orientations (FIG. 50) is that there is no force applied to the electrons at the turns in the racetrack to actually cause them to turn. The force due to the electric field can only cause an attraction of the electrons to the anode (vertical). The force due to the magnetic field can only turn the electrons within the plane of the electric field and the drift vector (vertical). The result is that a significant fraction of the electrons are lost at the turns as shown in FIG. 52. The plasma is not extinguished at the turns due to collisions between the fast moving electrons and gas atoms/molecules continuously generating new ions and electrons. The electron loss does result in a plasma density imbalance around the racetrack which is not optimum for maximizing the power output of the ion source. Worse, the electrons spilled at the end can cause arcing in the ion source which significantly limits output levels. This source of arcing is due to the fact that an electron continuing along an unimpeded vector at the turns can impact the interior cathode surfaces resulting in a breakdown of the dark space and an arc.

Figure 53:
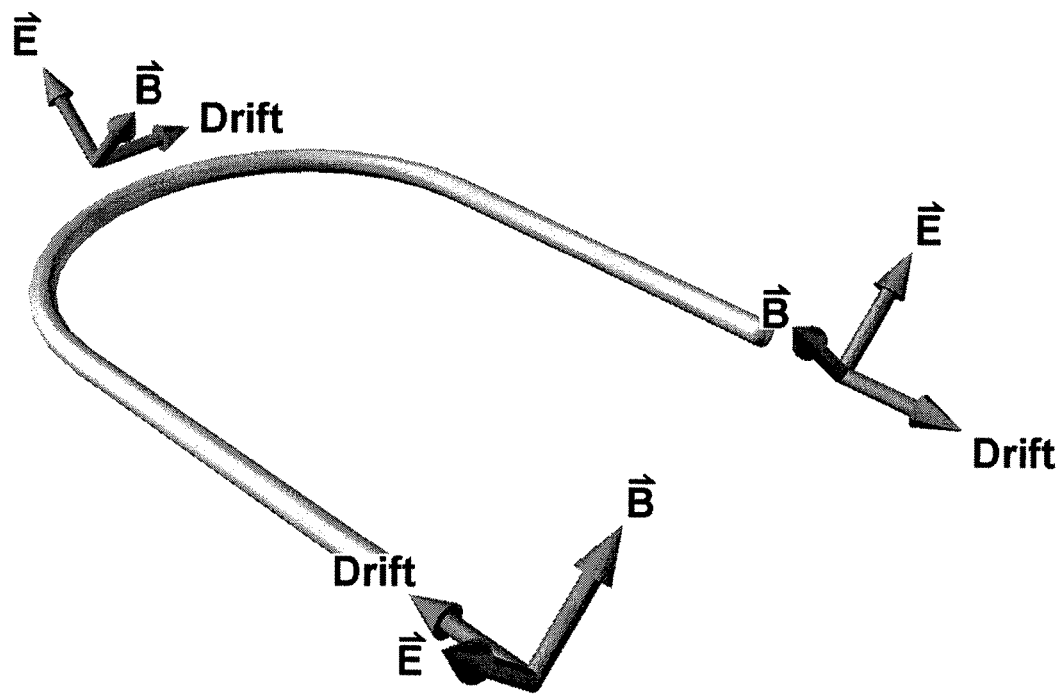
FIG. 53 is a three-dimensional view of a portion of an electron race track of an ion source that emits an ion beam at an angle to the source central axis.
Figure 54:
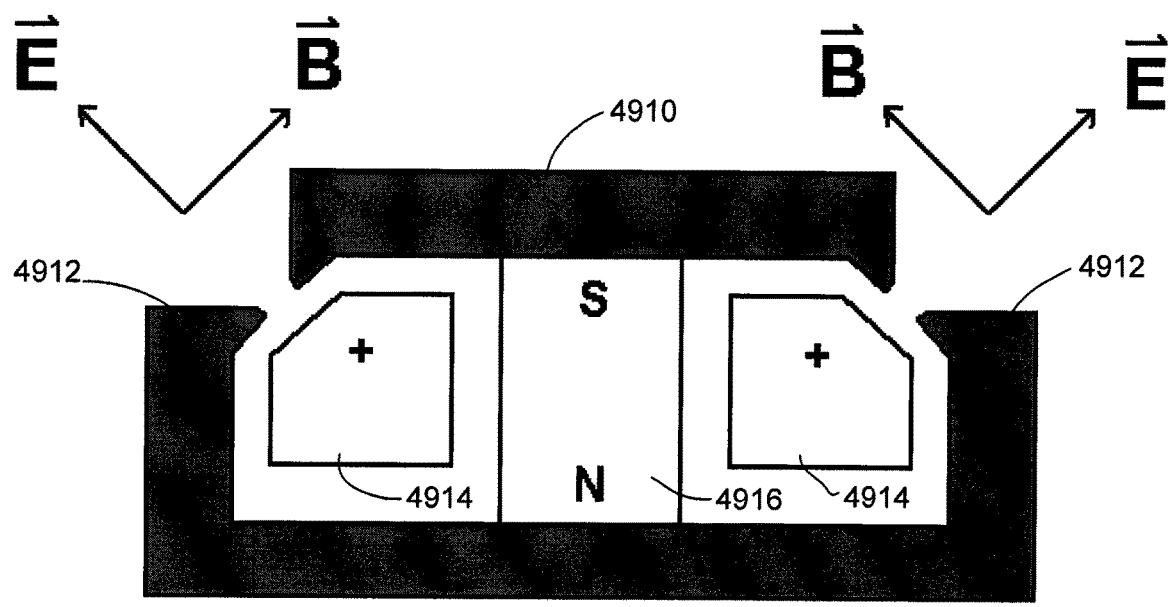
FIG. 54 is a cross sectional view of an ion source that emits an ion beam at an angle to the source central axis.
Figure 55:
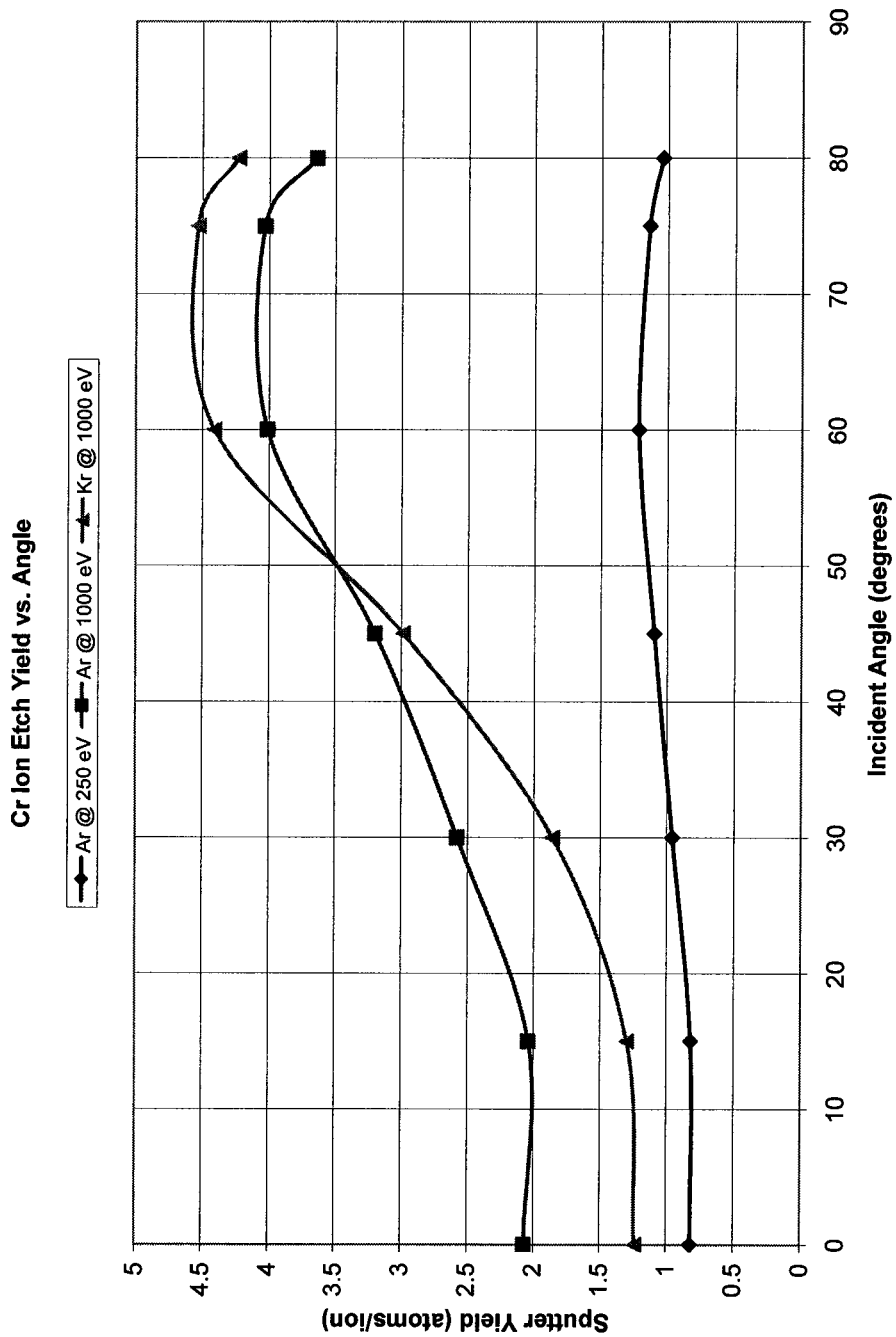
FIG. 55 is a plot of Cr ion etch yield vs. angle.

A significant advantage of the angled beam design discussed elsewhere in this document is that the electric and magnetic fields are oriented at 45 degrees relative to the standard design described above (FIG. 50). The new field orientation is shown pictographically in FIG. 53. Because the electric field is rotated 45 degrees away from the axis of the racetrack turns it now applies a portion of its force in a direction suitable to turn the electrons. The same rationale applies to the orientation of the magnetic field. A portion of the turning force applied by the magnetic field is now in a direction suitable to help turn the electrons. A second benefit of the angled beam design is that the electrons that are lost at the turns are more likely to drift off into free space than under the cathodes. This can be seen from the cross section view in FIG. 54. In this case, the inner and outer cathodes 5410 and 5412 are configured so that the gap therebetween opens at an angle relative to the central axis of the ion source. Also, the anode 5414 is configured to have an angled surface perpendicular to the cathode gap and normal to the angle at which the ion beam is emitted. Magnet 5416 is centrally disposed to oppositely magnetize inner and outer cathodes 5410 and 5412. As shown in FIG. 55, the optimum etch rate is reached, in the Cr example, at 60 to 70 degrees. The steeper angle will also result in a higher electron confinement at the turns in the racetrack. This steep angle is not as practical to design and fabricate. Also, steep angled beams require a much larger space to operate in a vacuum system which is not always compatible with existing chamber design and utilization. Because the electric and magnetic fields apply turning forces to the electrons in angled designs like the one described in FIG. 54, one could begin to fine tune the angle, magnetic field and electric field to better optimize the electron confinement in the racetrack, especially at the turns. Ideally, benefits to electron confinement will occur with even modest increase in angle at the turns. Preferably, to optimize electron containment at the turns, one would design the angle at the turns to be greater than about 15 degrees, more preferably above 30 degrees and even more preferably above 45 degrees and most preferably above 60 degrees. However, in practice other design criteria must be considered when designing an ion beam and other angles for the turns may be used. Additionally, the confinement at the turns can be improved by the tuning of magnetic strength and placement of magnets around the perimeter of the turns. By adding magnets at the outer radius of the turn a component of the magnetic field can be appropriately modified to optimally bend the electron trajectory thus minimizing electron leakage. Another method would be to angle the orientation of the magnets. The alteration of the electromagnetic field thus attains a similar result to angled turns. The preferred details of the magnet strength, orientation and placement will depend on the geometry of a given source.

Another advantage of the current designs being described (compact and angled) is the increased magnetic field strength. Previous anode layer ion beam designs have used significantly lower magnetic field strength than those described here, ~2500 gauss versus ~7600 gauss. The rationale used is that as the field strength is increased from a low level, at a fixed pressure and gas flow, the beam current increases until it saturates at approximately 2500 gauss. Because higher current is not generated by increased magnetic field it was assumed that there was no advantage to increasing it further. There is actually a significant advantage to higher magnetic field strength. These anode layer linear ion sources operate in two distinct modes. The first is a low pressure mode, referred to as the collimated mode, in which the ion beams are highly columnar. The beam is run at relatively high potential and relatively low current. At higher pressures, the beam will run in what is referred to as the diffused mode. In this mode there is no visibly defined beam, only a diffused glow/plasma. This mode is characterized by low potential and high current. When argon is the working gas, the diffused mode is particularly damaging to the cathodes, eroding the tips and contamination the substrate with iron. While increasing the magnetic field strength does not increase beam current, it does increase the pressure at which the beam begins to transition to the diffused mode. This transition zone is highly unstable and characterized by heavy arcing. By increasing the pressure at which the diffused mode transition begins to occur, the operational window for pressure is broadened, greatly increasing the flexibility of the ion source and making it more compatible with chamber conditions commonly present for magnetron sputtering processes (~1-4 mTorr). Preferably the magnetic field strength is greater than about 2600 Gauss, more preferably greater than about 5000 Gauss, and most preferably greater than about 7500 Gauss.

Figure 56B:
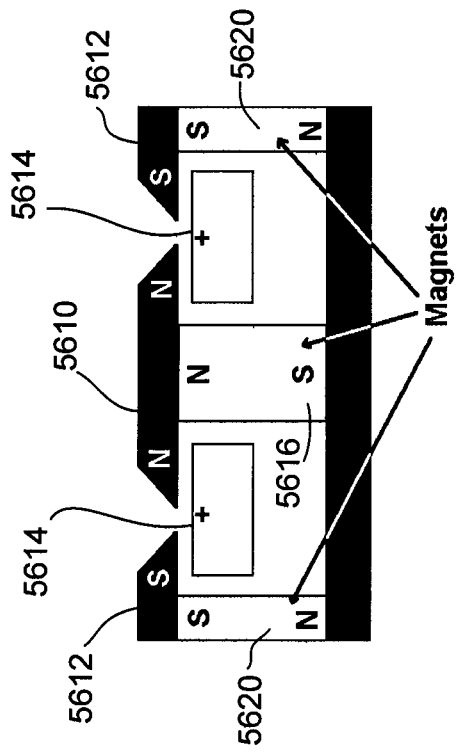
FIG. 56B is a cross sectional view of an ion source having a row of magnets under the inner cathode and additional magnets under the outer cathode.
Figure 56A:
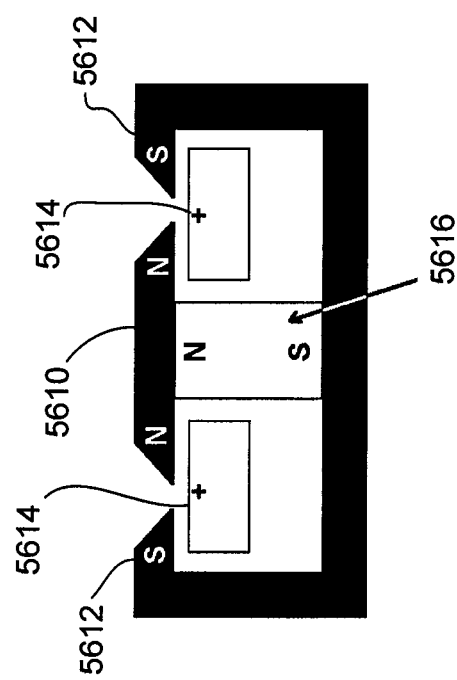
FIG. 56A is a cross sectional view of an ion source having a single row of magnets under the inner cathode.

High magnetic field in the cathode gap can be achieved through the use high magnetic energy product (MegaGauss-Oersteds) magnets such as Neodymium Iron Boron. For reference, the magnets employed in the two sources described in FIGS. 56A and 56B have a magnetic energy product of 45 MGOe. The standard design (FIG. 56A) utilizes a row of permanent magnets 5616 under the centerline of the center cathode 5610. It is possible to further increase the magnetic field strength by adding a second set of magnets 5620 under the outer cathode(s) 5612 (FIG. 56B). The additional magnets 5620 are placed all the way around the ion source following the path of the outer cathode 5612. This magnet placement adds a significant cross-section of magnet to the magnetic circuit resulting in a significant increase of the magnetic field in the cathode gap.

In operation, the beam current generated by the anode layer ion sources described here is a function of the applied potential and the gas pressure in the cathode gap. The gas pressure in the cathode gap is a function of the chamber pressure and the gas flow rate introduced into the ion source. In some instances it may be preferable to maintain a high beam current at low flow rate into the ion source. This may be due to limited pumping capacity in a particular vacuum system. Decreasing the cathode gap can have the effect of reducing the gas flow required to maintain a particular beam current output. This also has the added benefit of increasing the magnetic field strength in the cathode gap. Conversely, widening the cathode gap will reduce the magnetic field strength and increase the fraction of beam current due to chamber pressure.

Figures 57A, 57B:
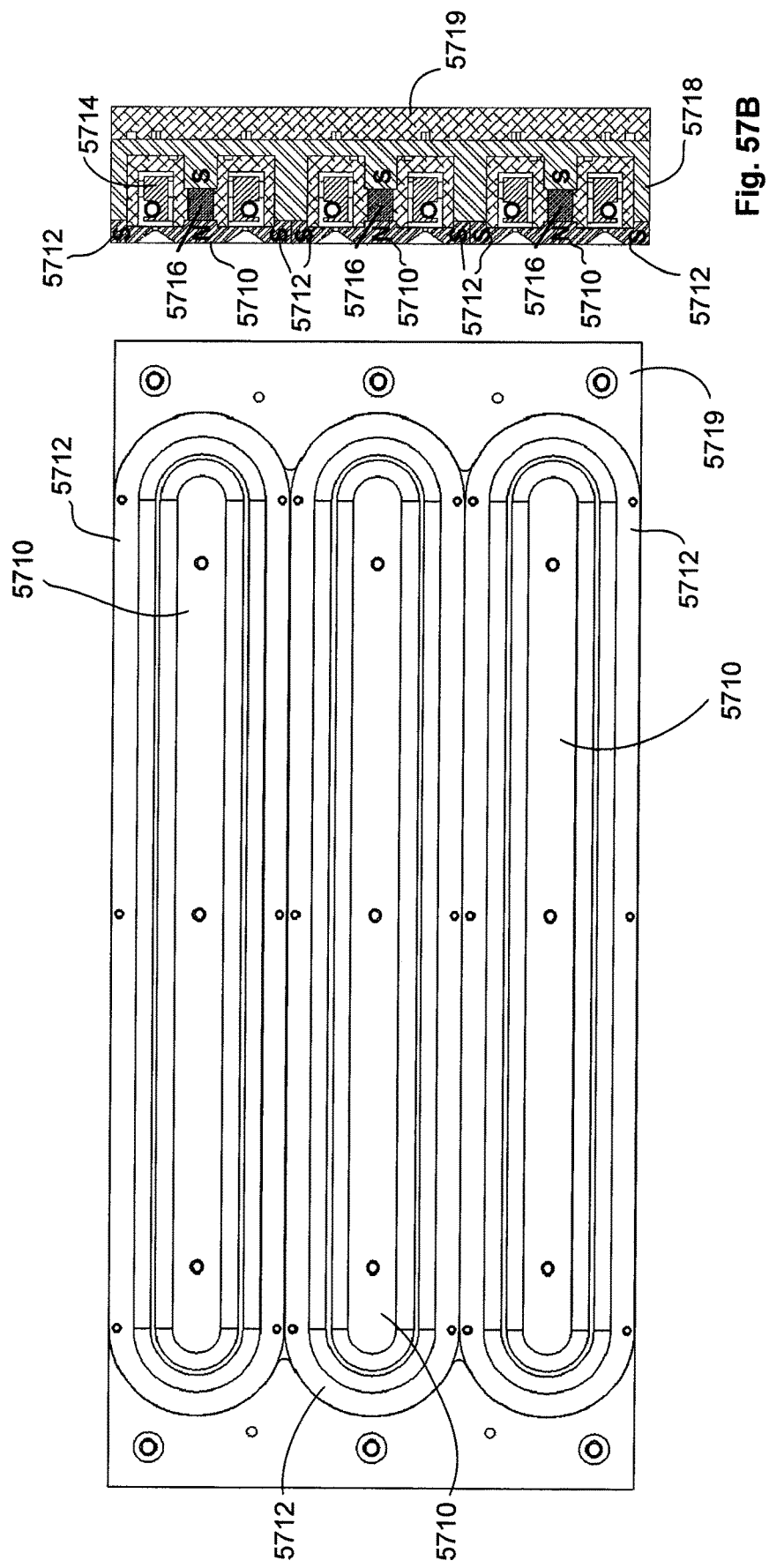
FIG. 57A is a plan view of an ion source having multiple race tracks.
FIG. 57B is a cross sectional view of the ion source shown in FIG. 57A.

It is possible to design and manufacture compact, multi-racetrack linear ion sources as single units. This has the advantage of more efficiently applying as much beam current as possible into a small chamber opening. An efficient approach to this type of multi-element design is the use of a common magnetic backplane as shown in FIGS. 57A and 57B. FIG. 57B is a cross sectional view of the ion source shown in FIG. 57A. The base plate 5718 under the three rows of magnets 5716 serves to carry the magnetic field around and up to the outer cathodes 5712 while the opposite poles of the magnets act directly on the inner cathodes 5710. Again, as discussed above, the choice of North vs. South pole for the inner cathodes 5710 is irrelevant as long as consistency is maintained between the multiple sets of magnets. A plurality of anodes 5714 are provided for the plurality of racetracks. This embodiment is shown without angled turns. Optionally, the design could be modified to take advantage of the benefits of the angled turns and/or angled beam described above.

Figure 58:
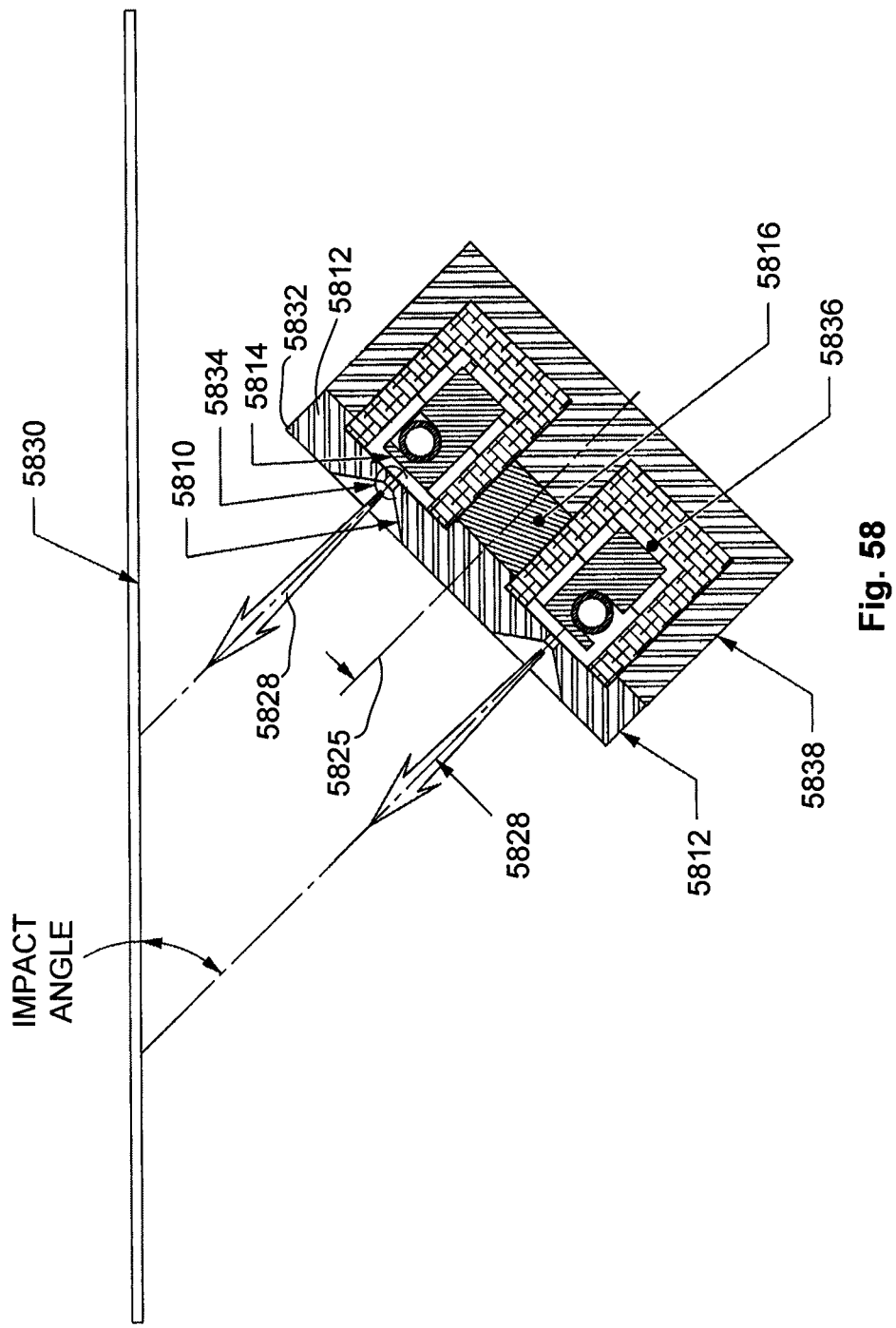
FIG. 58 is a cross sectional view of an ion source featuring a beam discharge which is parallel to the axis of the source.

FIG. 58 is a cross sectional view of an ion source featuring a beam discharge which is parallel to the axis of the source.

FIG. 59 is a cross sectional view of an ion source featuring a beam discharge which is not parallel to the axis of the source.

Work piece surface erosion rate is dependent on the angle at which the ion beam impacts the work piece surface. This erosion rate is increased when the impact angle is greater than about 30° and at a maximum when the impact angle is between 45° and 85°. One approach includes mounting the ion source 5800 itself so the discharge slot axis 5828 is at the desired angle relative to the work piece surface 5830, as shown in FIG. 58. The source axis 5825 is at an angle to the work piece surface 5830 and to the vacuum chamber in which it is installed. This angled orientation has several undesirable aspects: (1) The ion beam working distance is non-uniform; one side is always angled closer to the work piece surface 5830 than the other side. Since working distance is one of the critical operating parameters this configuration dictates a non-optimum solution. (2) Since the inner angled corner 5832 of the ion source body is closer to the work piece surface 5830 than the discharge gap 5834 it can create physical interference situations within the vacuum chamber, especially in terms of the work piece transport mechanism. This may further influence the placement of the source and further effect the choice of working distance. (3) Any ion source has a number of utility connections; such as cooling water lines, gas supply lines, and power connections. These connections are typically arranged parallel to the axis 5825 of the source. In the case of the angled installation the design of the necessary vacuum tight connections is complicated by the need to accommodate this angle.

By changing the configuration of the ion source's anode 5914 and cathodes 5912 and 5914, a beam 5928 that emerges at an angle (non-parallel) to the source axis can be produced. FIG. 59 shows an ion source 5900 designed in this manner. It can be seen from FIG. 59 that the axis of the source 5925 is normal to the work piece surface 5930 while the ion beam 5928 impacts the work piece surface at the desired angle. This design addresses all the previously mentioned issues: (1) Because the axis of the ion source body is mounted normal to the work piece surface the working distance is uniform and may be easily optimized. (2) Because the axis of the ion source body 5938 is mounted normal to the work piece surface 5930 no part of the body 5938 is closer to the work piece surface 5930 than the discharge gap 5934. Therefore the working distance of the source is not affected by interference considerations with the vacuum chamber and work piece transport mechanism. (3) Because the axis 5925 of the ion source body 5938 is mounted normal to the work piece surface 5930, the utility connections can exit straight through the vacuum chamber wall using standard vacuum tight fittings.

Figure 60A:
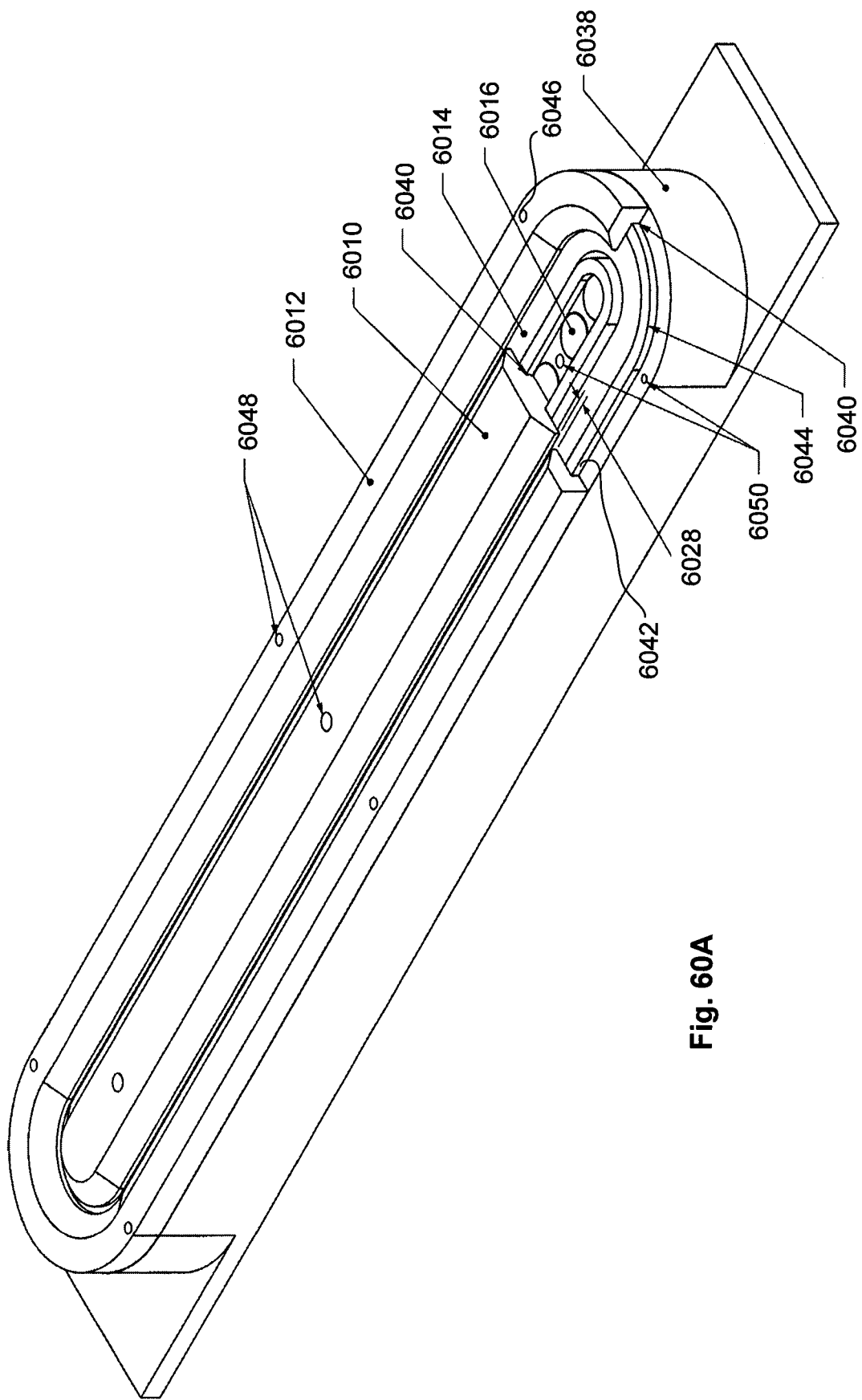
FIG. 60A shows an ion source that features self-locating cathode pole pieces.

FIG. 60A shows an ion source that features self-locating cathode pole pieces.

Accurate setting of the distance between the inner cathode pole pieces 6010 and outer cathode pole pieces 6012, or discharge gap 6034, is significant to the stable operation of the ion source. This gap is typically set by placing non-magnetic shims of suitable thickness into the gap between cathodes 6010 and 6012, fixing the cathodes in place with screws, and then removing the shims. This technique can have the following shortcomings: (1) The typical ion source featured high magnetic field strength in the discharge gap 6034. This high field pulls the cathode pole pieces 6010 and 6012 together, pinching the shims and making them very difficult to remove. There is also a strong possibility of metal shavings being produced, from the shims, as they are removed. If these shavings are not removed they can cause short-circuiting between the anode 6014 and cathodes 6010 and 6012. (2) Because of the need to remove the shims, after assembly, their thickness must be less than the discharge gap width. Since it is difficult to distribute this clearance evenly the tendency is to end up with non-uniform gap spacing which will be reflected in some non-uniform beam characteristics. Over time the shims experience a certain amount of wear and aggravate this situation. (3) The need to have adequate material cross sections to accommodate screws also places some limits on the design of the ion source; in terms of both magnetic field design and overall physical design for compactness.

Figure 60B:
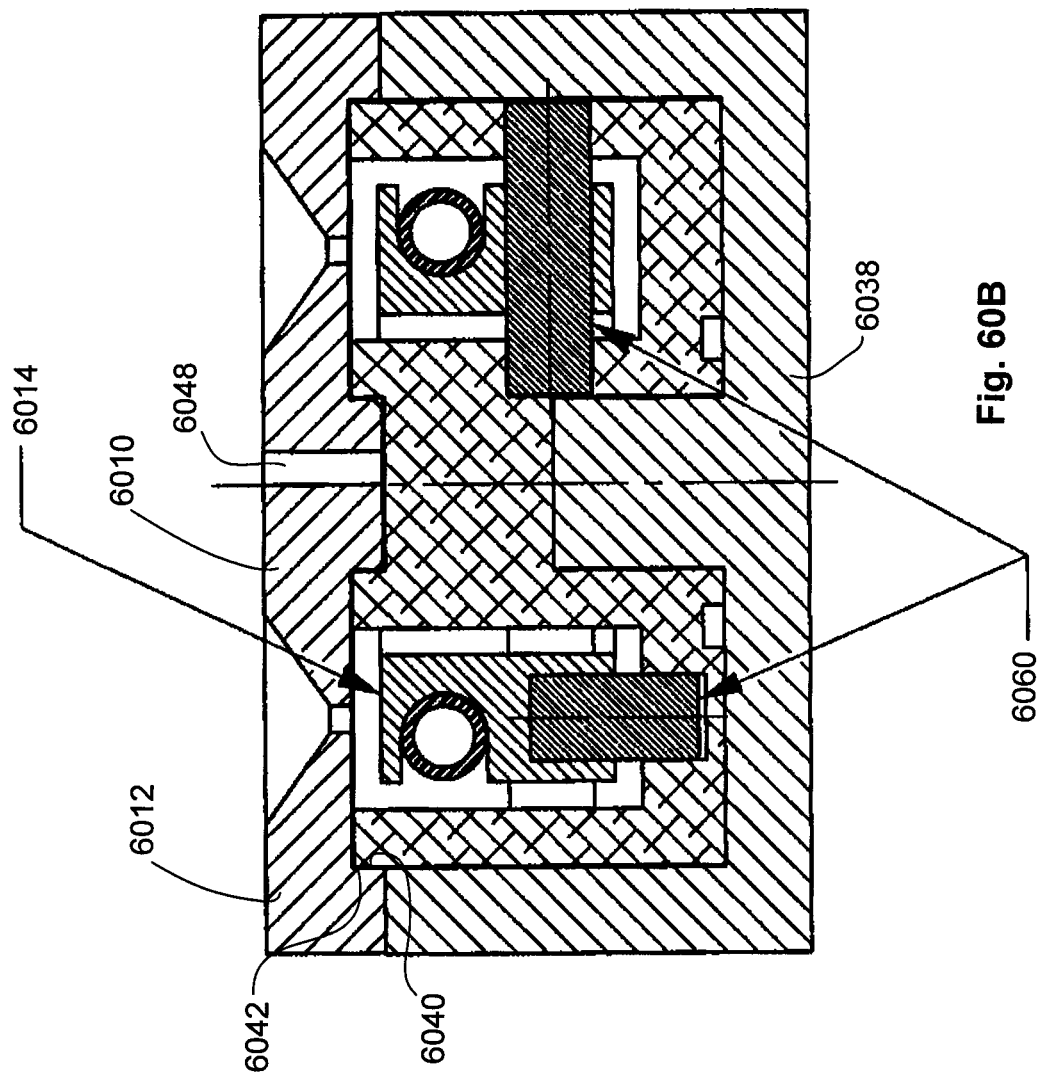
FIG. 60B is a cross sectional view of an ion source that employs ceramic pins as high voltage insulators for the anode.

It can be seen from the FIGS. 60A and 60B that both the inner and outer cathode pole pieces 6010 and 6012 have a stepped profile 6040 that fits around or into a corresponding lip or groove 6042 in a non-magnetic body filler piece 6044, which fits in a body 6038. As shown, magnets 6016 are disposed under inner cathode 6010. While threaded fasteners are not required to hold the cathodes 6010 and 6012 in place, jack screws 6046 are used for removal and installation. Each cathode pole piece 6010 and 6012 has an appropriate number of threaded jack screw holes 6048 and the body filler piece 6044 has locating dimples 6050 on axis with each hole. These dimples 6050 provide initial alignment during assembly. To install a cathode, a jack screw 6046 is threaded into each hole 6048 and extended in until its tip is well past the mating face of the cathode. The cathode is then placed into position with the tips of the screws 6046 resting in the dimples 6050 in the body filler piece 6044. The screws 6046 are systematically backed out until the cathode comes to rest, captured laterally by the locating lip 6042. The magnetic fields present are generally quite high and will provide adequate force to fix the cathodes 6010 and 6012 to the body filler piece 6044. Cathode removal is done in the reverse order. The jack screws 6046 are systematically turned in until the resulting space between the mating surfaces of the cathode and body filler piece is large enough to overcome the magnetic attraction and allow for manual removal.

Figure 61:
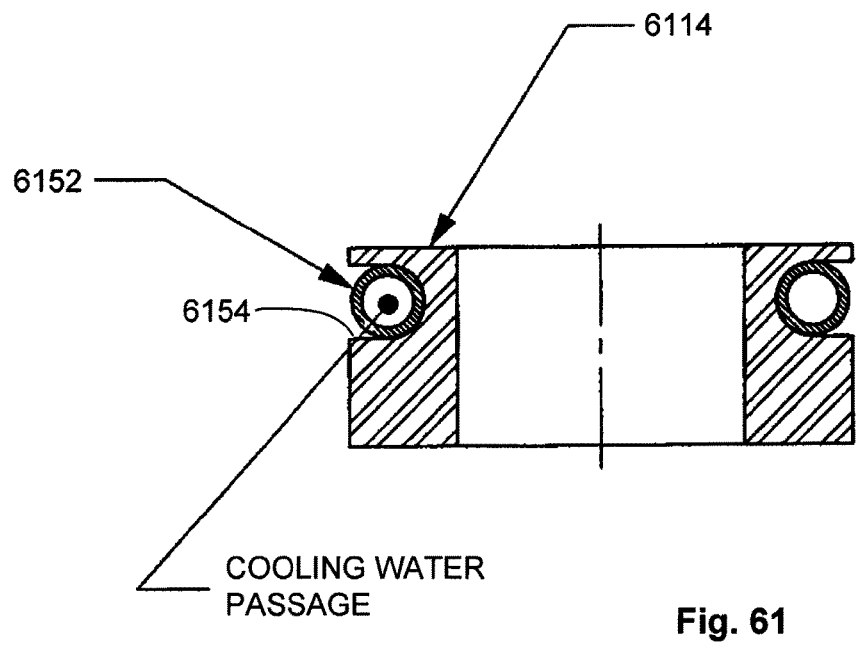
FIG. 61 is a cross sectional view of an ion source anode featuring a typical formed cooling water tube design.

FIG. 61 is a cross sectional view of an ion source anode 6114 featuring a typical formed cooling water tube design.

Figure 62:
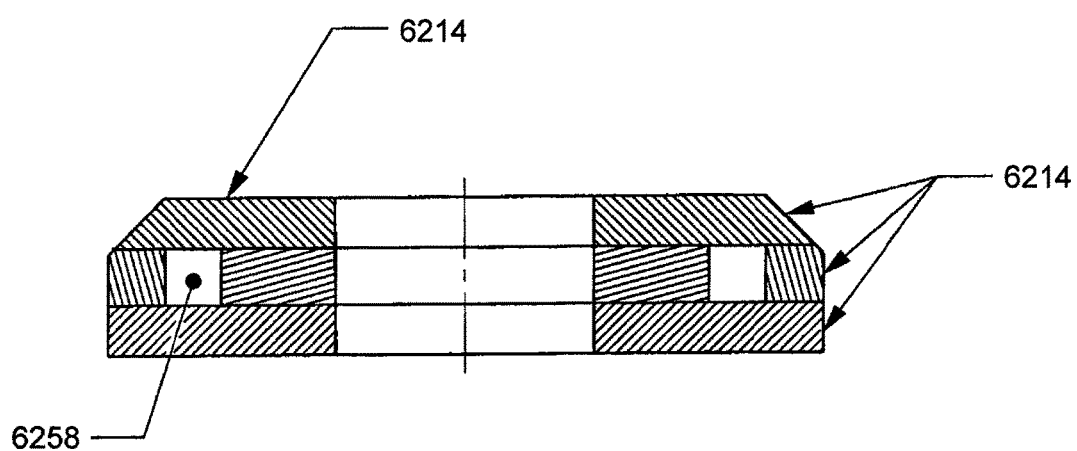
FIG. 62 is a cross sectional view of an ion source anode featuring vacuum brazed sandwich design.

FIG. 62 is a cross sectional view of an ion source anode 6214 featuring vacuum brazed sandwich design.

An ion source anode absorbs a large percentage of the operating power of the beam. Therefore some sort of cooling must be provided. Heretofore, this is done by attaching a formed stainless steel tube 6152 to the anode 6114, often in a machined groove 6154, as shown in FIG. 61. The tube 6152 is generally attached by an intermittent weld. Cooling efficiency, and as a result power capacity, is limited by the relatively poor contact between the tube 6152 and the anode 6114 itself. Additional shortcomings of this design are the difficulty and expense of machining the anode 6114 and forming the tube 6152 with sufficient precision to assure an adequate fit at assembly, especially for large industrial sized ion sources.

The present inventive approach shown in FIG. 62 includes fabricating the anode 6214 from a sandwich of stainless steel plates 6256 arranged to provide for an internal water passage 6258. These plates are then vacuum brazed to form a single unit. The advantages to this design are as follows: (1) The cooling water passage 6258 is an integral part of the anode 6214. Cooling efficiency is much higher as is power capacity. (2) Manufacturing costs are much lower, especially for large ion sources. The flat stainless steel plates 6256 can be laser cut and can include locating features for use during brazing as well as features within the water passage 6258 to control and direct water flow in order to maximize turbulence and increase cooling capacity. The brazed assembly then requires only minimal finish machining.

FIG. 60B is a cross sectional view of an ion source 6014 that employs ceramic pins 6060 as high voltage insulators for the anode.

The anode 6014 in an ion source operates at several kilovolts electrical potential, and must be insulated from the body 6038 of the ion source as well as the vacuum chamber. FIG. 60B shows a typical ion source design that employs cylindrical ceramic insulators 6060 with threaded screw holes. These insulators are available commercially in a variety of sizes and configurations. While these standard insulators give satisfactory service in typical installations they do take up quite a bit of space and are difficult to incorporate into compact designs. They can also be quite fragile, especially in the area of the threaded screw holes. FIG. 60B shows an ion source in which the anode 6014 is supported on a set of ceramic pins 6060, arranged at right angles. The vertical pins provide lateral location and the horizontal pins provide vertical and longitudinal support. If designed appropriately, this arrangement can be extremely compact and robust.

Figure 63:
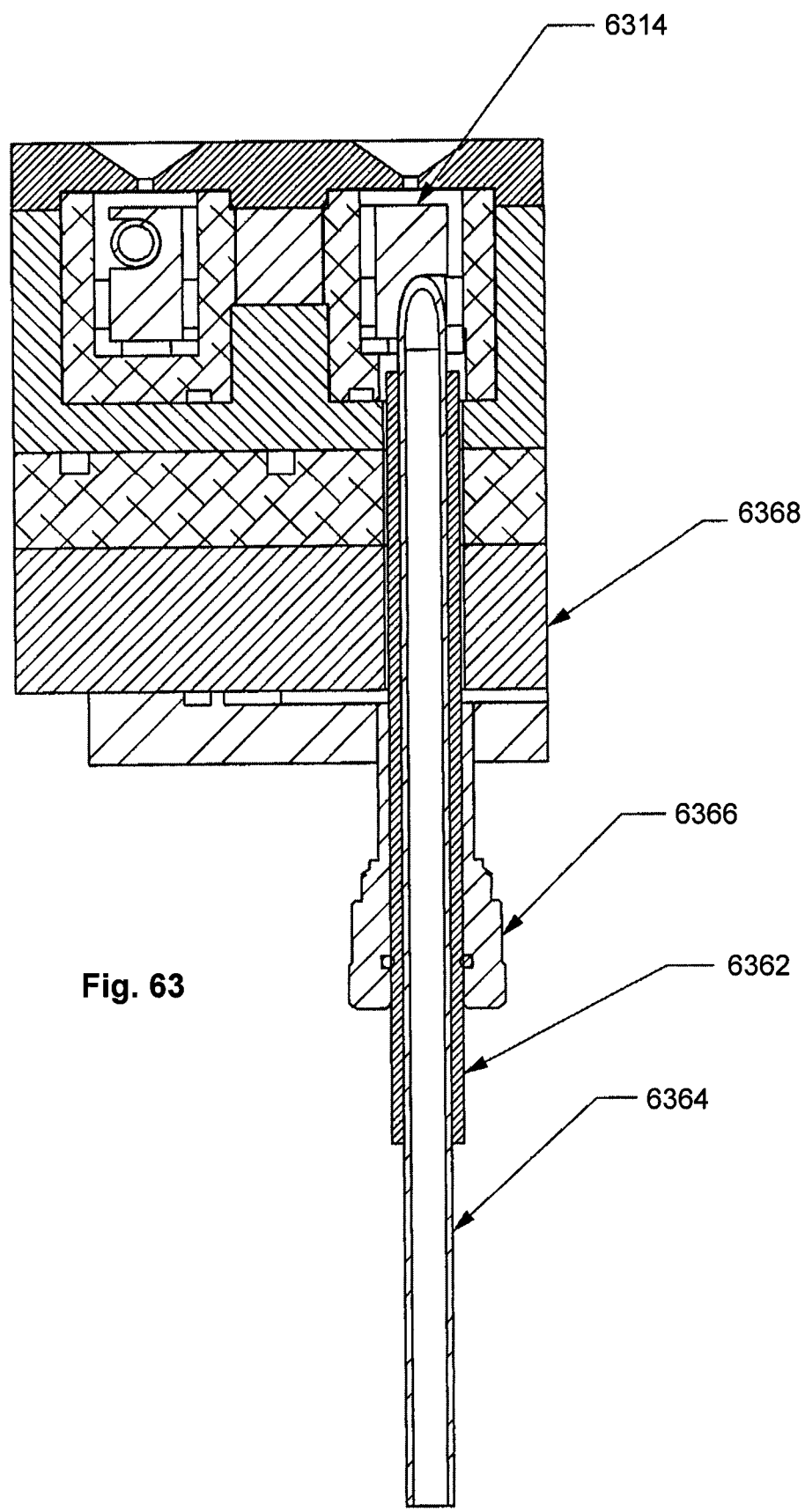
FIG. 63 is a cross sectional view of an ion source anode showing a cooling tube.

Another area of the anode that requires high voltage electrical isolation is where the anode cooling water tubes 6364 pass through the vacuum chamber wall 6368. As shown in FIG. 63, this is typically done by placing a piece of insulating tube 6362, such as Teflon, over the anode cooling water tube 6364 where it passes through some sort of o-ring compression fitting 6366. This tubing 6362 is chosen such that its inner diameter is a tight fit to the outer diameter of the cooling water tube 6364. A vacuum tight seal is then affected by squeezing the relatively soft Teflon with the o-ring compression fitting 6366, creating a seal on both the outside and inside diameters of the Teflon tube 6362. A drawback to this technique is that there is no positive sealing member between the Teflon tube 6362 and the cooling water tube 6364. The quality of the seal depends entirely on the "squeeze" created by the o-ring compression fitting 6366 and as a result tends to be a source of leakage.

Figure 64:
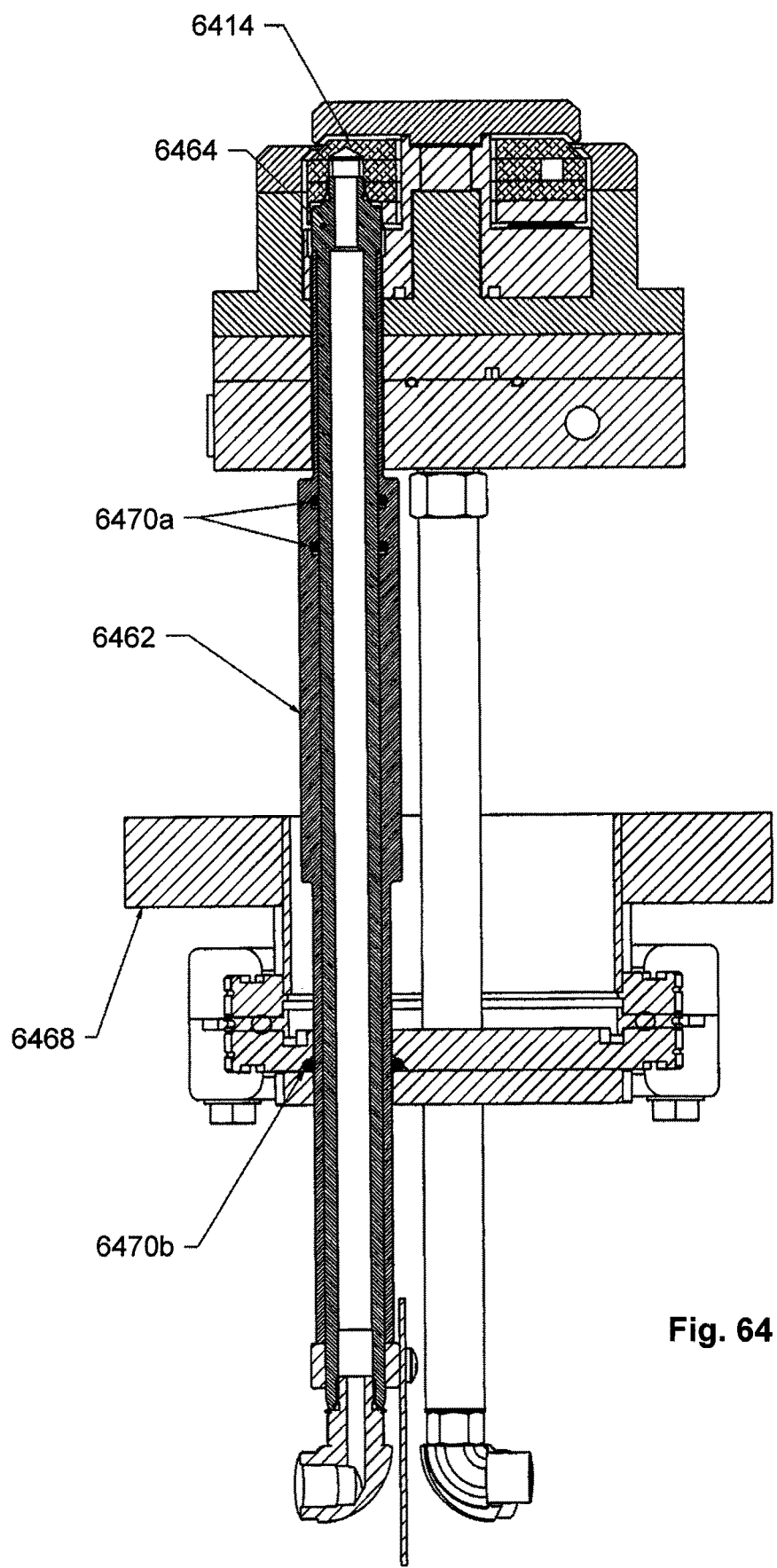
FIG. 64 is a cross sectional view of an ion source anode showing an improved cooling tube assembly.

An alternative design is shown in FIG. 64. In this case, an insulator tube 6462 is manufactured from a rigid insulating plastic and includes one or more internal grooves for o-ring seals 6470a and 6470b. When this insulating tube 6462 is fitted over the cooling water tube 6464 a positive seal is formed by the internal o-rings 6470a. The outside diameter is sealed at the vacuum chamber wall 6468 with some type of o-ring compression fitting 6470b or triangular groove design. There is no need for high compression forces and a much more reliable seal results.

Figure 65:
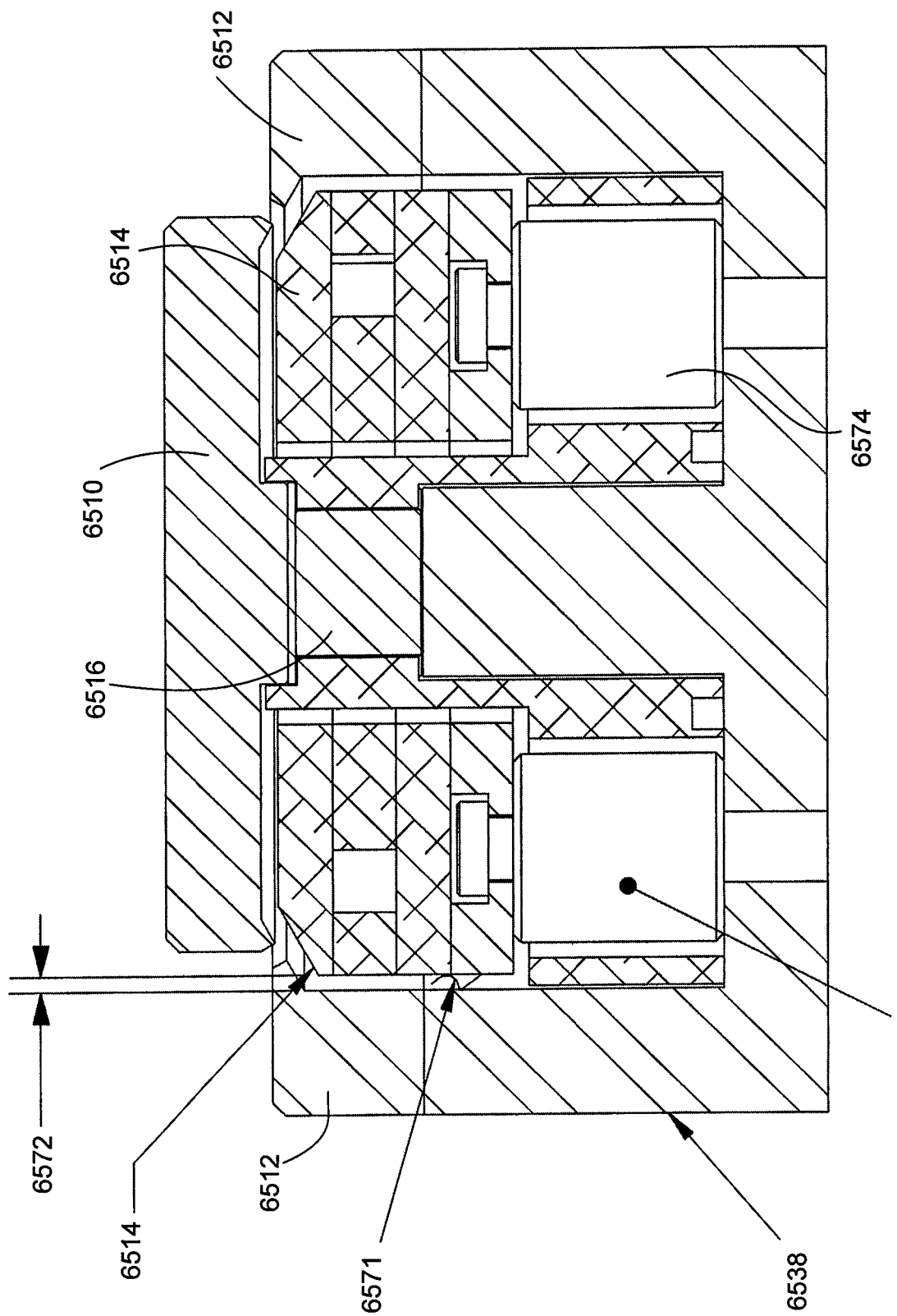
FIG. 65 is a cross section of an ion source that relies on an insulating dark space and high voltage insulators to isolate the anode from the surrounding body and cathodes.

FIG. 65 is a cross section of a typical ion source that relies on an insulating dark space 6572 and high voltage insulators 6574 to isolate the anode 6514, ~3 KV operating potential, from the surrounding body 6538 and cathodes 6510 and 6512 which are at ground potential. The practical dimension for this dark space gap 6572, at typical operating conditions, is 1.5 mm to 2.0 mm. During operation it is common for the inside surfaces of the ion source to collect dust and flakes 6571 of eroded material, some of which may be electrically conductive. At the small dimensions of the dark space 6572 it is fairly common for these conductive flakes to cause short circuits between the anode 6514 and the surrounding structure.

Figure 66:
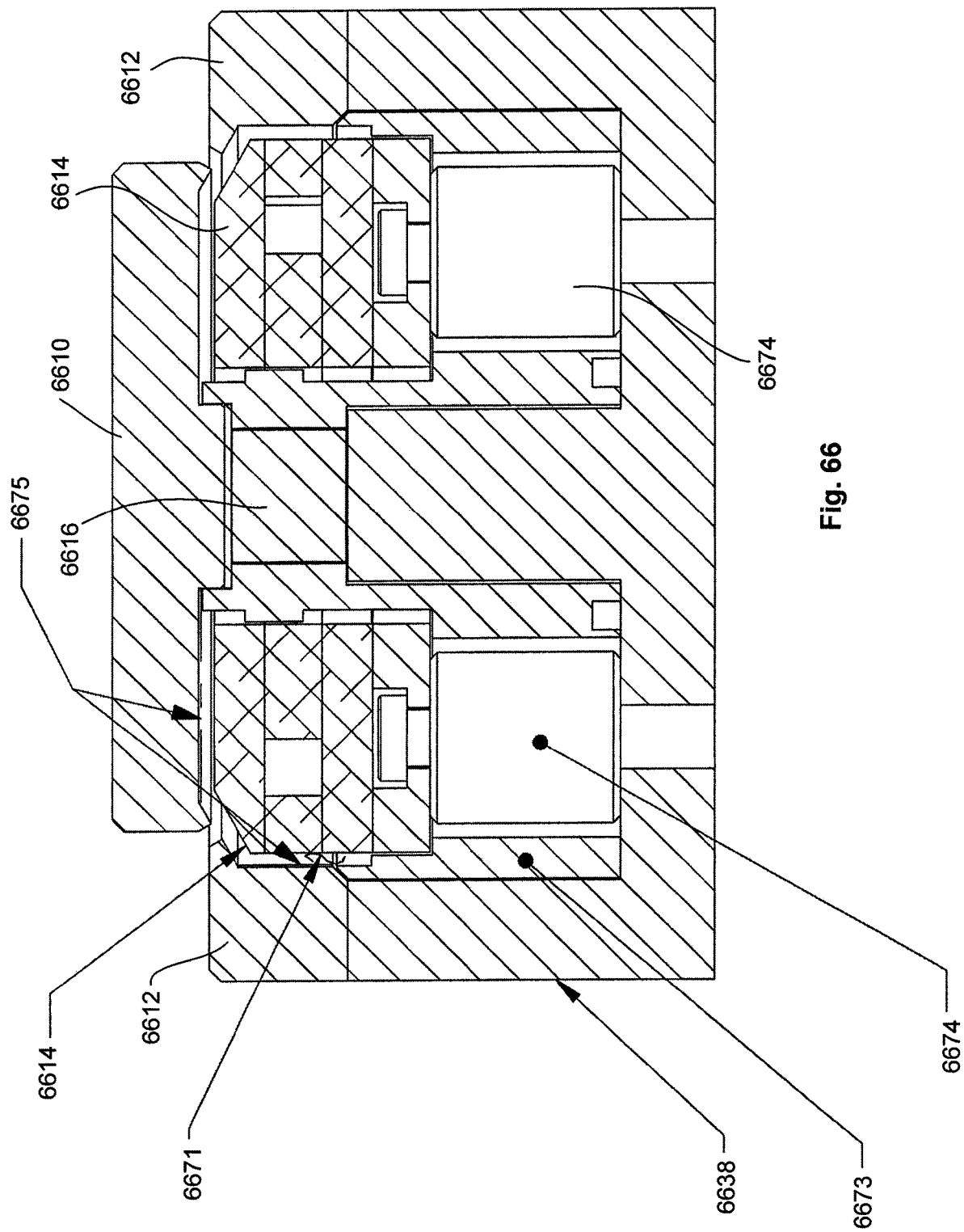
FIG. 66 is a cross section of an ion source that incorporates some design features that prevent the build-up of dust and flakes as well as minimizes the chances for flakes to cause short circuits.

FIG. 66 is a cross section of an ion source that incorporates some design features that prevent the build-up of dust and flakes 6671 as well as minimizes the chances for flakes to cause short circuits.

An insulating filler 6673, of a material with a high enough dielectric strength to resist the operating voltage, is installed in the anode cavity. This filler occupies as much of the dark space as is practically possible. This excludes foreign material and makes periodic cleaning and maintenance simpler. It is also non-conductive so any flakes that do work their way in are much less likely to cause short circuits.

The inner surfaces that are not covered by the insulating filler 6673 are coated with an insulating material with a high enough dielectric strength to resist the operating voltage. This again prevents any flakes that accumulate from causing short circuits.

In FIG. 66, the dielectric coating 6675 is applied to the cathodes 6610 and 6612, or grounded components. It is also effective to insulate the anode 6614, or high voltage component.

Figure 67B:
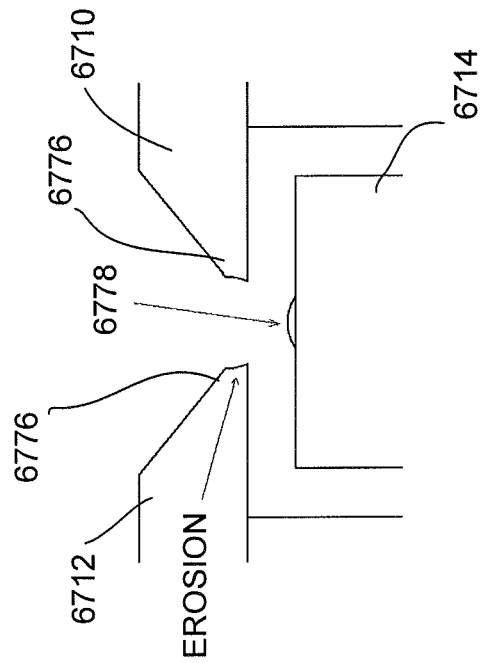
FIG. 67B is a cross section of a portion of an ion source after heavy erosion of the cathodes.
Figure 67A:
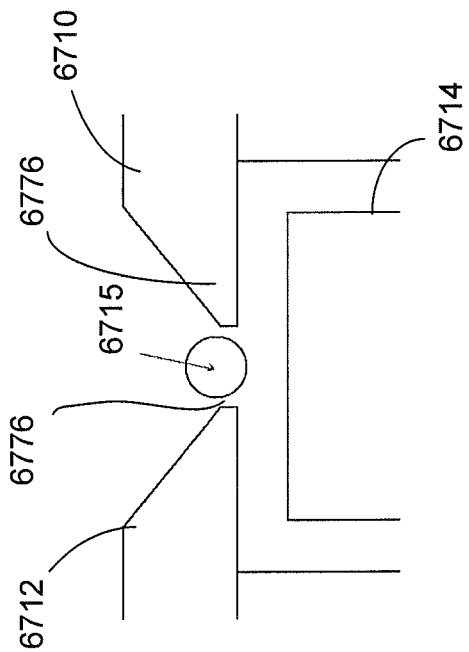
FIG. 67A is a cross section of a portion of an ion source as originally assembled.

As mentioned elsewhere in this document and illustrated in FIGS. 67A and 67B, erosion of the cathode tips 6776 by sputtering can be an issue for the use of anode layer ion sources in production. The regions of the cathode surfaces closest to the plasma can be sputtered by off angle ions ejected from the plasma 6715. This results in removal of material from the cathode tips 6776. This removal increases the size of the gap 6728 between the cathodes. The increased gap size increases the relative conductance of gas from the interior of the ion source to the vacuum chamber, changing the pressure gradient in the area of the plasma and altering the processing behavior of the ion source. This can lead to variation in the performance of the ion source in a production environment resulting in, for example, a change in the etch rate.

Increasing the spacing of the gap 6728 between the cathodes 6710 and 6712 significantly affects the magnetic field in the gap 6728. As the gap 6728 becomes wider, the magnetic field strength drops rapidly. At weaker magnetic fields the ion source becomes more sensitive to increased chamber pressure, resulting in increased arcing and decreased process stability. This can be a significant issue for embodiments where an ion source is operated in close proximity to a magnetron necessitating higher chamber pressure than would be optimum for the ion source operation.

Figure 67D:
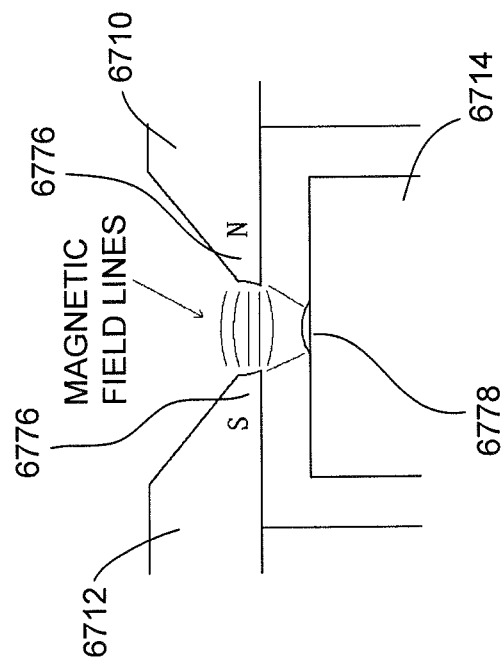
FIG. 67D is a cross section of a portion of an ion source after heavy erosion of the cathodes.
Figure 67C:
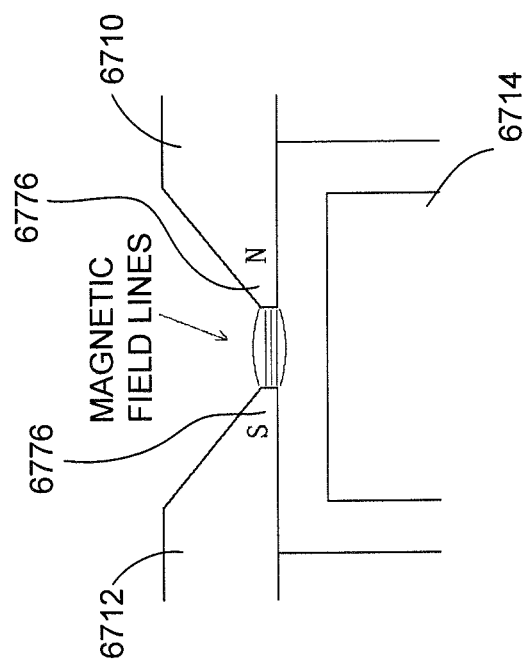
FIG. 67C is a cross section of a portion of an ion source as originally assembled.

A third consequence of erosion of the cathode tips 6776 is buildup of magnetic material on the anode surface 6714. Because the anode 6714 is the closest surface to the portions of the cathodes 6710 and 6712 being sputtered, it collects the highest density of the ablated material. The cathodes 6710 and 6712 must be fabricated out of materials with high magnetic permeability to maximize the magnetic field strength for the ion sources described here. These materials are still highly permeable after being sputtered onto the anode 6714. As illustrated in FIGS. 67C and 67D, once a sufficient volume of material has been deposited onto the anode surface it behaves as a magnetic shunt, essentially short circuiting the magnetic field in the cathode gap 6728. The magnetic field lines will normally stretch across from one cathode tip 6776 to the other, essentially parallel to the anode surface. The magnetic shunt caused by the material buildup on the anode 6714 draws the field lines down to the shunt from the cathode tip 6776, through the shunt 6778 and then back up to the other cathode tip 6776 as illustrated in FIG. 67D. Magnetic field lines passing from the grounded cathodes to the anode surface lead to increased arcing due to breakdown of the dark space gap between the anode and cathodes.

One route to reducing or eliminating the erosion of the cathode tips 6776 is to cap them with another material. This material would optimally have a low sputter rate; it would be very thin so as not to affect the magnetic field; it would have a low magnetic permeability so that buildup on the anode

6714 would not affect the magnetic field lines; it would be easily cleaned off of the anode 6714; it would be electrically conductive and it would have no detrimental effects on the process or product quality. The cathodes 6710 and 6712 of the style of ion sources described here generally utilize very low carbon steel, essentially iron, for its high permeability. Iron has a sputter yield of 0.8 atoms per ion for 500 eV argon ions (500 eV $Ar^+$ ions assumed from this point on in this discussion). For comparison, the sputter yield for: carbon is 0.4, titanium is 0.5, aluminum is 1.0 and copper is 2.0. One could envision a strip of low sputter rate sacrificial material such as titanium attached to the tip 6776 of the cathode 6710/6712. This would have to be attached in such a way as not to distort or reduce the magnetic field in the cathode gap 6728. Since the preferred material is non-magnetic the thickness of the sacrificial layer in effect increases the gap 6728 between the cathodes 6710 and 6712 and thus the magnetic field strength in the gap 6728. Therefore, one cannot arbitrarily increase the thickness of the sacrificial layer. Preferably, the thickness of the sacrificial layer and the effective gap are selected so that the magnetic field strength is above 300 gauss, more preferably above 1500 gauss, even more preferably above 2500 gauss and most preferably above 4000 gauss.

Another embodiment would be to coat the cathode tips 6776 with a thin layer of material. Again, a material such as titanium could be sputtered or evaporated onto the surface of the cathode tips 6776 to reduce the erosion rate and prevent magnetic material from building up on the anode 6714. A significant advantage of the coating approach is that no modification to the cathode design is required. The sacrificial coating on the cathodes needs to be thick enough to last a reasonable amount of time under process conditions before it is recoated to extend the service life of the cathodes. As stated above, the sputter rate of carbon is very low for a non-ceramic material. Several forms of carbon are quite conductive. Carbon based conductive paints are readily available and vacuum compatible. Liquid applied paints are quite thick in comparison to PVD coatings. They are easily removed for reconditioning. Conductive carbon based paint meets all of the requirements stated above. These carbon paints can be sprayed, hand applied or even dip coated onto the cathodes.

One feature/area that is gaining popularity is the use of the exterior mirror to display features such as turn signals, heater on/off indicators, door ajar warnings or warning to oncoming traffic that a door may be about to open. The mirror or mirror housing is also being used to house puddle or approach lighting.

The requirements are unique for an inside mirror when compared with a mirror for outside the vehicle. In at least one embodiment the specular reflectance of an inside mirror is preferably 60% or higher and preferably has ample transmittance in front of the display to pass an adequate amount of light through the associated mirror element. Furthermore, an inside mirror does not have to withstand the harsh chemicals and environmental challenges encountered in an outside mirror application. One challenge is to balance the need to meet automotive specifications for a rearview mirror and the desire to incorporate an aesthetically pleasing information center. Providing high mirror element light transmittance is one means to compensate for limited light output display technologies. Often times high transmittance results in circuitry and other hardware behind the mirror element being visible. An opacifier layer may be applied on the fourth surface of the mirror element to combat this problem.

A supplemental turn signal as depicted in FIG. 5A is one example of a display feature desirable in an outside mirror assembly. One way to incorporate a signal feature behind an electrochromic mirror element is to laser ablate some of the reflective material from the element to allow light to pass through. A desire to offer alternative styling and designs is motivation for employing transflective mirror element technologies. The transflective approaches of some embodiments of the present invention allow features in the mirror with a much more "stealthy" (covert) appearance. Stealthy allows light to pass through the transflective element while blocking the view of the source of the light. Stealthy may also or alternatively mean that there is minimal contrast between the display area and the main reflective area. In some instances there is a desire to clearly indicate the display or feature with a contrast in color or in reflectivity to give a framing effect so that the viewer has a clear indication of where to look for the desired information. Traditional materials utilized in outside mirror applications typically have low reflectivity, and or, high sheet resistance associated with achieving an appreciable transmittance level.

For example, ruthenium is often used in outside EC applications because of its relatively high reflectance and environmental durability. A 23 nm Ru coating as the reflector in an EC element would have a reflectance of approximately 57.5% a level that would meet most commercial mirror reflectance specifications. This coating would have a sheet resistance of approximately 20 ohms/sq and the EC element would have a transmittance of approximately 2.5%. Neither the transmittance nor the sheet resistance is viable for practical applications. Other environmentally durable metals may have slightly different reflectance, transmittance and sheet resistance values but none will have the properties to meet the requirements in an EC application.

A lower reflectivity requirement for OEC elements enables use of different configurations of materials including silver, silver alloys, chrome, rhodium, ruthenium, rhenium, palladium, platinum, iridium, silicon, semiconductors, molybdenum, nickel, nickel-chrome, gold and alloy combinations for the associated reflective and, or, transflective layer(s) stacks with fewer difficulties in meeting the preferred reflectance, durability and electrochromic performance characteristics. Some of these materials have an advantage over silver or silver alloys in that silver and silver alloys are susceptible to damage in an outside mirror environment. Use of harder metals is advantageous for durability of the mirror element in terms of manufacturing options and a more robust final product. Reflective and, or, transflective stacks may also be created with dielectric materials which produce high enough reflectance levels for use in an OEC element.

Ag based materials will generally gain approximately 1% transmittance for every percent of reflectance reduction in the mid-visible range. An advantage associated with increased transmission is the ability to utilize lower cost, lower light output light sources, such as, displays or LEDs. The outside mirror has typically been used for indication type displays that generally use LEDs that can be ordered with very high light outputs. Novel designs are disclosed herein that enable the use of Ag based transflective coatings in inside and outside mirror applications. These novel designs preserve the unique optical properties and benefits derived from the Ag layer while simultaneously addressing the limitations for using Ag based materials in outside applications. Different coating options may be considered when lower transmittance is part of the design criteria using stacks that have and do not have an Ag based layer. One big advantage to a lower transmittance is the reduction, or elimination, of the need for an opacifier layer.

In many markets the size of the mirror is increasing to allow for more field of view. The darkening time for larger mirrors is a challenge and is an important consideration in the design options. Larger mirrors, generally associated with outside mirrors, require increased or improved conductivity to maintain an acceptable darkening and clearing speed. The previous limitations of a single thin metal coating as described above are solved by the innovative use of a Transparent Conductive Oxide (TCO) in the stack. The TCO provides a means for achieving good conductivity while maintaining a high level of transmittance. Several of the following examples illustrate that satisfactory levels of transmittance for outside mirrors can be achieved with relatively thick Indium Tin Oxide (ITO. ITO is one specific example of the broader TCO class of materials. Other TCO materials include $F:SnO_2$, $Sb:SnO_2$, Doped ZnO, IZO, etc. The TCO layer is overcoated with a metal coating that may consist of a single metal or alloy or a multilayer metal coating. The use of multiple metal layers may be needed, for instance, to facilitate adhesion between different materials. In another embodiment a semiconductor layer may be added in addition or in lieu of the metal layers. The semiconductor layer provides some unique properties that will be discussed below. When the thickness of the ITO/TCO layer(s) is increased to improve conductivity the effects of coating roughness need to be considered. The increased roughness can lead to lower reflectance which in turn requires increased metal thickness which can lower transmittance. Increased roughness can also lead to unacceptable haze as described elsewhere. The roughness issue can be solved by either modifying the deposition process for the ITO and/or implementing ion beam smoothing after the ITO deposition and before the deposition of subsequent layers. Both methods were discussed above in detail. In addition, improved ITO materials discussed above may be employed in this embodiment to lower the sheet resistance of the overall transflective coating.

The semiconductor layer may comprise Silicon or doped silicon. Small amounts of an additional element or elements may be added to alter the physical or optical properties of the Silicon to facilitate its use in different embodiments. The benefit of a semiconductor layer is that it enhances the reflectivity with less absorption compared to a metal. Another benefit of many semiconductor materials is that they have a relatively low band gap. This equates to an appreciable amount of absorption in the blue to green wavelengths of the visible spectrum. The preferential absorption of one or more bands of light lends the coating to have relatively pure transmitted color. The high transmitted color purity equates to having certain portions of the visible or near infrared spectra with transmittance values greater than 1.5 times the transmittance of the lower transmitting regions. More preferably the transmittance in the high transmitting region will be greater than 2 times the transmittance in the low transmitting region and most preferably greater than 4 times the transmittance in the low transmitting region. Alternately, the transmitted color of the transflective stack should have a C* value $[sqrt(a^{*2}+b^{*2})]$ greater than about 8, preferably greater than about 12 and most preferably greater than about 16. Other semiconductor materials that result in transflective coatings with relatively high purity transmitted color include SiGe, InSb, InP, InGa, InAlAs, InAl, InGaAs, HgTe, Ge, GaSb, AlSb, GaAs and AlGaAs. Other semiconductor materials that would be viable would be those that have a band gap energy at or below about 3.5 eV. In an application where stealthy characteristics are desired and a red signal is used then a material such as Ge or an SiGe mixture may be preferred. Ge has a smaller band gap compared to Si and this results in a greater wavelength range that have relatively low transmittance levels. This can be preferred because the lower transmittance at wavelengths different from the display are more effective at hiding any features behind the mirror. If a uniform transmittance is needed then it would be advantageous to select a semiconductor material that has a relatively high band gap.

A display area may be stealthy in nature such that an observer may not perceive that the mirror has a display until the display it is activated or back lit. Stealthiness is achieved when the reflectivity of the display area is relatively similar to the remaining viewing area and the color or hue contrast is minimal. This feature is very advantageous because the display area does not reduce the viewing area of the mirror as discussed above.

A small amount of transmitted light can make features behind the mirror visible such as circuit boards, LED arrays, shrouds and heater terminals. Use of a light blocking (opacifying) layer may be used to avoid this problem. An opaque layer is often applied on the fourth surface of the mirror using a variety of materials such as paints, inks, plastics, foams, metals or metal foils. The challenge of applying this layer is complicated in an outside mirror. Most outside mirrors have a convex or aspheric shape which makes application of a film or coating more difficult.

An opacifying layer may be incorporated into the third surface stack of the element. The transflective area may be masked and an appropriate stack such as ruthenium, rhodium or other single or multi-layer stack (metals, metal/ dielectrics and or dielectrics) which provide the appropriate reflectance and color (opaqueness) may be applied over the remaining surface. The stealthy appearance is achieved when desired color and reflectance match or mismatches are maintained. In one preferred embodiment the display area and the main viewing area of the mirror element are virtually indistinguishable. In other embodiments one may want the transflective area to have a different color with an aesthetically pleasing contrast.

Another option is to maintain high transmittance levels in one part of the visible spectrum with low overall transmittance to obtain a stealthy appearance. Use of a narrow spectral band pass filter may also be employed to obtain the stealthy effect.

Inserting a relatively opaque layer (whether of the same material or one different than those in adjacent layers) into an otherwise transflective third surface coating stack maybe be incorporated to help hide electronics that are behind the mirror element in without, or in addition to, use of a coating or tape or other opacifying material on the rear surface of the element. Addition of this layer may affect the reflectance in the area where it is inserted. Reflectance in this area might then be adjusted, through choice of materials and their thicknesses, such that the difference between A display area and the relatively opaque areas of the mirror element are hardly noticeable, thereby preserving the unity of the appearance of the device.

It may also be advantageous to purposely offset the reflectivity and/or hue of the display area to give a visual cue as to where the display will be when it is active and give some indication that a display function is included in the mirror even when the display is off. When a conductive material is used to add opacity the conductivity of the relatively opaque portion of the display is now greater and there is a correspondingly smaller voltage drop across the majority of the viewing area providing a faster coloring speed. Additional opacifying layer(s) may be such that the reflectivity from the back of that area is substantially less than without the opacifying layer(s), thereby, lessening the effect of multiple reflections that may otherwise occur from stray light. One such device demonstrating the aforementioned principles includes a third surface coating stack of approximately 400 angstroms $TiO_2$ followed by 200 angstroms of ITO over substantially all of the entirety of the third surface followed by approximately 90 angstroms of chrome except for an area roughly over the display followed by approximately 320 angstroms of 7% gold 93% silver alloy over substantially the entire third surface.

The opening for the display on this particular model of inside automotive mirror is too small for measuring reflectance with some sphere based spectrophotometers, therefore, elements were made with different portions of the stack over their entire viewing surface in order to facilitate measurement of reflectance of the different portions of the stack. Transmission and reflectance measurements were taken from both the front and back of the elements.

Figure 68:
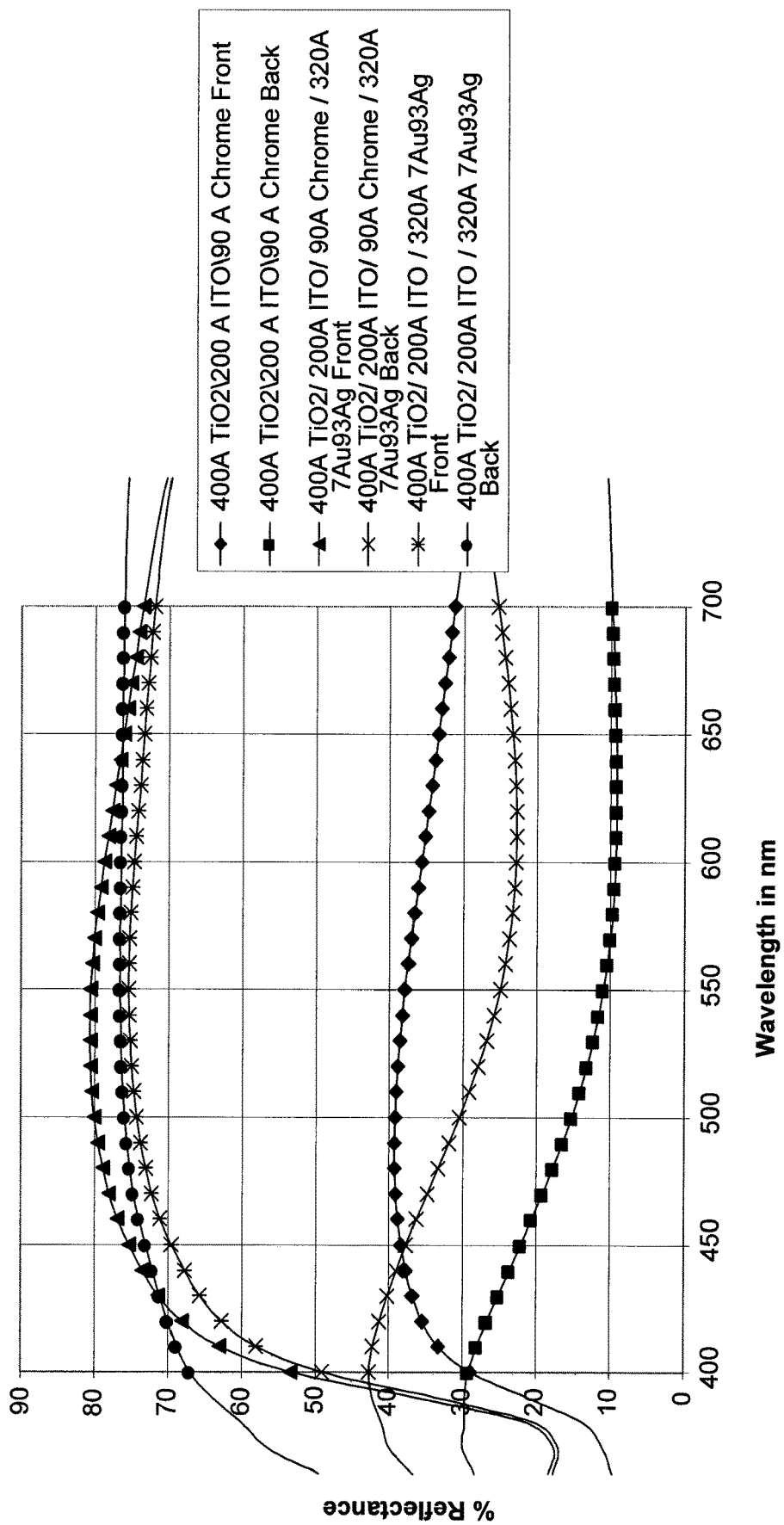
FIG. 68 depicts a graph of thin film reflectance vs. wavelength.

Tables 19 and 20 along with the graphs of FIGS. 68 and 67, respectively, depict the resulting measurements

TABLE 19

Measurements in an Element

| | A illuminant 10 Degree Observer | | | Reflectance values | |
|---|---|---|---|---|---|
| | Y | L* | a* | b* | Comments |
| 400A TiO2/200A ITO/ 90A Chrome Front | 36.8 | 67.2 | −3.5 | −1.7 | |
| 400A TiO2/200A ITO/ 90A Chrome Back | 10.8 | 39.3 | −4.5 | −23.6 | |
| 400A TiO2/200A ITO/ 90A Chrome/320A 7Au93Ag Front | 79.3 | 91.4 | −1.9 | 2.9 | as in the more opaque area |
| 400A TiO2/200A ITO/ 90A Chrome/320A 7Au93Ag Back | 24.9 | 57.0 | −3.4 | −17.0 | as in the more opaque area |
| 400A TiO2/200A ITO/ 320A 7Au93Ag Front | 74.7 | 89.3 | −1.0 | 4.0 | as in the display area |
| 400A TiO2/200A ITO/ 320A 7Au93Ag Back | 76.3 | 90.0 | −0.2 | 2.3 | as in the display area |

TABLE 20

Measurements in an element

| | A illuminant 10 Degree Observer | | | Reflectance values | |
|---|---|---|---|---|---|
| | Y | L* | a* | b* | Comments |
| 400A TiO2/200A ITO/ 90A Chrome Front | 24.5 | 56.6 | 1.4 | 5.2 | |
| 400A TiO2/200A ITO/ 90A Chrome/320A 7Au93Ag Front | 3.7 | 22.8 | −0.1 | −0.9 | as in the more opaque area |
| 400A TiO2/200A ITO/ 320A 7Au93Ag Front | 13.5 | 43.5 | −4.4 | −4.9 | as in the display area |

It can be seen that for this particular example, the addition of chrome to the stack adds opacity and lowers reflectance from the back of the element. If in order to achieve opacity the thickness of the silver alloy were increased in the non-display areas it would not yield the reduction in reflectance from the back of the element as seen in this example but would increase further the already relatively high reflectance seen from the back of the element if the chrome were omitted. It can also be seen that the display area of this design when compared to the area with the chrome layer included, has a difference in hue that is relatively small as is the difference in brightness, even though the transmission is sufficient in the display area to serve as a transflector.

It should also be noted in the preceding example that by increasing or decreasing the thickness of the silver alloy layer in the transflective region, a greater or lesser "blue bias" will be obtained, respectively, in the transmission characteristics of this display region. Using an RGB video display behind this region may benefit by adjusting the relative intensity of the red, green and blue emitters in order to maintain better color rendering. For example, in the case of transmission that was greater for the blue region of the spectrum and lesser for the red region it may be desirable to decrease the intensity of the blue emitter and increase the intensity of the red emitter. This type of adjustment would be appropriate in this and other transflective designs whether the spectral bias of the transmission is a gentle slope or one with more distinct bands of transmission.

When the display is intended for use when the mirror element is dimmed intensity adjustments may be made to compensate for any spectral bias from the coatings and, of, the activated electrochromic medium. The intensity adjustment, may be a function of the operating voltage of the device, and or, other feedback mechanism to match the relative RGB intensities appropriately for a given point in the color excursion of the electrochromic element. When dyes are used, such as those that might be used to create a "blue mirror" even when the electrochromic species are not active, the intensity of the emitters may be adjusted to have improved color rendering. As the mirror element decreases in reflectivity, any spectral bias of first and/or second surface coatings will become more of a factor; the degree of compensation of the intensities of the different colors of the display may correspondingly be adjusted. UV absorbers and other additives to the EC medium may also affect the visible absorption of the element intensity adjustments may be incorporated to improve color rendering of an associated display.

It may be advantageous to design a transflective coating for both displays and signal or other indicator applications. When high output is necessary for the signals or indicators, the transmittance spectra of the transflector may be biased to accentuate the transmittance in this region. An RGB display with equal intensities in the red, green and blue parts of the spectrum would have different intensities after passing through the transflective layer (and other components of the mirror element). This offset in intensities may then be correspondingly compensated by adjusting the output of the individual RGB colors to get proper color rendering.

The light output of LCDs is dependent on the transmittance bands of the red, green and blue absorbing filters present in the pixels. The LCD is back lit by various means. In some instances a fluorescent tube is used as the light source. In other applications the light source is an LED or series of LEDs. LEDs often are coated with a white phosphor material to provide broad band illumination of the LEDs.

In order to increase light output or lumens more power needs to be applied to the LEDs. The higher power applied to the light sources lead to more waste heat. This can cause overheating of neighboring circuit boards and other electronic components. Means are therefore needed to increase light output while simultaneously minimizing waste heat.

As LCD's transmit specific bands of light for the three colored pixels, it has been determined that the associated system will be most efficient if the light generated by the LED is matched to the transmittance bands of the LED. Specifically, the maximum benefit will occur if the LEDs emit a very narrow wavelength band of light that is optimally matched to the LCD transmittance bands. This maximizes the light through the LCD with minimal heating due to waste light and heat that does not contribute to output through the LCD.

In the case of an LCD system transmitting through an EC element the final light output will be dependent on the transmittance properties of the EC element. Various transflective coating stacks have been described herein to maximize light output for a given reflectance level. Another option is a transflective coating optimized to specifically transmit the wave bands transmitted through the LCD.

The net output of light is a product of the initial intensity of the light source, the transmittance of the LCD and the transmittance of the EC element. The LCDs typically have a fairly broad transmittance band for the red, green and blue filters because the back lighting sources are often broad band light emitters. This means that an EC element with broad, uniform transmittance spectrum is preferred. The benefit to using a spectrally selective transflective coating in an EC element is realized when the output of the light source is tuned to match the transmittance of the LCD. In this case, waste heat is minimized because the light bands are narrowly defined. The transmittance through the LCD is optimized because of the spectral matching. The final transmittance is then further optimized by the use of a spectrally selective transflective coating in the element.

Figure 68A:
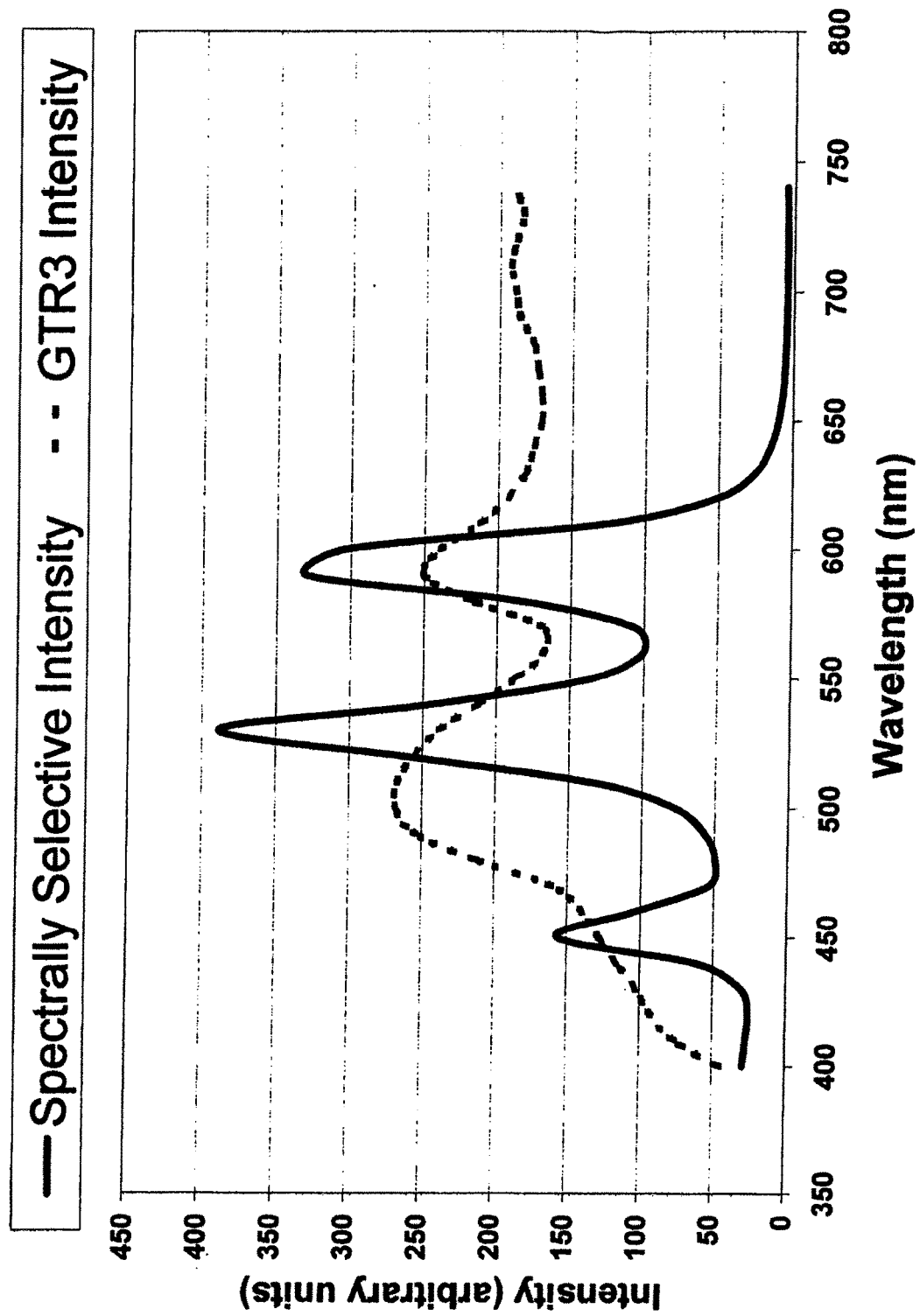
FIG. 68A depicts a graph of LED light intensity vs. wavelength.

FIG. 68A shows the relative intensity of light derived from the product of the transmittance of the LCD and a relatively uniform transflective coating (GTR3) and a spectrally selective transflector. The benefit of the spectrally selective transflector is obvious from the higher intensity levels at the design wavelengths of 450 nm, 530 nm and 590 nm. The light intensity is increased by 22%, 63% and 32%, respectively, for the 450 nm, 530 nm and 590 nm wavelengths.

The preferred configuration is where the output from the light source, LED transmittance bands and spectrally selective transflector are aligned. In practice, improvements may be obtained only if the light source and spectrally selective transflector are aligned. Alignment in this case is defined in terms of net light output. Alignment is present when the output wavelengths of the light source or light source and LCD transmittance overlap with the enhanced transmittance present in the spectrally selective transflective to such a degree that the net light output is increased relative to a uniform transflector.

A novel thin film coating stack has been developed that is particularly well suited to producing multiple transmittance bands needed for LCD applications while simultaneously having high photopic reflectance and neutral color. The neutral color is very important for many uses of these coatings. Market preferences drive products toward mirrors that have relatively neutral reflected color. Other applications may prefer a mirror with a relatively colored appearance. The spectrally selective transflective coating stack described herein is particularly well suited for applications were either neutral or colored reflectance is desired.

Figure 68B:
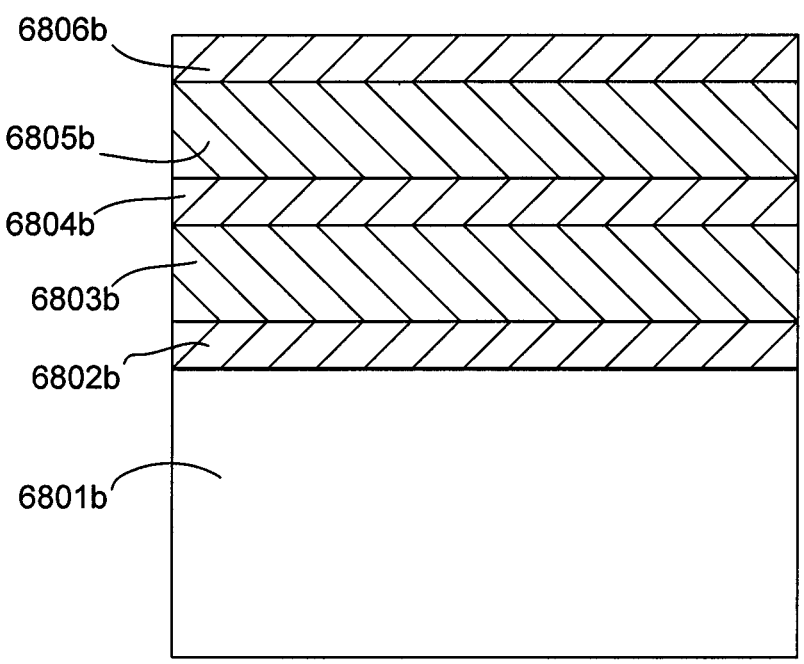
FIG. 68B depicts a profile view of cross-sections of various elements.

The general stack is shown in FIG. 68B and consists of a glass substrate 6801*b*, a first silver based material 6802*b*, a first dielectric layer 6803*b*, a second silver based material 6804*b*, a second dielectric layer 6805*b* and a third silver based material 6806*b*. The silver based material may be a pure Ag layer, a doped Ag layer, or an Ag containing alloy. The second dielectric layer and third Ag based layer may be omitted for some applications. Similarly in other applications one or more pairs of dielectric layer and Ag based layer may be added to the top of the stack. The dielectric layer may be a single layer or may consist of multiple sub layers. The selection of the sub layers, their thicknesses and total thickness of the dielectrics is based on the design criteria of the final application. In addition, thin flash layers may be added either above the top Ag based layer or below the bottom Ag based layer. These flash layers are the same as those described elsewhere in this document. The flash layers may also be placed between the Ag based layers and the dielectrics to improve adhesion or modify particular properties of the stack.

Figure 68C:
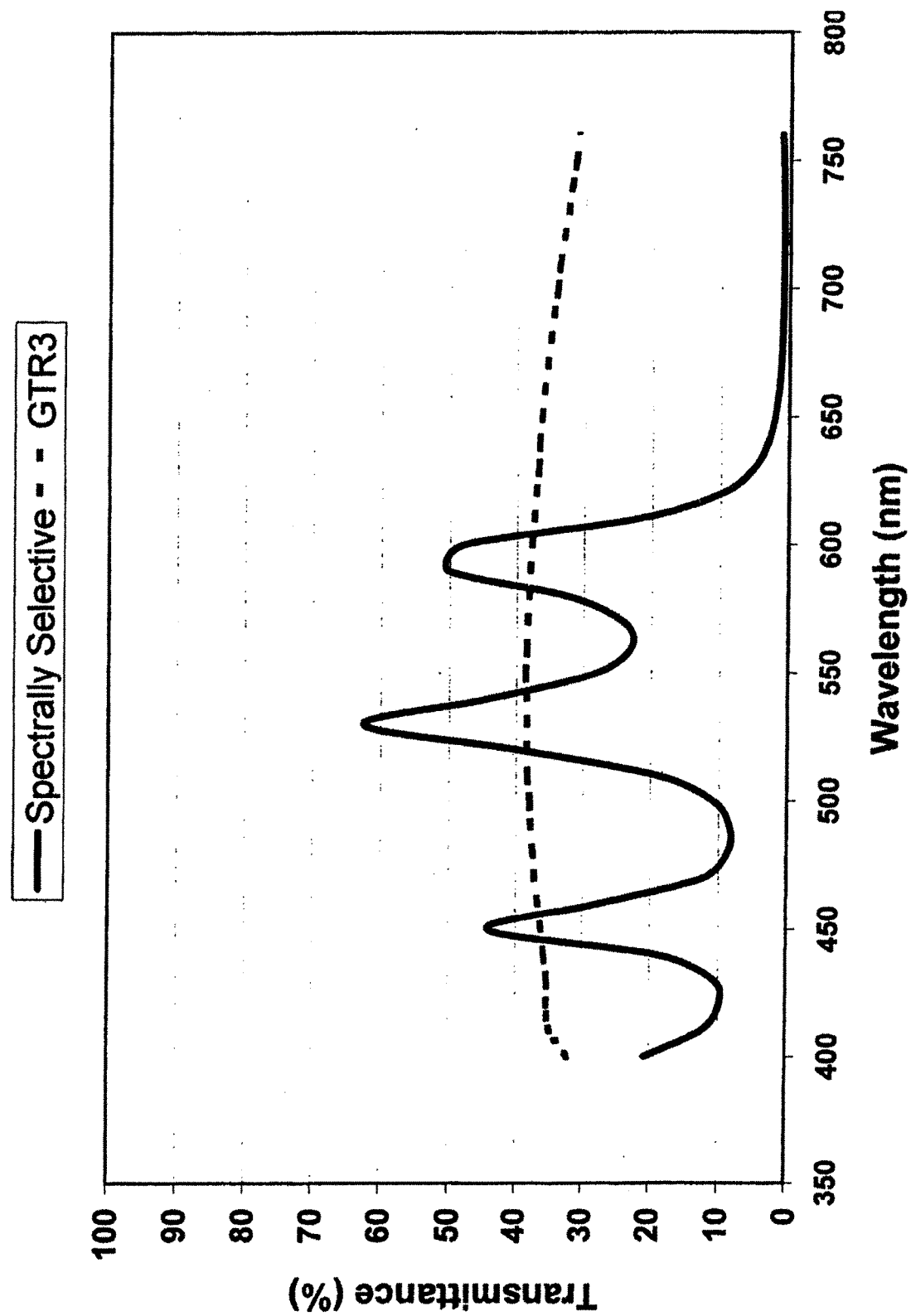
FIG. 68C depicts a graph of LED light transmittance vs. wavelength.
Figure 69:
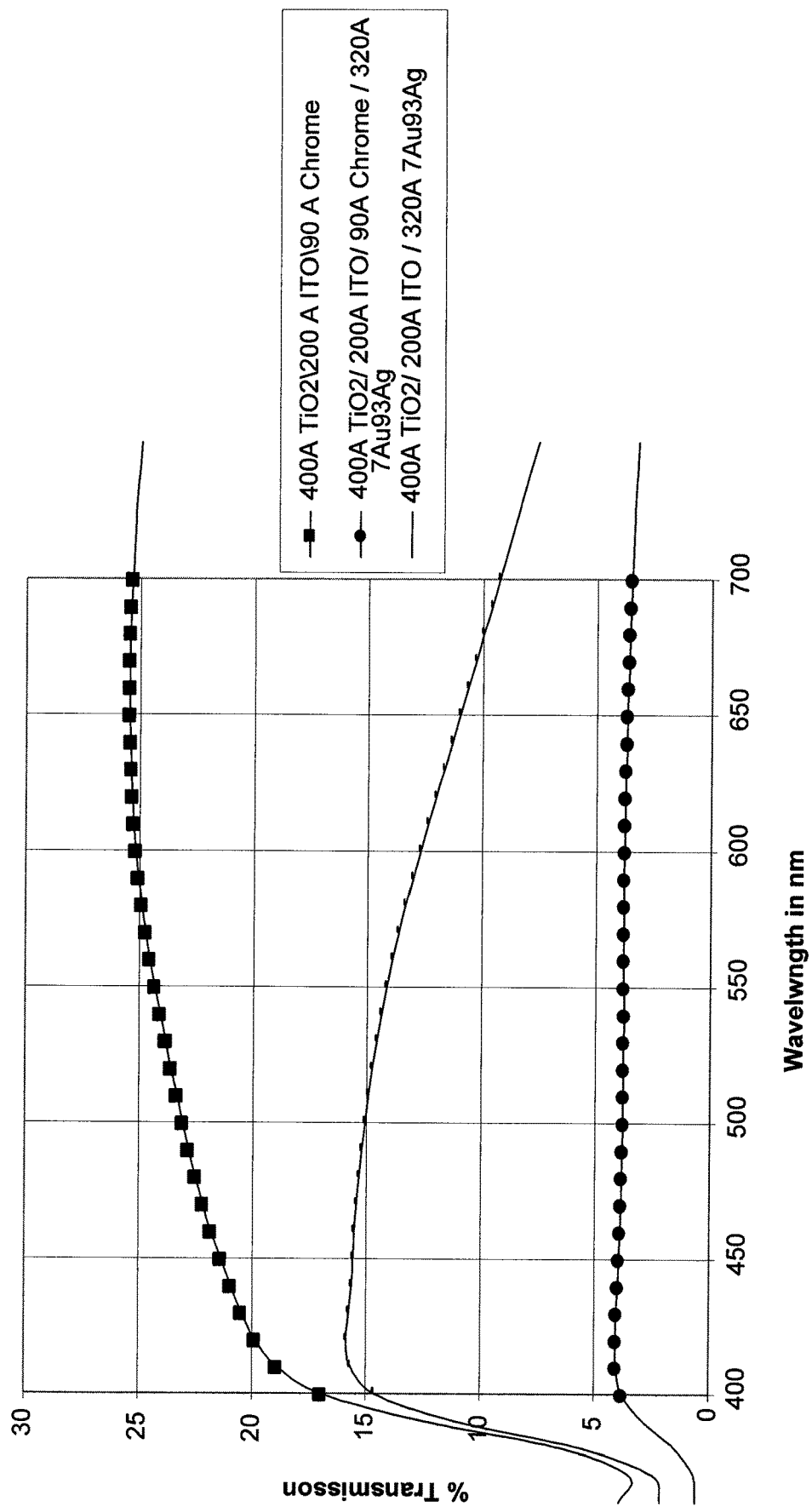
FIG. 69 depicts a graph of thin film transmission vs. wavelength.

The transmittance spectra of the spectrally selective transflective and uniform transflective (GTR3) used in the calculations for intensity plots in FIG. 68A are shown in FIG. 68C. The two coatings were designed so that they both had approximately 55% photopic reflectance in an EC cell. The transmittance is enhanced in specific wavebands by the interference effects due to the interaction of the dielectric layers and the silver layers. In this particular example the transmittance spectra are for an EC element similar to those described elsewhere in this document. The transflective coatings are on the third surface of the element. The GTR3 transflective consists of a first $TiO_2$ layer (45 nm), an ITO layer (18 nm) deposited over the $TiO_2$ and a silver-gold alloy (7% Au—20 nm). The spectrally selective transflector consists of a first layer of AgAu alloy (7% Au-20 nm), a first dielectric $TiO_2$ layer (185 nm), a second AgAu alloy layer (7% Au-17 nm), a second $TiO_2$ dielectric layer (330 nm) and a third AgAu alloy layer (7% Au-17 nm).

The thickness of the dielectric layers controls the number of transmittance bands in the final product and the wavelengths at which they occur. A thicker dielectric layer will result in more bands. The refractive index of the dielectric coating or the refractive indices and sequence of sub layers in the dielectric coating also can be tuned to further refine the wavelengths of the transmittance bands and the maximum transmittance. A general trend is that higher refractive index dielectric layers will result in higher transmittance values at the peaks of the transmittance bands. When two dielectric layers are present they do not necessarily result in transmittance bands at the same wavelength. This effect can be controlled for various design goals. If narrow transmittance bands are required then the ratio of the two dielectrics can be adjusted such that the transmittance bands overlap. In other applications wide transmittance bands may be attained by adjusting the ratio of the dielectrics so that the transmittance peaks derived from each dielectric layer diverge thus creating a broad transmittance peak.

The increase in transmittance at the various peaks results in a corresponding drop in reflectance at the wavelengths of the peaks. This will results in a decrease of the overall reflectance from the coating. The thickness of the silver based layers can be increased or decreased to tune the overall reflectance and transmittance of the coating.

There may be situations where the reflectance match between the opaque and display areas is more desirable than the example in Tables 19 and 20. Additionally, there may be benefits for having the reflectance match at a range of different reflectance values. In this manner, the transmittance of the display area may be adjusted without compromising the reflectance match between the opaque viewing area and the display areas. Another design objective is to have the color either match in the viewing and display areas or to be different in an aesthetically pleasing fashion. A color match may be beneficial when the least perceptible difference between the two areas is desired. In other circumstances it may be beneficial to have a reflectance match but a color mismatch to help guide the viewer to where the display is located.

Other means may be employed to further reduce the reflectance in the opaque area when viewed from the reverse direction independent of the first surface reflectance. Another aspect of the invention relates to the perception of the display area relative to the opaque or viewing area. The viewer will see only reflected light in the viewing area while in the display area the viewer will see a combination of reflected and transmitted light. The addition of the transmitted light in this area may make the display area noticeable even though the reflectance in both areas is identical. Therefore, the reflectance in the display area may be reduced to compensate for the added transmitted light.

It should be noted that in the previous example the reflectance match between the opaque areas and the display areas is a function of the thickness of the layers. The thickness of the chrome and AgAu7x were optimized so that the reflectance match was relatively close while still having a relatively low transmittance. The change in reflectance and transmittance as a function of the chrome and AgAu7x thickness is shown in Table 21. The data in Table 21 is modeled data for an Electrochromic element consisting of the identified stack, 0.14 microns of EC fluid, and a top plate with a ½ wave of ITO coating on the $2^{nd}$ surface. The reflectance difference between the opaque and display areas are lower when the chrome layer is relatively thin and/or when the AgAu7x layer is relatively thick. This approach provides for a means to make a mirror with an opaque area and a display with a fairly good match in certain transmittance and reflectance ranges.

TABLE 21

Optical properties of calculated stacks with
and without opacifying chrome layers
Transflective Examples

| | 2 degree, D65 | | | | Reflectance Difference |
|---|---|---|---|---|---|
| Stack | R Cap Y | a* | b* | Transmittance | |
| Glass/45 nm TiO2/18 nm ITO/0 nm Cr/15 nm AgAu7x | 48.4 | −3.8 | −0.4 | 42.1 | |
| Glass/45 nm TiO2/18 nm ITO/0 nm Cr/20 nm AgAu7x | 58.1 | −3.6 | 1.1 | 31.6 | |
| Glass/45 nm TiO2/18 nm ITO/0 nm Cr/25 nm AgAu7x | 66.1 | −3.4 | 2.1 | 22.9 | |
| Glass/45 nm TiO2/18 nm ITO/0 nm Cr/30 nm AgAu7x | 72.3 | −3.4 | 2.7 | 16.3 | |
| Glass/45 nm TiO2/18 nm ITO/0 nm Cr/35 nm AgAu7x | 76.9 | −3.3 | 2.9 | 11.3 | |
| Glass/45 nm TiO2/18 nm ITO/0 nm Cr/40 nm AgAu7x | 80.2 | −3.3 | 3.0 | 7.8 | |
| Glass/45 nm TiO2/18 nm ITO/10 nm Cr/15 nm AgAu7x | 64.0 | −3.8 | 1.6 | 13.1 | 15.6 |
| Glass/45 nm TiO2/18 nm ITO/10 nm Cr/20 nm AgAu7x | 70.3 | −3.7 | 2.2 | 9.7 | 12.3 |
| Glass/45 nm TiO2/18 nm ITO/10 nm Cr/25 nm AgAu7x | 75.3 | −3.6 | 2.5 | 6.9 | 9.2 |
| Glass/45 nm TiO2/18 nm ITO/10 nm Cr/30 nm AgAu7x | 79.0 | −3.5 | 2.7 | 4.8 | 6.7 |
| Glass/45 nm TiO2/18 nm ITO/10 nm Cr/35 nm AgAu7x | 81.7 | −3.4 | 2.8 | 3.4 | 4.8 |
| Glass/45 nm TiO2/18 nm ITO/10 nm Cr/40 nm AgAu7x | 83.5 | −3.3 | 2.8 | 2.3 | 3.3 |
| Glass/45 nm TiO2/18 nm ITO/20 nm Cr/15 nm AgAu7x | 70.3 | −3.3 | 2.1 | 4.9 | 21.9 |
| Glass/45 nm TiO2/18 nm ITO/20 nm Cr/20 nm AgAu7x | 75.2 | −3.3 | 2.5 | 3.5 | 17.2 |
| Glass/45 nm TiO2/18 nm ITO/20 nm Cr/25 nm AgAu7x | 78.9 | −3.3 | 2.6 | 2.5 | 12.8 |
| Glass/45 nm TiO2/18 nm ITO/20 nm Cr/30 nm AgAu7x | 81.6 | −3.2 | 2.7 | 1.7 | 9.3 |
| Glass/45 nm TiO2/18 nm ITO/20 nm Cr/35 nm AgAu7x | 83.5 | −3.2 | 2.7 | 1.2 | 6.6 |
| Glass/45 nm TiO2/18 nm ITO/20 nm Cr/40 nm AgAu7x | 84.8 | −3.2 | 2.7 | 0.8 | 4.6 |
| Glass/45 nm TiO2/18 nm ITO/30 nm Cr/15 nm AgAu7x | 72.1 | −2.9 | 2.1 | 1.9 | 23.7 |
| Glass/45 nm TiO2/18 nm ITO/30 nm Cr/20 nm AgAu7x | 76.6 | −3.0 | 2.4 | 1.4 | 18.5 |
| Glass/45 nm TiO2/18 nm ITO/30 nm Cr/25 nm AgAu7x | 79.9 | −3.1 | 2.6 | 1.0 | 13.8 |
| Glass/45 nm TiO2/18 nm ITO/30 nm Cr/30 nm AgAu7x | 82.3 | −3.1 | 2.6 | 0.7 | 10.0 |
| Glass/45 nm TiO2/18 nm ITO/30 nm Cr/35 nm AgAu7x | 84.0 | −3.1 | 2.6 | 0.5 | 7.1 |
| Glass/45 nm TiO2/18 nm ITO/30 nm Cr/40 nm AgAu7x | 85.1 | −3.2 | 2.6 | 0.3 | 4.9 |

A means is desirable to attain a reflectance match over a broad range of desired reflectance values while maintaining opacity in the viewing area and higher transmittance in the display area. This is attained in at least one embodiment by adding an additional layer to the stack described in the example of Table 21. This preferred third surface stack is TiO$_2$/ITO/AgAu7x/Cr/AgAu7x. By splitting the AgAu7x the ability to achieve a reflectance match over a broad intensity range and have the ability to simultaneously control the transmittance of the stack in the opaque area is attained. The transmittance in the display area is limited to the values previously described for AgAu7x stacks.

Figure 70:
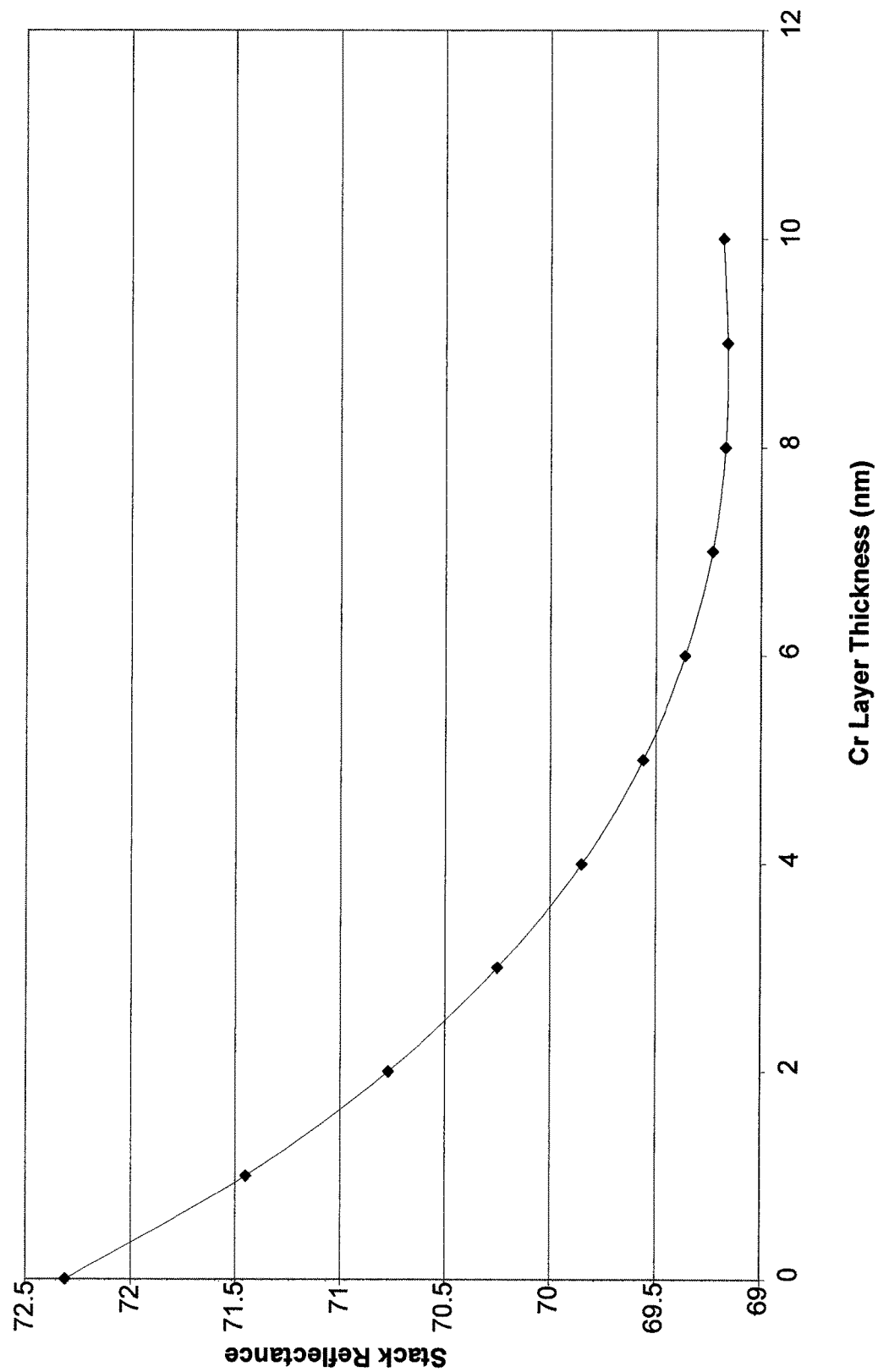
FIG. 70 depicts a graph of thin film reflectance vs. thickness.

The chrome layer is masked in the area of the display while the other layers may be present over substantially the entire surface or, at a minimum, in the area of the display. This example uses a TiO$_2$/ITO net quarter wave bi-layer (the so-called GTR3 base layer) to neutralize the color of the transflective silver or silver alloy layer in the area of the display. Other transflective color neutralization layers may be substituted in the display area and are within the scope of this embodiment. The chrome layer which splits the AgAu7x layer has the novel property in this application of not only providing an opaque character for the stack but it also optically isolates the lower layers from the top AgAu7x layer. FIG. 70 shows how the reflectance varies with the thickness of the chrome layer. As can be seen, at a thickness slightly greater than 5 nm the thin chrome layer effectively isolates the bottom silver gold alloy layer from contributing to the reflectance. This isolation results with such a thin layer of chrome which allows the chrome thickness to be tuned to attain a range of transmittance values while not having any applicable effect on the overall reflectance of the stack.

One benefit of this approach extends to the display area. Since only a thin chrome layer is needed to isolate the bottom AgAu7x layer from contributing to the reflectance the thickness of the bottom AgAu7x layer may be varied to attain other design goals. For example, the desire to have the reflectance match in the opaque area and in the display area as previously expressed may be achieved. In the examples wherein a transflective mirror element has regions of relatively high transmittance and low transmittance the term "opaque" is meant to indicate that the transmittance level is sufficiently low to hide the appearance of components behind the fourth surface without the addition of opacifying materials on the fourth surface. In certain embodiment the transmittance should be less than 5%, preferably less than 2.5% and even more preferably less than 1% and most preferably less than 0.5%. Since the AgAu7x is isolated in the opaque area, the thickness may be adjusted as needed to attain the desired reflectance in the display area. The AgAu7x top layer will have a higher reflectivity when it is deposited onto Cr versus $TiO_2$/ITO (as present in the display area). The bottom AgAu7x thickness may be set such that the display area matches the reflectance of the opaque area. The reflectance value for the mirror element may be as low as the reflectance value of the chrome layer alone up to the reflectance of a thick AgAu7x layer. The reflectance can be tuned to any desired value over this range and the transmittance can be adjusted as well. A desirable reflectance match between the display area and the viewing area is also attainable.

The silver containing layers may be other alloys or combinations of alloys aside from 7% Au93% Ag. For example, it may be advantageous to have a higher amount of gold in the alloy above the opacifying layer(s) than under the layer(s). This may be for reasons associated with obtaining a more durable interface between the opacifying layer and the upper silver bearing layer, color desires or durability of the upper silver bearing layer during processing or when in contact with the electrochromic medium. If the two silver bearing layers contain different levels of materials that easily diffuse through the silver such as gold, platinum, palladium, copper, indium or the like, the transflective area where the silver layers no longer have one or more intervening opacifying layers will likely become after processing or time, an alloy that is the weighted average of the upper and lower alloys. For example if silver-palladium alloy were used as the upper silver bearing layer and silver-gold alloy for the lower layer, then the transflective region would likely become a silver-gold-palladium ternary alloy layer. Similarly if equal thicknesses of 7% gold in silver and 13% gold in silver were used as the two silver bearing layers, the resulting layer in the transflective region would likely be a layer with essentially uniform distribution of gold at 10% in silver.

The opacifying layer may be separate layers combined in the transflective region where one, or both or all layers might not contain silver. For example, silver alloy over silicon may be employed in the transflective region, or ruthenium over silicon, among many possible combinations.

Flash overcoat layers of materials mentioned in U.S. Pat. No. 6,700,692 which is hereby incorporated in its entirety by reference, as useful for flash layers, which include among other materials, indium tin oxide, other conductive oxides, platinum group metals and their alloys, nickel, molybdenum and their alloys, may also be incorporated into the above described designs. Depending on the thickness and optical properties of the materials chosen for the flash layer(s) adjustments may be needed to the underlying stack to maintain a similar degree of match or mismatch between the relatively opaque region and the transflective region(s).

Figure 71:
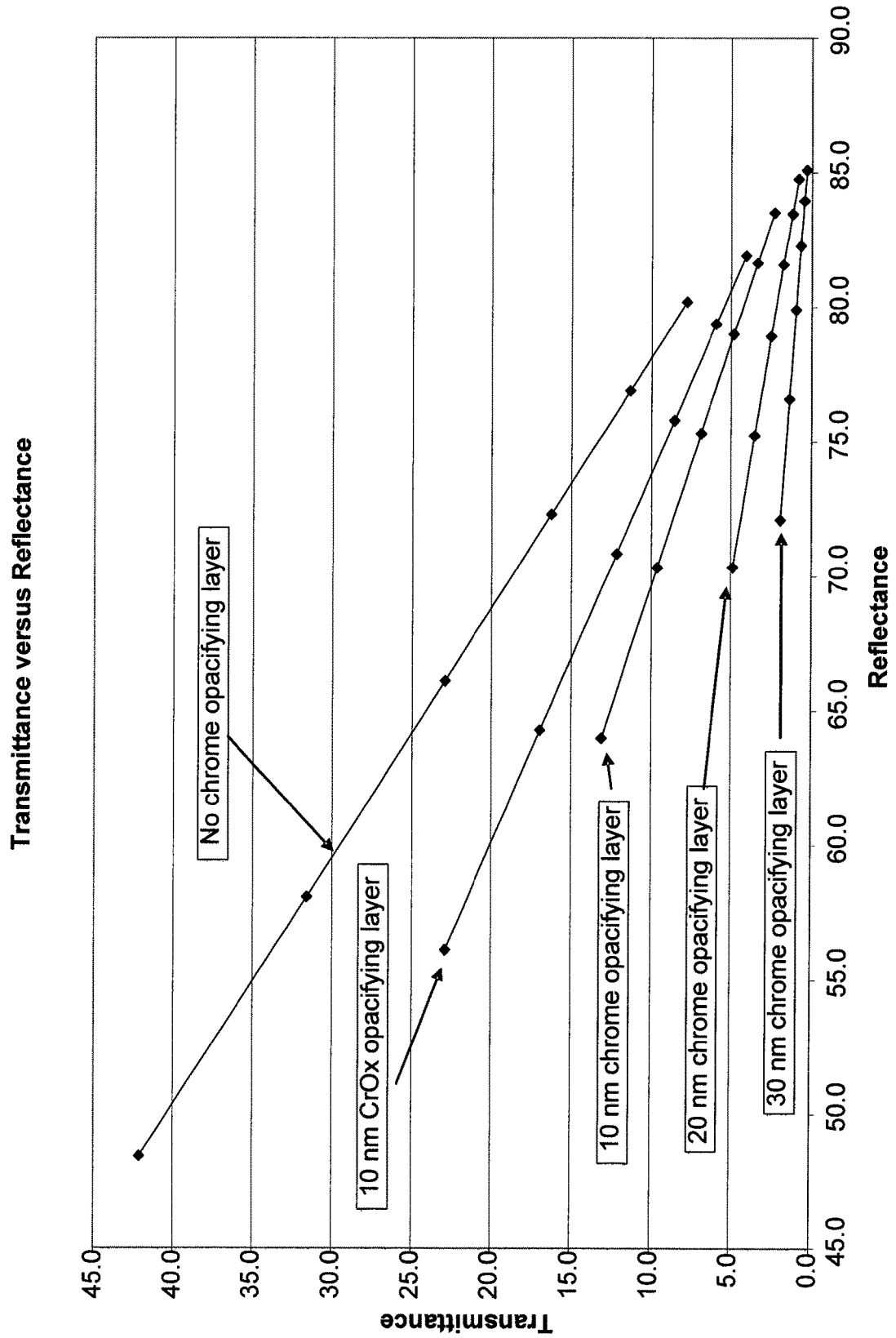
FIG. 71 depicts a graph of thin film transmission vs. reflectance.

As noted above the transmittance attainable in the "opaque" area is dependent on both the silver based layer and the chrome or "opacifying" layer. The thicker the chrome layer the lower the transmittance at a given reflectance level. The chrome layer can be thinned to a desired level to approach the transmittance of the display area. It is often difficult to control the thickness of a very thin layer if higher transmittance levels are needed. Thicker layers may be used if the metal opacifying layer is partially oxidized. A thicker layer may be needed to attain the higher transmittance relative to a thin pure metal layer. FIG. 71 depicts the relationship between transmittance and reflectance for the stacks from Table 21 above and the case of using a CrOx layer as the opacifying layer. FIG. 71 depicts transmittance versus reflectance for different opacifying layers and thicknesses. The symbols in the chart represent different thickness AgAu7x layers. The thicker layers are to the right and the thinner layers are to the left.

As can be seen, as the thickness of the AgAu7x layer is thinned the reflectance approaches the value of the chrome or opacifying layer. The thickness of the opacifying layer will affect the low end reflectance of the mirror element. For instance, when the Cr layer is 10 nm thick the low end reflectance is 41.7%, 20 nm it is 50.5% and 30 nm it is 52.7%. The low end reflectance approaches a constant value as the opacifying layer is increased in thickness however, for thin layers there will be a drop in reflectance when the layer gets too thin. This can be an advantage or disadvantage depending on the design criteria for a given application. The limitations between reflectance and transmittance for a chrome layer can be overcome by replacing the chrome layer entirely with a different material or by adding additional layers.

With reference to U.S. Pat. No. 6,700,692 different metals, semiconductors, nitrides or oxides are taught above or below the Ag containing layer. These layers and materials are selected to provide improvements to the stack. A base layer below the reflector is taught which may be a conductive metal, metal oxide, metal nitride or alloy. There may also be an intermediate layer or layers between the base layer and the reflective material. These metals and materials may be selected such that there are no galvanic reactions between the layers and/or to improve adhesion to the substrate and to the reflector or other layer(s). These layers may be deposited on the substrate or there may be additional layers below the previously mentioned base layers that provide additional desirable characteristics. For example, a dielectric pair comprising TiO2 and ITO with an effective odd quarter wave optical thickness may be present. The thickness of the $TiO_2$ and ITO layers may be adjusted as needed to meet specific conductivity and optical requirements.

When a metal layer is deposited under the silver comprising layer it may be selected from the group consisting of chromium, stainless steel, silicon, titanium, nickel, molybdenum, and alloys of chromium/molybdenum/nickel, nickel/chromium, molybdenum, and nickel-based alloys, Inconel, indium, palladium, osmium, tungsten, rhenium, iridium, molybdenum, rhodium, ruthenium, stainless steel, silicon, tantalum, titanium, copper, nickel, gold, platinum, and alloys whose constituents are primarily those aforementioned materials, any other platinum group metals, and mixtures thereof. In addition the layer under the reflector layer may be an oxide or metal oxide layer such as chromium oxide and zinc oxide.

An optional metal layer over the silver comprising layer may be chosen from the group consisting of rhodium, ruthenium, palladium, platinum, nickel, tungsten, tantalum, stainless steel, gold, molybdenum or their alloys.

The present disclosure contemplates opacifying layers in conjunction with transflective portions of the mirror or optical element. This presents new or additional design criteria be included which affect the selection of metals which act to reduce the transmittance in certain areas of the element or mirror. Table 22 below shows the reflectance and color of various suitable base or opacifying layer metals on a TiO$_2$/ITO dielectric layer stack in an EC cell. The thickness of all of the metal layers is 30 nm. The color and reflectance will vary with the thickness of the metal layers. Table 22 depicts the relative differences in color and reflectivity of various suitable metal opacifying layers on the low end reflectance when the opacifying metal is relatively thick and the AgAu7x or other Ag comprising top layer is absent. As is known in the art, alloys of these metals with each other or with other metals will have differing optical properties. In some cases the alloys will behave as do mixtures of the individual metals, however in other cases the alloys do not have reflective properties which are simply the interpolation of the individual metals. The metals or alloys can be selected for their galvanic properties, reflectivity, color or other properties as needed.

In silver containing reflective layer stack's the reflectivity and color will vary when deposited onto these different metals or alloys. Table 23 depicts metal containing stacks with 20 nm of AgAu7x on top. The color and reflectance of the 20 nm Ag containing layer stack is altered by the properties of the metal used as with the opacifying layer. The transmittance of the different stacks is also shown. As shown above for chrome, the transmittance, reflectance and color can be altered by changing the thickness of the opacifying metal. It is clear from these examples that a desired color, transmittance and reflectivity may be attained by altering the properties of the opacifying metal layer or layers.

TABLE 22

Reflectance and color of various metals in an EC cell on top of a TiO2/ITO base layer system.

| Stack | R Cap Y | a* | b* |
|---|---|---|---|
| Glass/45 nm TiO2/18 nm ITO/ 30 nm Mo/0 nm AgAu7x | 45.9 | −2.2 | 1.6 |
| Glass/45 nm TiO2/18 nm ITO/ 30 nm Au/0 nm AgAu7x | 50.8 | 1.3 | 16.6 |
| Glass/45 nm TiO2/18 nm ITO/ 30 nm NiCr (80/20)/0 nm AgAu7x | 52.8 | −2.1 | 4.4 |
| Glass/45 nm TiO2/18 nm ITO/ 30 nm Si/0 nm AgAu7x | 36.9 | −0.8 | −3.4 |
| Glass/45 nm TiO2/18 nm ITO/ 30 nm Pd/0 nm AgAu7x | 55.8 | −2.2 | 4.0 |
| Glass/45 nm TiO2/18 nm ITO/ 30 nm Os/0 nm AgAu7x | 37.4 | −0.9 | −9.8 |
| Glass/45 nm TiO2/18 nm ITO/ 30 nm W/0 nm AgAu7x | 39.3 | −0.2 | 4.8 |
| Glass/45 nm TiO2/18 nm ITO/ 30 nm Rh/0 nm AgAu7x | 63.9 | −1.3 | 2.2 |
| Glass/45 nm TiO2/18 nm ITO/ 30 nm Ru/0 nm AgAu7x | 60.3 | −2.3 | 1.1 |
| Glass/45 nm TiO2/18 nm ITO/ 30 nm Ir/0 nm AgAu7x | 56.0 | −2.9 | 3.7 |
| Glass/45 nm TiO2/18 nm ITO/ 30 nm Cu/0 nm AgAu7x | 48.4 | −2.1 | 7.4 |
| Glass/45 nm TiO2/18 nm ITO/ 30 nm Pt/0 nm AgAu7x | 51.2 | −1.8 | 5.4 |

TABLE 23

Table 23: Reflectance and color of various metals and AgAu7x in an EC cell on top of a TiO$_2$/ITO base layer system.

| Stack | R Cap Y | a* | b* | Transmittance |
|---|---|---|---|---|
| Glass/45 nm TiO2/18 nm ITO/ 30 nm Mo/20 nm AgAu7x | 73.2 | −2.8 | 3.8 | 2.1 |
| Glass/45 nm TiO2/18 nm ITO/ 30 nm Au/20 nm AgAu7x | 78.4 | −3.0 | 8.4 | 6.3 |
| Glass/45 nm TiO2/18 nm ITO/ 30 nm NiCr (80/20)/20 nm AgAu7x | 77.3 | −3.1 | 4.2 | 1.9 |
| Glass/45 nm TiO2/18 nm ITO/ 30 nm Si/20 nm AgAu7x | 62.7 | −2.0 | 0.5 | 15.8 |
| Glass/45 nm TiO2/18 nm ITO/ 30 nm Pd/20 nm AgAu7x | 78.8 | −3.0 | 3.9 | 2.1 |
| Glass/45 nm TiO2/18 nm ITO/ 30 nm Os/20 nm AgAu7x | 66.6 | −1.0 | −0.5 | 7.3 |
| Glass/45 nm TiO2/18 nm ITO/ 30 nm W/20 nm AgAu7x | 70.4 | −2.5 | 6.1 | 3.8 |
| Glass/45 nm TiO2/18 nm ITO/ 30 nm Rh/20 nm AgAu7x | 80.9 | −2.6 | 2.9 | 0.9 |
| Glass/45 nm TiO2/18 nm ITO/ 30 nm Ru/20 nm AgAu7x | 78.5 | −3.0 | 2.6 | 0.4 |
| Glass/45 nm TiO2/18 nm ITO/ 30 nm Ir/20 nm AgAu7x | 78.3 | −3.2 | 3.8 | 1.4 |
| Glass/45 nm TiO2/18 nm ITO/ 30 nm Cu/20 nm AgAu7x | 76.4 | −3.2 | 5.5 | 3.1 |
| Glass/45 nm TiO2/18 nm ITO/ 30 nm Pt/20 nm AgAu7x | 76.8 | −3.0 | 4.7 | 2.2 |
| Glass/45 nm TiO2/18 nm ITO/ 30 nm Cr/20 nm AgAu7x | 76.6 | −3.0 | 2.4 | 1.4 |

The ability to color and reflectance tune in the viewing area may be further augmented or enhanced by combining the metal opacifying layers with dielectric layers additionally described in the U.S. Pat. No. 6,700,692. The dielectric layers may modify both the color and reflectance, often without having a substantial effect on the absorption in the stack.

In order to match the color and reflectance in the display area the previously described bi-layer base layer under the silver containing reflecting layer may be employed. Table 24 depicts how the reflectance and color varies with changes to the ITO and TiO$_2$ thickness for a fixed AgAu7x layer. As can be seen the thickness of the bi-layers not only affects the reflectance, but, the color can also be tuned. These layers may then be adjusted as needed to get both the desired reflectance and color. The adjustability of the color and reflectance may be further expanded by adjusting the thickness of the AgAu7x, or silver containing reflecting layer. Additional color and reflectance changes may be obtained by adding additional dielectric or metal layers as part of the display stack either above or below the silver containing layer or by changing the refractive indices of the dielectric layers.

TABLE 24

Table 24: Color and reflectance changes with variations in the TiO$_2$ and ITO thickness of the base layer in the display area for a fixed silver containing layer thickness.

| TiO2 | ITO | AgAu7x | Reflectance (cell) | a* | b* |
|---|---|---|---|---|---|
| 20 | 15 | 20 | 46.2 | 3 | 4.8 |
| 30 | 15 | 20 | 50.1 | 0.6 | −1.2 |
| 40 | 15 | 20 | 56.2 | −2.2 | −1.2 |
| 50 | 15 | 20 | 61.5 | −3.7 | 1.5 |
| 20 | 25 | 20 | 50.3 | 1 | 0.7 |
| 30 | 25 | 20 | 56 | −1.8 | −0.6 |
| 40 | 25 | 20 | 61.6 | −3.4 | 1.4 |

TABLE 24-continued

Table 24: Color and reflectance changes with variations in the TiO$_2$ and ITO thickness of the base layer in the display area for a fixed silver containing layer thickness.

| TiO2 | ITO | AgAu7x | Reflectance (cell) | a* | b* |
|------|-----|--------|--------------------|------|------|
| 50 | 25 | 20 | 65.4 | −4.2 | 4.7 |
| 20 | 35 | 20 | 55.1 | −1.1 | 0.5 |
| 30 | 35 | 20 | 60.8 | −3.1 | 1.7 |
| 40 | 35 | 20 | 65 | −4 | 4.6 |
| 50 | 35 | 20 | 67.3 | −4.7 | 8.8 |
| 20 | 45 | 20 | 59.3 | −2.6 | 2.3 |
| 30 | 45 | 20 | 63.9 | −3.9 | 4.9 |
| 40 | 45 | 20 | 66.7 | −4.7 | 8.9 |
| 50 | 45 | 20 | 67.6 | −5.5 | 14.4 |

For example, when the color in the viewing area is yellow, blue, green or red biased by choice of metal under the silver reflecting layer or due to the silver reflecting layer itself or by a combination of the layers then a color and/or a reflectance match may be achieved by adjusting the layers in the display area. One benefit of this approach is that layers can be applied over substantially the entire surface, however because of the unique optical shielding properties of the opacifying layer or layers, these lower layers do not contribute to the reflectance and color in the viewing or opaque area but are fully functional in the display area where the opacifying layer or layers are masked. The present invention is not limited to having the layers which function in the display area cover the entire part. This is particularly applicable to layers under the opacifying layer. These layers may be deposited as necessary only in the general area of the display should the manufacturing process warrants this approach.

The adhesion of deposited thin film layers to the substrates the thin film layers are deposited onto can be significantly affected by the nucleation of the deposited material on the surface and the strength of the bonds between the substrate and deposited layer. The nucleation is partially controlled by the interaction of the arriving atomic species with the surface of the substrate. Reactive metals such as chrome or titanium rapidly form bonds to surface oxygen atoms (on oxide surfaces) resulting in good adhesion. Less reactive materials like silver tend to prefer interaction with themselves resulting in an oil on water effect. Thin silver coatings tend to ball up forming thin, discontinuous films that can remain rough as they grow thicker. There is less surface area for bonding and the bonds present are relatively weak. The nucleation and bond strengths can be addressed by the choice of material in contact with the silver. A thin layer of a material with strong interaction to silver can be deposited as a buffer layer under the silver. Materials like zinc oxide and zinc sulfide are particularly efficacious for this purpose. It is important to understand that the majority of the metal being deposited interacts preferably with the top 1 to 10 atomic layers, more preferably with the top 1 to 5 atomic layers, and most preferably, with the top 1 or 2 atomic layers. The rest of the buffer layer is essentially invisible to the overcoat. Often, the addition of a buffer layer for enhanced nucleation/adhesion can adversely affect the overall chemical, physical or optical properties of the stack.

A novel approach to controlling the nucleation and adhesion of a coating to a substrate includes modifying the surface to make it more likely to form chemical bonds to the overcoat material. Because the overcoat material only interacts with the top 1 or 2 atomic layers of the material below it, one does not need to deposit a monolithic layer of interfacial material. Surface atoms can be replaced or added to yield groups with high affinity for the overcoat material to be deposited. Surface treatment in vacuum is preferable for many production processes. This can be accomplished by several chemical vapor or physical vapor deposition processes. PECVD would be one potential chemical route to the deposition of a mono- or sub-monolayer nucleation enhancing material such as sulfur or metal sulfide coating. The surface alternatively can be exposed to an energetic plasma containing, for example, sulfur species. This can cause addition to, or replacement of, a fraction of the surface atoms yielding improved nucleation/adhesion of the next deposited layer. An ion beam is also an excellent source of energetic species. The elevated energies relative to those obtained from a plasma source are useful since they cause implantation of the species of interest at energies high enough to break and reform bonds. For many metal surfaces, simple exposure to a low partial pressure of a reactive gas, such as H$_2$S, would be adequate to add a significant concentration of a modifier, such as sulfur atoms, to the surface.

For example, the surface interaction between ITO and silver can be less than optimum. This is manifest in less than acceptable adhesion for certain applications and thermal instability relative to hazing at elevated temperature. Hazing can be caused or affected by lack of sufficient nucleation sites on the substrate and the relatively high surface mobility of silver. At elevated temperature the silver is free to migrate into 'clumps' instead of maintaining a smooth, continuous coating. If the ITO surface is treated with an ion beam supplying energetic SO$_2$ ions to the ITO surface, for example, the behavior of the silver changes drastically. Thermally generated haze is greatly reduced in the SO$_2$ treated sample compared to an untreated sample.

The most obvious choice of surface modifier is sulfur. This can be supplied in a plasma or ion beam from a number of gaseous sources; H$_2$S and SO$_2$ are two examples. Many metals form very stable bonds to sulfur. This is particularly true for the more noble-metals. Other chalcogenides, pnictogens, halogens, etc. such as O, Se, N, P, F, etc. could be chosen. Silver is a good example of a metal that can have improved nucleation and/or bond strength through this technique since it does not form particularly stable bonds to oxygen. Many other metals can benefit from this approach as well. Metals such as (but not limited to) W, Mo, Fe, Ru, Os, Co, Rh, Ir, Cu, Ag, Au, Zn, Cd, Hg, Ga, In, Tl, Ge, Sn, Pb, As, Sb, Bi all form strong interactions with sulfur.

As discussed above, silver or silver alloy layers can experience hazing caused by agglomeration of the silver or silver alloy. Such agglomeration tends to occur more easily as one makes thinner and thinner layers as is required in coating stacks where one or more silver or silver alloy layer is slightly to highly transmissive. In order to obtain an acceptable gradient or a color and reflectivity match utilizing designs and techniques described in this patent, layers of lesser thicknesses with such additional vulnerability to agglomeration may be required. Such agglomeration may occur due to processing conditions in the manufacture of the coating stack or the element, contamination interactions, voltage or polarity of voltage used in the electrochromic device, interaction of components of the electrochromic system when stored under particular environmental conditions, etc. By creating an interface where the affinity of the silver or silver alloy is increased to adjacent layer(s) one may reduce the degree of agglomeration or other degradation from a cause or causes such as those mentioned.

Electrochromic Transflective elements were made with two flat pieces of glass, half wave optical thickness Indium tin oxide as the second surface conductor, thermally cured epoxy perimeter seal, and third surface conductive stacks of approximately 400 Angstroms of $TiO_2$ under approximately 200 Angstroms of ITO, under approximately 150 Angstroms of silver or silver alloy. The variations in processing of the films described below are in relation to the conditioning of the ITO of the $TiO_2$/ITO third surface, which was cut from stock sheets and washed prior to reintroduction into a vacuum coating system and deposition of the silver or silver alloy layer.

An ion beam process, as described elsewhere herein, running at 2500 volts with substrates passing beneath the ion beam at 30 inches per minute was used where conditioning with same is indicated. In all cases, the gas used during sputtering was Argon even where the gas used during ion beam treatment was a mixture of Argon with either oxygen or sulfur dioxide. Subject tests included:

Group 1) No ion beam treatment between ITO and deposition of silver or 94% silver 6% gold alloy.

Group 2) 10 Sccm Argon/4.7 Sccm $O_2$ run at the ion beam as the substrate passed beneath prior to deposition of silver or 94% silver 6% gold alloy.

Group 3) Same as Group 2 except that there was a vacuum break between treatment with the ion beam and deposition of silver or 94% silver 6% gold alloy.

Group 4) Same as group 2 except that the gas mixture used during ion beam treatment was 10 Sccm Argon/5 Sccm $SO_2$.

Group 5) Same as Group 4 except that there was a vacuum break between treatment with the ion beam and deposition of silver or 94% Silver 6% Gold alloy.

The empty cell elements made in the fashion described above were filled, through a port left in the perimeter of the seal, with a solution containing in part anodic and cathodic electrochromic materials 5,10-dimethylphenazine, and octyl viologen tetrafluoroborate, per teachings such as found in U.S. Pat. No. 6,876,478 issued Apr. 5, 2005, entitled COLOR STABILIZED ELECTROCHROMIC DEVICES, and materials that form a permeable crosslinked polymer matrix per teachings such as found in U.S. Pat. No. 7,001,540 issued Feb. 21, 2006, entitled ELECTROCHROMIC MEDIUM HAVING A SELF-HEALING CROSS-LINKED POLYMER GEL AND ASSOCIATED ELECTROCHROMIC DEVICES, and plugged with a UV cured material (each of these patents being incorporated herein by reference in their entirety). These elements were then subjected to storage at 125° C. for about 24 hours. At the end of that time elements were inspected for cosmetic issues with the following result.

All group 1-5 elements containing 94% silver and 6% gold as the layer on top of the treated third surface ITO layer showed little haze or difference in haze between the groups. Groups 1-3 with silver as the same layer showed noticeable haze when inspected under high intensity light in a darkened room whereas Groups 4 and 5 had relatively little haze.

The same groups were then inspected after and additional 72 hours of 125° C. exposure. Again all groups containing the silver/gold alloy showed little haze and therefore little difference in haze. Groups 1-3 with silver as the metal layer still showed substantially greater haze than Groups 4 and 5, Group 5 was only slightly hazier than Group 4 demonstrating that the $SO_2$ ion beam treatment can still be nearly as effective after a short vacuum break.

The same groups were then inspected after a total of 1 week of 125° C. exposure.

Groups with the unalloyed silver had become sufficiently hazy in all groups as to all but wash out the differences between groups although Groups 4 and 5 were still discernibly less hazy. The elements with 94% silver 6% gold as the metal layer after 1 week at 125° C. had haze levels appreciably better with the sulfur dioxide treatment. The trends with the silver/gold alloy were the same as the pure silver except that it took longer for the differences to manifest. Groups 4 and 5 of the silver alloy groups after the 1 week exposure did have sufficient haze to discern that Group 5 was only slightly hazier than Group 4 if at all.

Electrochromic reflective elements were made with two flat pieces of glass, half wave optical thickness Indium tin oxide as the second surface conductor, thermally cured epoxy perimeter seal, and third surface conductive stacks of approximately 300 Angstroms of Chrome, under approximately 150 Angstroms of silver or silver alloy. The variations in processing of the films described below are in relation to the conditioning of the chrome on the third surface, prior to the deposition of the silver or silver alloy layer.

An ion beam process, as described elsewhere herein, running at 2500 volts with substrates passing beneath it at 30 inches per minute was used where conditioning with same is indicated. In all cases the gas used during sputtering was Argon even where the gas used during ion beam treatment was a mixture of Argon with either oxygen or sulfur dioxide. Subject test Groups included:

Group 1) A vacuum break and no ion beam treatment between the chrome and deposition of silver or 94% silver 6% gold alloy.

Group 2) 10 Sccm Argon/4.7 Sccm $O_2$ run at the ion beam as the substrate passed beneath prior to deposition of silver or 94% silver 6% gold alloy.

Group 3) Same as Group 2 except that there was a vacuum break between treatment with the ion beam and deposition of silver or 94% silver 6% gold alloy.

Group 4) Same as Group 2 except that the gas mixture used during ion beam treatment was 10 Sccm Argon/5 Sccm $SO_2$.

Group 5) Same as Group 4 except that there was a vacuum break between treatment with the ion beam and deposition of silver or 94% silver 6% Gold alloy.

The empty cell elements made in the fashion described above were filled, through a port left in the perimeter of the seal, with a solution containing in part anodic and cathodic electrochromic materials 5,10-dimethylphenazine and octyl viologen tetrafluoroborate, per teachings such as found in U.S. Pat. No. 6,876,478, and materials that form a permeable crosslinked polymer matrix per teachings such as found in U.S. Pat. No. 7,001,540 and plugged with a UV cured material. These elements were then subjected to storage at 125° C. for about 16 hours. At the end of that time elements were inspected for cosmetic issues with the following result.

All Group 1-5 elements containing 93% silver and 7% gold as the layer on top of the treated third surface chrome layer showed little haze or difference in haze between the groups. Groups 1-3 with silver as the same layer showed noticeable haze when inspected under high intensity light in a darkened room whereas Groups 4 and 5 had relatively little haze with group 4 still had noticeably less haze than Group 5.

The same groups were then inspected after an additional 96 hours of 125° C. exposure. Groups containing the silver gold alloy over the chrome showed substantially more haze in Groups 1-3 than in Groups 5 and 4. Groups with the unalloyed silver over the chrome had become sufficiently hazy in all groups as to all but wash out the differences between groups although Groups 4 and 5 were still discernibly less hazy.

A parallel set of just the coated backplates were heated to about 190° C. for about 5 minutes time, cooled and then inspected. The coated glass plates with the 93% silver 7% gold over the chrome did not show appreciable haze or difference in haze on Groups 1-5. The coated glass plates with pure silver over the chrome had more haze on groups 1-3 than on Groups 4 and 5.

In some situations it might be advantageous for the reflector and or transflector to be bluish in reflected hue. It could also be advantageous to combine an opaque bluish reflector region and a bluish transflective region in the same element for a stealthy appearance.

It is known to make blue electrochromic elements that have a blue hue to them even when there is no potential applied to them through the use of dyes such as in U.S. Pat. No. 5,278,693 which is hereby incorporated by reference. There are also practical methods using third surface coating stacks to make such a device that meets the typical requirements of outside automotive electrochromic devices. These techniques could also possibly be used in combination. Such a device must, at present, have a reflectance value above 35% in the United States and 40% in Europe. Preferably in at least one embodiment reflectance values above 50% or 55% are preferred. Whatever third surface stack is utilized needs to be durable, both chemically and physically and electrically in an electrochromic device.

Figure 77:
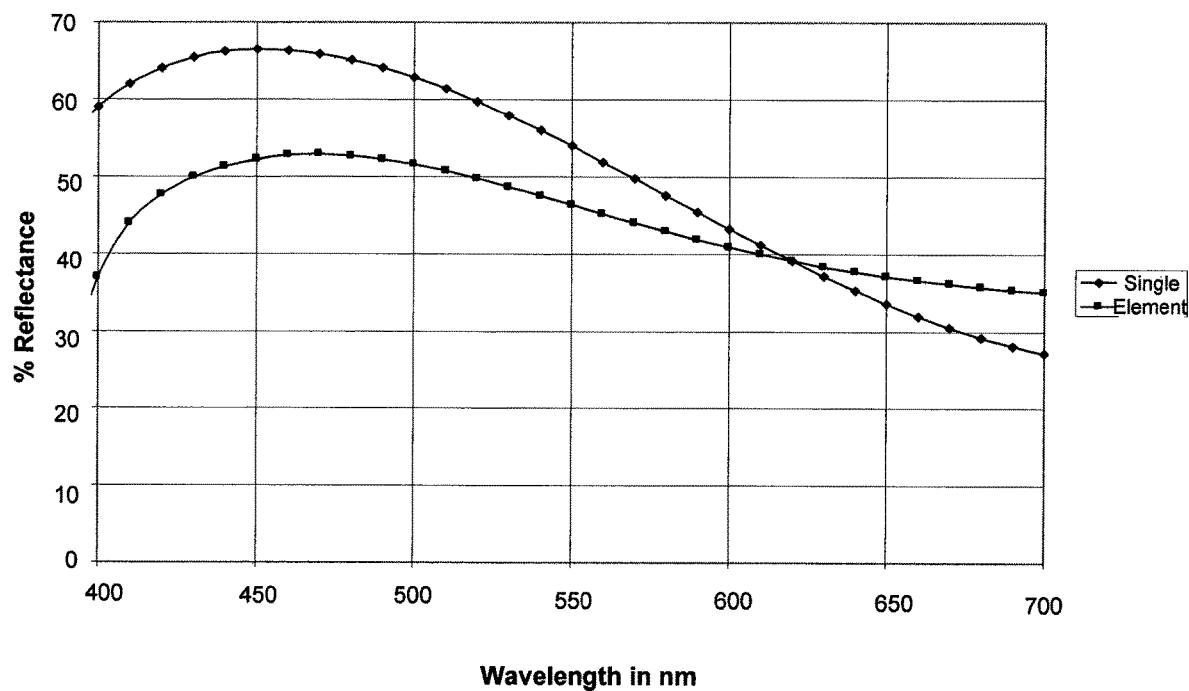

One can obtain a bluish Electrochromic device by depositing a layer of chrome on glass that is essentially opaque and then depositing approximately 900 Å of ITO over the top of that and afterwards completing the construction of an electrochromic device. A coating stack made and used in such a fashion had color values shown in Table 25 and a reflectance spectrum shown in FIG. 77. Table 25 and FIG. 77 show values when the coating is on a single lite of glass and after incorporation into an EC element.

There will be a substantial reflectance drop when the coating on glass measured in air is compared to the reflectance in the completed device. To compensate one might think that an opaque layer of silver or silver alloy could be used instead of or in addition to the chrome layer with a similar top layer or layers. However the optics of silver are such that it is more difficult to obtain a high reflectance bluish coating over a silver based material. This is partly due to the slightly yellow spectral bias of silver and also due to the fact that as there is little one can do to interferentially boost the reflectivity of silver in any portion of the spectrum to give it significant color since the reflectance is already so close to 100% over the visible spectrum.

If one however places a translucent layer of silver or silver alloy between the chrome and ITO in the stack above, one can still boost the reflectivity a significant amount, maintain a bluish color and increase the conductivity of the third surface reflector electrode.

With a translucent layer of silver present one could make a region that is transflective by the addition of color neutralizing underlayer(s) and "splitting" the silver and masking an opening in the chrome, in accordance with teachings contained in this document.

For example a reflective stack of approximately 40 nm of $TiO_2$, 20 nm of ITO, 14 nm Silver, 50 nm Chrome, 10 nm Silver and 90 nm ITO models as being similar in hue and brightness to the same stack without the Chrome layer. Without the chrome layer the transmission of the stack is calculated as being adequate for use as a display or light sensor region. Therefore one could mask the chrome during the deposition of that layer and make an electrochromic element with similar bluish hue and brightness (i.e. stealthy) in both the opaque and transflective portions of the device.

One might also boost the reflectivity of the Chrome\ITO stack through the insertion of a low index layer between the chrome and the ITO or by multiple alternating low and high index layers. However most low index oxide and fluoride materials in sufficient layer thicknesses to have the appropriate optical effect will also be electrical insulators. Silver itself is however a low index material and this does explain in part its benefit when placed between the chrome and ITO.

TABLE 25

Illuminant A 10 degree observer Chrome with about 900 Angstroms ITO as single and as the 3rd Surface reflector electrode

|  | Y | L* | a* | b* |
| --- | --- | --- | --- | --- |
| Single | 49.571 | 75.805 | −13.526 | −15.323 |
| element | 44.315 | 72.439 | −7.339 | −7.896 |

Another feature beneficial in the area of display windows and transflective coatings is an anti-reflection feature from the reverse direction. Often displays put out a substantial amount of stray light which bounces or scatters around the back of the mirror element and eventually make its way out in the area of the display. By having the elements have a relatively low reflectance from the reverse direction this stray light can be reduced. Attaining lower reflectance without additional layers on the fourth surface has the added benefit of reduced cost.

Cr/$TiO_2$/ITO/AgAu7x/Cr/AgAu7x is provided in the opaque or viewing area while having $TiO_2$/ITO/AgAu7x/AgAu7x in the display area. The first chrome layer is thin, about 2 to 15 nm thick, preferable about 5-10 nm thick and is masked in the display area. The second chrome is also masked in the display area and its thickness is adjusted to get the desired transmittance in the viewing area. The $TiO_2$/ITO bi layer covers the entire surface and is adjusted to get the anti-reflectance effect from the reverse direction in the viewing area while providing the proper color in the display area from the front of the part.

Table 26 depicts the reflectance from the reverse direction, or from the fourth surface. The first case is the reference case. This is the stack described above for the opaque or viewing area of the mirror element. As can seen the reflectance from the back is quite high at about 61%. In the second case a thin chrome layer (~5 nm) is added below the dielectric layers. The addition of this thin layer in the viewing area reduces the reflectance to approximately 6% at 10 fold decrease in intensity. In this manner the scattering of any stray light will be reduced. This reflectance value, and its color, may be adjusted by the thickness of the chrome layer and the dielectric layers. Approximately 4% of the 6.2% reflectance arises from the uncoated fourth surface of the glass. If further reductions in reflectance are desired an additional traditional anti-reflection layer may be added. The reflectance value of 6.2% could be reduced to values below 2.5%.

TABLE 26

Reflectance from reverse direction (fourth surface)
with and without anti-reflection layer in the view
area. These are assembled element values.

| Stack | R Cap Y |
|---|---|
| Glass/35 nm TiO2/18 nm ITO/14 nm AgAu7x/25 nm Cr/8.5 nm AgAu7x | 61.4 |
| Glass/5Cr/35 nm TiO2/18 nm ITO/14 nm AgAu7x/25 nm Cr/8.5 nm AgAu7x | 6.2 |

The amount of reflectance reduction and its absolute value are dependent on the properties of the first silver containing layer and the subsequent chrome layer. As described above these layers are adjusted to tune not only the transmittance but also the reflectance toward the viewer. As these layers are adjusted to meet varying design goals or targets, the dielectric layers and/or the base chrome layer may be adjusted to achieve the optimal anti-reflection effects.

Other metals or absorbing layers other than chrome may be used as the anti-reflection layer. Materials such as tungsten, chrome, tantalum, zirconium, vanadium and other similar metals will also provide a broad anti-reflection property. Other metals may result in a higher, more colored reflectance. Additionally, the chrome or other metal layer may be doped with small amounts of oxygen or nitrogen to alter the optical properties of the metal to adjust the anti-reflection properties.

The usefulness of an alternating set of a layer of high and low refractive index or multiple sets of such layers to modify the optical properties of a surface or thin film stack has been mentioned elsewhere in this document. Materials that are typically thought of as being low refractive index that are metal oxides, nitrides, oxynitrides, fluorides tend to be poor conductors. Typically, the greater the difference in indices of refraction between adjacent materials the greater the optical effect. This is why a material with an index of refraction of about 1.6 or less is usually used as the low index material. However, beneficial effects arise with materials of higher index, such as transparent conductive oxides, when the material to which the TCO is coupled has sufficiently higher index of refraction and results in a high-low index pair. In particular, when titanium dioxide is used as a relatively high index material coupled with indium tin oxide as a relatively low index material benefits are obtained optically and electrically. In particular titanium dioxide is a relatively high index of refraction material that is not a sufficiently good insulator at optical thicknesses to isolate more conductive thin films placed above or below it such as ITO, another TCO or a metal or semimetal layer or layers. When $TiO_2$ is applied as an optical thin film between layers that are much more conductive, such as Indium Tin Oxide, the $TiO_2$ will not insulate the ITO layers from one another in an electrochromic element and the desired optical effect of a high-low-high stack is achieved. In other words, most of the cumulative conductivity benefits of the total thickness of ITO in the thin film is retained along with obtaining the optical benefits of the high and low index layers. The following examples will illustrate the benefits of this principle in general and these materials in particular. All base layers were deposited and measured on soda lime glass (n approximately 1.5 in the visible spectrum).

Figure 78A:
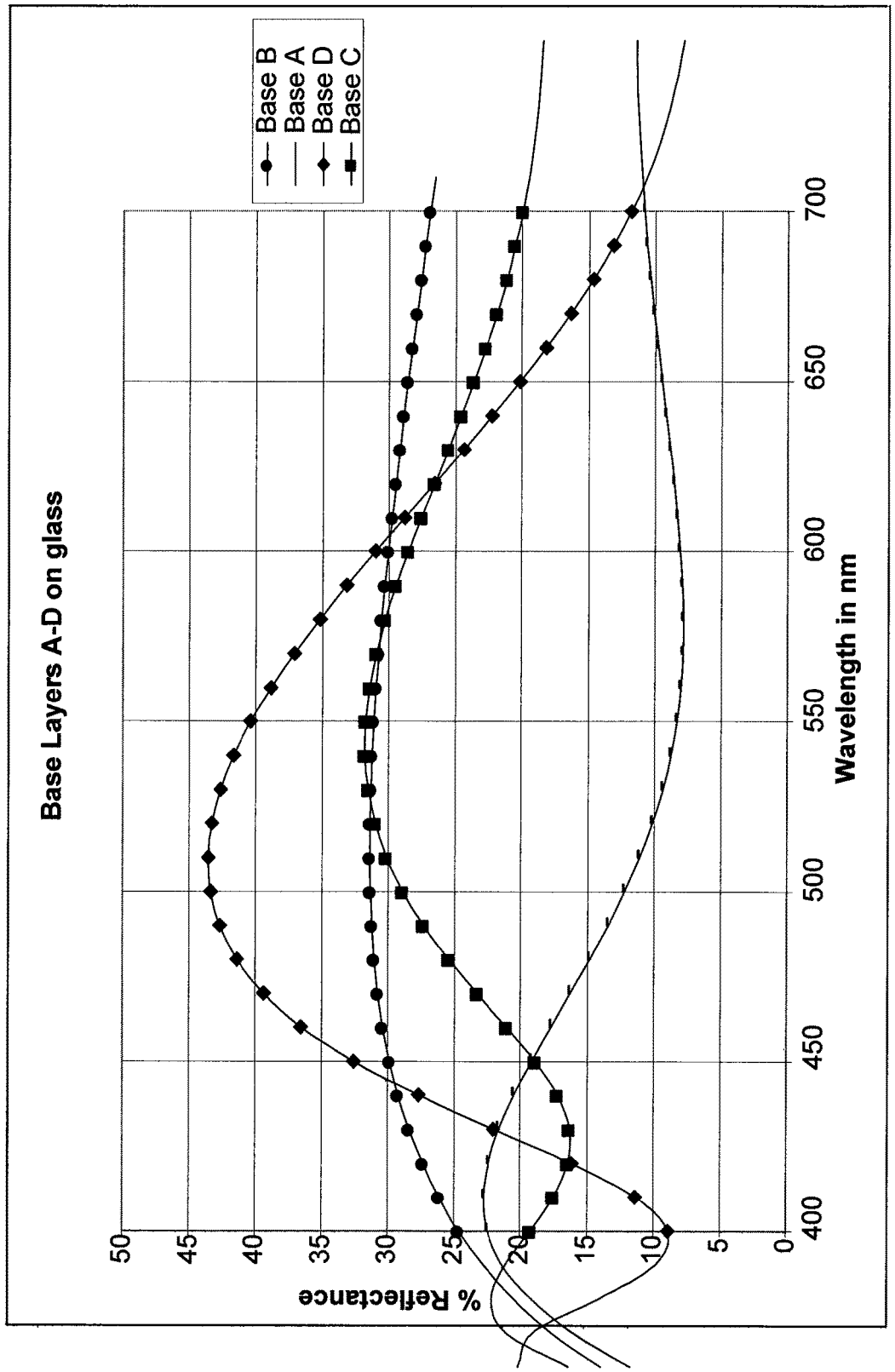
FIGS. 78A-83 depict various embodiments of elements having graded thin-film coatings.

Base layer A=half wave optical thickness ITO of approximately 145 nm physical thickness and 23 ohms/square sheet resistance (produced under conditions less than ideal for conductivity). Base layers B=approximately 40 nm titanium dioxide under approximately 20 nm ITO with sheet resistance between about 110 and 150 ohms/square. Base layers C=Base layer A+base layers B with a sheet resistance of approximately 16 ohms/square (the lower than expected sheet resistance may be due to the fact that capping the ITO layer of A before vacuum break and cooling may have enhanced the conductivity compared with layer A alone). Base layers D=approximately 42.5 nm titanium dioxide, 42.5 nm ITO, 42.5 nm titanium dioxide, 42.5 nm ITO with a sheet resistance of about 40 ohms/square. FIG. 78A depicts the reflectance spectra of these base layers on glass in air (without additional coatings and prior to assembly into electrochromic elements).

Figure 78B:
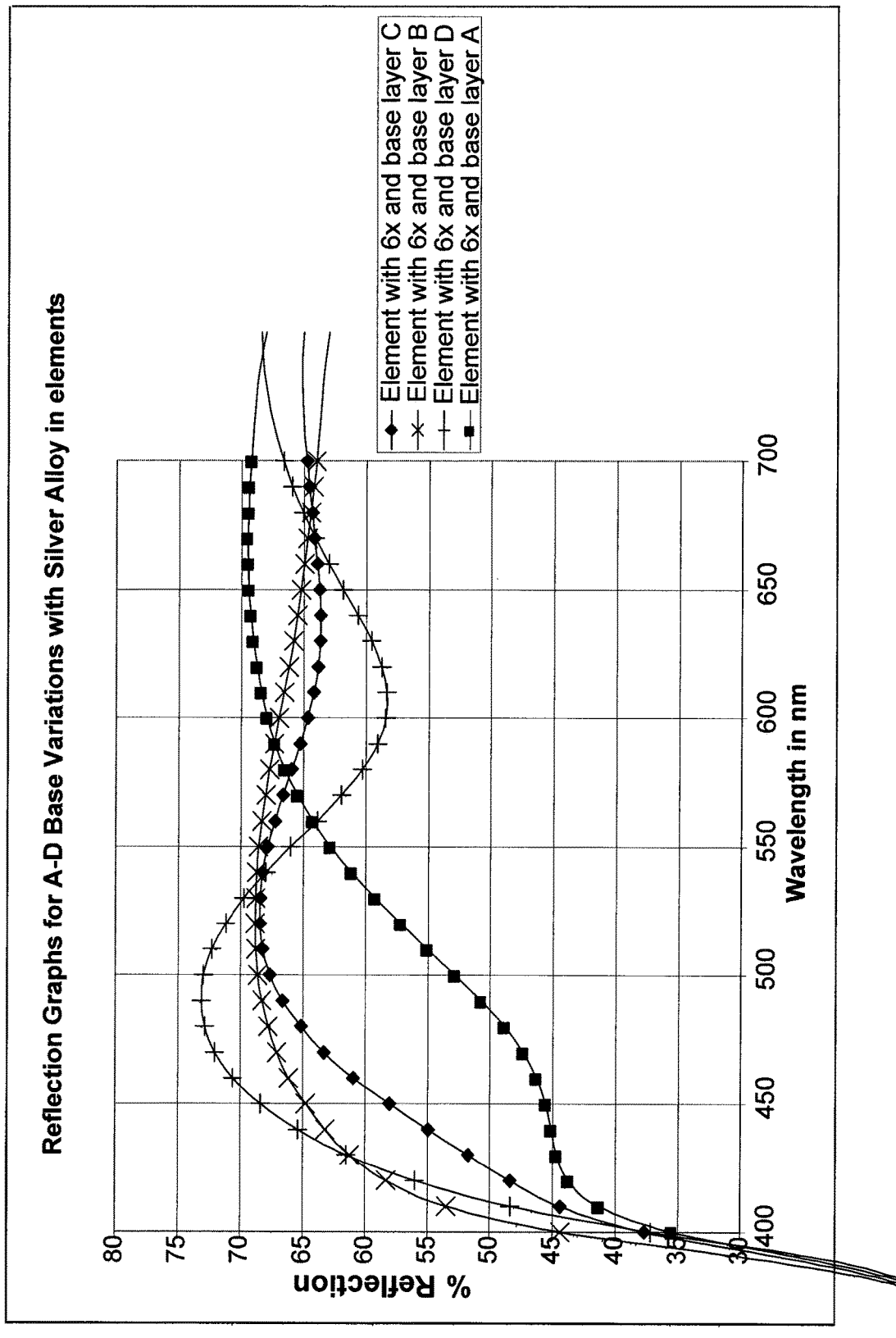
Figure 78C:
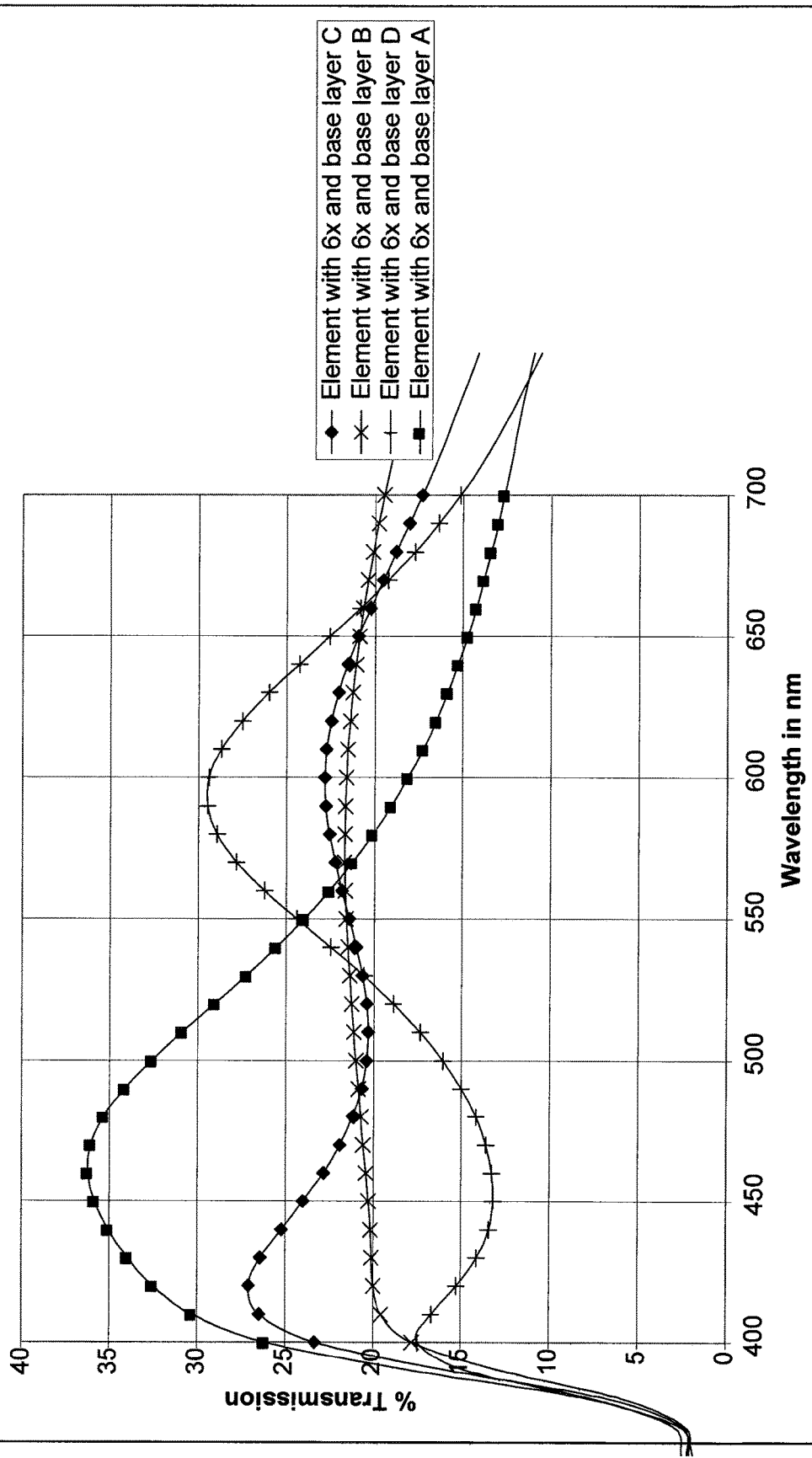

Samples from the same coating runs (note that there will be some variation even within a run) as the samples of FIG. 78A were given an additional coating of approximately 25 nm of 6% Au 94% Ag (referred to as 6x) alloy and assembled into electrochromic elements in accordance with principles outlined elsewhere in this document. Half wave optical thickness ITO with approximately 12 ohms/square on glass was used as the second surface coating for these elements. Spectrophotometric measurements were then taken as depicted in FIGS. 78B and 78C. The results are tabulated in Table 27.

TABLE 27

| Reflected Color Values | Illum | L* | a* | b* | Y | Illum | L* | a* | b* | Y |
|---|---|---|---|---|---|---|---|---|---|---|
| Element with 6x and base layer C | D65 | 85.183 | −5.628 | 7.707 | 66.366 | A | 85.076 | −3.044 | 6.241 | 66.156 |
| Element with 6x and base layer B | D65 | 85.921 | −2.895 | 3.187 | 67.83 | A | 85.815 | −1.824 | 2.358 | 67.618 |
| Element with 6x and base layer D | D65 | 84.769 | −7.573 | −1.199 | 65.555 | A | 83.838 | −6.109 | −3.781 | 63.754 |
| Element with 6x and base layer A | D65 | 82.573 | 2.453 | 15.379 | 61.362 | A | 83.845 | 5.064 | 16.813 | 63.768 |

As mentioned previously, it is often useful to mask the silver alloy so that it is, for the most part, not deposited under the seal area As a consequence, if that option is chosen the electrical contact for the element is made to the underlayer(s) on the third surface. In such an instance lower sheet resistance for the underlayers becomes more important than if the silver or silver alloy is taken all the way to the point of electrical contact via buss bar or conductive epoxy or other means.

Resistance measurements on the base layers described were taken with a four point probe that can give misleading results as to the surface conductivity if the probes break through insulating layers. Therefore elements were constructed with just the base layer(s) as the third surface coatings and compared for coloring and clearing characteristics. The performance of the elements was consistent with sheet resistance measurements taken via the four point probes.

In one embodiment of the present invention a color and reflectivity match between the viewing area and the display area may be desired. In some examples mentioned above there may be two different metal stacks in the two areas and if the same metal is the top layer the thickness of the layer may be different or other metals may or may not be below the top metal layer. As singles, before being laid up into EC elements, the reflectance of the two areas may be adjusted to be substantially the same. After lay up, when the medium in contact with the metals changes from air to that of the EC fluid the reflectivity may be different in the two areas. This is because each stack interacts with the new incident medium in different ways.

For example, Ruthenium as the top layer in one design (Glass/TiO$_2$ 45 nm/ITO 18 nm/Ru14 nm) and AgAu7x in another (Glass/TiO$_2$ 45 nm/ITO 18 nm/AgAu7x19 nm) both are adjusted to have a reflectance as single of 70.3% then when assembled into an element the Ru side will drop to 56.6% reflectance while the AgAu7x side will drop to 58.3%.

Another example TiO$_2$ 40 nm/ITO 18 nm/Cr 25 nm/AgAu7x 9 nm has a reflectance of 77.5% as a single and 65.5% when assembled in an element while TiO$_2$ 40 nm/ITO 18 nm/AgAu7x 23.4 nm has a reflectance of 77.5% as a single and 66% when assembled in an element. The difference in this case is not as dramatic as the earlier example, however it shows that even buried layers can influence the reflectance drop going from a single to an element. This is to illustrate that when reflectance matches are desired in an element a reflectance mismatch may be needed for the coatings as singles.

The methods described above to attain good reflectance and color matches in the two areas of the mirror presume that the appearance in the two areas is due virtually entirely by the reflectance. However, the viewer perceives not only the reflectance but, in the display area, also the transmitted light. In the viewing or opaque area the viewer only perceives the reflectance since the transmittance is relatively low. The amount of transmitted light is a function of the transmittance in the display area and the reflectance of components behind or in contact with the fourth surface of the mirror. The amount of light perceived by the viewer increases as the transmittance of the coating in the display area increases. Similarly, as the reflectance of the components behind the mirror increases the light perceived by the viewer also increases. This may add a substantial amount of light and the viewer would perceive this as the display area being brighter than the viewing area. This may result in the display area appearing brighter even if the two areas have identical reflectance. This effect may be mitigated by producing an element with components having low reflectance and/or by having the transmittance in the viewing area set to a relatively low level. If the output brightness of the display is relatively limited, or low, then reducing the transmittance can substantially dim the display.

For yet another example, an EC element consisting of 40 nm TiO$_2$/18 nm ITO/EC fluid/140 nm ITO/Glass having a reflectance of 8.1%. a 5 nm Ruthenium layer is deposited on the fourth surface to simulate a display behind the mirror (i.e. 5 nm Ru/Glass/40 nm TiO$_2$/18 nm ITO/EC fluid/ITO/Glass) the reflectance rises to 22.4%. An EC element consisting of Glass/40 nm TiO$_2$/18 nm ITO/22 nm AgAu7x/EC fluid/ITO/Glass has a reflectance of 61.7%. The stack with the 5 nm of Ruthenium has a reflectance of 63.5%— approximately a 2% increase in reflectance. This amount of reflectance is quite perceptible by the viewer. As noted above the actual reflectance increase will be dependent on the reflectance of the components behind the mirror and the transmittance of the EC element.

In order to reduce the perceived brightness differences in the two areas the relative reflectance may be adjusted in the two areas to compensate for the transmitted light component. Therefore, to achieve a net 2 percent brighter area in the display section of the mirror either preferentially increase the reflectance in the viewing area or decrease the reflectance in the display area. The amount of adjustment is dependent on the particular circumstances of the system.

Example 1a

In this example, the third surface of a 2.2 mm glass substrate is coated with approximately 400 Å TiO$_2$ followed by approximately 180 Å of ITO and finally with approximately 195 Å of silver-gold alloy (93% silver/7% gold by weight). The titanium dioxide and ITO are preferably applied substantially to the edge of the glass and the silver alloy is preferably masked inboard of at least the outboard side of the associated seal. In at least one embodiment the second surface comprises a ½ wave (HW) layer of ITO. The associated element reflectance and transmission model is illustrated FIGS. 72A and 72B, lines 7201*a* and 7201*b* respectively. The model reflection is approximately 57% @ approximately 550 nm and transmittance is approximately 36.7%.

Example 1 b

This Example is configured similar to Example 1a except with a chrome/metal tab along at least a portion of a perimeter area of the third surface extending beneath the seal to improve the conductivity between an associated clip contact area and the silver alloy. The appearance remains the same however, the darkening speed is improved. This feature may be applied to a number of the following examples to improve electrical conductivity from the third surface to the associated electrical contacts. As can be seen from FIGS. 72A and 72B, the reflectance associated with the element of Example 1a while the transmission of each is dramatically different; this represents one of the advantages of the present invention.

Example 1c

Figure 72A:
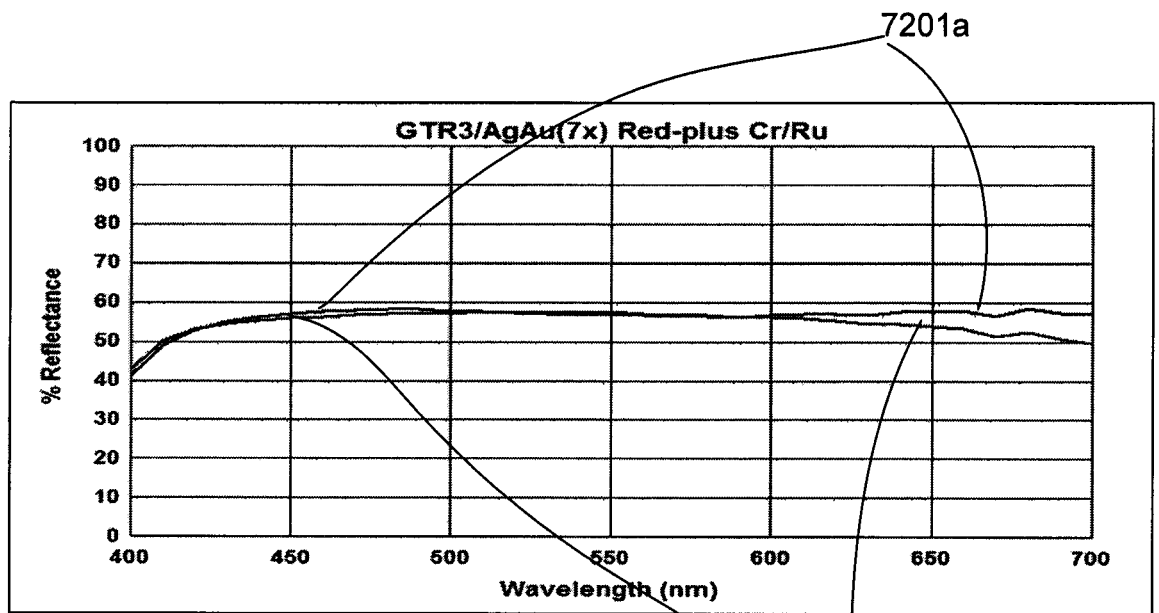
FIGS. 72A-77 depict various graphs of thin film reflectance and or transmission vs. wavelength.
Figure 72B:
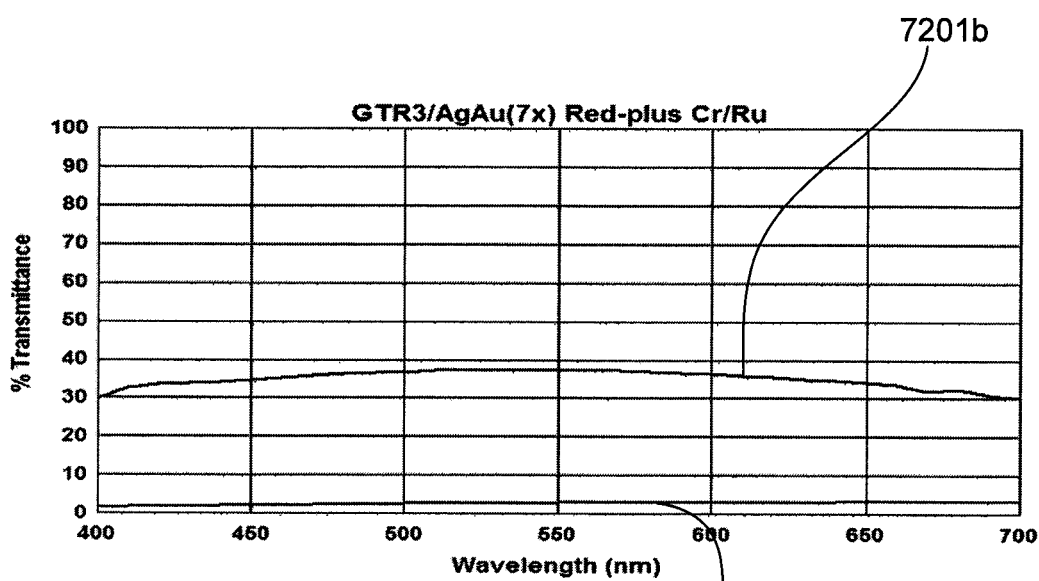

Example 1c is configured similar to Example 1a, however, a display area is initially masked and a stack consisting of Cr/Ru is deposited over substantially the entire surface, subsequent to removing the mask (i.e. resulting in only the Cr/Ru on the glass in the display area. The Cr/Ru opacifying stack may be replaced by a number of combinations. The reflectance and transmission results are depicted in FIGS. 72A and 72B by lines 7202*a* and 7202*b*, respectively. The opacifying stack preferably has a low contrast for both reflectivity and color, relative the display area. Another advantage in this example is that the metals generally used in the opacifying layer may extend to the edge of the glass to bridge between an associated electrical connection clip and the third surface silver-gold alloy. The model reflection is approximately 56.9% @ approximately 550 nm in the viewing area and approximately 57% reflection in the display region with transmittance <10, <5% preferred, <1% even more preferred, and <0.1% most preferred design goal (this applies to all comparable designs) in the viewing area and transmittance in the display region of approximately 36.7%. It should be understood that a light sensor may be located behind the "display area" in addition to, or in lieu of, a display or other light source.

Example 2a

In this Example, the third surface of a mirror element is coated with approximately 2000 Å of ITO followed by approximately 50% transmission chrome and finally with approximately 170 Å of silver-gold alloy. Preferably the ITO and chrome are coated substantially to the edge of the glass and the silver alloy is masked inboard of at least the outboard side of the seal. The Cr thickness is preferably adjusted so that the ITO plus Cr layer measures 50% transmittance through the back plate only. In at least one embodiment the second surface preferably comprises a HWITO layer. The reflectance and transmission of the element is illustrated in FIGS. 73A-73D lines 7301a and 7301b respectively. The Cr layer may be adjusted (thicker or thinner) to adjust the final transmittance of the transflective element. As the Cr layer is thickened the transmittance will drop, when the Cr layer is thinned the transmittance will increase. An added advantage of the Cr layer is that the stack is relatively color stable for normal vacuum sputter deposition process fluctuations in the base ITO layer. The physical thickness of the chrome layer is preferably between approximately 5 Å and 150 Å, more preferably between 20 and 70 Å and most preferably between 30 and 60 Å. The model reflection is approximately 57% @ approximately 550 nm and the transmittance is approximately 21.4%.

Example 2b

Figure 73A:
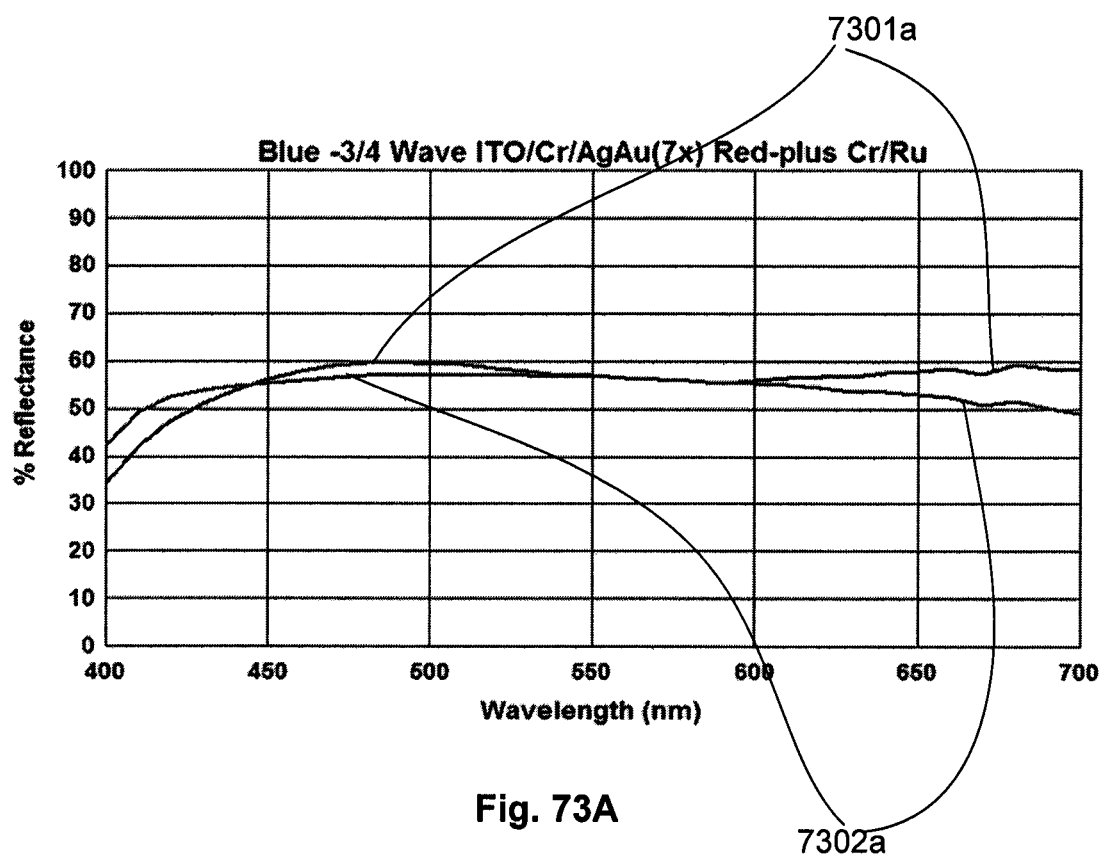
Figure 73B:
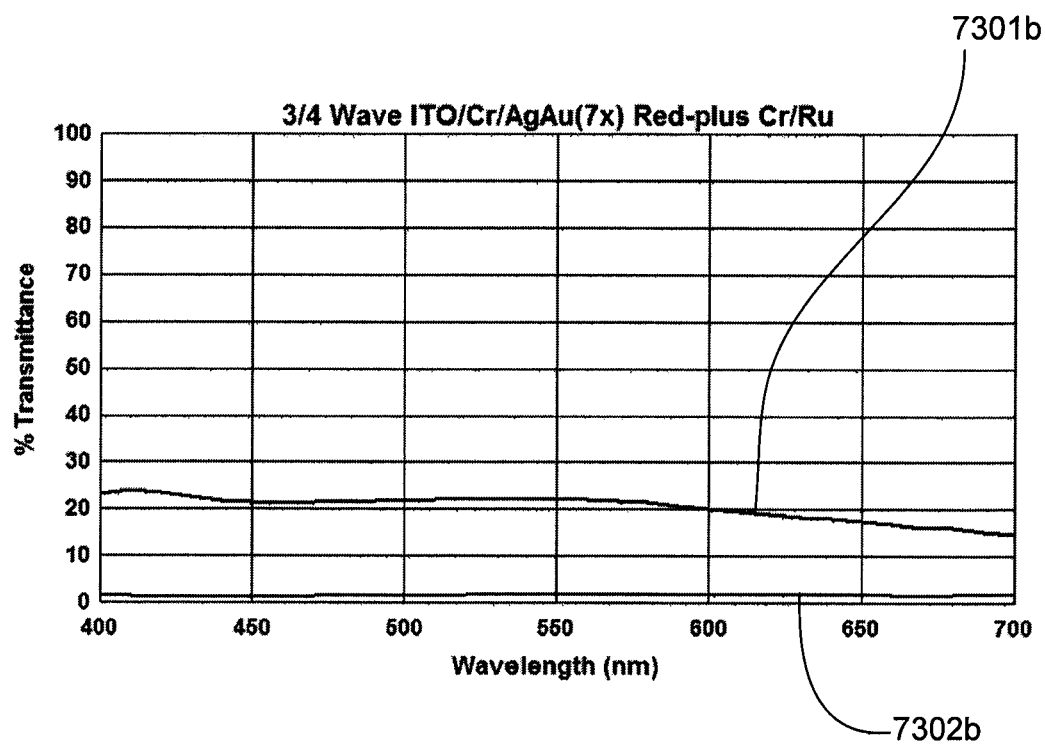
Figure 73C:
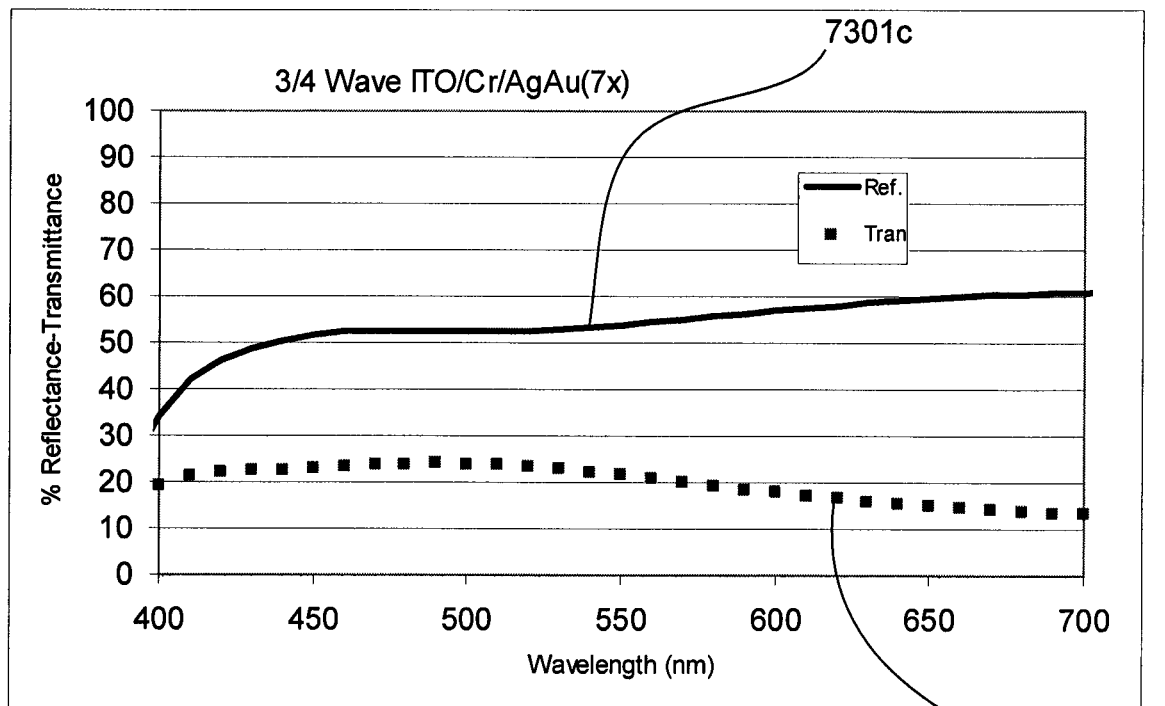
Figure 73D:
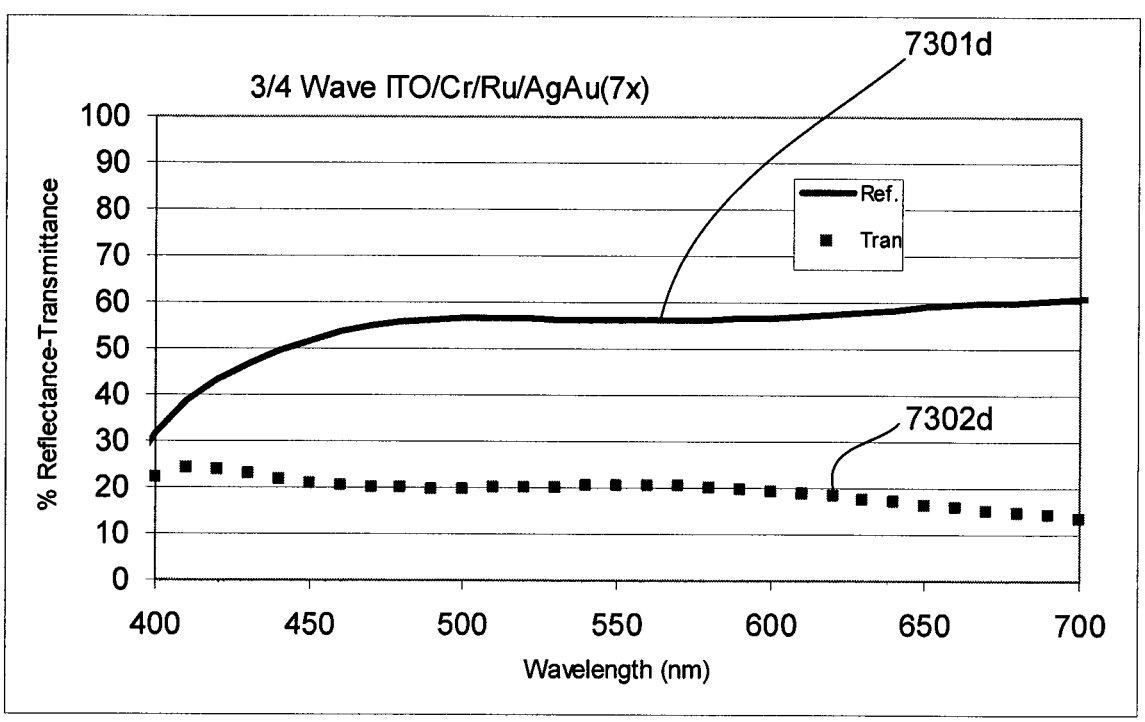

Example 2b is similar to Example 2a except with chrome/ruthenium combination stack coated to obtain a transmittance of 50% when measuring the back plate only (i.e. prior to incorporation in a mirror element). Addition of the Ru layer provides improved stability during curing of the epoxy seal. The ratio of the Ru and chrome thickness may be adjusted and there is some design latitude. Chrome is incorporated primarily to improve the Ru adherence to the ITO. The Ru has preferred bonding to the Ag or Ag alloy. Other metal or metals may be placed between the Cr and Ru layers so long as the proper material and physical properties are maintained. The reflectance and transmission characteristics are depicted in FIG. 73C, lines 7301c and 7302c, respectively.

Example 2c

Example 2c is similar to Examples 2a and 2b except a display area is initially masked and a Cr/Ru (or other opacifier) layer deposited over substantially the entire third surface subsequent to removing the mask. Transmission and reflectance results are illustrated in FIGS. 73A and 73B, lines 7302a and 7302b, respectively. The associated advantages are similar to those of Example 1c.

Example 3a

In this Example, the third surface of an EC element is coated approximately 400 Å of $TiO_2$ followed by approximately 180 Å of ITO followed by approximately 195 Å of silver and finally with approximately 125 Å of IZO-TCO.

Figure 74A:
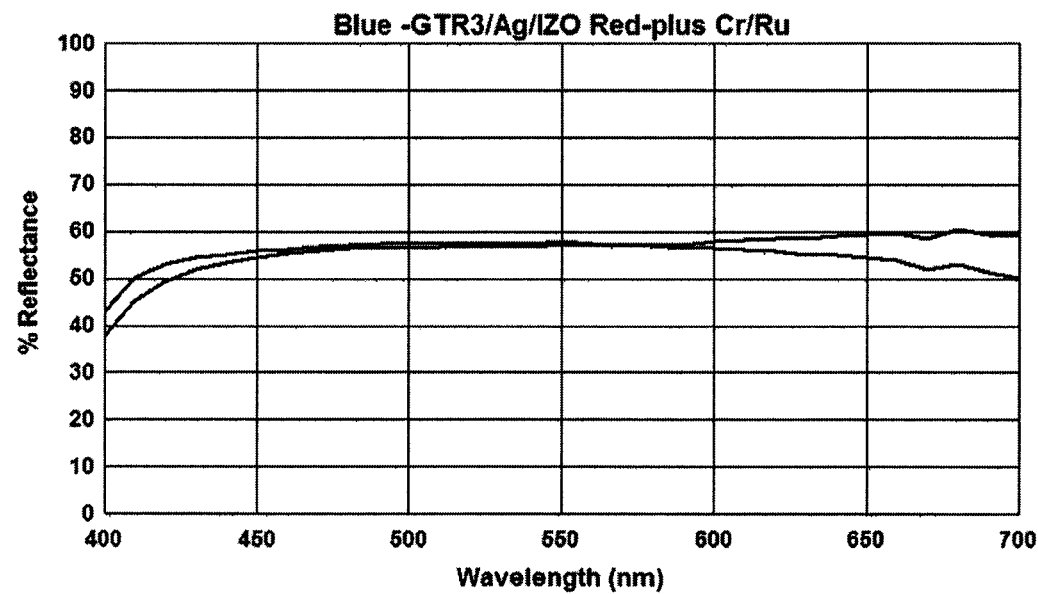
Figure 74B:
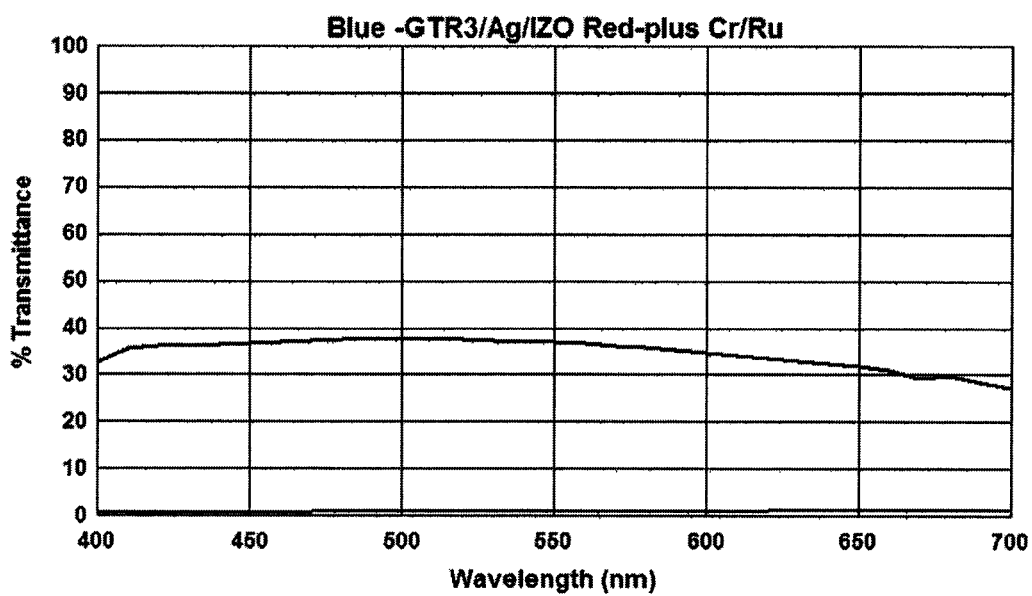

This Example is similar to example 1a, the $TiO_2$ and ITO are coated substantially to the edge of the glass and the silver is masked inboard of at least the outboard side of the seal and a layer of Indium-Zinc-Oxide (IZO) or other TCO is subsequently applied over the silver as a protective barrier from the EC fluid. Alternatively, the IZO/TCO layer may extend substantially to the edge of the glass. In at least one embodiment, the second surface preferably comprises a HWITO layer. The element reflectivity and transmission is illustrated in FIGS. 74A and 74B, lines 7401a and 7401b, respectively. The model reflection is approximately 57% @ approximately 550 nm and the transmittance is approximately 36%.

Example 3b

Figure 74C:
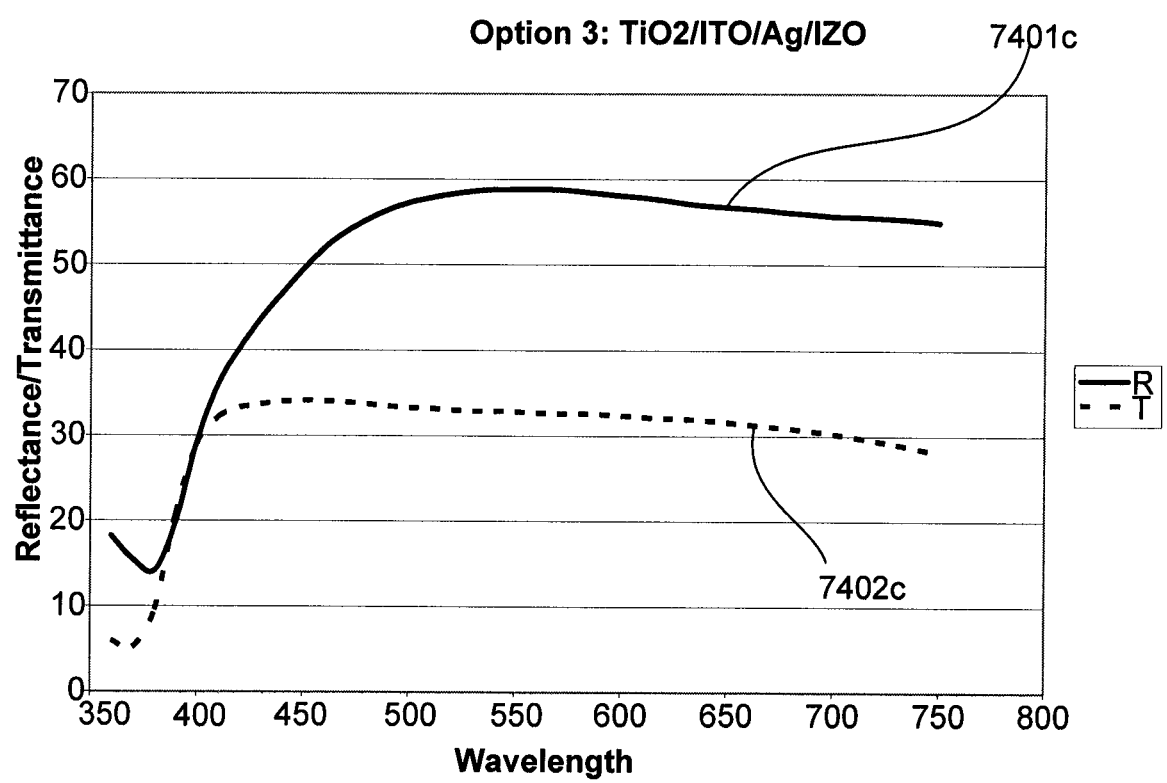

Example 3b is configured similar to Example 3a except a display area is masked and a stack consisting of Cr/Ru is deposited over substantially the entire unmasked area of the third surface. The Cr/Ru opacifying stack may be replaced by a number of combinations of materials. The reflectance and transmission results are depicted in FIGS. 74A and 74B by lines 7402a and 7402b, respectively. An advantage in this example is that the metals generally used in the opacifying layer may extend substantially to the edge of the glass and provide a bridge between an associated electrical contact clip and the silver alloy. Related reflectance and transmission measured data is depicted in FIG. 74C, lines 7401c, 7402c, respectively.

Example 4a

In this Example, the third surface of an EC element is coated with approximately 2100 Å of ITO followed by approximately 225 Å of silicon and finally with approximately 70 Å of Ru or Rh.

Figure 75A:
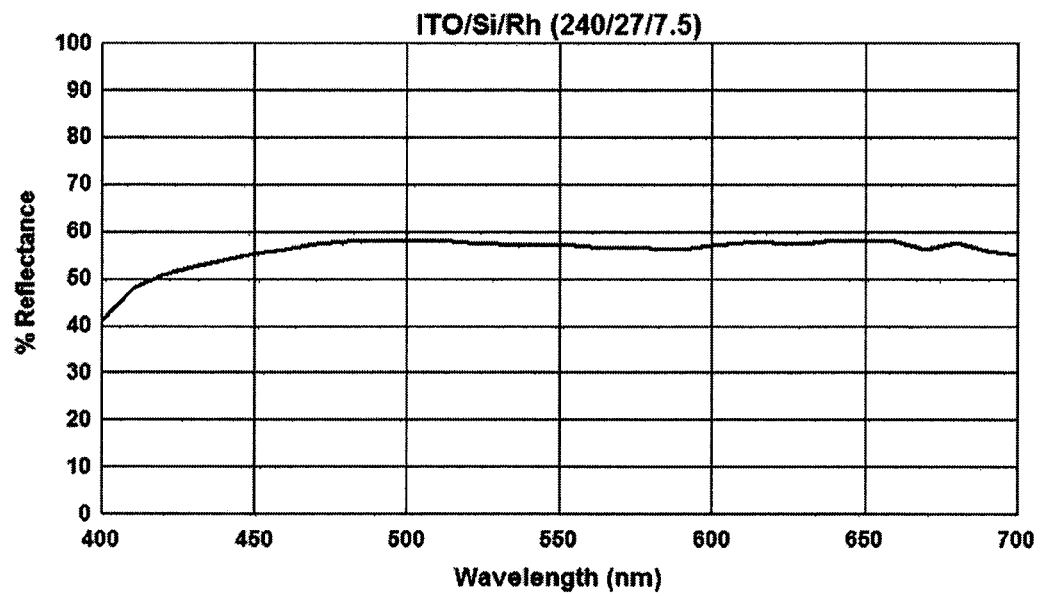
Figure 75B:
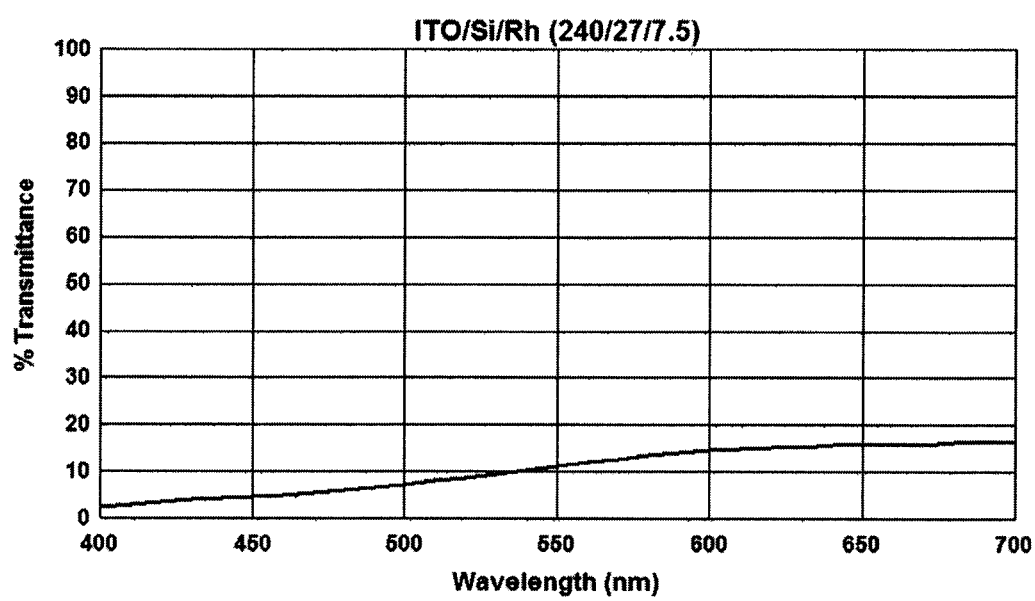
Figure 75C:
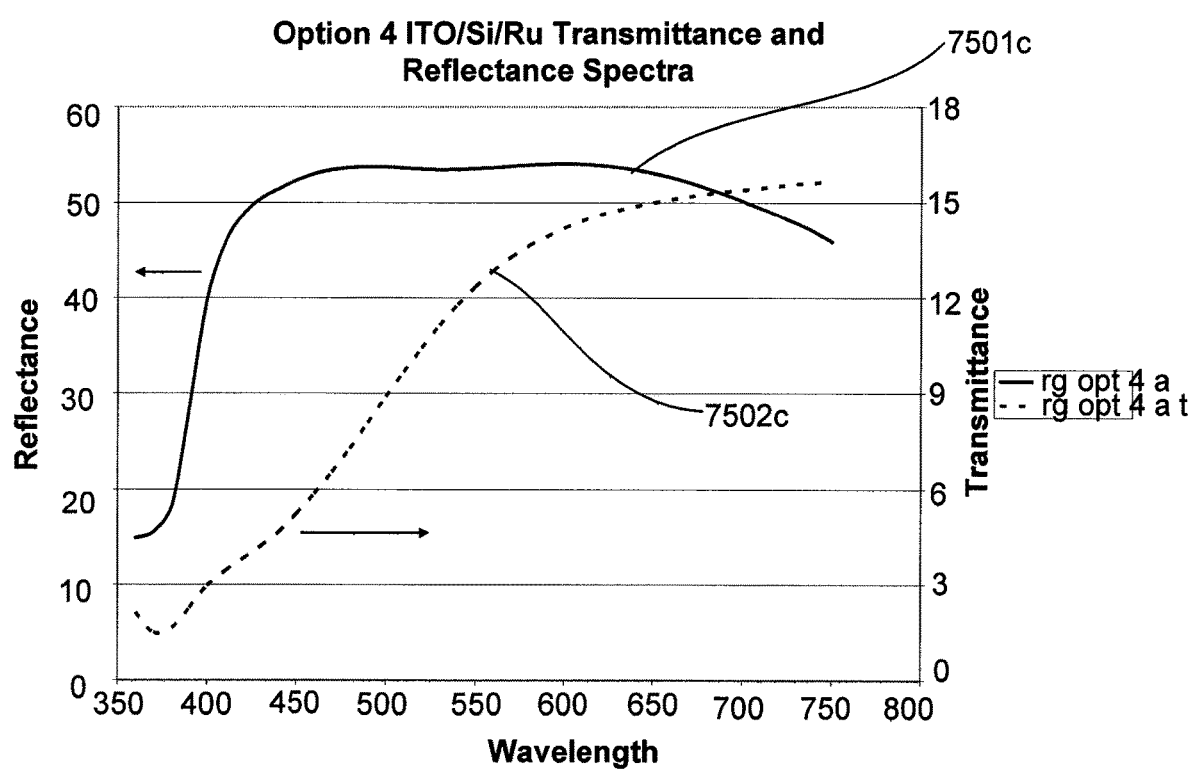

All of the layers may be coated substantially to the edge of the glass. Alternatively the glass may be processed in sheets and cut subsequently into singles for incorporation into a mirror element. The Ru or Rh layer may be replaced by one of several highly reflective metals or alloys. In at least one embodiment the second surface is preferably coated with HWITO. This example illustrates the advantage of increased transmittance at different wavelengths. The base ITO layer may be replaced having layers with different thicknesses. In some embodiments it is preferred that the ITO is an odd multiple of ¼ wave. In these cases the reflectance will be slightly enhanced by the ITO. This effect is diminished somewhat as the ITO gets thicker. The benefit of the thicker ITO is generally lower sheet resistance which will result in faster element darkening times. The model reflection is approximately 57% @ approximately 550 nm and the transmittance is approximately 11.4%. The modeled reflectance and transmission is depicted in FIGS. 75A and 75B, respectively. The measured reflectance and transmission is depicted in FIG. 75C, lines 7501c, 7502c, respectively.

Example 5

In this Example, the third surface of an EC element is coated with approximately 2100 Å of ITO followed by approximately 50 Å of chrome followed by approximately 75 Å of Ru and finally, optionally, with approximately 77 Å of Rh.

Figure 76A:
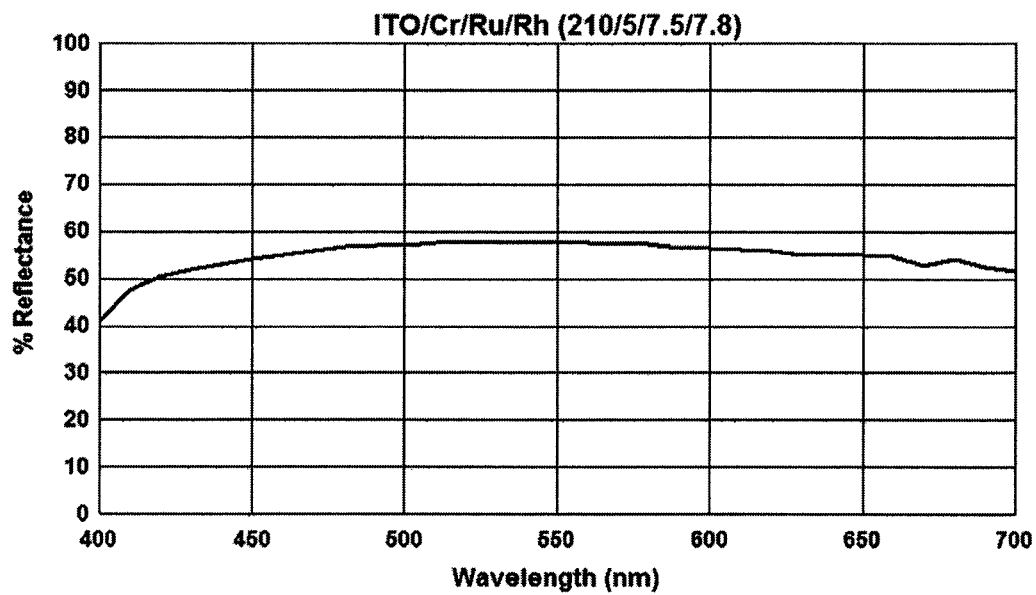
Figure 76B:
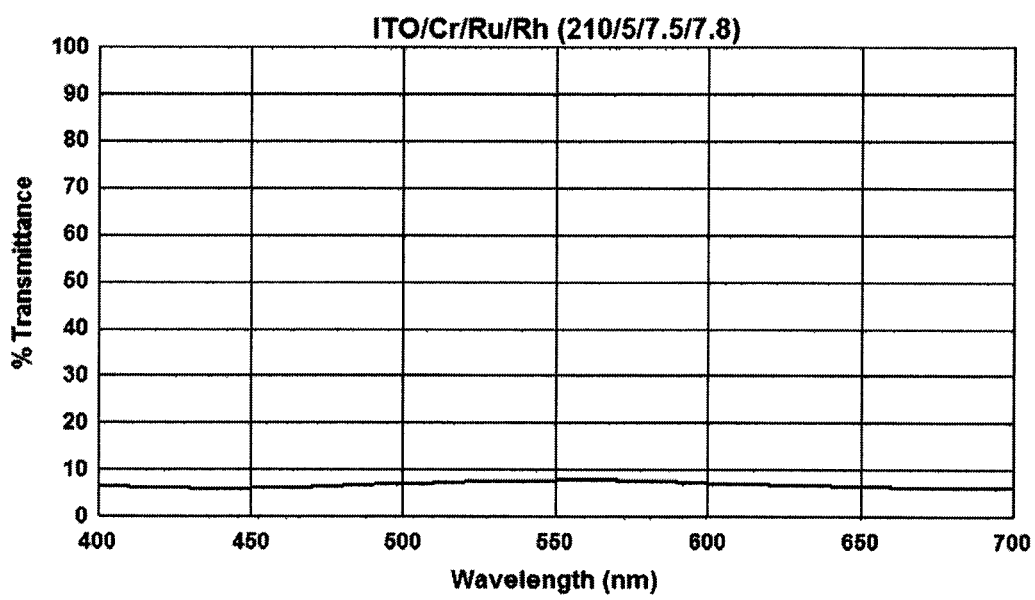
Figure 76C:
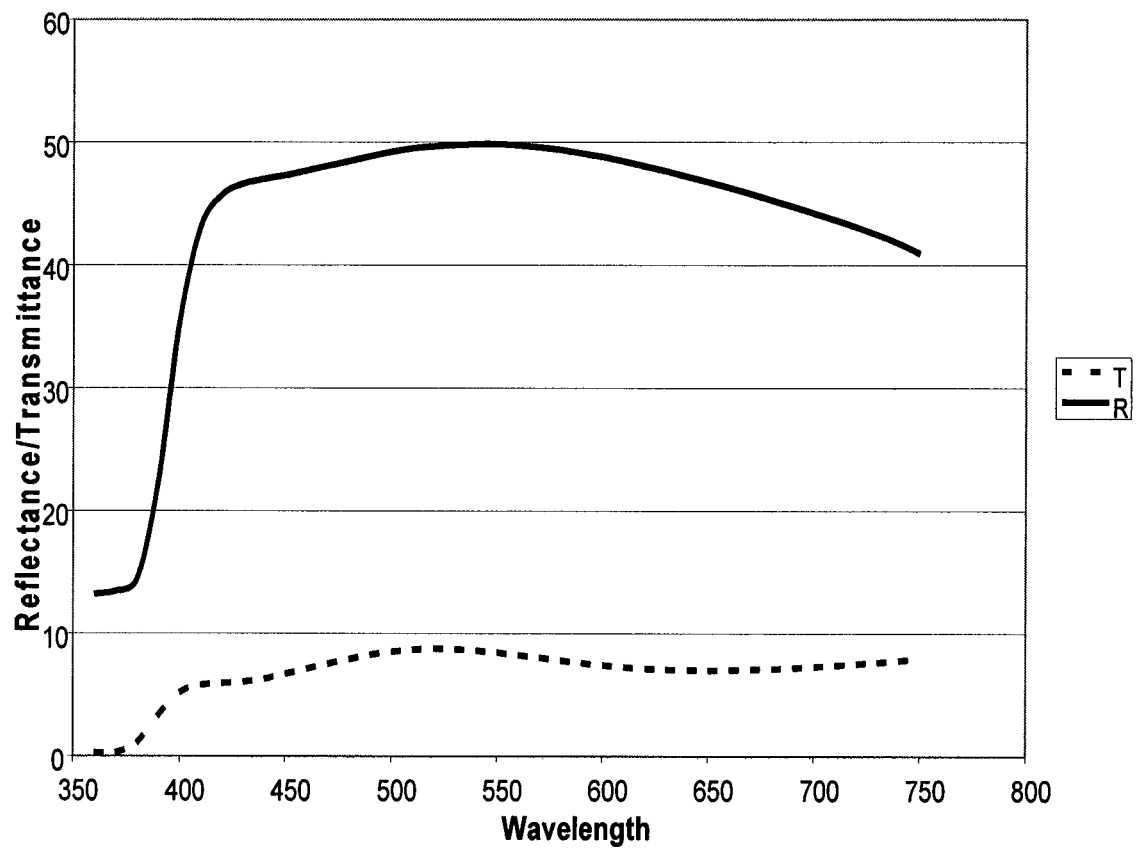

All of the layers may be coated substantially to the edge of the glass or the glass may be processed in sheets and subsequently cut into singles for incorporation into mirror elements. The Ru layer may be replaced by one of several highly reflective metals or alloys or additional layer(s) may be added such as rhodium. The metal layers may be adjusted to obtain a higher or lower reflectivity/transmittance balance. In at least one embodiment, the second surface is preferably coated with a HWITO layer. One benefit of the thicker ITO is lower sheet resistance which will result in faster element darkening times. Thicker ITO may increase the third surface stack roughness which may result in lower reflectivity. This effect is observed when comparing the model transmission and reflectance of FIGS. 76A and 76B, respectively to the transmission and reflectance obtained from the experiments (lines 7601c1 and 7601c2, respectively of FIG. 76C). The model reflection is approximately 57% @ approximately 550 nm and the transmittance is approximately 7.4%.

Example 6a Opacifier Layer on Third Surface

In this Example an opacifier layer is incorporated into the third surface coating stack. A base layer stack of approximately 600 Å of chrome followed by approximately 600 Å of ITO is deposited onto a glass substrate either with a display area masked during the deposition process of the base layer stack or the base layer stack is subsequently laser deleted in the display area. Subsequently layers of approximately 700 Å of ITO and (approximately 180 Å of silver-alloy Ag—X where X indicates the option for an alloy of Ag) are applied. This approach is substantially opaque in the viewing area and transflective in the display area.

The alloy may be masked relatively far away from the seal to improve the life of the element in harsh environments. The model reflection is approximately 52% @ approximately 550 nm and the transmittance is approximately 41%.

Example 6b

Example 6b is similar to Example 6a. In this Example the third surface is initially coated with a base layer stack of approximately 600 Å of chrome followed by approximately 100 Å of ITO followed by approximately 500 Å of $TiO_2$ and finally by approximately 50 Å chrome other than in a display area. Substantially the entire third surface is subsequently coated with approximately 150 Å of $T_iO_2$ followed by approximately 500 Å of ITO and finally by approximately 180 Å of silver-gold alloy. The model reflection is approximately 54% @ approximately 550 nm and the transmittance is approximately 41%.

An electrochromic mirror, may have limited reflectance (R) if a high transmittance (T) level is desired or alternatively limited transmittance if high reflectivity is required. This may be described by the relationship R+T+A=1 assuming the absorption (A) remains constant. In some display, or light sensor, mirror applications it may be desirable to have a high level of transmitted light or (luminance) to adequately view an associated display or transmit adequate light, through the mirror element. Often this results in a mirror with less than desirable reflectance.

Figure 79:
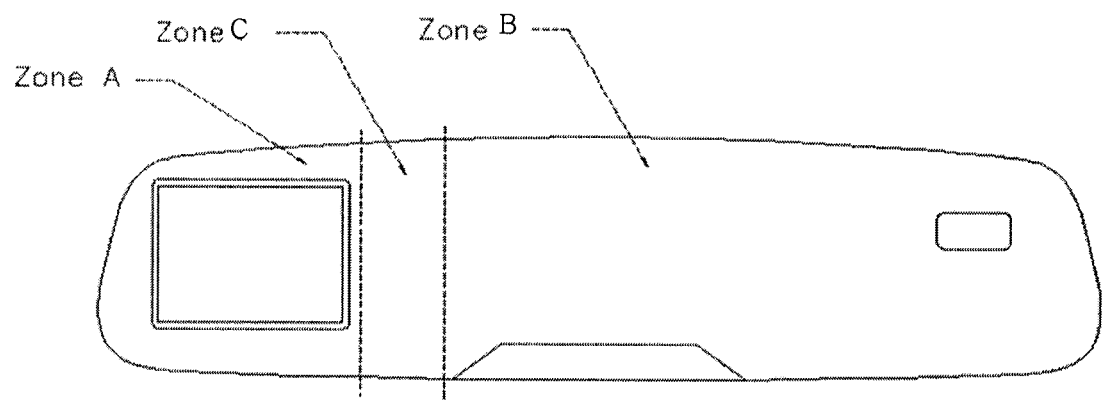
Figure 80A:
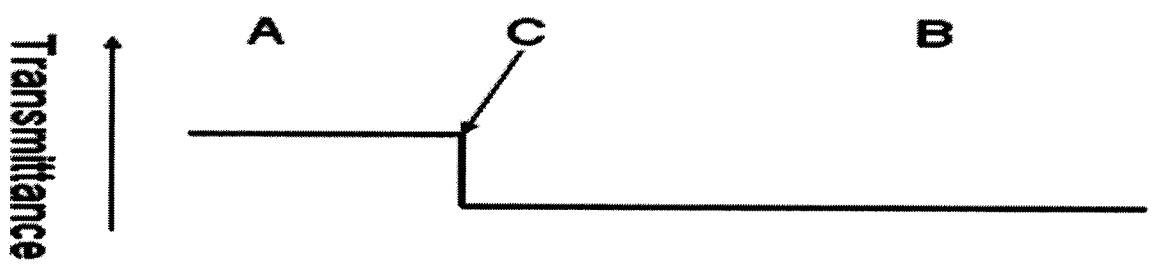
Figure 80B:
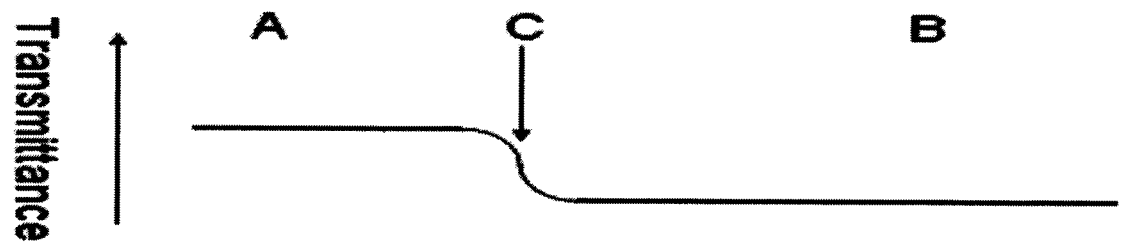
Figure 80C:
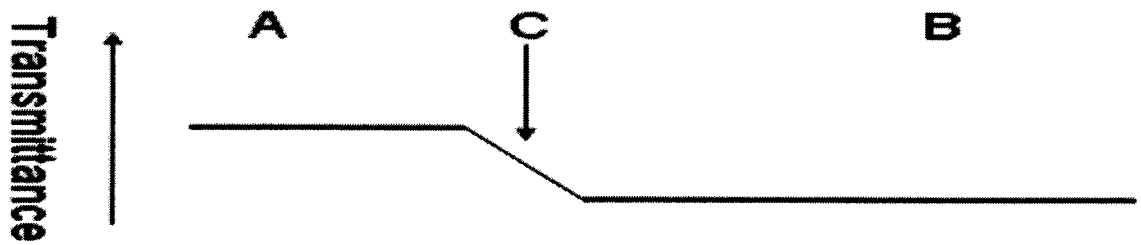
Figure 80D:
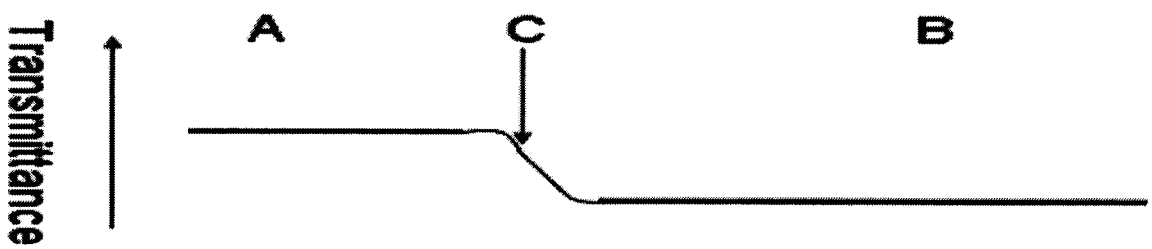
Figure 87:
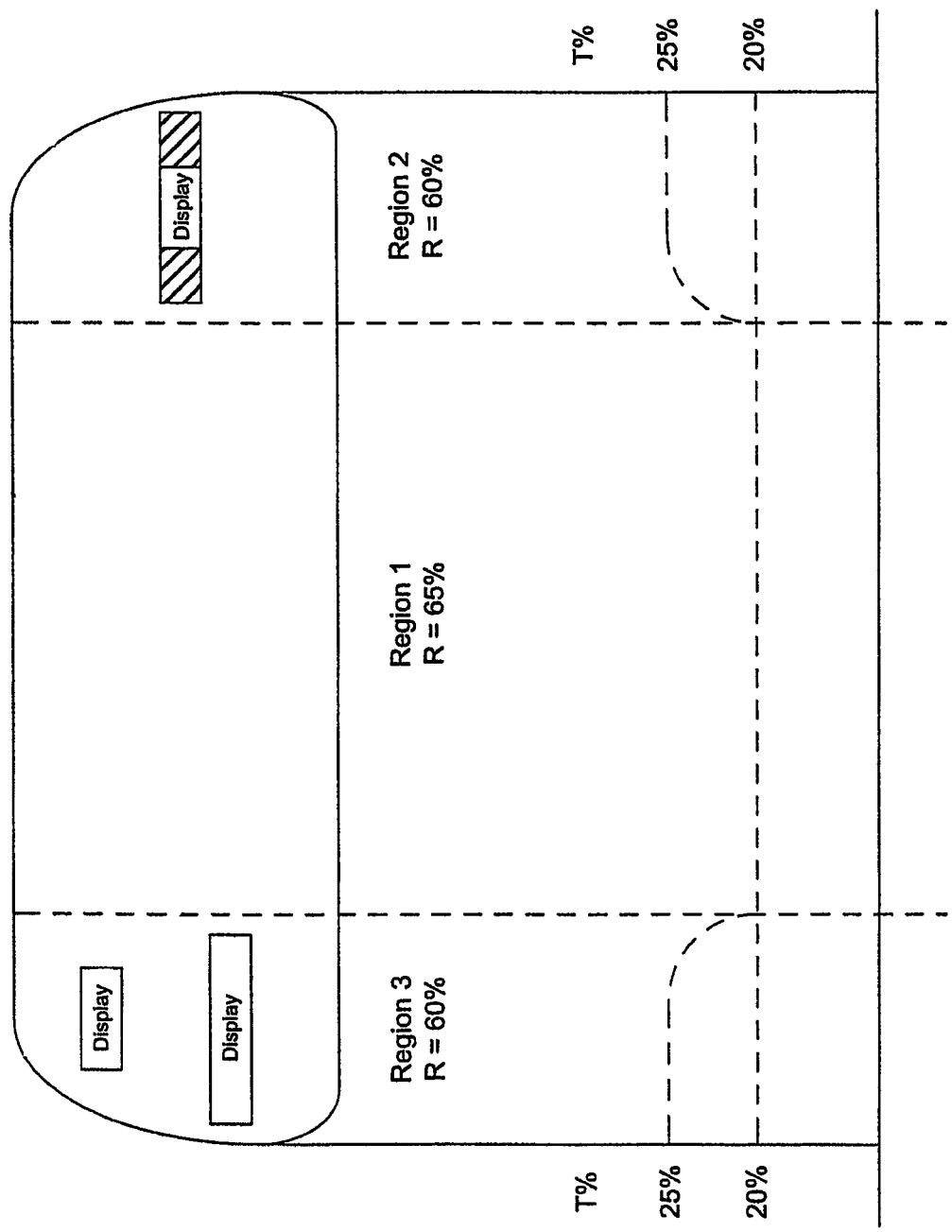
FIG. 87 depicts a prior art rearview mirror element.

Solutions to deal with the mentioned limitations have been discussed in other examples herein where the thickness of the metal layer or layers are adequate for reflectance in the viewing area and are thinner over the display area only. Other examples employ layers of differing metals or coating stacks over the display area in an attempt to match color and or reflectivities of the different regions. Often times an abrupt change in reflectivity or color is objectionable to an observer. Referring to FIGS. 79 and 80A, for example, the boundary (C) between the two regions is abrupt. Region (A) has a higher transmittance than region (B). Boundary (C) delineates the two regions. In FIG. 87 the boundary at the start of the transition between high and lower reflectance region is also abrupt. The slope of the reflectance change per unit distance approaches infinity as one transitions between the regions.

In at least one embodiment a transition in the metal layer thickness is gradual in manner. A gradual change in reflectance and or transmittance in a transition region is more difficult for the human eye to detect. Two regions still have distinct reflectance and transmittance values, however, the boundary between the two regions is graded. The gradation eliminates the abrupt discontinuity and replaces it with a gradual transition. The human eye is not as drawn to the interface when it is graded. The grade may be linear, curvilinear or other forms of transition illustrated in FIGS. 56B-56D. The distance over which the grade takes place may vary. In at least one embodiment the distance is a function of the reflectance difference between the two regions. When the reflectance between the two regions is relatively low, the distance of the grading may be relatively short. When the reflectance difference is large, a longer grade may be desired to minimize visibility of the transition. In at least one embodiment length of the grade is a function of the application and intended use, observers, lighting, etc.

Figure 80E:
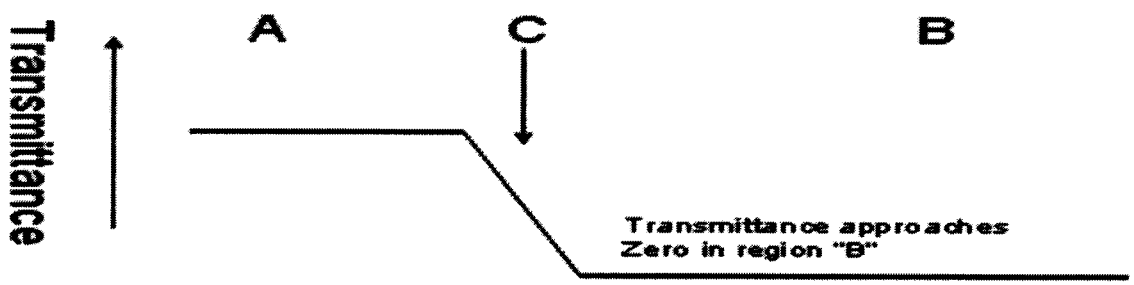

In at least one embodiment, shown in FIG. 80E, the transmittance may be reduced to near zero in one or more portions. The reflectance may be the same or different in other cases described herein. The "stealthy" embodiments described elsewhere herein may be employed to keep the reflectance relatively constant while allowing the transmittance to be tuned in various portions of the mirror element as desired.

Figure 80F:
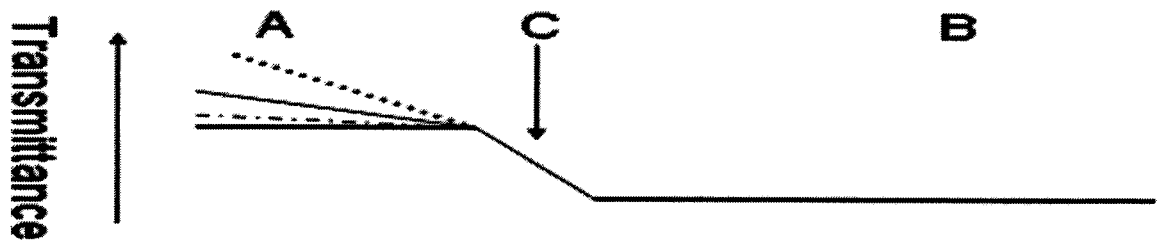

The present invention is not limited to having two or more regions of constant transmittance or reflectance. One embodiment is illustrated in FIG. 80F. Region B has a relatively low transmittance that may be zero. This may be desired if one of the design goals is to have region B block the light coming from objects placed behind the transflective coated substrate. The coating stack may have a gradual transition from region B via grade C. Region A may have another gradient within itself. There are potential benefits to this that will be discussed below.

Figure 81A:
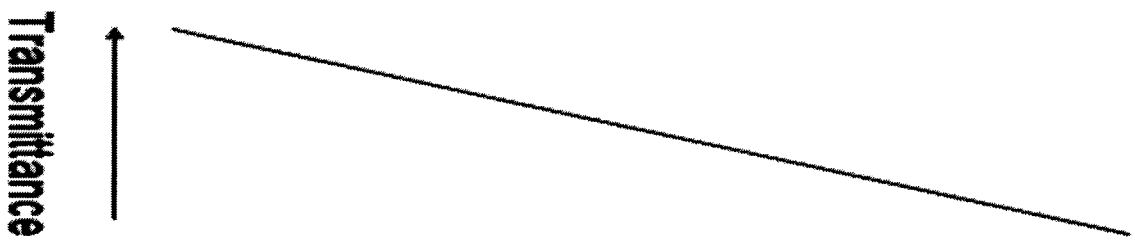

In certain applications sufficient length may not be available to attain a dual plateau situation. In these cases, it is advantageous to use a continuous grade across the area where transflective properties are desired, as illustrated in FIG. 81A. The change in reflectance is gradual and the benefits of higher transmittance are attained; there is no abrupt interface between the regions.

Figure 81B:
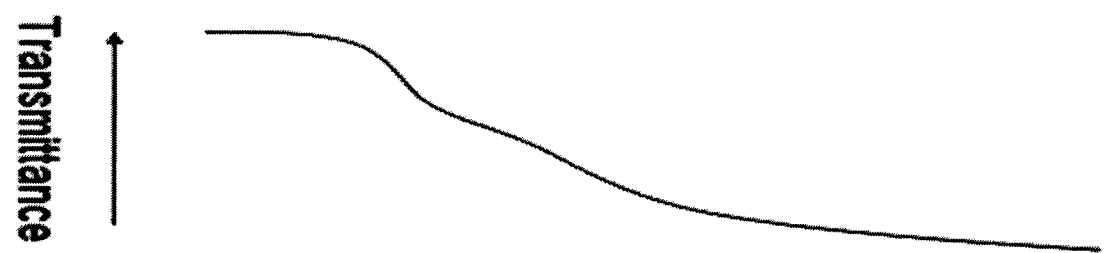

The grade between the two zones may take on various forms. In the broadest sense an element may comprise regions of distinct and uniform transmittance and reflectance. In the examples shown in FIGS. 81A-81C, there are not regions of constant reflectance and transmittance. These cases have a gradual and continuous change in optical properties. Advantages to this approach are illustrated in FIG. 82.

When a viewer looks at a display through a mirror element or coated glass substrate there is a continuum of path lengths and angles in relation to a closer portion of the display relative to a far portion of the display. Depending on the orientation of the mirror element display, the size of the element, distance from the observer, etc., the effective angle relative of incidence will change. This results in a different amount of transmittance through the glass at various portions of a display area. The different amount of transmittance in turn leads to a change in brightness of the display. When a constant output of light from all regions of the display is desirable the transflective coating may be varied to take into account the loss of transmittance arising from the viewing angle and path difference through the glass. If the effective angle of viewing changes from about 45 degrees to 60 degrees the transmittance through the glass will vary by about 6%. Thus, having a graded transflective coating in the region of the display may compensate somewhat for this effect and therefore can result in a more equal perceived light intensity across the display.

A graded transition zone may be used for a display such as a rear camera or a traditional compass temperature display. In some of the "stealthy" examples discussed elsewhere herein a so called "split Ag" stack is provided where an opacifying layer is placed between two Ag layers to help match the appearance between the areas of transflective and opaque properties. In another embodiment of a stealthy display an Ag layer is placed above an opacifying layer. Both of these embodiments may benefit from a graded transition between the regions. The opacifying layer or Ag layer or all layers may be graded. In at least one embodiment the opacifying layer may be graded to minimize the abruptness of the transition between the regions.

Many methods may be employed for varying the material thickness in the layer or layers to create transition regions, including but not limited to, masking; motion or speed variations on either the substrate or coating source; magnetic field variations in a magnetron, or layer reduction techniques such; as ion beam etching as described herein or other suitable means.

Figure 83:
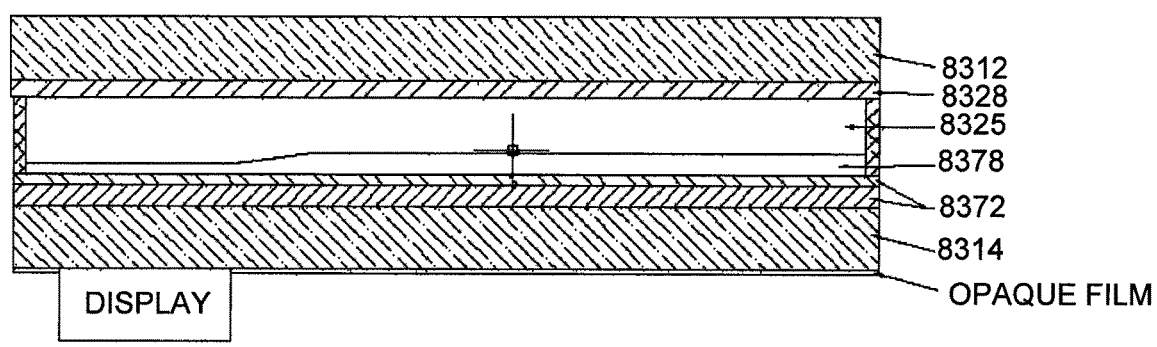

FIG. 83 illustrates an example of an electrochromic mirror construction having a back plate 5914 of glass, layer 5972 including a sub layer of titanium dioxide of approximately 440 Å and a sub layer of ITO of about 200 Å, a layer 5978 of 6Au94Ag where one region has a thicknesses of about 140 Å another region has a thickness of about 235 Å, and a third region between the first two regions where the thickness gradually transitions between the two, an electrochromic fluid/gel 5925 having a thickness of approximately 140 microns, a layer 5928 of approximately 1400 Å of ITO, and a glass plate 5912 of 2.1 mm. The resulting reflectance of the element ranges from about 63% in the majority of the mirror to about 44% in the area in front of the display.

Example 7

Figure 83A:
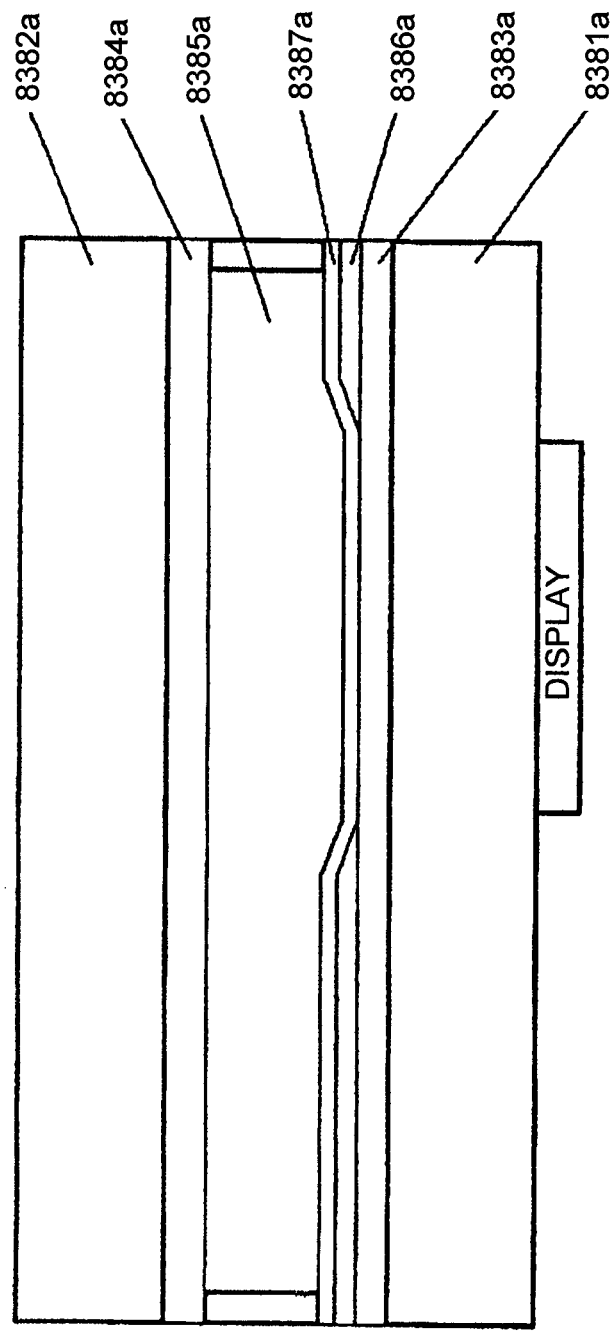
FIG. 83A depicts a profile view of cross sections of various elements.

A gradient version of the aforementioned opacified transflective stack can be constructed. In this example a preferred third surface stack is composed of $TiO_2$ (440 Å)/ITO (180 Å)/Mo (350 Å)/AgAu7x (150 Å). This results in an element reflectance of 69% in the main viewing area and a transmittance of 1% (opaque). The molybdenum layer can be graded to zero thickness near the edges of a display area to give $TiO_2$ (440 Å)/ITO (180 Å)/AgAu7x (150 Å) in the display area. This gives an element reflectance in the display area of 53% and a transmittance of 37%. The reduction in reflectance is spread across the transitional gradient making it difficult to perceive. FIG. 83A illustrates this example, with a top layer of glass 5952a and a bottom layer of glass 5981a. The LCD display or other display is attached to or placed behind the bottom of the bottom layer of glass 5981a or surface 4. Surface 2 is coated with an ITO 5984a. Surface 3 has a two layer stack of ITO over $TiO_2$ 5983a. The two halves of the EC cell are separated by the EC fluid 5985a and the bottom silver alloy layer 5986a, is deposited over the base layers 5983a. The Mo opacifying layer 5986a is deposited over the base layers 5983b. The Mo 5986a layer is graded to zero thickness at the edges of the display area leaving no Mo in the display area. A uniform layer of silver alloy 5987b is deposited over the Mo layer 5986a. In other embodiments, the silver alloy layer may also be graded to further change the reflectance/transmittance ratio.

Example 8

Figure 83B:
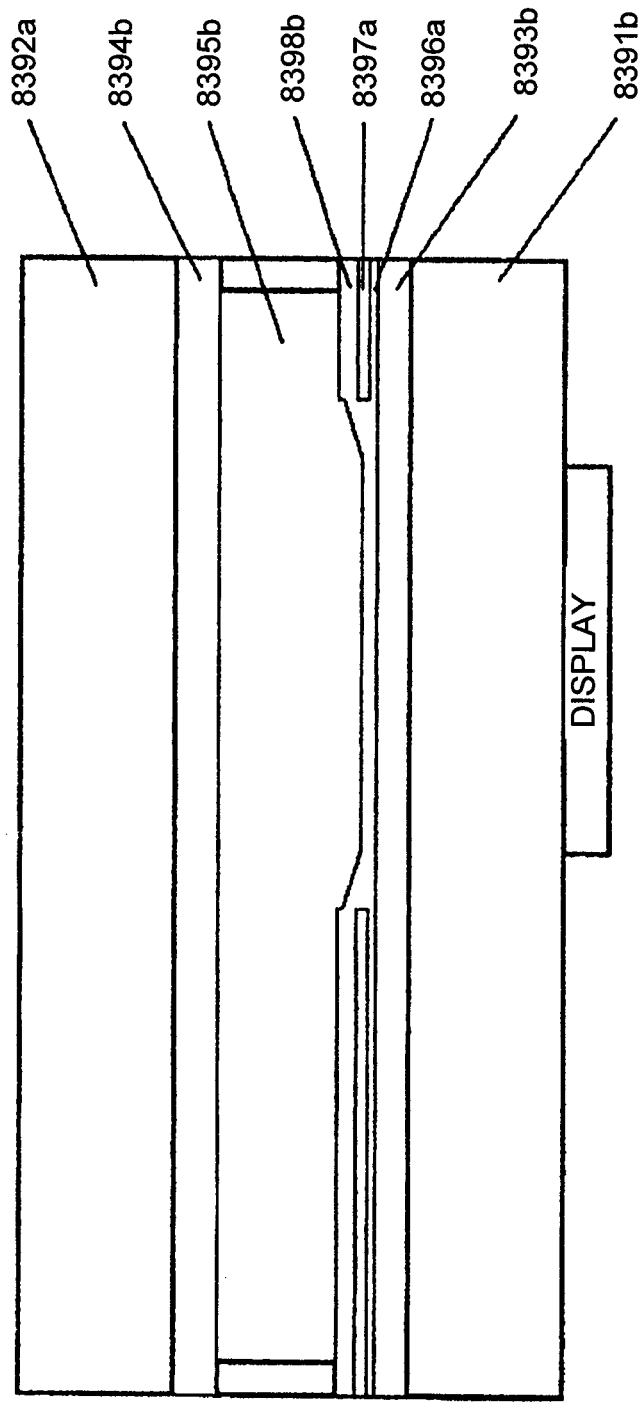
FIG. 83B depicts a profile view of cross sections of various elements.

A gradient version of the so called "split Ag" stack can be constructed. In this example a preferred third surface stack is composed of $TiO_2$ (440 Å)/ITO (180 Å) /AgAu7x (84 Å)/Mo (350 Å)/AgAu7x (150 Å). This stack results in an element reflectance of 68% and a transmittance of 1% (opaque). One can delete the Mo layer in a display area so that the resulting stack over the display area is $TiO_2$ (440 Å)/ITO (180 Å)/AgAu7x (84 Å)/AgAu7x (150 Å). This gives an element reflectance in the display area of 68% and a transmittance of 21%. The transmittance in the display region can be further improved by grading the silver alloy layers so that the resulting stack in display area is $TiO_2$ (440 Å)/ITO (180 Å)/AgAu7x (136 Å). This yields an element reflectance in the display area of 50% and a transmittance of 40%. The advantage of this design is that the element is essentially opaque in the regions not incorporating a display and highly transparent in the areas that do. The gradual change in silver alloy thickness hides the change in reflectance required to increase the transmittance to such a high level. The general structure of this design is illustrated in FIG. 83B with a top layer of glass 8392b and a bottom layer of glass 8391b. The LCD display or other display is attached to the bottom of or placed behind 8391b or surface 4. Surface 2 is coated with an ITO 8394b. Surface 3 has a two layer stack of ITO over $TiO_2$ 8393b. The two halves of the EC cell are separated by the EC fluid 8395b and the bottom silver alloy layer 8396b is deposited over the base layers 8393b. The Mo opacifying layer 8397b is deposited over the bottom silver alloy layer 8396b. The Mo layer 8397b stops near the edges of the display area leaving no Mo in the display area. The top silver alloy layer 8398b is deposited over the Mo layer 8397b and display area. The top, bottom or both silver alloy layers can be graded in the display to gradually change the reflectance/transmittance ratio in the display area yielding a stealthy display. In other embodiments, the silver alloy layers may be graded elsewhere to modify the reflectance in other zones.

In both of these examples, many opacifying materials other than Cr or Mo can be used. Other metals, alloys, intermetallics, non-metals, etc. can be used. Silver and its alloys are particularly useful for the reflecting layer this kind of optical stack, however, other materials can be employed, including multilayer dielectric stacks. In both cases, the relative reflectance and transmittance can be varied in both the opaque and transflective regions by appropriate choice of materials and layer thicknesses.

The reflectance of a fourth surface coating can be modified through the use of dielectric layers. For example, a quarter-wave layer of $SiO_2$ between the fourth surface of the element and a reflective metal layer would serve to increase the reflectance of the metal layer. A higher index material will further increase the reflectance. This can be applied to a system incorporating a deposited reflector layer as well as a laminated reflector layer.

Figure 81C:
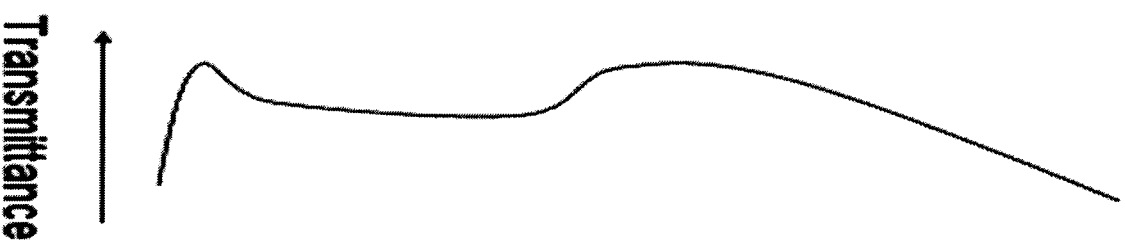
Figure 82:
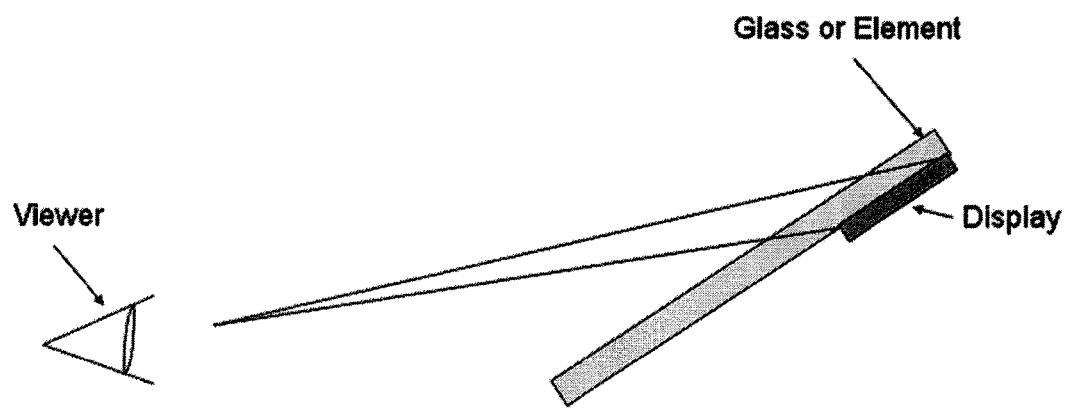
Figure 84:
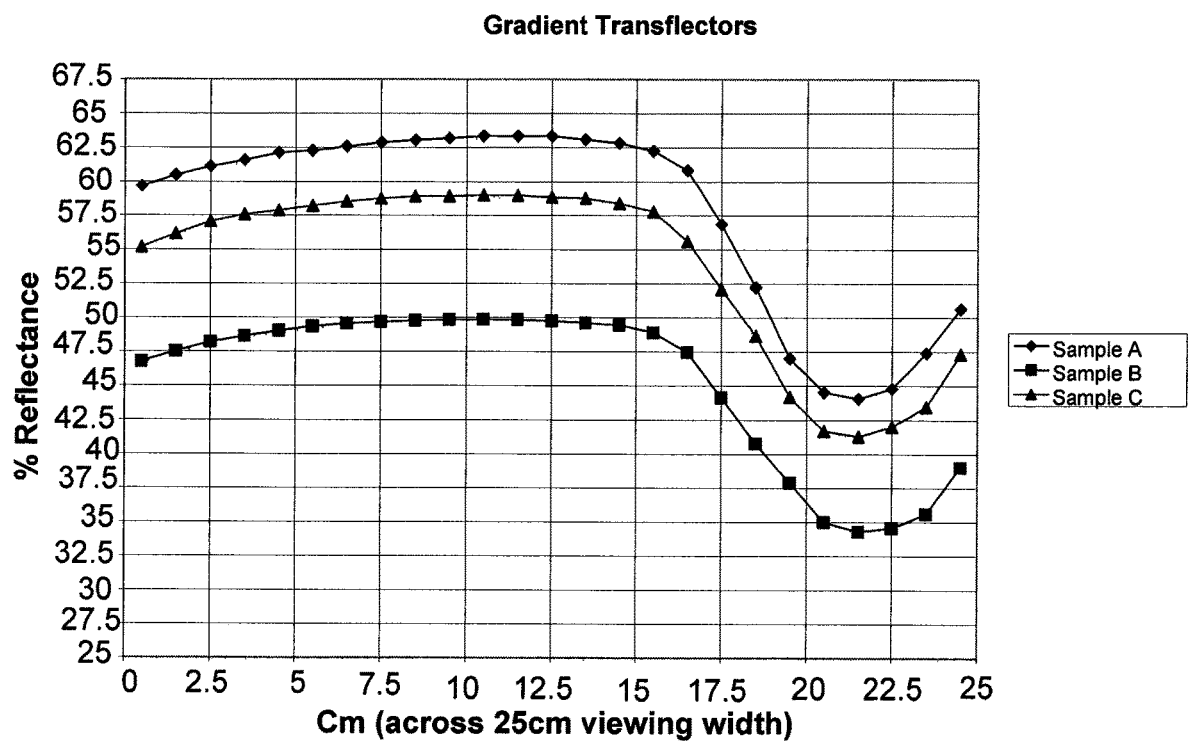
FIGS. 84-86 depict various embodiments of elements having graded thin-film coatings.
Figure 85:
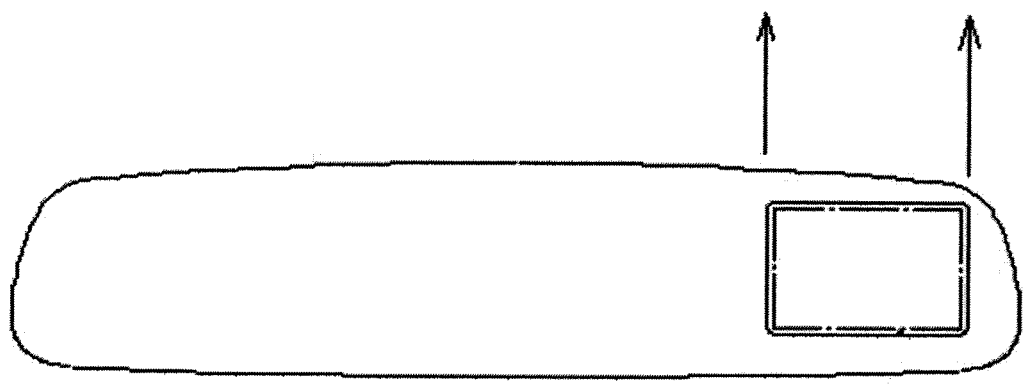

A similar electrochromic device to that described above was constructed where the thickness of layer 8378 was varied in a manner similarly described and illustrated in FIG. 81C using a combination of masking techniques and magnetic manipulation of the deposition source. The method of choice will depend on the exact features required in the finished element and what processing methods are available. FIGS. 84 and 85 depict the corresponding reflectance data as a function of the position on a mirror. A display is placed behind the region of low reflectance, high transmittance in this instance.

Figure 86:
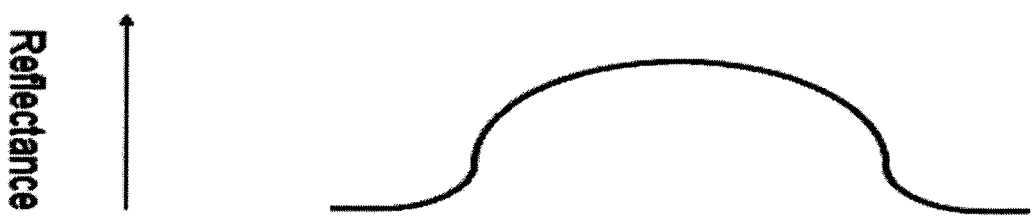

Another application of graded transitions is in electrochromic elements having a second surface reflector that hides the epoxy seal; a reflectance and color match between the "ring" and the reflector positioned on the third or fourth surfaces may be achieved. The best match is when the reflected intensity of the ring matches the reflector reflected intensity. In at least one embodiment the reflectance of the reflector is further increased while not altering the ring. This may occur because of durability, manufacturing or other considerations. A means to maintain the match between the reflector and the ring may be obtained when the reflectance of the reflector is graded as discussed above. When a gradual change in reflectance occurs, the reflectance of the reflector may be tuned to match the reflectance of the ring near the ring and then gradually increase moving away from the ring. In this manner the reflectance in the center of the viewing area is relatively high, as seen in FIG. 86.

In a similar manner the ITO may be gradually changed from the ring area to the center of the viewing area to preserve the thickness range necessary for acceptable color while allowing a relatively high reflectance in the center of the element. In this manner, the mirror will darken relatively quickly compared to the case where the ITO coating is relatively thin across the element.

The same concepts may be extended to the metal reflector electrode. In this case grading may be employed such that the sheet resistance of the coating varies gradually with position. This method compliments various bus configurations and results in faster and more uniform darkening. FIG. 87 illustrates an embodiment of a mirror element in accordance with the state of the art prior to the present invention.

It should be understood that the detail descriptions provided herein are intended to allow one of ordinary skill in the art to make and use the best mode of various embodiments of the present invention. In no way should these descriptions be construed as limiting the scope of the appending claims. The claims, as well as, each individual claim limitation shall be construed as encompassing all equivalents.

What is claimed is:

1. A drive circuit for controlling the reflectance of an electro-optic mirror of a vehicle, the drive circuit comprising:
   a current monitor operable to sense current flowing through the electro-optic mirror;
   a reverse polarity protection diode coupled in parallel with the electro-optic mirror, the reverse polarity protection diode operable to short-circuit the electro-optic mirror when a reverse polarity connection is made to the electro-optic mirror; and
   a processing circuit coupled to the current monitor, the processing circuit operable to:
      detect excessive current flow caused by a reverse polarity connection to the electro-optic mirror, and
      disable a supply of power to the electro-optic mirror when excessive current flow is detected.

2. The drive circuit of claim 1, wherein the processing circuit is further operable to:
   determine a desired reflectance for the electro-optic mirror; and
   vary a voltage applied to the electro-optic mirror to obtain the desired reflectance.

3. The drive circuit of claim 1, wherein the reverse polarity protection diode comprises an anode coupled to a negative terminal of the electro-optic mirror and a cathode coupled to a positive terminal of the electro-optic mirror.

4. The drive circuit of claim 1, wherein the electro-optic mirror is an electrochromic mirror.

* * * * *